United States Patent [19]

Masaki et al.

[11] Patent Number: 5,680,064
[45] Date of Patent: Oct. 21, 1997

[54] LEVEL CONVERTER FOR CMOS 3V TO FROM 5V

[75] Inventors: Satoru Masaki; Akinori Yamamoto; Fusao Seki; Fumitaka Asami, all of Kawasaki; Kazuo Ohno; Masao Imai, both of Kasugai; Shinya Udo, Satsuma-gun, all of Japan

[73] Assignees: Fujitsu Limited, Kawasaki; Fujitsu VLSI Limited, Kasugai; Kyushu Fujitsu Electronics Limited, Satsuma, all of Japan

[21] Appl. No.: 653,973

[22] Filed: May 28, 1996

Related U.S. Application Data

[63] Continuation of Ser. No. 220,047, Mar. 30, 1994, abandoned.

[30] Foreign Application Priority Data

Mar. 30, 1993 [JP] Japan ................... 5-072223

[51] Int. Cl.⁶ ................ H03K 19/0175; H03K 19/094
[52] U.S. Cl. .......................... 326/81; 326/68
[58] Field of Search ........................... 326/68, 81

[56] References Cited

U.S. PATENT DOCUMENTS

| | | | |
|---|---|---|---|
| 4,029,973 | 6/1977 | Kobayashi et al. | 326/81 |
| 4,150,308 | 4/1979 | Adlhoch | 326/81 |
| 4,305,009 | 12/1981 | Miyagawa et al. | 326/81 |
| 4,561,702 | 12/1985 | McAdams | 326/81 |
| 4,920,284 | 4/1990 | Denda | 326/81 |
| 4,978,870 | 12/1990 | Chen et al. | 326/81 |
| 4,996,443 | 2/1991 | Tateno | 326/81 |
| 5,204,557 | 4/1993 | Nguyen | 326/81 |
| 5,300,835 | 4/1994 | Assar et al. | 326/68 |
| 5,332,936 | 7/1994 | Nakao | 326/81 |
| 5,381,062 | 1/1995 | Morris | 326/68 |
| 5,521,531 | 5/1996 | Okuzumi | 326/81 |

Primary Examiner—Edward Westin
Assistant Examiner—Richard Roseen
Attorney, Agent, or Firm—Staas & Halsey

[57] ABSTRACT

A first level converter is provided with an input transistor circuit and an output transistor circuit. The input transistor circuit is supplied with power from a first power source and outputs a complementary signal on the basis of an input signal. The output transistor circuit is supplied with power from a second power source, and amplifies and outputs the complementary signal. A second level converter is provided with a pulse generating circuit and a signal output circuit. The pulse generating circuit is supplied with power from the first driving power source, and generates a one-shot pulse signal. The signal output circuit is supplied with power from the second driving power source, latches the one-shot pulse signal and outputs the signal. The semiconductor integrated circuit is provided with a first circuit system, a level conversion circuit and a second circuit system. The first circuit system is driven by being supplied with power from the first driving power source. The level conversion circuit is supplied with power from the first driving power source, and converts an output signal of the first circuit system into an input signal of the second circuit system. The second circuit system drives a signal with level converted by being supplied with power from the second driving power source. Further, in the semiconductor integrated circuit, a bidirectional level conversion circuit and a signal control means are provided, and the first and the second driving power sources are wired in a lattice form in a semiconductor chip.

26 Claims, 72 Drawing Sheets

LEVEL CONVERTER FOR CMOS 3V TO FROM 5V

This is a continuation of application Ser. No. 08/220,047, filed Mar. 30, 1994, now abandoned.

BACKGROUND OF THE INVENTION

1. Field of the Invention

The present invention relates to a level converter and a semiconductor integrated circuit adapting the same, and more specifically to improvement of an interface circuit used between circuits having different driving power sources and for converting a signal level between these circuits and of an integrated circuit adapting the same.

2. Description of the Related Art

With the advancement of hyperfine processing and high integration techniques, a semiconductor integrated circuit device (hereinafter referred to as an IC) capable of being driven by low voltage of approximately 2 to 3 V has been developed and manufactured in recent years. Further, a 5 V driving system is central to a CMOS integrated circuit with a microcomputer being presently used as a center. On the other hand, there is a requirement in the market for portable electronic equipment with the driving power source supplied from a battery. Low power consumption is also an indispensable condition for a simple IC.

However, a level converter having an interface function for converting a signal level becomes necessary in order to have an IC of a 5 V driving system and an IC of a 2-3 V driving system coexist in the electronic equipment.

Here, the related art of the present invention will be described. For example, when a signal processing circuit is formed using an IC 1 of a 3 V driving system and an IC 2 of a 5 V driving system as shown in a system block diagram in FIG. 1, an IC 3 for a level converter is connected between the IC 1 and IC 2. The IC 3 for a level converter has an interface function of converting a signal level processed by the IC 1 of a 3 V driving system into a potential level applicable with signal processing by the IC 2 of a 5 V driving system.

Further, FIG. 2 is a circuit diagram of a level converter, which shows a signal conversion circuit of one system forming the IC 3 for a level converter. In FIG. 2, the level converter is composed of an inverter INV, two p-type field effect transistors (hereinafter referred to as simply as transistors) TP1 and TP2 and two n-type field effect transistors (hereinafter referred to as simply as transistors) TN1 and TN2.

The inverter INV is connected, for example, between the ground line GND=0 V and a power line VDD1=3 V, and is further connected to an input IN and the gate of the transistor TN2. Further, the transistors TP1 and TN1 are connected in series and a common drain thereof is connected to the gate of the transistor TP2 and also connected to an output OUT1. The source of the transistor TP1 is connected to a power line VDD2=5 V, and the source of the transistor TN1 is connected to the ground line GND=0 V.

Similarly, the transistors TP2 and TN2 are connected in series, and the common drain thereof is connected to the gate of the transistor TP1 and also connected to an output OUT2. The source of the transistor TP2 is connected to the power line VDD2=5 V, and the source of the transistor TN2 is connected to the ground line GND=0 V. The gate of the transistor TN1 is connected to the input IN of the inverter INV, and the gate of the transistor TN2 is connected to the output of the inverter INV.

The operation of the level converter concerned is such that, in FIG. 3A, at stationary time when the input IN becomes an "H" level for example, the transistors TN1 and TP2 are turned ON, and the transistors TN2 and TP1 are turned OFF, thus putting the output OUT1 to an "L" level and the output OUT2 to an "H" level. Further, at a stationary time when the input IN becomes the "L" level in contrast to the above, the transistors TN1 and TP2 are turned OFF, and the transistors TN2 and TP1 are turned ON, thus putting the output OUT1 to an "H" level and the output OUT2 to an "L" level.

Furthermore, in FIG. 3B, at transition time when the input IN becomes an "H" level from an "L" level for instance, the transistors TN1 and TP2 are turned ON from an OFF state and the transistors TN2 and TP1 are turned OFF from an ON state, thus shifting the output OUT1 to an "L" level from an "H" level and the output OUT2 to an "H" level from an "L" level. Further, at a transition time when the input IN becomes an "L" level from an "H" level in contrast to the above, the transistors TN2 and TP1 are turned ON from an OFF state and the transistors TN1 and TP2 are turned OFF from an ON state, thus shifting the output OUT1 to an "H" level from an "L" level and the output OUT2 to an "L" level from an "H" level. With this, it is possible to convert a signal level processed by the driving power source system VDD1 and GND into a potential level capable of being processed by a driving power source system VDD2 and GND.

SUMMARY OF THE INVENTION

It is an object of the present invention to achieve high speed circuit operation and reduction in current consumption by improving a structure of a level conversion circuit provided between two circuits driven by power sources different from each other.

It is another object of the present invention to improve circuit functions and reduce current consumption, when a level conversion circuit is integrated in a same chip, by devising an arrangement position thereof and a method of supplying power.

Namely, in a level converter according to the present invention, a first level converter is provided with an input transistor circuit and an output transistor circuit as shown with a preferred embodiment shown in FIG. 6. The transistor circuit is supplied by a first driving power source and converts an input signal into a complementary signal. The output transistor circuit is supplied by a second driving power source and outputs a complementary signal after amplifying it.

The input transistor circuit comprises an inverter and a first and a second two-input NOR circuits connected to a first driving power. The output transistor circuit comprises first, second, third and fourth transistors.

The input of the inverter is connected to one input of the second two-input NOR circuit and the output of the inverter is connected to one input of the first two-input NOR circuit. Another input of the first two-input NOR circuit is connected to the output of the second two-input NOR circuit, and another input of the second two-input NOR circuit is connected to the output of the first two-input NOR circuit, respectively.

The drain of the first transistor is connected to the drain of the second transistor, and respective sources of the first and the third transistors are connected to the high potential side of the second driving power source. The drain of the third transistor is connected to the drain of the fourth transistor. Respective sources of the second and the fourth transistors are connected to the low potential side of the second driving power source. The gate of the first transistor is connected to respective drains of the third and the fourth transistors and the second output. The gate of the third transistor is connected to respective drains of the first and the second transistors and the first output. Respective gates of the second and the fourth transistors are connected to the outputs of the first and the second two-input NOR circuits of the input transistor circuit, respectively.

A second level converter is provided with a pulse generating circuit and a signal output circuit as shown with a preferred embodiment in FIG. 19. The pulse generating circuit is supplied by the first driving power source and generates a one-shot pulse signal. The signal output circuit is supplied by the second driving power source, latches the one-shot pulse signal and outputs a signal.

A first semiconductor integrated circuit is provided with a first circuit system, a level conversion circuit and a second circuit system as shown with a preferred embodiment in FIG. 22. The first circuit system is supplied by the first driving power source thereby to be driven. The level conversion circuit is supplied by the first driving power source and converts an output signal of the first circuit system into an input signal of the second circuit system. The second circuit system is supplied by the second driving power source so as to drive a signal with the level converted.

A second semiconductor integrated circuit is provided with a bidirectional level conversion circuit and a signal control unit as shown with preferred embodiments in FIGS. 23 and 24. The bidirectional level conversion circuit converts as output signal of the first circuit system connected to the first driving power source into an input signal of the second circuit system connected to the second driving power source or converts an output signal of the second circuit system connected to the second driving power source into an input signal of the first circuit system connected to the driving power source. The signal control means determines a signal direction of the bidirectional level conversion circuit based on making sequence of the first driving power source or the second driving power source.

A third semiconductor integrated circuit is provided with a first circuit system, a level conversion circuit and a second circuit system. The first circuit system is supplied by the first driving power source wired in a lattice form in a semiconductor chip thereby to be driven. The level conversion circuit is supplied by the first and second driving power source wired in a lattice form in the semiconductor chip, and converts an output signal of the first circuit system into an input signal of the second circuit system. The second circuit system is supplied by the second driving power source wired in a lattice form in the semiconductor chip thereby to be driven by a signal with the level converted.

By adopting such a structure, high-speed operation of the level conversion circuit is achieved, and the current consumption is reduced. Further, improvement of functions and reduction in current consumption of a semiconductor integrated circuit adapting the level conversion circuit can be expected.

BRIEF DESCRIPTION OF THE DRAWINGS

FIG. 69 is a block diagram of a semiconductor integrated circuit according to the 32nd preferred embodiment of the present invention;

FIG. 70 is a block diagram of a D/A-converter of the semiconductor integrated circuit according to a second preferred embodiment of the present invention shown in FIG. 69;

FIG. 71 is a block diagram of a semiconductor integrated circuit according to the 33rd preferred embodiment of the present invention;

FIG. 72 is a block diagram of a bidirectional level converter of the semiconductor integrated circuit shown in FIG. 71;

FIG. 73A is a block diagram of a timing generation circuit of the semiconductor integrated circuit shown in FIG. 71;

FIG. 73B is an operating waveform diagram of a timing generation circuit shown in FIG. 73A;

FIG. 74A is a layout drawing of a bidirectional level converter of the semiconductor integrated circuit shown in FIG. 71;

FIG. 74B is another layout drawing of the bidirectional level converter of the semiconductor integrated circuit shown in FIG. 71;

FIG. 75 is a power source wiring diagram of a semiconductor integrated circuit according to the 34th preferred embodiment of the present invention;

FIG. 76 is a block diagram of level converter cells of the semiconductor integrated circuit shown in FIG. 75;

FIG. 77 is a power source wiring diagram of level converter cells shown in FIG. 76; and FIG. 78 is a block diagram of another semiconductor integrated circuit according to the 34th preferred embodiment of the present invention.

DESCRIPTION OF THE PREFERRED EMBODIMENTS

Figure 1:
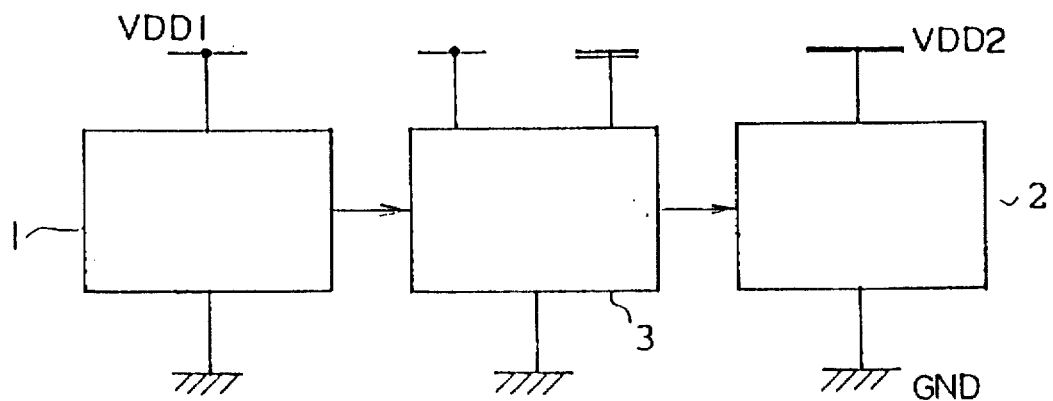
FIG. 1 is an explanatory diagram of a level converter connected between different types of circuits according to the related art of the present invention.
Figure 2:
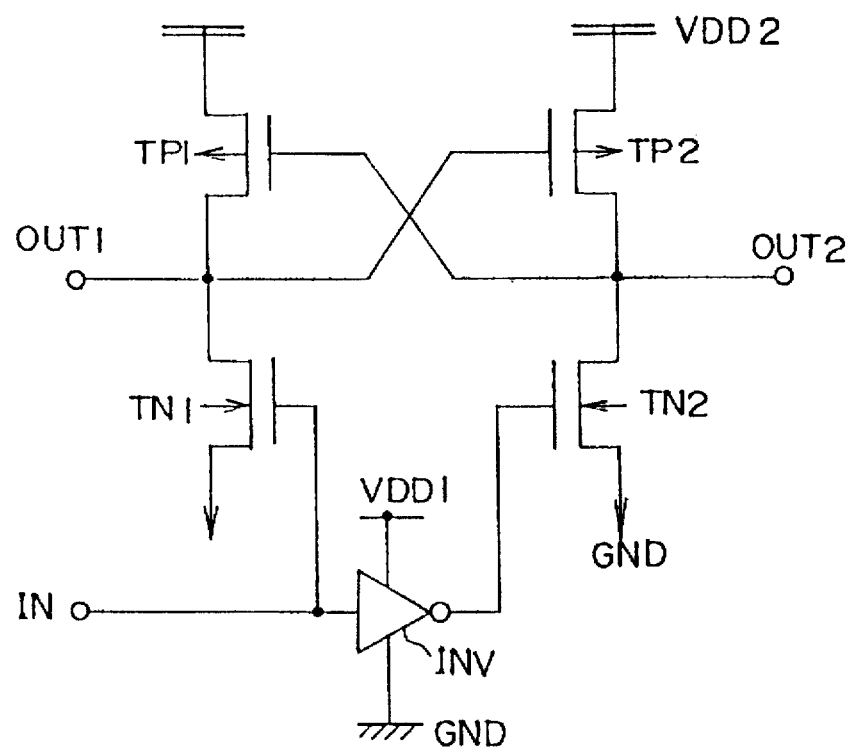
FIG. 2 is a circuit diagram of a level converter according to the related art of the present invention.

According to a level converter (hereinafter referred to also as a level conversion circuit) and a semiconductor integrated circuit of the related art of the present invention, there are such problems as described hereunder.

i. When a signal processing circuit is formed using an IC 1 of 3 V driving system and an IC 2 of 5 V driving system, an IC 3 for a level converter has to be connected between the IC 1 and the IC 2 as shown in FIG. 1. As a result, individual IC 1 to IC 3 have to be packaged separately on a printed circuit board, which, in particular, becomes an obstacle to construct portable electronic equipment which depends on a battery-driven power source compact in size, or an IC packaging area of the electronic equipment where digital/analog processing circuits coexist gets larger.

ii. Further, the level converter is composed, for example, of an inverter INV connected between a power line VDD1 of 3 V driving system and a ground line GND, transistors TP1 and TN1 and transistors TP2 and TN2 connected between a power line VDD2 of 5 V driving system and the ground line GND as shown in FIG. 2.

As a result, a through electric current passes between the transistors TP1 and TN1 and between the transistors TP2 and TN2 at state transition time of an input IN. Thus, circuit power consumption is increased, or circuit operation is slowed down due to delay in fall time of an "H" level to an "H" level of outputs OUT1 and OUT2.

Figure 3A:
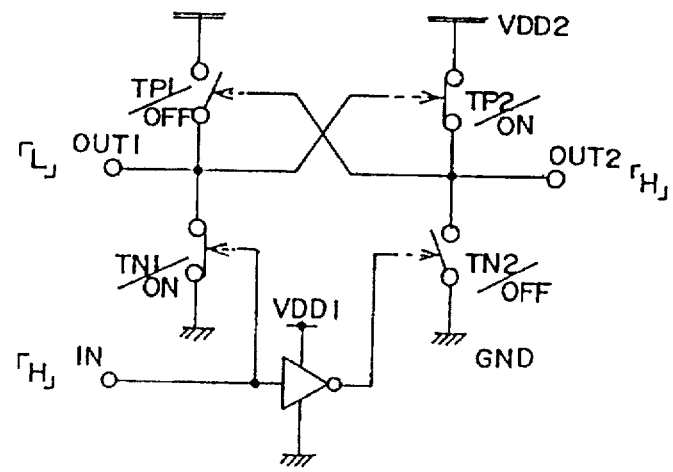
FIG. 3A is an equivalent circuit diagram for explaining the operation at stationary time of the level converter shown in FIG. 2.
Figure 3B:
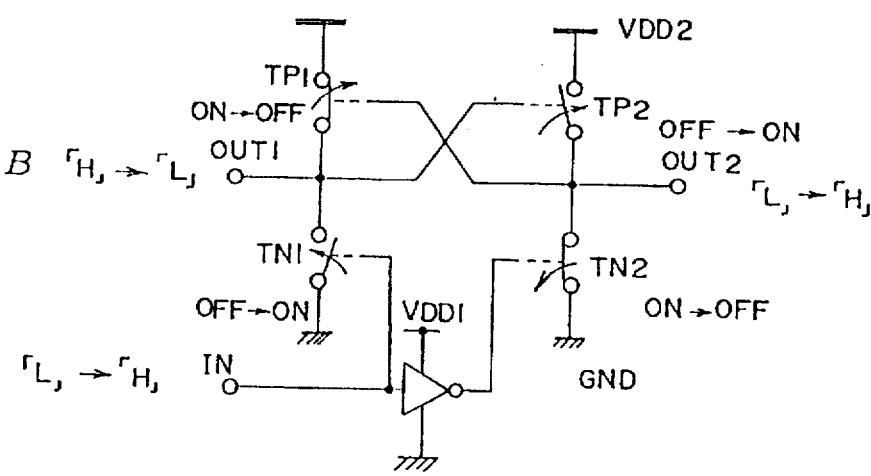
FIG. 3B is an equivalent circuit diagram for explaining the operation at transition time of the level converter shown in FIG. 2.
Figure 3C:
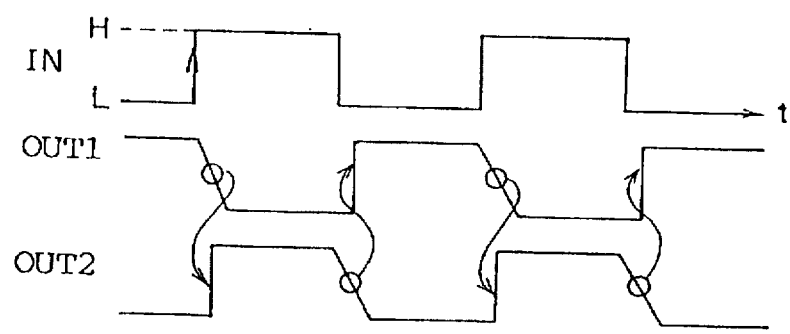
FIG. 3C shows operating waveforms of the level converter shown in FIG. 2.

When attention is paid to a state that the output OUT1 changes from an "H" level to an "L" level for instance as shown in a signal waveform diagram in FIG. 3C, in case the transistor TP1 is shifted to an OFF operation, it is required to turn the transistor TP2 ON before this. In this case, the condition that the transistor TP2 is turned ON is such that the voltage level of the output OUT1 becomes a threshold voltage Vth of the transistor TP2 or below.

Here, the voltage level of the output OUT1 at time of state transition when the input IN changes from an "L" level to an "H" level is determined by the ratio of ON resistances of the transistors TP1 and TN1. This is due to the ON resistance of the transistor TP1 acts as a load of the transistor TP1 (which depends on the ON resistance value of the transistor TP1) which is lowering the output OUT1 to the "L" level because of a state that both transistors TP1 and TN1 are turned ON when the output OUT1 shifts from the "H" level to the "L" level.

As a result, the voltage level of the output OUT1 exerts a great influence on the circuit operation speed depending on the ratio of the ON resistance of the transistor TP1 to the ON resistance of the transistor TN1. Therefore, the transistor size is designed small so as to make the ON resistance of the transistors TP1 and TP2 large. If the ON resistance is designed too big, however, it becomes no longer possible to drive a circuit at the next stage with high performance, and the design size is restricted.

With this, the circuit speed is restrained or a consuming electric current passes between the power line VDD2 and the ground line GND until the transistors TP1 and TP2 are turned OFF completely. Besides, the consuming electric current is increased by the portion that the speed is restrained. The foregoing is also applicable to a state that the output OUT2 is changed from the "H" level to the "L" level.

iii. Furthermore, when it is required that a signal processing circuit of 3 V driving system, a signal processing circuit of 5 V driving system and a level converter are made to coexist and integrated in the same chip, the layout position of the level converter is restricted.

Figure 4:
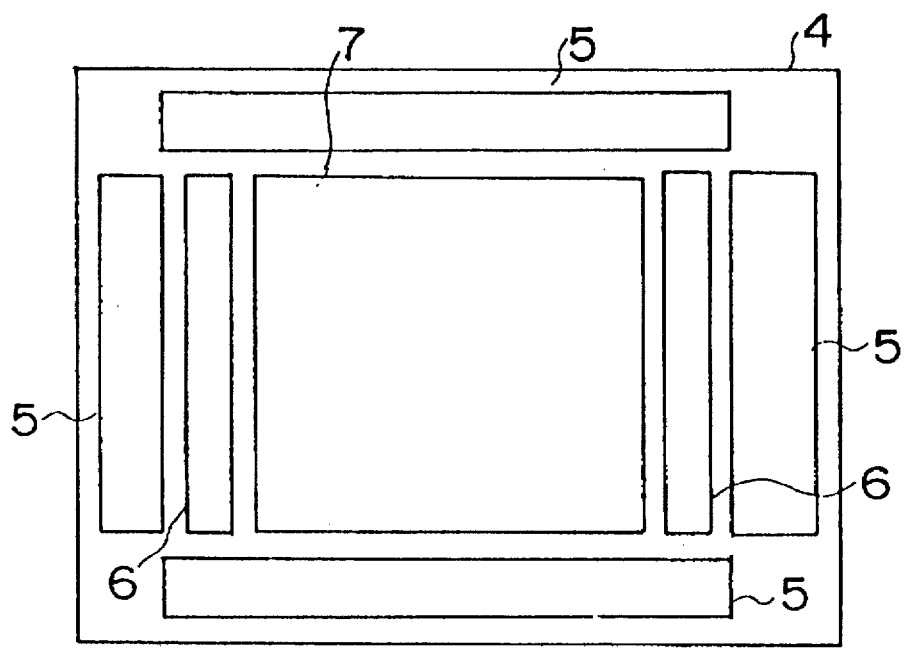
FIG. 4 is a layout drawing of a level converter according to the related art of the present invention.

Namely, for example, when level conversion circuits 6 are arranged on a semiconductor chip 4 as shown in the layout diagram of level converters in FIG. 4, a method of placing the level conversion circuits 6 in an input-output portion of a cell portion 7 provided at the center thereof and I/O interface circuits 5 are arrange in the periphery thereof is conceivable. In this method, it is considered to restrict supply terminals of the power lines VDD1 and VDD2 and the ground line GND of the level conversion circuits 6 and the signal input and output terminals.

However, since a signal wiring distance is short between a level conversion circuit 6 and an I/O interface circuits 5 adjacent thereto, it is possible to aim at a high speed in signal transmission, but, since the signal wiring distance between a level conversion circuit 6 and an I/O interface circuits 5 remote therefrom is long, a delay in signal transmission is caused.

Figure 5:
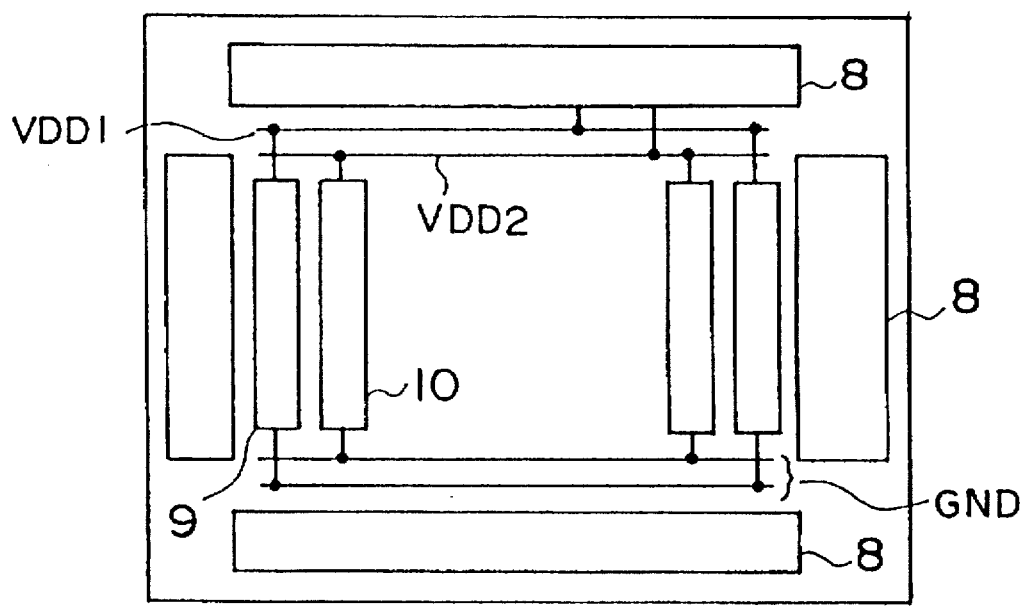
FIG. 5 is another layout drawing of a level converter according to the related art of the present invention.

As shown in a gate array system in FIG. 5, for example, the power line VDD1 is connected to cells 9 in an odd-numbered row, and the power line VDD2 is connected to cells 10 in an even-numbered row. As a result, it is impossible to include different types of power sources in the same cell row in a method of feeding power according to the related art of the present invention. Thus, there is a fear of interfering with formation in a gate array of a signal processing circuit in which a level converter requiring three of the power lines VDD1 and VDD2 and the ground line GND is incorporated, or of incurring useless power consumption due to pulling around of power source wiring.

Figure 6:
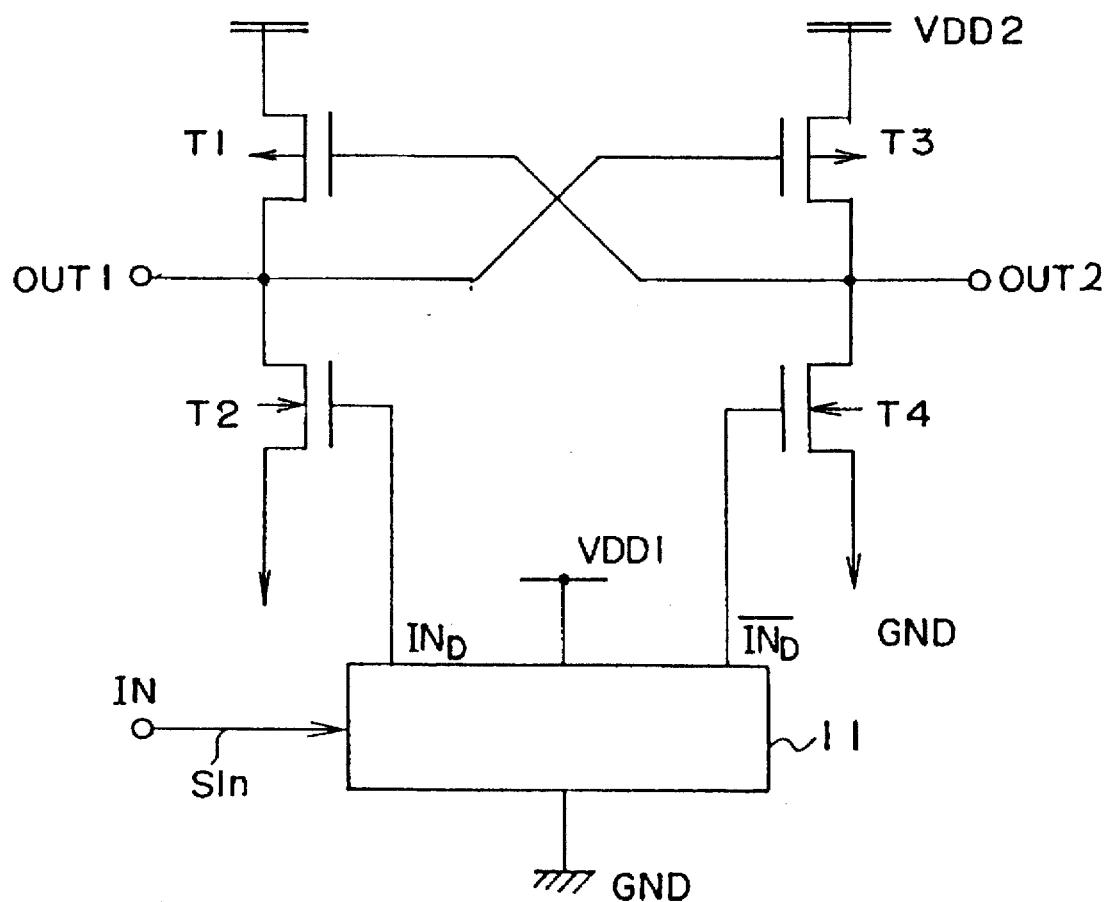
FIG. 6 is a block diagram of a first level converter in principle according to the present invention.

In contrast to the above, a first level converter in principle according to the present invention is provided with an input transistor circuit 11, and a first to a fourth transistors T1 to T4 as shown in FIG. 6. The input transistor circuit 11 is connected to a first power source system VDD1, GND and an input IN, and the input transistor circuit 11 is connected to respective gates of a second and a fourth transistors T2 and T4. The first and the second transistors T1 and T2 are connected in series with each other and connected to the second driving power source system VDD2 and GND. The third and the fourth transistors T3 and T4 are connected in series with each other and connected between the second driving power source system VDD2 and GND. The gate of the first transistor T1 is connected to a second output OUT2 which is a series Junction point of the third and the fourth transistors T3 and T4. The gate of the third transistor T3 is connected to a first output OUT1 which is a series junction point of the first and the second transistors T1 and T2. The input transistor circuit 11 comprises a first latch circuit 11A for latching and outputting an input signal Sin.

Figure 7:
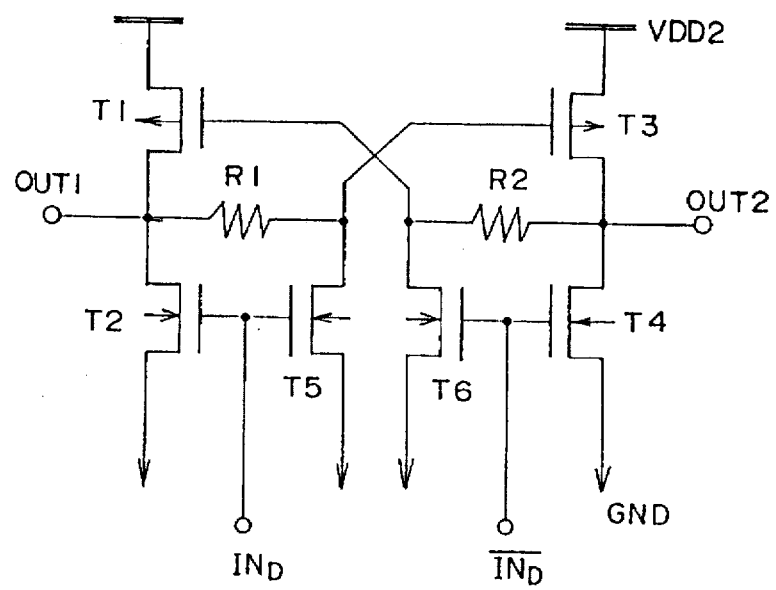
FIG. 7 is a block diagram of a second level converter in principle according to the present invention.

Further, according to a second level converter in principle of the present invention, a first and a second load elements R1 and R2 and a fifth and a sixth transistors T5 and T6 are provided in the first level converter as shown in FIG. 7. The first load element R1 is connected between the gate of the third transistor T3 and the first output OUT1. The second load element R2 is connected between the gate of the first transistor T1 and the second output OUT2. The drain of a sixth transistor T6 is connected to a 3unction point of the gate of the first transistor T1 and the second load element R2. The gate of the sixth transistor T6 is connected to the gate of the fourth transistor T4. The drain of the fifth transistor T5 is connected to the Junction point of the gate of the third transistor T3 and the first load element R1. The gate of the fifth transistor T5 is connected to the gate of the second transistor T2. The sources of the fifth and the sixth transistors T5 and T6 are connected to the power line GND. The junction point of the gates of the second and the fifth transistors T2 and T5 is connected to the Junction point of the gates of the fourth and the sixth transistors T4 and T6 and connected to the input transistor circuit 11.

Figure 8:
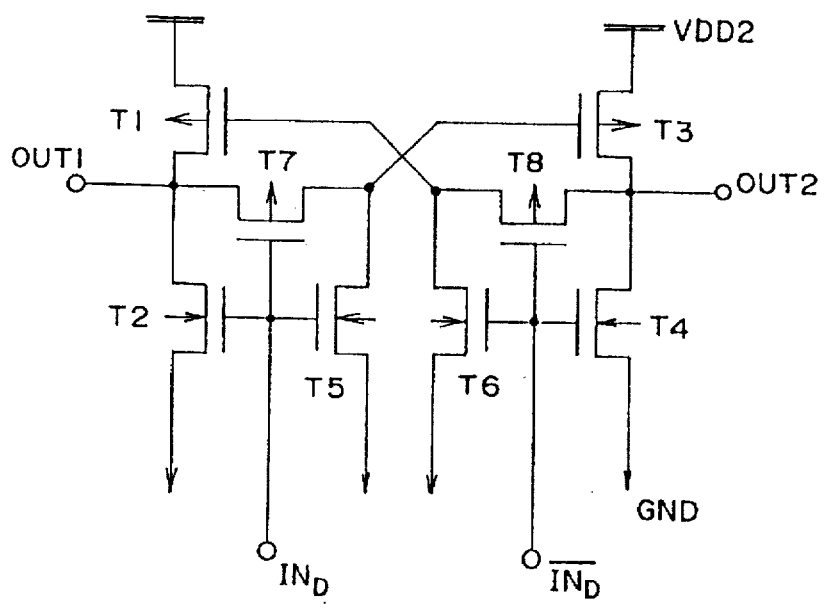
FIG. 8 is a block diagram of a third level converter in principle according to the present invention.

Furthermore, according to a third level converter in principle of the present invention, a fifth to an eighth transistors T5 to T8 are provided in the first level converter as shown in FIG. 8. The eighth transistor T8 is connected between the gate of the first transistor T1 and the second output OUT2. The drain of the sixth transistor T6 is connected to the junction point of the first transistor T1 and the eighth transistor T8. The gate of the sixth transistor T6 is connected to the gates of the fourth and the eighth transistors T4 and T8. The seventh transistor T7 is connected between the gate of the third transistor T3 and the first output OUT1. The drain of the fifth transistor T5 is connected to the junction point of the third transistor T3 and the seventh transistor T7. The gate of the fifth transistor T5 is connected to the gates of the second and the seventh transistors T2 and T7. Respective sources of the second, the fourth, the fifth and the sixth transistors T2, T4, T5 and T6 are connected to the power line GND. The junction point of respective gates of the second, the fifth and the seventh transistors T2, T5 and T7 is connected to the junction point of the gates of the fourth, the sixth and the eighth transistors T4, T6 and T8 and connected to the input transistor circuit 11.

Figure 9:
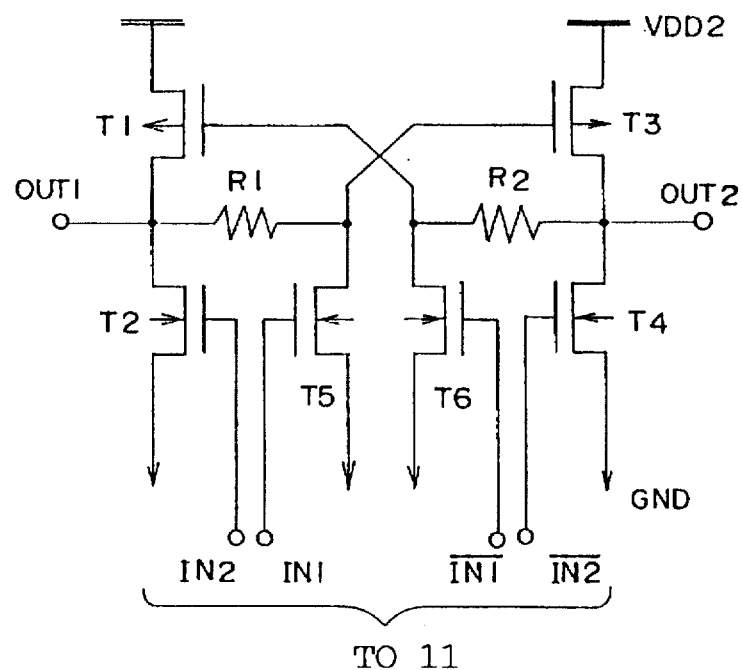
FIG. 9 is a block diagram of a fourth level converter in principle according to the present invention.

Further, according to a fourth level converter in principle of the present invention, respective gates of the second, the fourth, the fifth and the sixth transistors T2, T4, T5 and T6 are connected individually to the input transistor circuit 11 as shown in FIG. 9.

Figure 10:
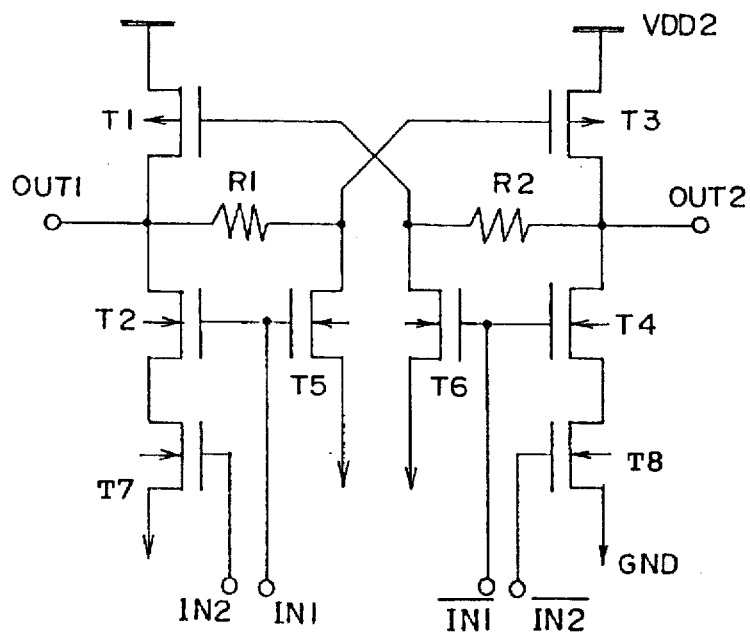
FIG. 10 is a block diagram of a fifth level converter in principle according to the present invention.

Furthermore, according to a fifth level converter in principle of the present invention, a ninth and a tenth transistors T9 and T10 are provided in the first and the second level converters shown in FIGS. 6 and 7 as shown in FIG. 10. The drain of the ninth transistor T9 is connected to the source of the second transistor T2. The gate of the ninth transistor T9 is connected to the input transistor circuit 11. The drain of the tenth transistor T10 is connected to the source of the fourth transistor T4. The gate of the tenth transistor T10 is connected to the input transistor circuit 11. The source of the ninth transistor T9 is connected to the source of the 10th transistor T10 and connected to the power line GND.

Figure 11:
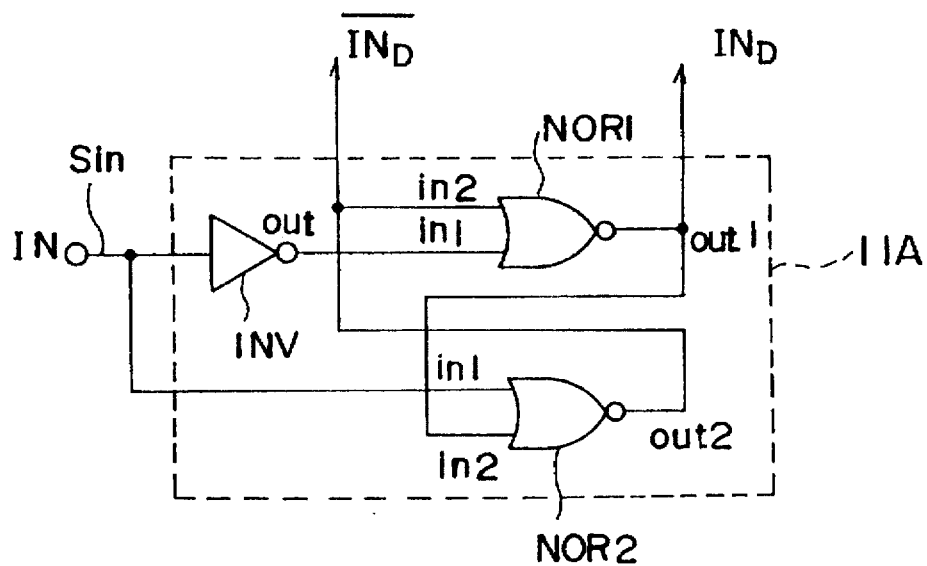
FIG. 11 is a block diagram of a latch circuit used in the first to the third level converters shown in FIGS. 6 to 8.

In the first to the third level converters of the present invention shown in FIGS. 6 to 8, the first latch circuit 11A is composed of an inverter INV and a first and a second two-input NOR circuits NOR1 and NOR2 as shown in FIG. 11. The input IN of the inverter INV is connected to one input in1 of the second two-input NOR circuit NOR2. An output out of the inverter INV is connected to one input in1 of the first two-input NOR circuit NOR1.

Another input in2 of the first two-input NOR circuit NOR1 is connected to an output out2 of the second two-input NOR circuit NOR2. Another input in2 of the second two-input NOR circuit NOR2 is connected to the output out1 of the first two-input NOR circuit NOR1. Complementary control signals $IN_D$, $\overline{IN}_D$ of the first and the second two-input NOR circuits NOR1 and NOR2 are supplied to the gate of the second transistor T2 and the gate of the fourth transistor T4 of the first level converter of the present invention. Alternatively, the complementary control signals $IN_D$, $\overline{IN}_D$ are supplied to the junction point of the gates of the second and the fifth transistors T2 and T5 and the junction point of the gates of the fourth and the sixth transistors T4 and T6 of the second level converter of the present invention, respectively. Alternatively, the complementary control signals $IN_D$, $\overline{IN}_D$ are supplied to the junction point of the gates of the second, the fifth and the seventh transistors T2, T5 and T7 and a Junction point of the gates of the fourth, the sixth and the eighth transistors T4, T6 and T8, respectively.

Figure 12:
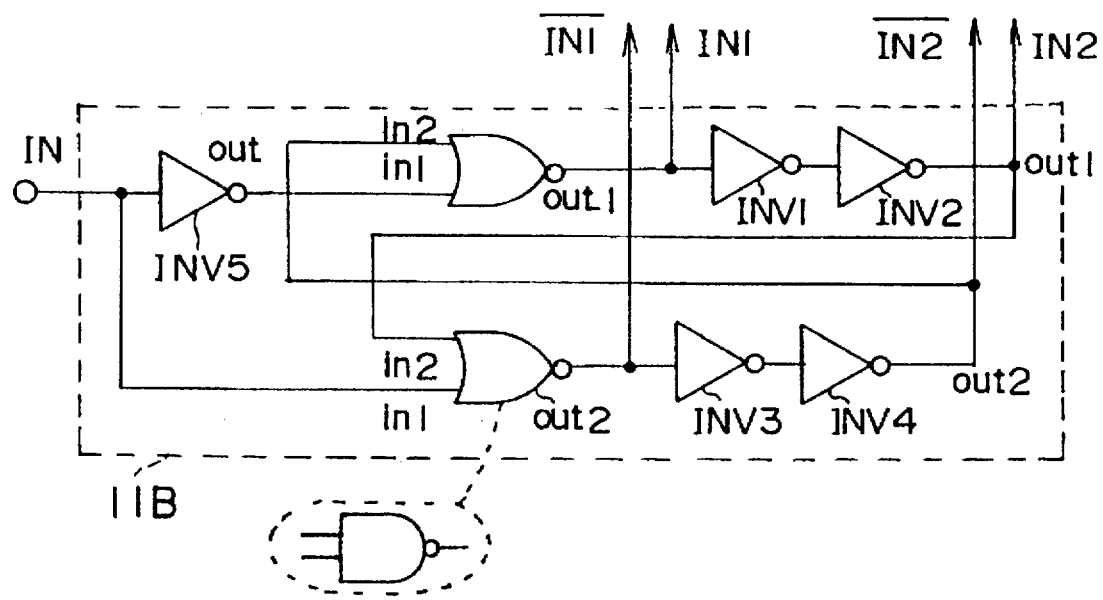
FIG. 12 is a block diagram of a latch circuit used in the fourth and the fifth level converters shown in FIGS. 9 and 10.

Further, in a fourth and a fifth level converters of the present invention shown in FIGS. 9 and 10, the input transistor circuit 11 is composed of a second latch circuit 11B in which a first to a fifth inverters INV1 to INV5 and the first and the second two-input NOR circuits NOR1 and NOR2 are connected as shown in FIG. 12. The first and the second inverters INV1 and INV2 are connected in series with each other and connected to the output out1 of the first two-input NOR circuit NOR1.

The third and the fourth inverters INV3 and INV4 are connected in series with each other and connected to the output OUT2 of the second two-input NOR circuit NOR2. The input IN of the fifth inverter INV5 is connected to one input in1 of the second two-input NOR circuit NOR2. The output out of the fifth inverter INV5 is connected to one input in1 of the first two-input NOR circuit NOR1. Another input in2 of the first two-input NOR circuit NOR1 is connected to the output out of the fourth inverter INV4. Another input in2 of the second two-input NOR circuit NOR2 is connected to the output out of the second inverter INV2.

Complementary control signals IN1 and $\overline{IN1}$ outputted from the first and the second two-input NOR circuits NOR1 and NOR2 are supplied to the gates of the fifth and the sixth transistors T5 and T6 of the fourth level converter of the present invention shown in FIG. 9, or they are supplied to the gates of the second, the fourth, the fifth and the sixth transistors T2, T4, T5 and T6 of the fifth level converter of the present invention. Complementary delay control signals IN2 and $\overline{IN2}$ outputted from the second and the fourth inverters INV2 and INV4 are supplied to the gates of the second and the fourth transistors T2 and T4 of the fourth level converter of the present invention shown in FIG. 9, or supplied to the gates of the ninth and the tenth transistors T9 and T10 of the fifth level converter shown in FIG. 10.

Figure 13:
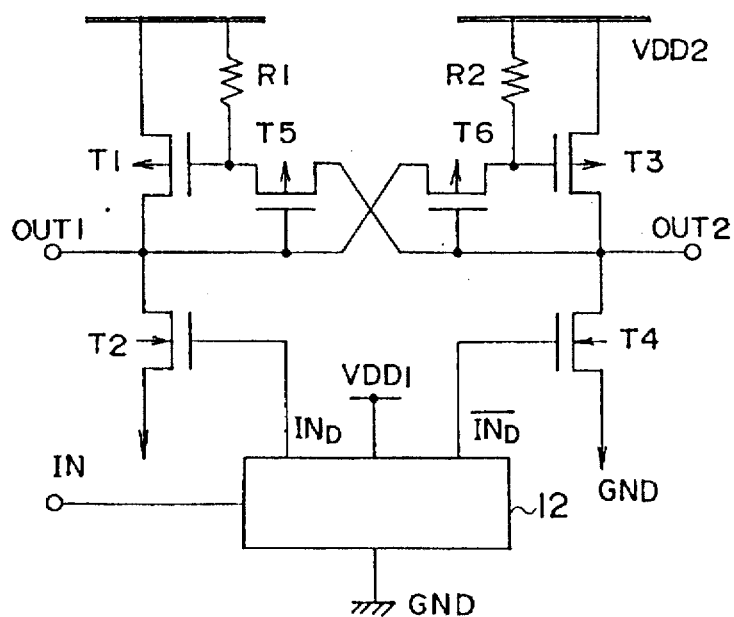
FIG. 13 is a block diagram of a sixth level converter in principle according to the present invention.

A sixth level converter in principle of the present invention is provided with an input transistor circuit 12, a first to a sixth transistors T1 to T6 and a first and a second load elements R1 and R2 as shown in FIG. 13. The input transistor circuit 12 is connected to the first and the second power lines VDD1 and GND and the input IN. The input transistor circuit 12 is connected to respective gates of the second and the fourth transistors T2 and T4. The first and the second transistors T1 and T2 are connected in series with each other, and connected to the second and the third power lines GND and VDD2. The third and the fourth transistors T3 and T4 are connected in series with each other and connected to the second and the third power lines GND and VDD2. The gate of the first transistor T1 is connected to the source of the fifth transistor T5. The gate of the third transistor T3 is connected to the source of the sixth transistor T6. The drain of the fifth transistor T5 is connected to the gate of the sixth transistor T6 and connected to the second output OUT2 which is a junction point of the drain of the third and the fourth transistors T3 and T4. The drain of the sixth transistor T6 is connected to the gate of the fifth transistor T5 and connected to the first output OUT1 which is a junction point of the drains of the first and the second transistors T1 and T2. The first load element R1 is connected between a gate-source junction point of the first and the fifth transistors T1 and T5 and the third power line VDD2. The second load element R2 is connected between a gate-source junction point of the third and the sixth transistors T3 and T6 and the third power line VDD2.

Figure 14:
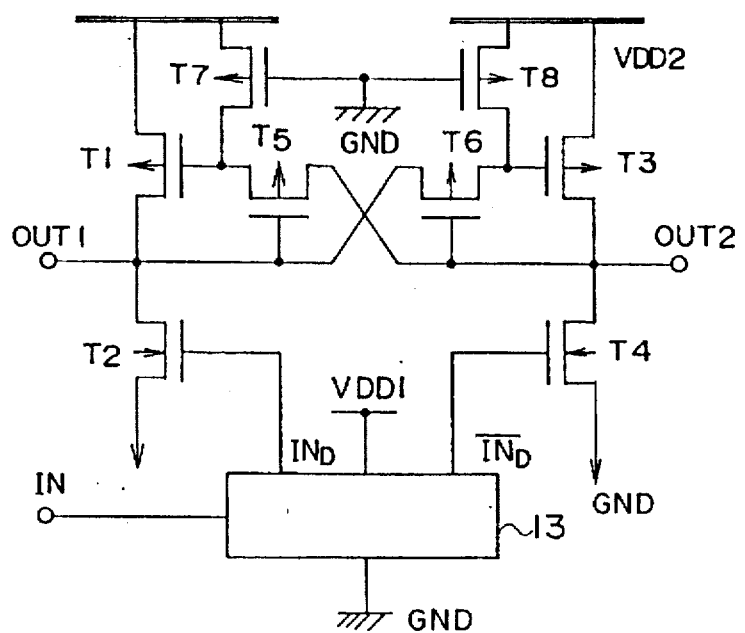
FIG. 14 is a block diagram of a seventh level converter in principle according to the present invention.

Further, a seventh level converter in principle of the present invention is provided with an input transistor circuit 13 and a first to an eighth transistors T1 to T8 as shown in FIG. 14. The input transistor circuit 13 is connected to the first and the second power lines VDD1 and GND and the input IN. The input transistor circuit 13 is connected to respective gates of the second and the fourth transistors T2 and T4. The first and the second transistors T1 and T2 are connected in series with each other and connected to the second and the third power lines GND and VDD2. The third and the fourth transistors T3 and T4 are connected in series with each other and connected to the second and the third power lines GND and VDD2. The gate of the first transistor T1 is connected to the source of the fifth transistor T5. The gate of the third transistor T3 is connected to the source of the sixth transistor T6. The drain of the fifth transistor T5 is connected to the gate of the sixth transistor T6 and connected to the second output OUT2 which is a junction point of the drains of the third and the fourth transistors T3 and T4. The drain of the sixth transistor T6 is connected to the gate of the fifth transistor T5 and connected to the first output OUT1 which is a junction point of the drains of the first and the second transistors T1 and T2. The seventh transistor T7 is connected between a gate-source junction point of the first and the fifth transistors T1 and T5 and the third power line VDD2. The gate of the seventh transistor T7 is connected to the second power line GND. The eighth transistor T8 is connected between the gate-source junction point of the third and the sixth transistors T3 and T6 and the third power line VDD2. The gate of the eighth transistor T8 is connected to the second power line GND.

Figure 15:
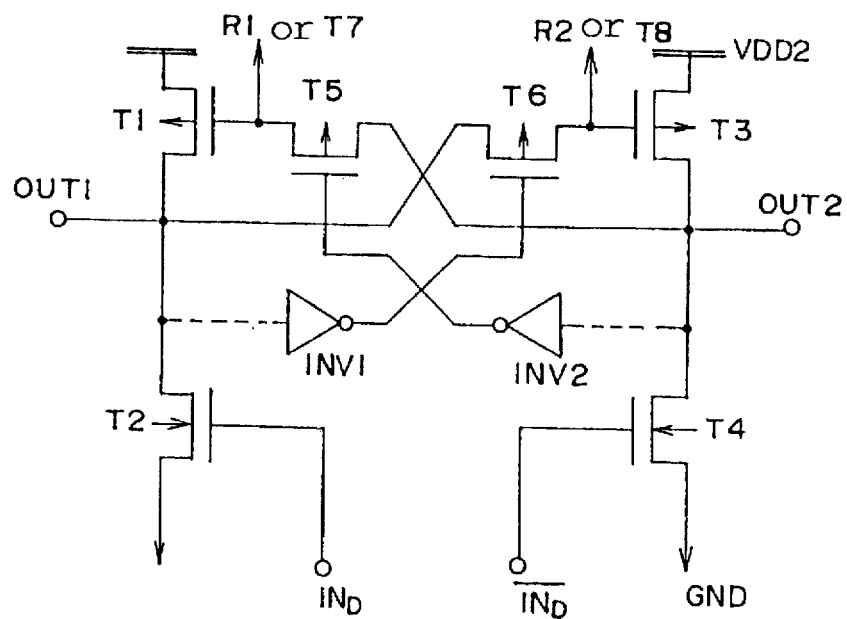
FIG. 15 is a block diagram of an eighth level converter in principle according to the present invention.

According to an eighth level converter in principle of the present invention, a first and a second inverters INV1 and INV2 in an odd number are provided as shown in FIG. 15 in the sixth and the seventh level converters shown in FIGS. 13 and 14. The first inverters INV1 in an odd number are connected between the gate of the sixth transistor T6 of the sixth and the seventh level converters of the present invention and the first output OUT1, and the second inverters INV2 in an odd number are connected between the gate of the fifth transistor T5 of the sixth and the seventh level converters shown in FIGS. 13 and 14 and the second output OUT2.

Figure 16:
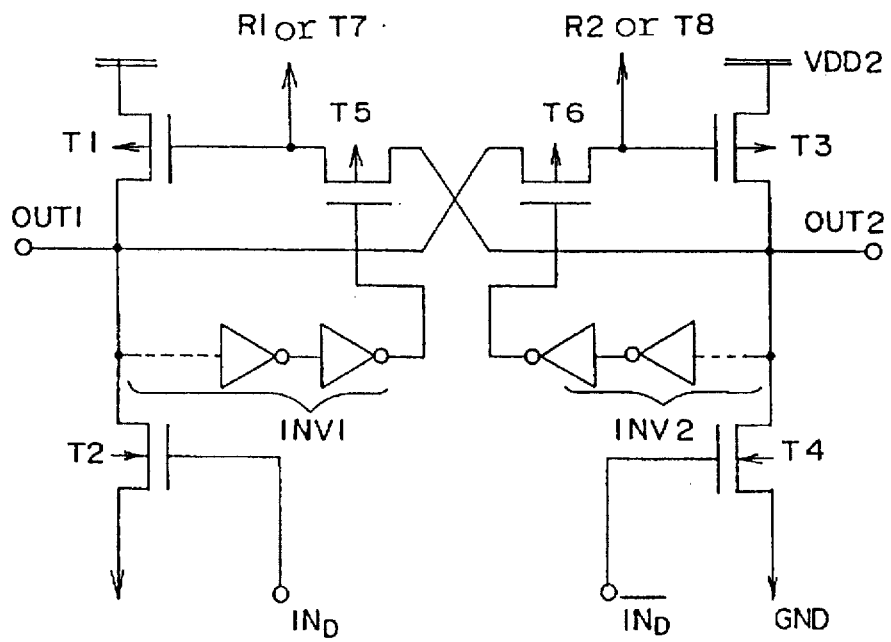
FIG. 16 is a block diagram of a ninth level converter in principle according to the present invention.

Furthermore, according to a ninth level converter in principle of the present invention, a first and a second inverters in even numbers are provided as shown in FIG. 16 in the sixth and the seventh level converters shown in FIGS. 13 and 14. The second inverters INV2 in even numbers are connected in series, and the second inverters connected in series is connected between the gate of the fifth transistor T5 of the sixth and the seventh level converters of the present invention shown in FIGS. 13 and 14 and the first output OUT1. The first inverters INV1 in even numbers are connected in series, and a first inverter connected in series is connected between the gate of the sixth transistor T6 of the sixth and the seventh level converters of the present invention shown in FIGS. 13 and 14 and the second output OUT2.

Figure 17:
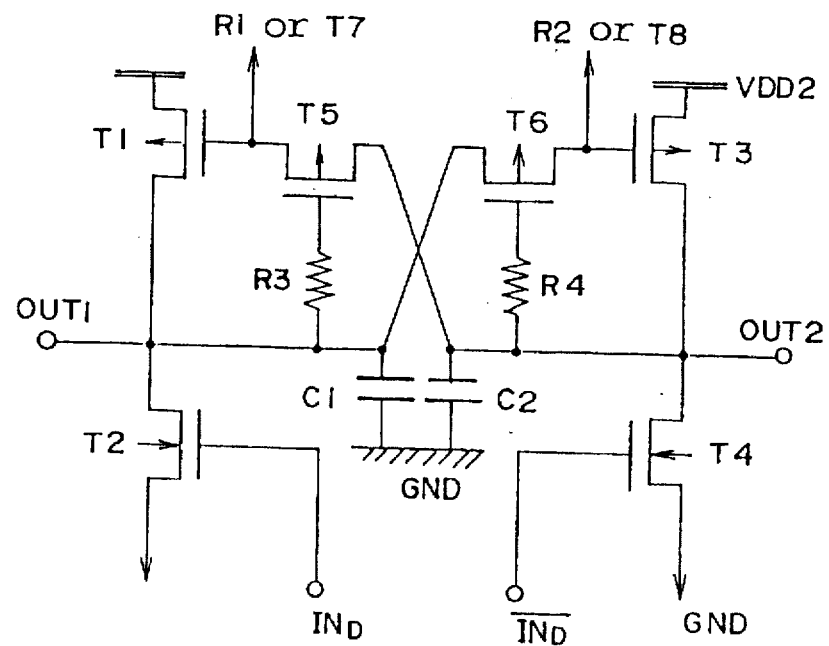
FIG. 17 is a block diagram of a tenth level converter in principle according to the present invention.

According to a tenth level converter in principle of the present invention, there are provided a third and a fourth load elements R3 and R4 and a first and a second electrostatic capacities C1 and C2 as shown in FIG. 17 in the eighth and the ninth level converters of the present invention shown in FIGS. 15 and 16. The third load element R3 is connected between the gate of the fifth transistor T5 and the first output OUT1. The first electrostatic capacity C1 is connected between the first output OUT1 and the second power line GND. The fourth load element R4 is connected between the gate of the sixth transistor T6 and the second output OUT2. The second electrostatic capacity C2 is connected between the second output OUT2 and the second power line GND.

Figure 18:
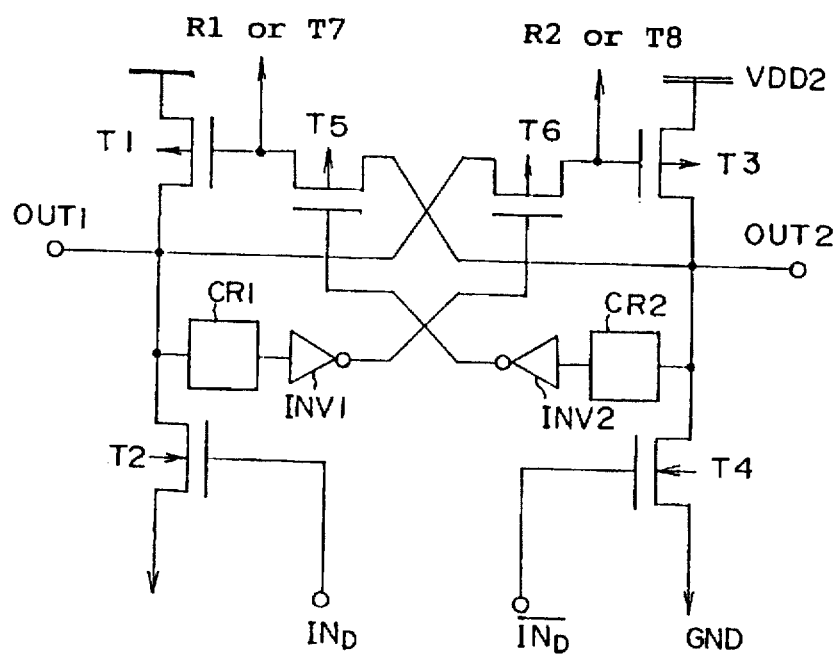
FIG. 18 is a block diagram of an 11th level converter in principle according to the present invention.

According to an 11th level converter in principle of the present invention, integration circuits CR1 and CR2 are connected to the first and the second inverters INV1 and INV2 or preceding stages of the first and the second inverter INV1 and INV2 as shown in FIG. 18 in the seventh to the tenth level converters shown in FIGS. 14 to 17.

In the sixth to the 11th level converters of the present invention shown in FIGS. 13 to 18, each of input transistor circuits 12 and 13 comprises an inverter INV or a first latch circuit 11A adopted in the first to the third level converters of the present invention such as shown in FIG. 11.

Figure 19:
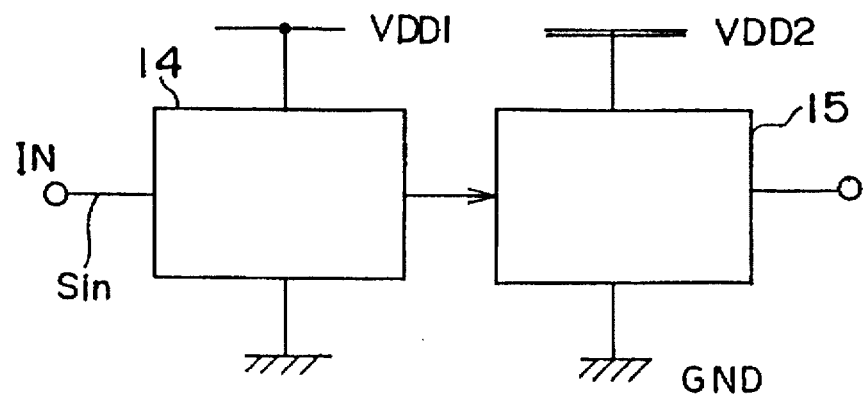
FIG. 19 is a block diagram of a 12th level converter in principle according to the present invention.

A 12th level converter in principle of the present invention is provided with a pulse generating circuit 14 for generating one-shot pulse signal based on an input signal Sin and a signal output circuit 15 for latching the one-shot pulse signal as shown in FIG. 19. The pulse generating circuit 14 is connected to a first driving power source system VDD1, GND and the input IN. The signal output circuit 15 is connected to the second driving power source system VDD2 and GND.

Each of the first to the 12th level converters in principle of the present invention constitutes a transistor circuit in which a high potential power supply system is adopted for the first and the third power lines VDD1 and VDD2 with the potential level of the second power line GND as the reference as shown in FIGS. 6 to 19.

Figure 20:
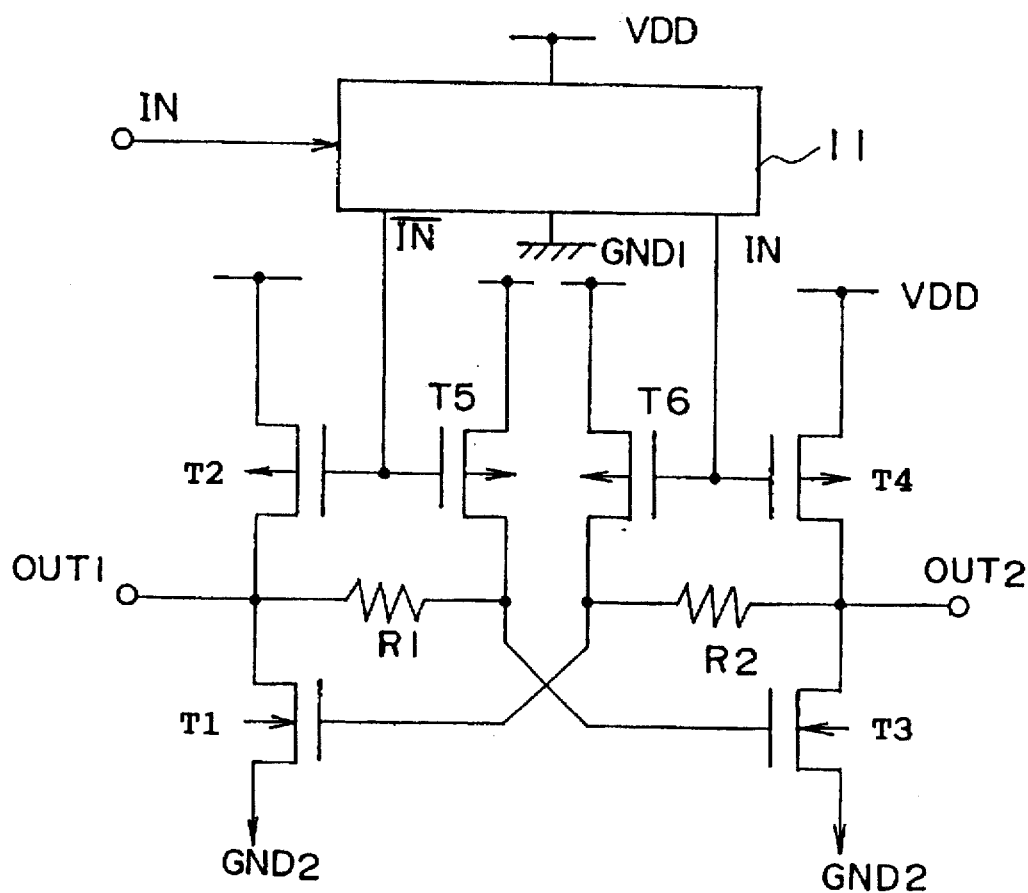
FIG. 20 is a block diagram of another level converter (GND2) in principle of the first to the 11th converters according to the present invention.
Figure 21:
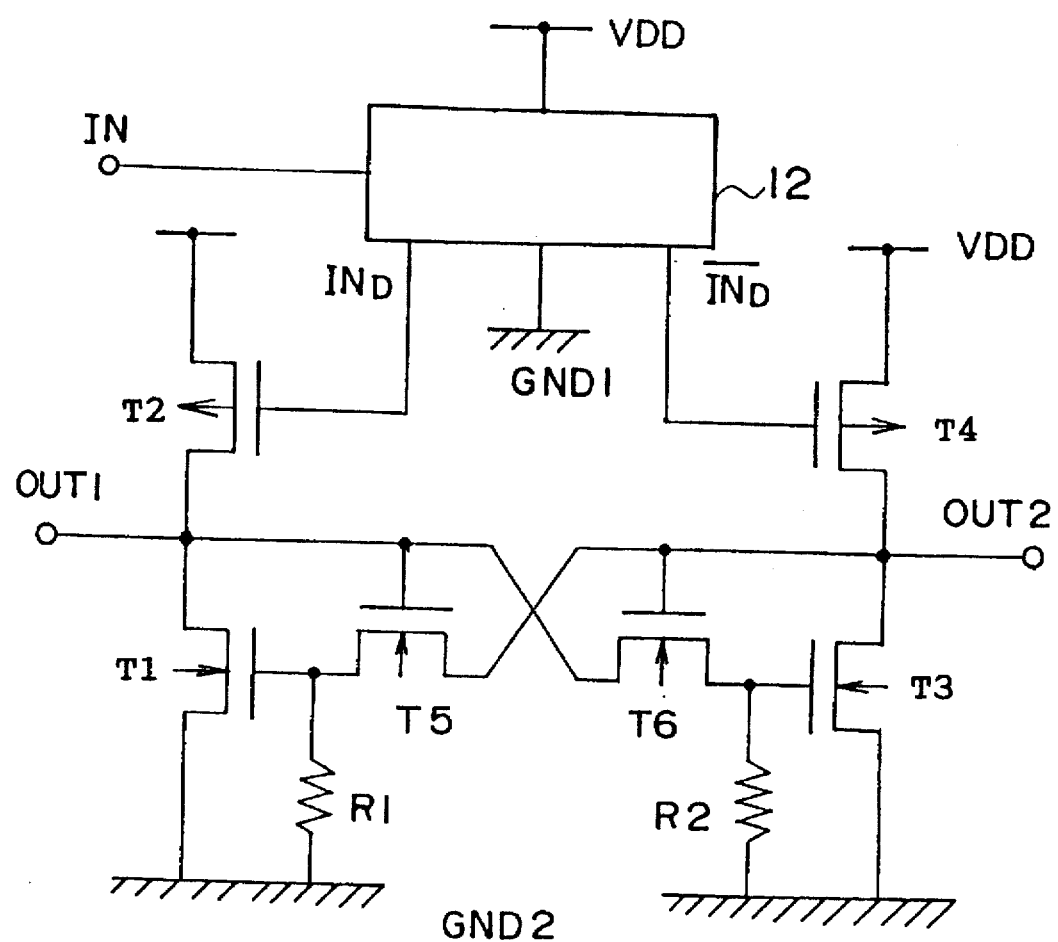
FIG. 21 is a block diagram of still another level converter (GND2) in principle of the first to the 11th converters according to the present invention.

Further, each of a first to a 12th other level converters in principle of the present invention is a circuit in which the power supply methods of the first to the 12th level converters of the present invention shown previously in FIGS. 6 to 19 are changed as shown in FIG. 20. Namely, the first and the third power lines VDD1 and VDD2 constitute a transistor circuit of a low potential power supply system with the potential level of the second power line GND as the reference. FIGS. 20 and 21 show examples of the other level converters.

Figure 22:
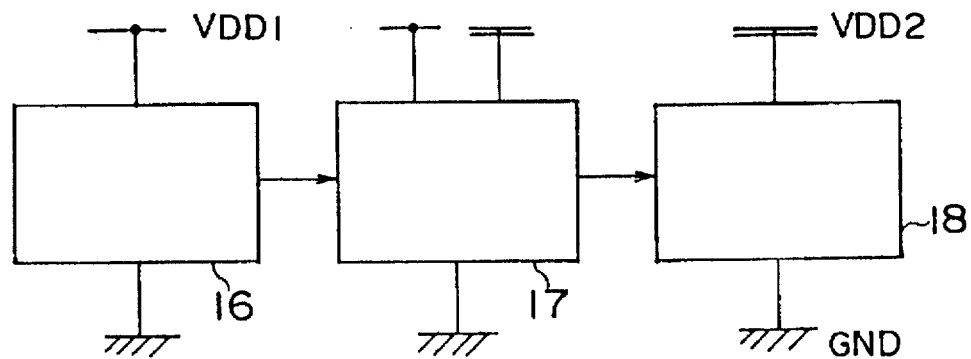
FIG. 22 is a block diagram of a first to a third semiconductor integrated circuits in principle according to the present invention.

As shown in FIG. 22, a first semiconductor integrated circuit in principle of the present invention is provided with a first circuit system 16 driven based on a first voltage level, a level conversion circuit 17 for converting the level of the output signal of the first circuit system 16 and a second circuit system 18 for driving an input signal with the level converted based on a second voltage level. The level conversion circuit 17 comprises the first to the 12th level converters of the present invention shown in FIGS. 6 to 21 and the first to the 12th other level converters with the power supply system replaced.

Besides, in the first semiconductor integrated circuit of the present invention shown in FIG. 22, the first and the second circuit systems 16 and 18 and the level conversion circuit 17 are provided in the same semiconductor chip.

Furthermore, in the first semiconductor integrated circuit of the present invention shown in FIG. 22, the first circuit system 16 and the level conversion circuit 17 are provided in the same semiconductor chip.

Further, in the first semiconductor integrated circuit of the present invention shown in FIG. 22, the level conversion circuit 17 and the second circuit system 18 are provided in the same semiconductor chip.

Figure 23:
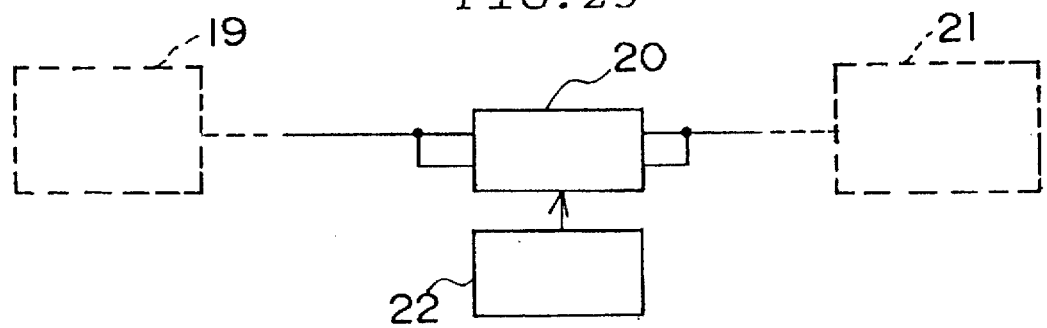
FIG. 23 is a block diagram of a fourth semiconductor integrated circuit in principle according to the present invention.

Further, according to a second semiconductor integrated circuit in principle of the present invention, there are provided a bidirectional level conversion circuit 20 and a signal control unit 22 connected to the bidirectional level conversion circuit 20 and the first to the third power lines VDD1, GND and VDD2 for a first circuit system 19 driven based on the first voltage level or in a second circuit system 21 driven based on the second voltage level as shown in FIG. 23. The signal control unit 22 determines the signal direction of the bidirectional level conversion circuit 20 based on the making order of the first and the third power lines VDD1 and VDD2.

In the second semiconductor integrated circuit of the present invention shown in FIG. 23, the bidirectional level conversion circuit 20 is provided at every input-output of the first circuit system 19 or the second circuit system 21.

Further, in the second semiconductor integrated circuit of the present invention shown in FIG. 23, the first circuit system 19 or the second circuit system 21, the bidirectional level conversion circuit 20 and the signal control means 22 are provided in the same semiconductor chip.

Figure 24:
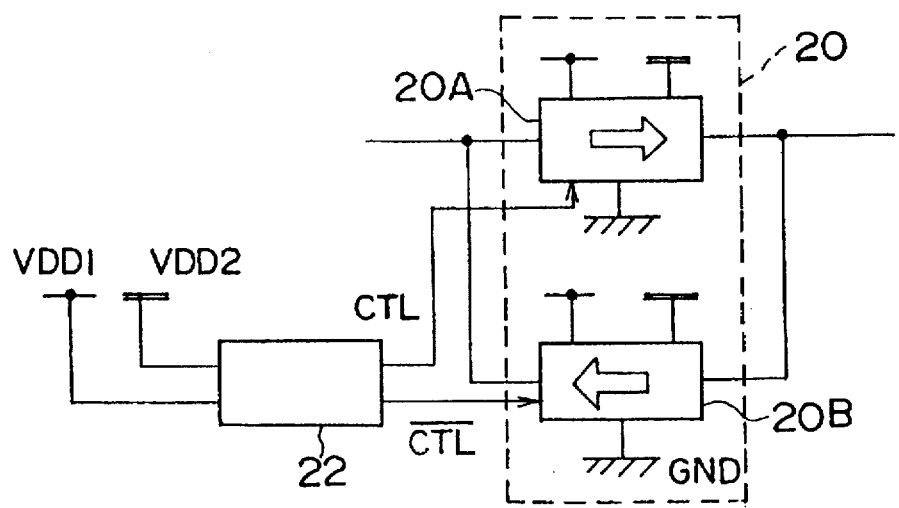
FIG. 24 is a block diagram of a bidirectional level conversion circuit of the fourth semiconductor integrated circuit shown in FIG. 23.

In the second semiconductor integrated circuit of the present invention shown in FIG. 23, the bidirectional level conversion circuit 20 comprises an output level converter 20A and an input level converter 20B as shown in FIG. 24. The output level converter 20A and the input level converter 20B include the first to the 12th level converters of the present invention shown in FIGS. 6 to 21 and the first to the 12th other level converters with the power supply system replaced.

Further, according to a third semiconductor integrated circuit in principle of the present invention, the first circuit systems 16 and 19, the second circuit systems 18 and 21, the level conversion circuit 17, and the first to the third power lines VDD1, GND and VDD2 connected to the bidirectional level conversion circuit 20 and the signal control unit 22 are wired in a lattice form in the first and the second semiconductor integrated circuits as shown in FIGS. 22 to 24.

The operation of the first level converter in principle of the present invention will be described. For example, complementary control signals $IN_D$ and $\overline{IN}_D$ from the first latch circuit 11A such as shown in FIG. 11 are supplied to the gate of the second transistor T2 and the gate of the fourth transistor T4.

Namely, when the input IN is shifted from an "H" level to an "L" level, the control signal $IN_D$ shifted from the "H" level to the "L" level is supplied from the first latch circuit 11A to the gate of the second transistor T2. Next, an inverting control signal $\overline{IN}_D$ shifting from the "L" level to the "H" level is supplied to the gate of the fourth transistor T4. As a result, it is possible to shift the ON operation state of the first transistor T1 from the OFF operation state of the second transistor T2.

In contrast with this, when the input IN shifts from the "L" level to the "H" level, the inverting control signal $\overline{IN}_D$ shifted from the "H" level to the "L" level is supplied from the latch circuit 11A to the gate of the fourth transistor T4. Next, a non-inverting signal $IN_D$ shifting from the "H" level to the "L" level is supplied to the gate of the second transistor T2.

As a result, when the input IN changes from the "L" level to the "H" level, it is also possible to shift the ON operation state of the third transistor T3 from the OFF operation state of the fourth transistor T4.

With this, it becomes possible to remove a through electric current between the transistors T1 and T2 connected to the second driving power system VDD2 and GND and a through electric current between the transistors T3 and T4. Thus, it becomes possible to aim at reduction of circuit power consumption of the level converter concerned.

Further, the operation of the second level converter in principle of the present invention will be described. For example, when the input IN is shifted from the "H" level to the "L" level, a non-inverting control signal $IN_D$ for shifting the potential from the "H" level to the "L" level is supplied to the gates of the second and the fifth transistors T2 and T5 from the first latch circuit 11A, and an inverting control signal $\overline{IN}_D$ shifting from the "L" level to the "H" level is supplied to the gates of the fourth and the sixth transistors T4 and T6.

As a result, it is possible to shift the first transistor T1 from OFF to ON quickly following to the ON to OFF operation of the second transistor T2, thus making it possible to raise the potential of the output OUT1 from the "L" level to the "H" level steeply.

This is due to the gate voltage of the first transistor T1 determines a switching speed by the ratio $R_n/(R_p+R_2)$ of an ON resistance $R_n$ of the transistor T6 to a resultant resistance of an ON resistance $R_p$ of the transistor T3 and a load element R2.

Besides, it is possible to shift the third transistor T3 from OFF to ON quickly following the operation from ON to OFF of the fourth transistor T4, thus making it possible to raise the potential of the output OUT2 from the "L" level to the "H" level steeply.

In contrast with the above, when the input IN is shifted from the "L" level to the "H" level, a control signal $IN_D$ for shifting the potential from the "L" level to the "H" level is supplied from the first latch circuit 11A to the gates of the second and the fifth transistors T2 and T5, and a control signal for shifting from the "H" level to the "L" level is supplied to the gates of the fourth and the sixth transistors T4 and T6.

Therefore, when the input IN is shifted from the "L" level to the "H" level, it is also possible to turn the third transistor T3 ON quickly next to the OFF operation of the fourth transistor T4, thus making it possible to raise the potential of the output OUT2 from the "L" level to the "H" level steeply. This is due to the fact that the gate voltage of the third transistor T3 determines the switching speed by the ratio $R_n/(R_p+R_1)$ of the ON resistance of the transistor T5 to the resultant resistance of the ON resistance of the transistor T1 and the load element R1.

When the input IN is shifted from the "L" level to the "H" level, it is possible to shift the first transistor T1 from ON to OFF quickly following the operation from OFF to ON of the second transistor T2, thus making it possible to lower the potential of the output OUT1 from the "H" level to the "L" level steeply.

With this, it becomes possible to remove a through electric current between the transistors T1 and T2 and a through electric current between the transistors T3 and T4 connected to the second driving power source system VDD2 and GND as in the prior art of the present invention. With this, it becomes possible to aim at reduction of circuit power consumption of the level converter concerned and to aim at higher speed of circuit operation as compared with the first level converter.

Furthermore, according to the third level converter in principle of the present invention, there are provided the fifth to the eighth transistors T5 to T8 as shown in FIG. 8. The seventh and the eighth transistors T7 and T8 are connected in place of the load elements R1 and R2 of the second level converter shown in FIG. 7, and complementary control signals $IN_D$, $\overline{IN}_D$ are supplied to a junction point of the gates of the second, the fifth and the seventh transistors T2, T5 and T7 and a junction point of the gates of the fourth, the sixth and the eighth transistors T4, T6 and T8, respectively.

As a result, it is possible to raise the potential of the output OUT1 from the "L" level to the "H" level steeply and to lower the potential of the output OUT2 from the "H" level to the "L" level steeply when the input IN is shifted from the "H" level to the "L" level similarly to the second level converter. Further, it becomes possible to lower the potential of the output OUT1 from the "H" level to the "L" level steeply and to raise the potential of the output OUT2 from the "L" level to the "H" level steeply when the input IN is shifted from the "L" level to the "H" level.

With this, it becomes possible to remove a through electric current between the transistors T1 and T2 and a through electric current between the transistors T3 and T4 similarly to the second level converter shown in FIG. 7. Thus, it becomes possible to aim at reduction of circuit power consumption of the level converter concerned and to aim at to a higher speed of circuit operation similarly to the second level converter.

Further, according to a fourth level converter in principle of the present invention, respective gates of the second, the fourth, the fifth and the sixth transistors T2, T4, T5 and T6 as shown in FIG. 9 are connected individually to such a second latch circuit 11B as shown in FIG. 12 which constitute the input transistor circuit 11.

In this circuit, for example, a non-inverting control signal IN1 is outputted from a first two-input NOR circuit NOR1 of the second latch circuit 11B to the gate of the fifth transistor T5, and a non-inverting delay signal IN1 is outputted from a second inverter INV2 to the gate of the second transistor T2. Further, an inverting control signal $\overline{IN1}$ is outputted from the second two-input NOR circuit NOR2 to the gate of the sixth transistor T6, and an inverting delay signal $\overline{IN2}$ is outputted from the fourth inverter INV4 to the gate of the fourth transistor T4.

Thus, it is possible to raise the potential of the output OUT1 from the "L" level to the "H" level steeply to lower the potential of the output OUT2 from the "H" level to the "L" level steeply when the input IN is shifted from the "H" level to the "L" level similarly to the second and the third level converters. Further, it becomes possible to lower the potential of the output OUT1 from the "H" level to the "L" level steeply and to raise the potential of the output OUT2 from the "L" level to the "H" level steeply when the input IN is shifted from the "L" level to the "H" level.

With this, it becomes possible to remove a through electric current between the transistors T1 and T2 and a through electric current between the transistors T3 and T4 similarly to the second and the third level converter shown in FIGS. 7 and 8. Thus, it becomes possible to aim at reduction of circuit power consumption of the level converter concerned and to aim at a higher speed of circuit operation similarly to the second and the third level converters.

Furthermore, according to a fifth level converter in principle of the present invention, the ninth and the tenth transistors T9 and T10 such as shown in FIG. 10 are connected to the second level converter shown in FIG. 7, and the gates thereof are connected individually to the second latch circuit 11B such as shown in FIG. 12.

In this circuit, for example, a non-inverting control signal IN1 is outputted from the first two-input NOR circuit NOR1 of the second latch circuit 11B to the junction point of the gates of the second and the fifth transistors T2 and T5, and a non-inverting delay signal IN1 is outputted from the second inverter INV2 to the gate of the ninth transistor T9. Further, an inverting control signal $\overline{IN1}$ is outputted from the second two-input NOR circuit NOR2 to the gates of the fourth and the sixth transistors T4 and T6, and an inverting delay signal $\overline{IN2}$ from the fourth inverter INV4 to the gate of the tenth transistor T10.

As a result, it is possible to raise the potential of the output OUT1 from the "L" level to the "H" level steeply and to lower the potential of the output OUT2 from the "H" level to the "L" level steeply when the input IN is shifted from the "H" level to the "L" level similarly to the second to the fourth level converters shown in FIGS. 7 to 9. Further, it becomes possible to lower the potential of the output OUT1 from the "H" level to the "L" level steeply and to raise the potential of the output OUT2 from the "L" level to the "H" level steeply when the input IN is shifted from the "H" level to the "L" level.

With this, it becomes possible to remove a through electric current among the transistors T1, T2 and T9 and a through electric current among the transistors T3, T4 and T10 similarly to the second to the fourth level converters s shown in FIGS. 7 to 9. Thus, it becomes possible to aim at reduction of circuit power consumption of the level converter concerned, and to aim at a higher speed of circuit operation similarly to the second to the fourth level converters.

Besides, in the first to the fifth level converters in principle of the present invention, the first and the third power lines VDD1 and VDD2 are connected to a high potential power source with the potential level of the second power line GND as the reference as shown in FIGS. 6 to 10. Further, as shown in FIG. 20, when a transistor circuit in which the first and the third power lines VDD1 and VDD2 are connected to a low potential power source with the potential level of the second power line GND as the reference, it also becomes possible to remove a through electric current between the transistors T1 and T2 and a through electric current between the transistors T3 and T4 connected to the power lines VDD and GND2 similarly to the above.

With this, it becomes possible to aim at reduction of circuit power consumption of the level converter concerned and to aim at a higher speed of circuit operation similarly to the first to the fifth level converters.

According to a sixth level converter in principle of the present invention, there are provided an input transistor circuit 12, a first to a sixth transistors T1 to T6, and a first and a second load elements R1 and R2 as shown in FIG. 13. The input transistor circuit 12 is composed of the first latch circuit 11A such as shown in FIG. 1 adopted in the first to the third level converters of the present invention.

In this circuit, for instance, when the input IN is shifted from the "H" level to the "L" level, a control signal $IN_D$ for shifting the potential from the "H" level to the "L" level is supplied to the gate of the second transistor T2 and a control signal $\overline{IND}$ for shifting the potential from the "L" level to the "H" level is supplied to the gate of the fourth transistor T4 from the input transistor circuit 12.

With this, the second, the third and the fifth transistors T2, T3 and T5 are turned OFF from ON, and the first, the fourth and the sixth transistors T1, T4 and T6 are turned ON from OFF. At this time, the potential level of the output OUT2 is determined by the ratio of the resistance R1 to the ON resistance of the fourth transistor T4. Namely, the fifth transistor T5 is turned OFF, the gate voltage of the first transistor T1 is set to the "H" level by the resistance R1, the sixth transistor T6 is turned ON, the "H" level is transmitted to the output OUT1 by way of the resistance R2, and the output OUT1 is shifted from the "L" level to the "H" level at a high speed.

Conversely, when the input IN is shifted from the "L" level to the "H" level, a control signal $IN_D$ for shifting the potential from the "L" level to the "H" level is supplied to the gate of the second transistor T2 and a control signal $\overline{IND}$ for shifting the potential from the "H" level to the "L" level steeply is supplied to the gate of the fourth transistor T4 from the input transistor circuit 12.

With this, the second, the third and the fifth transistors T2, T3 and T5 are turned ON from OFF, and the first, the fourth and the sixth transistors T1, T4 and T6 are turned OFF from ON. At this time, the potential level of the output OUT1 is determined by the ratio of the resistance R2 to the ON resistance of the second transistor T2.

Namely, the sixth transistor T6 is turned OFF from ON, the gate voltage of the third transistor T3 is set to the "H" level by the resistance R2, the fifth transistor T5 is turned ON, the "H" level is transmitted to the output OUT2 by way of the resistance R1, and the output OUT2 is shifted from the "L" level to the "H" level at a high speed.

With this, it becomes possible to remove a through electric current between the transistors T1 and T2 and a through electric current between the transistors T3 and T4 connected to the second driving power source system VDD2 and GND. Thus, it becomes possible to aim at reduction of circuit power consumption of the level converter concerned and to aim at a higher speed of circuit operation as compared with the first to the fifth level converters.

Further, according to a seventh level converter in principle of the present invention, there are provided an input transistor circuit 13 and a first to an eighth transistors T1 to T8. The seventh and the eighth transistors T7 and T8 are replaced with the load elements R1 and R2 of the sixth level converter at the junction positions thereof.

As a result, it is possible to take over the functions of the load elements R1 and R2 of the sixth level converter with normally ON resistances of the seventh and the eighth transistors T7 and T8. Further, when the input IN is shifted from the "H" level to the "L" level or from the "L" level to the "H" level, it is possible to have the output OUT1 shift from the "L" level to the "H" level steeply at a high speed and the output OUT2 shift from the "L" level to the "H" level at a high speed.

With this, it becomes possible to remove a through electric current between the transistors T1 and T2 and a through electric current between the transistors T3 and T4 similarly to the sixth level converter shown in FIGS. 13. Thus, it becomes possible to aim at reduction of circuit power consumption and a higher speed of circuit operation.

Further, according to an eighth level converter in principle of the present invention, a first and a second inverters INV1 and INV2 in odd numbers are provided as shown in FIG. 15. The first inverters INV1 in odd numbers are connected between the gate of the fifth transistor T5 and the second output OUT2. The second inverters INV2 in odd numbers are connected between the gate of the sixth transistor T6 and the first output OUT1.

As a result, it is possible to supply a delay signal on the potential level of the second output OUT2 to the gate of the fifth transistor T5. Further, it is possible to supply a delay signal on the potential level of the first output OUT1 to the gate of the sixth transistor T6. Similarly to the sixth and the seventh level converters, it is possible to have the output OUT1 shift from the "L" level to the "H" level at a high speed and the output OUT2 shift from the "L" level to the "H" level at a high speed when the input IN is shifted from the "H" level to the "L" level or from the "L" level to the "H" level.

With this, it becomes possible to remove a through electric current between the transistors T1 and T2 and a through electric current between the transistors T3 and T4 similarly to the sixth and the seventh level converters shown in FIGS. 13 and 14. Thus, it becomes possible to aim at reduction of circuit power consumption and a higher speed of circuit operation.

Furthermore, according to a ninth level converter in principle of the present invention, a first and a second inverters INV1 and INV2 in even numbers are provided as shown in FIG. 16. A first inverter connected in series is connected between the gate of the fifth transistor T5 and the first output OUT1. A second inverter connected in series is connected between the gate of the sixth transistor T6 and the second output OUT2.

In this circuit, when the input IN is shifted from the "H" level to the "L" level for instance, a non-inverting control signal $IN_D$ for shifting the potential from the "H" level to the "L" level is supplied to the gate of the second transistor T2, and an inverting control signal $\overline{IND}$ for shifting the potential from the "L" level to the "H" level is supplied to the gate of the fourth transistor T4.

With this, the second, the third and the fifth transistors T2, T3 and T5 are turned OFF from ON, and the first, the fourth and the sixth transistors T1, T4 and T6 are turned ON from OFF. At this time, the potential level of the output OUT2 is determined by the ratio of the resistance R1 to the ON resistance of the fourth transistor T4.

Namely, the fifth transistor T5 is turned OFF with delay time of the first inverter, the gate voltage of the first transistor T1 is set to the "H" level by the resistance R1, the sixth transistor T6 is turned ON, and the "H" level is transmitted to the output OUT1 through the resistance R2.

At this time, a first signal transmission path circulating through the fourth transistor T4→the output OUT2→the first transistor T1→the output OUT1→the first inverter→the fifth transistor T5→the resistance R1→the first transistor T1 and a second signal transmission path circulating through the fourth transistor T4→the output OUT2→the second inverter→the sixth transistor T6→the resistance R2→the output OUT1 are formed.

As a result, it is possible to shift the output OUT1 from the "L" level to the "H" level at a high speed through the first signal transmission path, and it becomes possible, after the potential is raised in the first signal transmission path, to maintain the potential or to shift the state uninterruptedly through the second signal transmission path. Thus, the output OUT1 is shifted from the "L" level to the "H" level at a high speed.

Conversely, when the input IN is shifted from the "L" level to the "H" level, a non-inverting control signal $IN_D$ for shifting the potential from the "L" level to the "H" level is supplied to the gate of the second transistor T2 and an inverting control signal $\overline{\text{IND}}$ for shifting the potential from the "H" level to the "L" level is supplied to the gate of the fourth transistor T4 from the input transistor circuit 12.

With this, the second, the third and the fifth transistors T2, T3 and T5 are turned ON from OFF and the first, the fourth and the sixth transistors T1, T4 and T6 are turned OFF from ON. At this time, the potential level of the output OUT1 is determined by the ratio of the resistance R2 to the ON resistance of the second transistor T2.

Namely, the sixth transistor T6 is turned OFF from ON with delay time of the second inverter, the gate voltage of the third transistor T3 is set to the "H" level by the resistance R2, the fifth transistor T5 is turned ON, and the "H" level is transmitted to the output OUT2 through the resistance R1.

At this time, a first signal transmission path circulating through the second transistor T2→the output OUT1→the third transistor T3→the output OUT2→the second inverter→the sixth transistor T6→the resistance R2→the third transistor T3 and a second signal transmission path circulating through the second transistor T2→the output OUT1→the first inverter→the fifth transistor T5→the resistance R1→the output OUT2 are formed.

As a result, it is possible to shift the output OUT1 from the "L" level to the "H" level at a high speed through the first signal transmission path, and it becomes possible, after the potential is raised in the first signal transmission path, to maintain the potential or to shift the state uninterruptedly through the second signal transmission path. Thus, the output OUT2 is shifted from the "L" level to the "H" level at a high speed.

With this, similarly to the sixth to the eighth level converters shown in FIGS. 13 to 15, it becomes possible to remove a through electric current between the transistors T1 and T2 and a through electric current between the transistors T3 and T4. Thus, it becomes possible to aim at reduction of circuit power consumption and to aim at a higher speed of circuit operation.

According to a tenth level converter in principle of the present invention, a third and a fourth load elements R3 and R4 and a first and a second electrostatic capacities C1 and C2 are provided as shown in FIG. 17.

As a result, it is possible to supply a signal obtained by delaying the second output OUT2 by means of the fourth load element R4 and the second electrostatic capacity C2 to the gate of the sixth transistor T6, and it is also possible to supply a signal obtained by delaying the first output OUT1 by means of the third load element R3 and the first electrostatic capacity C1 to the gate of the fifth transistor T5. Thus, similarly to the sixth to the ninth level converters, when the input IN is shifted from the "H" level to the "L" level or from the "L" level to the "H" level, it is possible to have the output OUT1 shift from the "L" level to the "H" level at a high speed and to have the output OUT2 shift from the "L" level to the "H" level at a high speed.

With this, similarly to the sixth to the ninth level converters, it becomes possible to remove a through electric current between the transistors T1 and T2 and a through electric current between the transistors T3 and T4 connected to the second driving power source system VDD2 and GND. Thus, it becomes possible to aim at reduction of circuit power consumption and a higher speed of circuit operation.

According to an 11th level converter in principle of the present invention, integrating circuits CR1 and CR2 are connected at preceding stages of the first and the second inverters INV1 and INV2 or the first and the second inverters as shown in FIG. 18.

As a result, it is possible to supply a signal obtained by delaying the second output OUT2 by means of the integrating circuit CR2 and the second inverter to the gate of the fifth transistor T5, and it is also possible to supply a signal obtained by delaying the first output OUT1 by means of the integrating circuit CR1 and the first inverter to the gate of the sixth transistor T6. Thus, similarly to the sixth to the tenth level converters, when the input IN is shifted from the "H" level to the "L" level or from the "L" level to the "H" level, it is possible to have the output OUT1 shift from the "L" level to the "H" level steeply at a high speed and to have the output OUT2 shift from the "L" level to the "H" level at a high speed.

With this, similarly to the sixth to the tenth level converters, it becomes possible to remove a through electric current between the transistors T1 and T2 and a through electric current between the transistors T3 and T4 connected to the second driving power source system VDD2 and GND. Thus, it becomes possible to aim at reduction of circuit power consumption and a higher speed of circuit operation.

In the sixth to the 11th level converters of the present invention shown in FIGS. 13 to 18, the first and the third power lines VDD1 and VDD2 are connected to a high potential power source with the potential level of the second power line GND as the reference. However, even when a transistor circuit in which the first and the third power lines VDD1 and VDD2 are connected to a low potential power source with the potential level of the second power line GND as the reference is formed as shown in FIG. 21, it becomes possible to remove a through electric current between the transistors T1 and T2 and a through electric current between the transistors T3 and T4 connected to the power lines VDD and GND2 in a similar manner as the above.

With this, in the first to the 11th level converters, it is no longer required to make the ON resistances of the first and the third transistors T1 and T3 larger as in the related art of the present invention, and it is possible to design the sizes of these p-type field effect transistors coordinately to the sizes of the other n-type field effect transistors, thus contributing greatly to form various signal processing circuits including level converters into a gate array (a CMOS integrated circuit).

Further, according to a 12th level converter in principle of the present invention, a pulse generating circuit 14 and a signal output circuit 15 are provided as shown in FIG. 19. The pulse generating circuit 14 is connected to the first driving power source system and the input IN. The signal output circuit 15 is connected to the second driving power system.

In this circuit, when an input signal Sin processed by the first driving power source system is supplied to the pulse generating circuit 14 for instance, a one-shot pulse signal is generated based on the input signal Sin. An output signal for the second driving power source system with the level converted based on the one-shot pulse signal is latch-outputted from the signal output circuit 15.

Thus, it is possible to change over the voltage of the first driving power source system to and from that of the second driving power source system instantaneously based on the one-shot pulse signal. It becomes possible to aim at reduction of circuit power consumption as compared with a level converter including a current mirror circuit involving current consumption as a principal part.

Furthermore, according to a first semiconductor integrated circuit in principle of the present invention, a first circuit system 16, a level conversion circuit 17 and a second circuit system 18 are provided as shown in FIG. 22. The level conversion circuit 17 is composed of the first to the 12th level converters of the present invention shown in FIGS. 6 to 21. For example, the first and the second circuit systems 16 and 18 and the level conversion circuit 17 are provided in the same semiconductor chip.

As a result, when a composite integrated circuit such as a digital/analog processing circuit is formed using an integrated circuit of a low voltage driving system and an integrated circuit of a high voltage driving system, contribution is made to achieve low power consumption and a high speed of signal operation by applying the first to the 12th level converters of the present invention to the level conversion circuit 17, and it becomes no longer required to package individual IC separately on a printed board as in the related art of the present invention.

With this, it becomes possible to keep an IC packaging area in electronic equipment small. Further, it becomes possible to aim at to form portable electronic equipment depending on a battery-driving power source compact in size.

According to the first semiconductor integrated circuit of the present invention, the first circuit system 16 and the level conversion circuit 17 are provided in the same semiconductor chip.

As a result, when an integrated circuit of a low voltage driving system and an integrated circuit of a high voltage driving system are made to coexist, contribution is made to achieve low power consumption and a high speed of signal operation, and it becomes possible to improve a packaging factor showing a packaging number of pieces per unit area of ICs as compared with the related art of the present invention by applying the first to the 12th level converters of the present invention to an input-output interface portion of the integrated circuit of a low voltage driving system.

With this, it becomes possible to keep the IC packaging area of electronic equipment small, and to aim at to form portable electronic equipment compact in size.

According to the first semiconductor integrated circuit of the present invention, the level conversion circuit 17 and the second circuit system 18 are provided in the same semiconductor chip.

As a result, when an integrated circuit of a low voltage driving system and an integrated circuit of a high voltage driving system are made to coexist, contribution is made to achieve low power consumption and a high speed of signal operation, and it becomes possible to improve a packaging factor of Ics by applying the first to the 12th level converters of the present invention to an input-output interface portion of the integrated circuit of a high voltage driving system.

With this, it becomes possible to keep the IC packaging area of electronic equipment small, and to aim at to form portable electronic equipment compact in size.

According to a second integrated circuit of the present invention, there are provided a bidirectional level conversion circuit 20 and a signal control means 22 for a first circuit system 19 or a second circuit system 21 as shown in FIG. 23, and, for example, the bidirectional level conversion circuit 20 is provided for every input-output of the first circuit system 19 or the second circuit system 21. These are provided in the same semiconductor chip.

As a result, a control signal CTL for determining the operating direction of the level converter is generated in the signal control means 22 based on the making order of the first and the third power lines VDD1 and VDD2, thus making it possible to output the signal CTL to the bidirectional level conversion circuit 20.

In this circuit, for example, when the first power line VDD1 is made first and the second power line VDD2 is made later as shown in FIG. 24, a non-inverting control signal CTL="H" level is supplied to an output level converter 20A. An inverting control signal $\overline{CTL}$="L" level is supplied to an input level converter 20B. With this, the output level converter 20A is brought into an operating state, the input level converter 20B is brought into a non-operating state, and it becomes possible to determined the output direction of the semiconductor integrated circuit concerned automatically.

Conversely, when the second power line VDD2 is made first and the first power line VDD1 is made later, a non-inverting control signal CTL="L" level is supplied to the output level converter 20A. An inverting control signal $\overline{CTL}$="H" level is supplied to the input level converter 20B. With this, the output level converter 20A is brought into a non-operating state, the input level converter 20B is brought into an operating state, and it becomes possible to determine the input direction of the semiconductor integrated circuit concerned automatically.

Thus, it becomes possible to reduce the number of input-output terminals of a one-chip microcomputer or the like as small as possible.

Further, according to a third semiconductor integrated circuit in principle of the present invention, the first to the third power lines VDD1, GND and VDD2 are wired in a lattice form in a semiconductor chip in the first and the second semiconductor integrated circuits shown in FIGS. 22 to 24.

As a result, it is possible to supply power to respective cells from lengthwise and breadthwise directions at need by connecting power wirings on the chip to respective cell trains from lengthwise and breadthwise directions without separating low voltage from high voltage depending on cell trains as in the related art of the present invention. Thus, it becomes possible to have low voltage and high voltage coexist in the same cell and to aim at reduction of useless power consumption, thus making it possible to provide the degree of freedom in the layout of level conversion circuits 6 having supply terminals of the power lines VDD1 and VDD2, the ground line GND or the like and input-output of signals.

With this, it becomes possible to construct a CMOS integrated circuit (a gate array) in which the first circuit systems 16 and 19, the second circuit systems 18 and 21, the level conversion circuit 17, the bidirectional level conversion circuit 20 and the signal control means 22 are included mixedly in the same chip. Further, it is possible to reduce by passing wirings of input/output signals as compared with the related art of the present invention, which contributes to achieve a high speed of circuit operation.

Next, preferred embodiments of the present invention will be described with reference to the drawings.

(1) Description of the first preferred embodiment

Figure 25A:
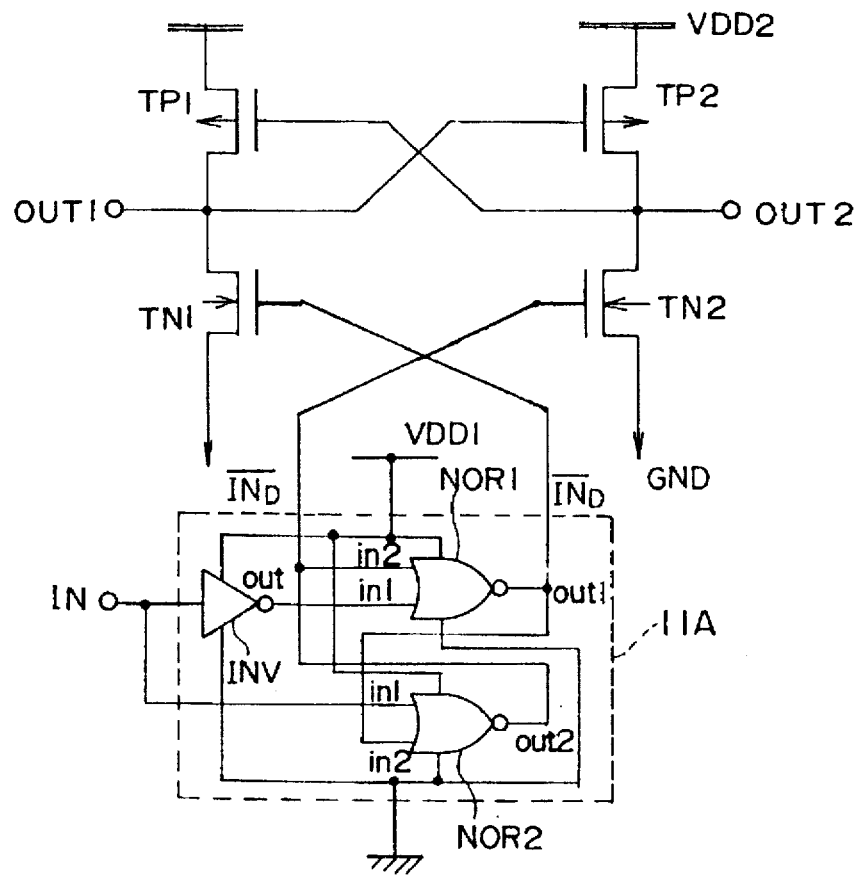
FIG. 25A is a block diagram of a level converter according to a first preferred embodiment of the present invention.

A first level converter of the present invention is composed of an input latch circuit 11A and four transistors TP1, TP2, TN1 and TN2 as shown in FIG. 25A. Namely, the input latch circuit (the first latch circuit) 11A is an example of the input transistor circuit 11, and connected between a power line VDD1 (driving voltage VD1=approximately 3 V) and a ground line GND (0 V) which become a first driving power source system.

The input latch circuit 11A is composed of an inverter INV and two-input NOR circuits NOR1 and NOR2. An input IN of the inverter INV is connected to one input in1 of the two-input NOR circuit NOR2, and an output out thereof is connected to one input in1 of the two-input NOR circuit NOR1. Further, another input in2 of the two-input NOR circuit NOR1 is connected to an output out2 of the two-input NOR circuit NOR2, and another input in2 of the two-input NOR circuit NOR2 is connected to an output out1 of the two-input NOR circuit NOR1. Thus, an input signal Sin is latched by the input latch circuit 11A, and complementary signals $IN_D$ and $\overline{IN}_D$ are supplied to the gate of the transistor TN1 and the gate of the transistor TN2 from these two-input NOR circuits NOR1 and NOR2, respectively.

Here, when the input signal Sin is shifted from an "L" level to an "H" level, a non-inverting signal $IN_D$ is outputted to the transistor TN1 behind an inverting signal $\overline{IN}_D$ which is shifted from the "H" level to the "L" level. The non-inverting signal $IN_D$ is in phase with the input signal Sin.

Further, when the input signal Sin is shifted from the "H" level to the "L" level, the inverting signal $\overline{IN}_D$ is outputted to the transistor TN2 behind the non-inverting signal $IN_D$ which is shifted from the "H" level to the "L" level. The inverting signal $\overline{IN}_D$ is in reverse phase with the input signal Sin.

TABLE 1

|  | IN = L → H | H → L |
|---|---|---|
| $IN_D$ | L → H | H → L |
| $\overline{IN}_D$ | H → L | L → H |

Further, the transistor TP1 is an example of the first transistor T1, and consists of a p-type field effect transistor (hereinafter referred to simply as a transistor). The source of the transistor TP1 is connected to a power line VDD2 (driving voltage VD2=approximately 5 V) which becomes a driving power source system, the drain thereof is connected to the output OUT1 and the drain of the transistor TN1 (hereinafter also referred to simply as series connection), and the gate thereof is connected to the output OUT2, respectively.

The transistor TP2 is an example of the third transistor, and consists of a p-type field effect transistor. The source of the transistor TP2 is connected to the power line VDD2, the drain thereof is connected to the output OUT2 and the drain of the transistor TN2, and the gate thereof is connected to the output OUT1, respectively.

The transistor TN1 is an example of the transistor T2, and consists of an n-type field effect transistor (hereinafter referred to simply as a transistor). The source of the transistor TN1 is connected to the ground line GND, the drain thereof is connected to the output OUT1 and the drain of the transistor TP1, and the gate thereof is connected to the output out1 of the two-input NOR circuit NOR1 of the input latch circuit 11A.

The transistor TN2 is an example of the transistor T4, and consists of an n-type field effect transistor. The source of the transistor TN2 is connected to the ground line GND, the drain thereof is connected to the output OUT2 and the drain of the transistor TP2, and the gate thereof is connected to the output out2 of the two-input NOR circuit NOR1 of the input latch circuit 11A.

Figure 25B:
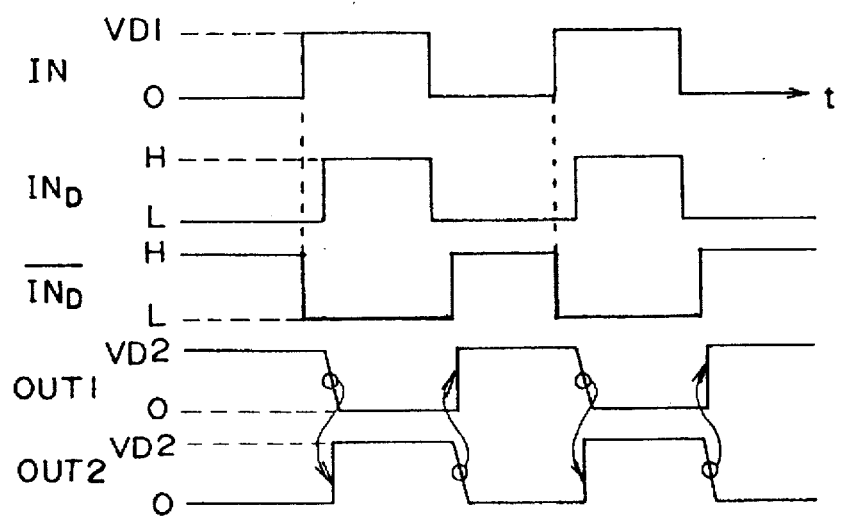
FIG. 25B is an operating waveform diagram of the level converter shown in FIG. 25A.
Figure 26A:
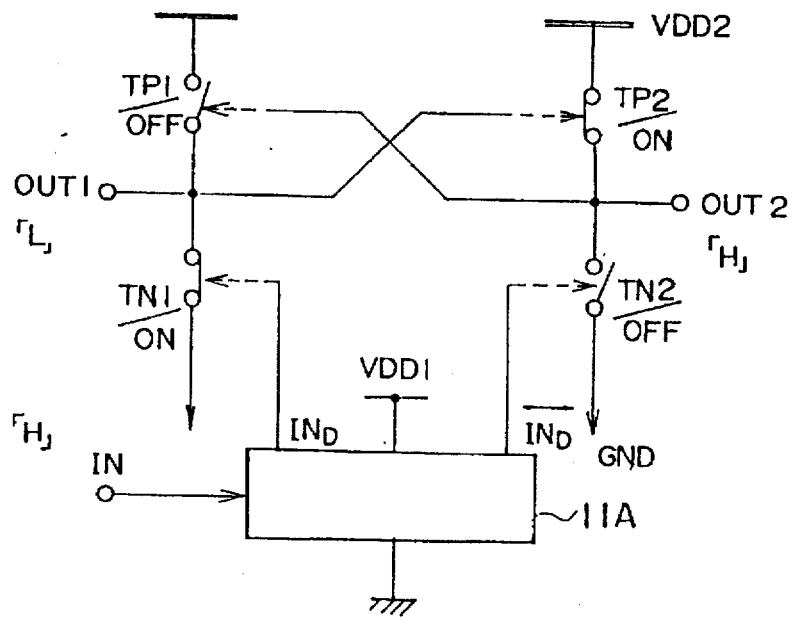
FIG. 26A is an equivalent circuit diagram for explaining the operation at stationary time (IN="H") of the level converter shown in FIG. 25A.
Figure 26B:
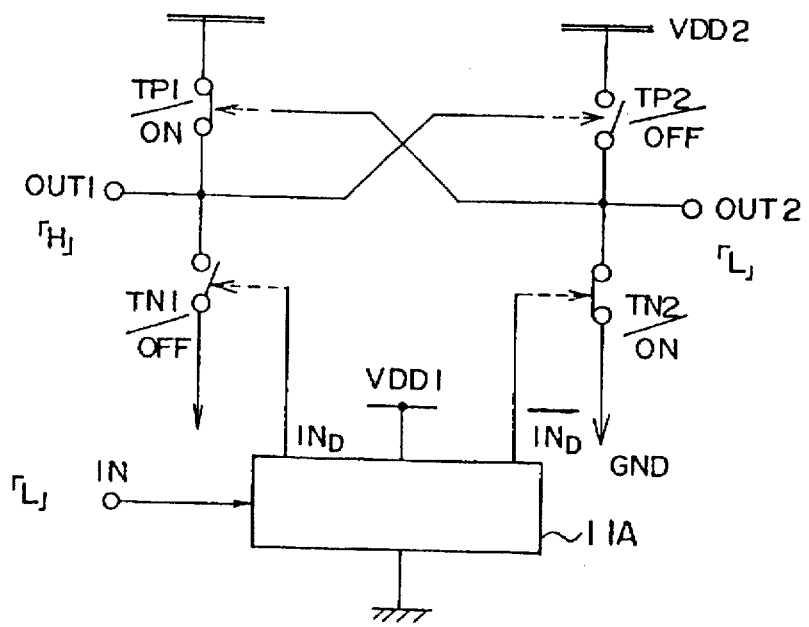
FIG. 26B is an equivalent circuit diagram for explaining the operation at stationary time (IN="L") of the level converter shown in FIG. 25A.
Figure 26C:
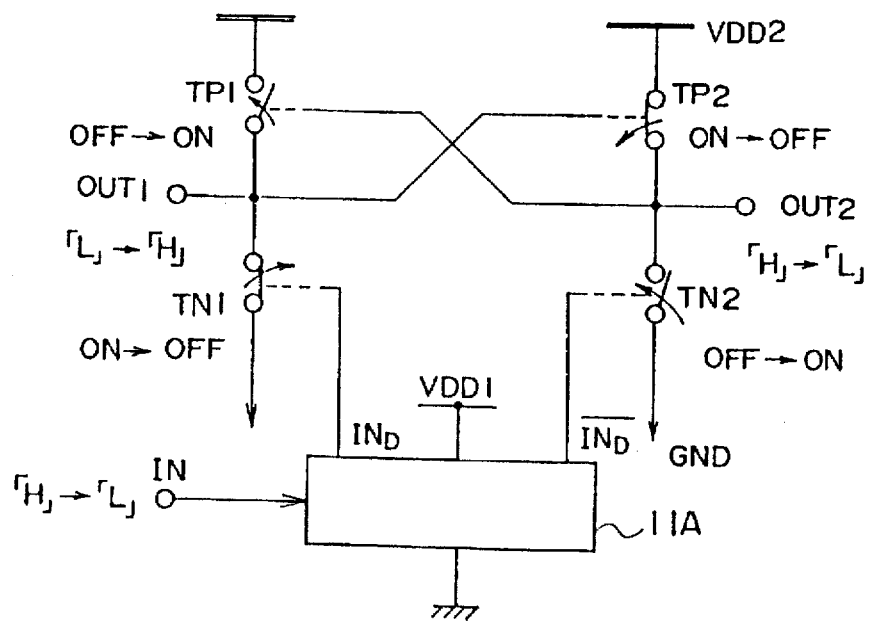
FIG. 26C is an equivalent circuit diagram for explaining the operation at transition time (IN="H"→"L") of the level converter shown in FIG. 25A.
Figure 26D:
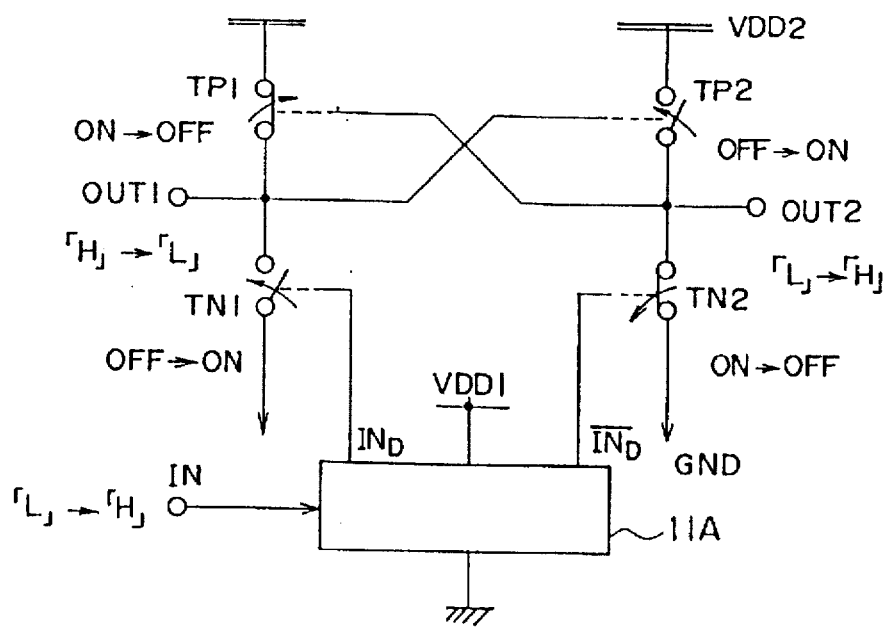
FIG. 26D is an equivalent circuit diagram for explaining the operation at transition time (IN="L"→"H") of the level converter shown in FIG. 25A.

Next, the operation of the level converter concerned will be described with reference to FIG. 25B and FIGS. 26A to 26D. First, at stationary time when the input IN is at the "H" level for instance, a non-inverting signal $IND_D$="H" level is supplied from the input latch circuit 11A to the gate of the transistor TN1 and an inverting signal $\overline{IN}_D$="L" level is supplied to the gate of the transistor TN2 as shown in FIG. 25B. With this, as shown in an equivalent circuit of FIG. 26A, the transistors TN1 and TP2 are turned ON, the transistors TN2 and TP1 are turned OFF, and the output OUT1 shows the "L" level and the output OUT2 shows the "H" level.

Conversely, at stationary time when the input IN shows the "L" level, a non-inverting signal $IN_D$="L" level such as shown in FIG. 25B is supplied from the input latch circuit 11A to the gate of the transistor TN1, and an inverting signal $\overline{IN}_D$="H" level is supplied to the gate of the transistor TN2. With this, as shown in an equivalent circuit of FIG. 26B, the transistors TN2 and TP1 are turned ON, the transistors TN1 and TP2 are turned OFF, and the output OUT1 shows the "H" level and the output OUT2 shows the "L" level.

Furthermore, at transition time when the input IN is shifted from the "H" level to the "L" level, a non-inverting signal $IN_D$="H"→"L" level is supplied to the gate of the transistor TN1 and an inverting signal $\overline{IN}_D$="L"→"H" level is supplied to the gate of the transistor TN2 from the input latch circuit 11A. With this, as shown in an equivalent circuit of FIG. 26C, the transistors TN1 and TP2 are turned OFF from ON, transistors TN2 and TP1 are brought into ON state from OFF, the output OUT1 is raised from the "L" level to the "H" level, and the output OUT2 falls from the "H" level to the "L" level.

Conversely, at stationary time when the input IN is shifted from the "L" level to the "H" level, a non-inverting signal $IN_D$="L"→"H" level is supplied to the gate of the transistor TN1 and an inverting signal $\overline{IN}_D$="H"→"L" level is supplied to the gate of the transistor TN2 from the input latch circuit 11A. With this, as shown in an equivalent circuit of FIG. 26D, the transistors TN2 and TP1 are turned OFF from OFF, the transistors TN1 and TP2 are brought into ON state from OFF, the output OUT1 falls from the "H" level to the "L" level, and the output OUT2 is raised from the "L" level to the "H" level.

Through repeated operation of the foregoing, it is possible to convert a signal level applied with signal processing in a 3 V driving system into a potential level applicable with signal processing by a 5 V driving system.

Thus, according to a level converter related to the first preferred embodiment of the present invention, the input latch circuit 11A and transistors TP1, TP2, TN1 and TN2 are provided, and complementary signals $IN_D$ and $\overline{IN}_D$ are supplied to the gate of the transistor TN1 and the gate of the transistor TN2 from the input latch circuit 11A as shown in FIG. 25A.

As a result, when the input IN is shifted from the "H" level to the "L" level, it is possible to deviate the ON state of the first transistor TP1 from the ON state of the second transistor TN1. Conversely, when the input IN is shifted from the "L" level to the "H" level, it is also possible to deviate the On state of the transistor TP2 from the ON state of the transistor TN2.

With this, it is possible to remove a through electric current between the transistors TP1 and TN1 and a through electric current between the transistors TP2 and TN2 connected to the second driving power source system VDD2 and GND. Thus, it becomes possible to aim at reduction of circuit power consumption of the level converter concerned as compared with the related art of the present invention.

(2) Description of the second preferred embodiment

Figure 27A:
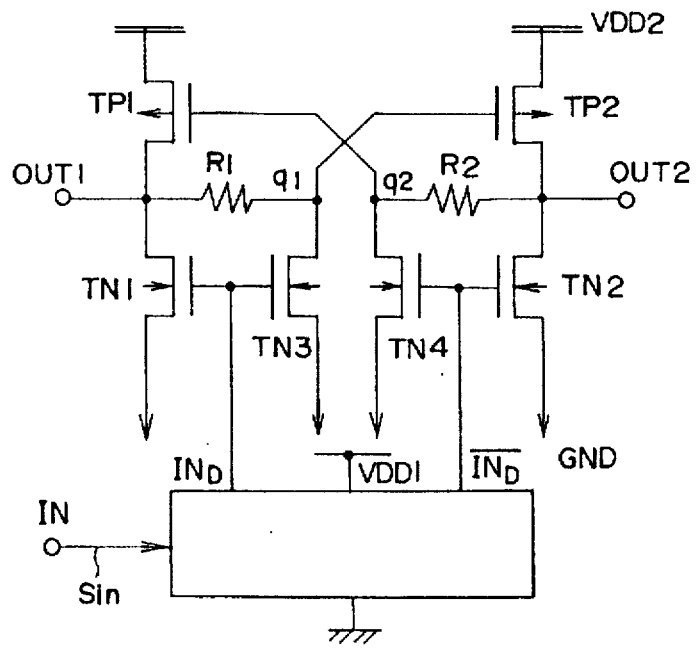
FIG. 27A is a block diagram of a level converter according to a second preferred embodiment of the present invention.

In a second embodiment of the present invention, resistances R1 and R2 and transistors TN3 and TN4 are connected to the level converter of the first embodiment as shown in FIG. 27A. Namely, the resistance R1 is an example of the first load element, which is connected between the gate of the transistor TP2 and the output OUT1 and has a resistance value of approximately several KΩ depending on the ON resistance of the transistor TP2. The resistance R2 is an example of the second load element, which is connected between the gate of the transistor TP1 and the output OUT2 and has a resistance value of several KΩ depending on the ON resistance of the transistor TP1. The transistor TN3 is an example of the transistor T5 and consists of an n-type field effect transistor (hereinafter referred to simply as a transistor). The drain of the transistor TN3 is connected to a junction point q1 of the resistance R1 and the gate of the transistor TP2, and the source thereof is connected to the ground line GND. Further, the gate of the transistor TN3 is connected to the gate of the transistor TN1 and connected further to the input latch circuit 11A.

The transistor TN4 is an example of the sixth transistor T6 and consists of an n-type field effect transistor (hereinafter referred to simply as a transistor). The drain of the transistor TN4 is connected to a junction point q2 of the resistance R2 and the gate of the transistor TP1, and the source thereof is connected to the ground line GND. Further, the gate of the transistor TN4 is connected to the gate of the transistor TN2 and connected further to the input latch circuit 11A.

With this, complementary signals $IN_D$ and $\overline{IN}_D$ are supplied from the input latch circuit 11A to the junction point of the gates of the transistors TN1 and TN3 and the junction point of the gates of the transistors TN2 and TN4, respectively. Besides, since the other structure is similar to that of the first embodiment, the description thereof is omitted.

Next, the operation of the level converter concerned will be described with reference to FIG. 27B and FIGS. 28A to 28D.

Figure 27B:
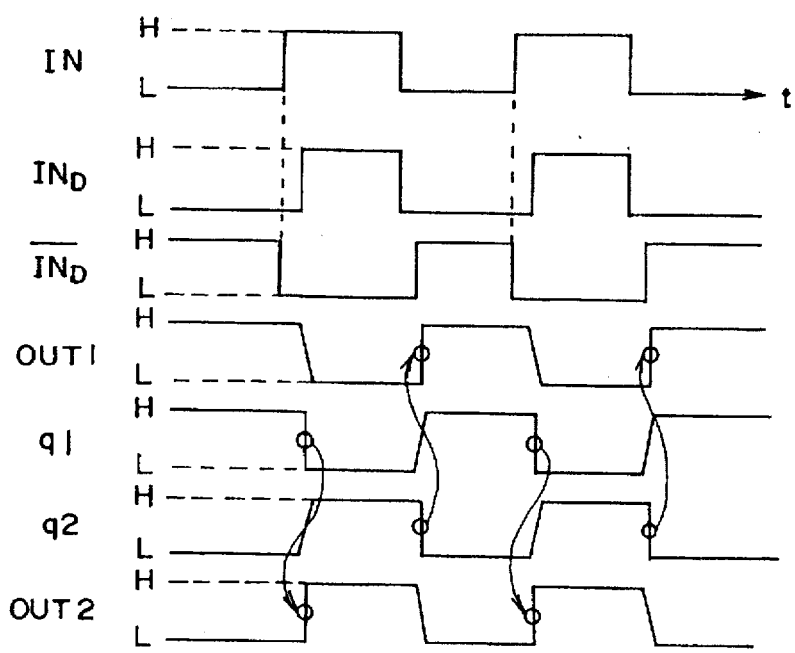
FIG. 27B is an operating waveform diagram of the level converter shown in FIG. 27A.

For example, at stationary time when the input IN shows the "H" level, a non-inverting signal $IN_D$="H" level is supplied to the gates of the transistors TN1 and TN3 and an inverting signal $\overline{IN}_D$="L" level is supplied to the gates of the transistors TN2 and TN4 from the input latch circuit 11A as shown in FIG. 27B. With this, as shown in an equivalent circuit of FIG. 28A, the transistors TN1, TN3 and TP2 are turned ON, the transistors TN2, TN4 and TP1 are turned OFF, and the output OUT1 shows the "L" level and the output OUT2 shows the "H" level.

Conversely, at stationary time when the input IN shows the "L" level, a non-inverting signal $IN_D$="L" level such as shown in FIG. 27B is supplied to the gates of the transistors TN1 and TN3 and an inverting signal $\overline{IN}_D$="H" level is supplied to the gates of the transistors TN2 and TN4 from the input latch circuit 11A. Thus, as shown in an equivalent circuit of FIG. 28B, the transistors TN2, TN4 and TP1 are turned ON, the transistors TN1, TN3 and TP2 are turned OFF, and the output OUT1 shows the "H" level and the output OUT2 shows the "L" level.

Furthermore, when the input IN is shifted from the "H" level to the "L" level, a non-inverting signal $IN_D$="H"→"L" level such as shown in FIG. 27B is supplied to the gates of the transistors TN1 and TN3, and an inverting signal $\overline{IN}_D$="L"→"H" level is supplied to the gates of the transistors TN2 and TN4 from the input latch circuit 11A. Here, the inverting signal $\overline{IN}_D$ shifted from the "L" level to the "H" level is outputted to the transistors TN2 and TN4 behind the non-inverting signal $IN_D$ shifted from the "H" level to the "L" level similarly to the first embodiment.

Figure 28A:
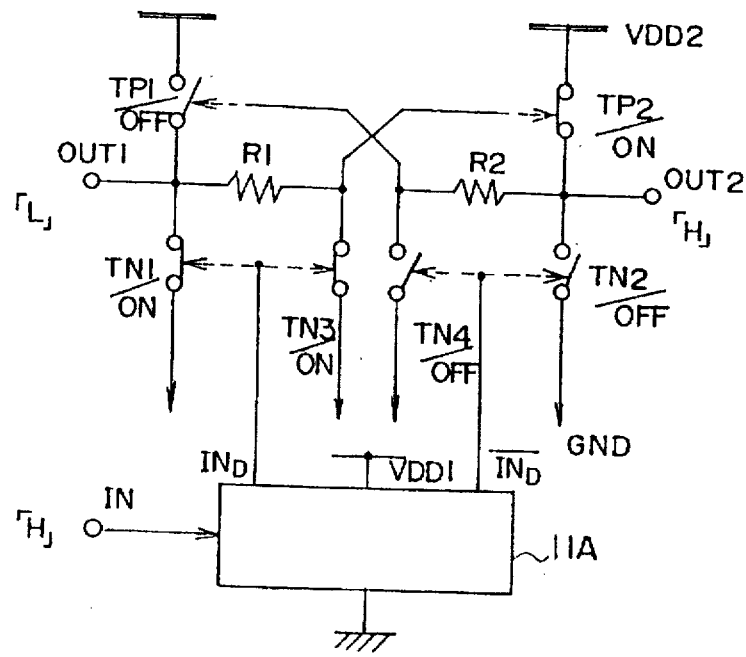
FIG. 28A is an equivalent circuit diagram for explaining the operation at stationary time (IN="H") of the level converter shown in FIG. 27A.
Figure 28B:
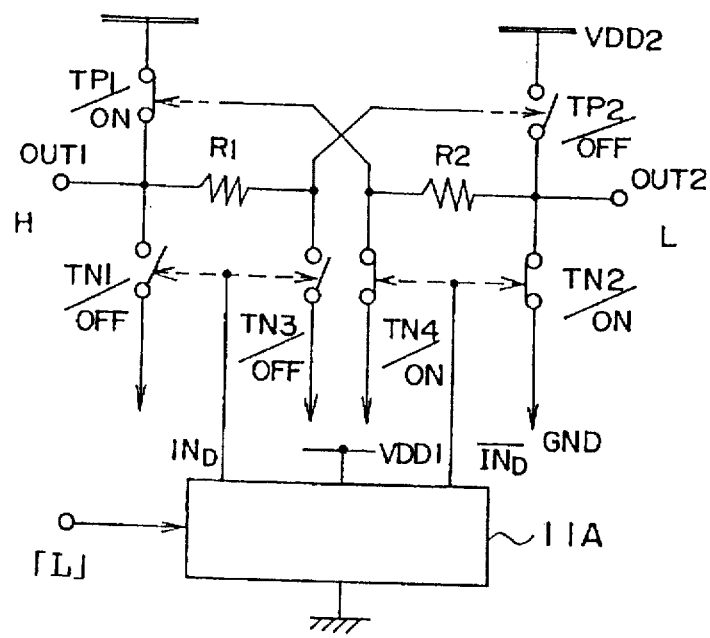
FIG. 28B is an equivalent circuit diagram for explaining the operation at stationary time (IN="L") of the level converter shown in FIG. 27A.
Figure 28C:
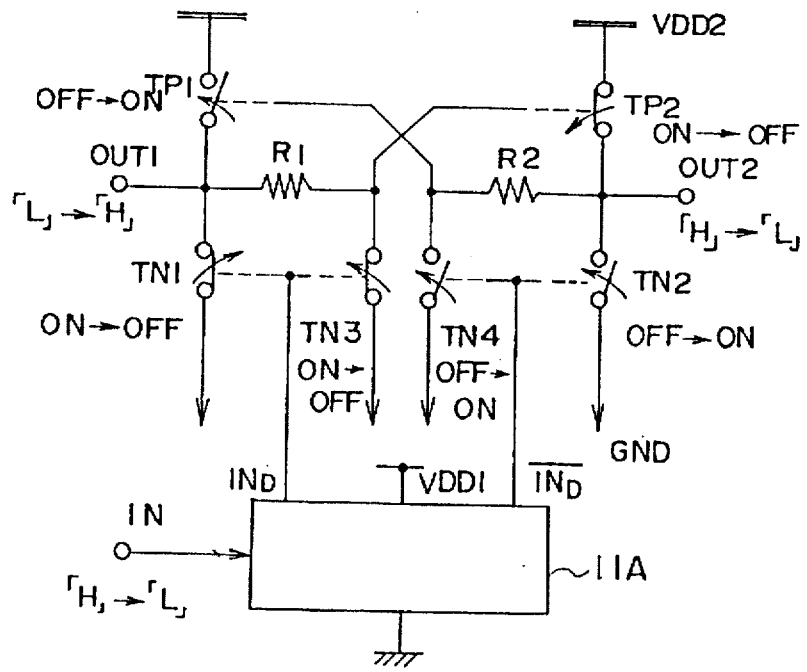
FIG. 28C is an equivalent circuit diagram for explaining the operation at transition time (IN="H"→"L") of the level converter shown in FIG. 27A.

With this, the transistor TP1 is shifted to ON operation from OFF quickly next to the OFF to ON operation of the transistor TN2 as shown in FIG. 28C, and the potential of the output OUT1 is raised from the "L" level to the "H" level steeply. Further, the transistor TP2 is shifted to OFF operation from ON quickly next to the ON to OFF operation of the transistor TN1, and the potential of the output OUT2 falls from the "H" level to the "L" level steeply.

Conversely, when the input IN is shifted from the "L" level to the "H" level, a non-inverting signal $IN_D$="L"→"H" level such as shown in FIG. 27B is supplied to the gates of the transistors TN1 and TN3 and an inverting signal $\overline{IN}_D$="H"→"L" level is supplied to the gates of the transistors TN2 and TN4 from the input latch circuit 11A. Here, the non-inverting signal $IN_D$ shifted from the "L" level to the "H" level is outputted to the transistors TN1 and TN3 behind the inverting signal $\overline{IN}_D$ shifted from the "H" level to the "L" level.

Figure 28D:
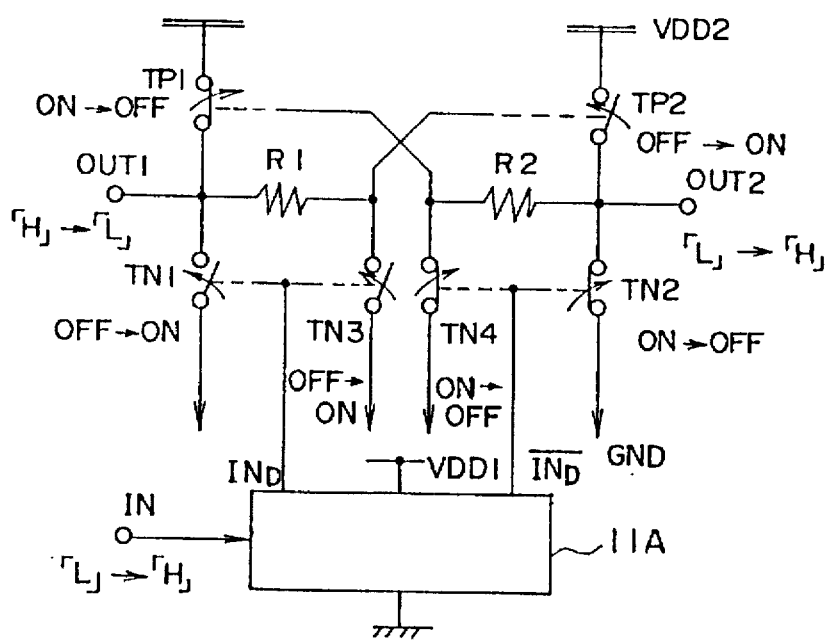
FIG. 28D is an equivalent circuit diagram for explaining the operation at transition time (IN="L"→"H") of the level converter shown in FIG. 27A.

With this, the transistor TP2 is shifted to ON operation from OFF quickly next the OFF to ON operation of the transistor TN1 as shown in FIG. 28D, and the potential of the output OUT2 is raised from the "L" level to the "H" level steeply. Further, the transistor TP1 is shifted to OFF operation from ON quickly next to the ON to OFF operation of the transistor TN2, and the potential of the output OUT2 falls from the "H" level to the "L" level steeply.

Through repeated operation of the foregoing, it is possible to convert a signal level applied with signal processing in a 3 V driving system into a potential level applicable with signal processing by a 5 V driving system.

Thus, according to a level converter related to the second preferred embodiment of the present invention, the resistances R1 and R2 and the transistors TN3 and TN4 are provided, and complementary signals $IN_D$ and $\overline{IN}_D$ are supplied to a junction point of the gates of the transistors TN1 and TN3 and a junction point of the gates of the transistors TN2 and TN4 from the input latch circuit 11A, respectively.

As a result, when the input IN is shifted from the "H" level to the "L" level, it is possible to raise the potential of the output OUT1 from the "L" level to the "H" level steeply and to lower the potential of the output OUT2 from the "H" level to the "L" level steeply. Further, when the input IN is shifted from the "L" level to the "H" level, it becomes possible to lower the potential of the output OUT1 from the "H" level to the "L" level steeply and to raise the potential of the output OUT2 from the "L" level to the "H" level steeply.

Namely, when the input IN is shifted from the "H" level to the "L" level, a non-inverting signal $IN_D$="H"→"L" level is supplied to the gates of the transistors TN1 and TN3 and a non-inverting signal $IN_D$="L"→"H" level is supplied to the gates of the transistors TN2 and TN4 from the input latch circuit 11A as shown in FIG. 27B.

Figure 29A:
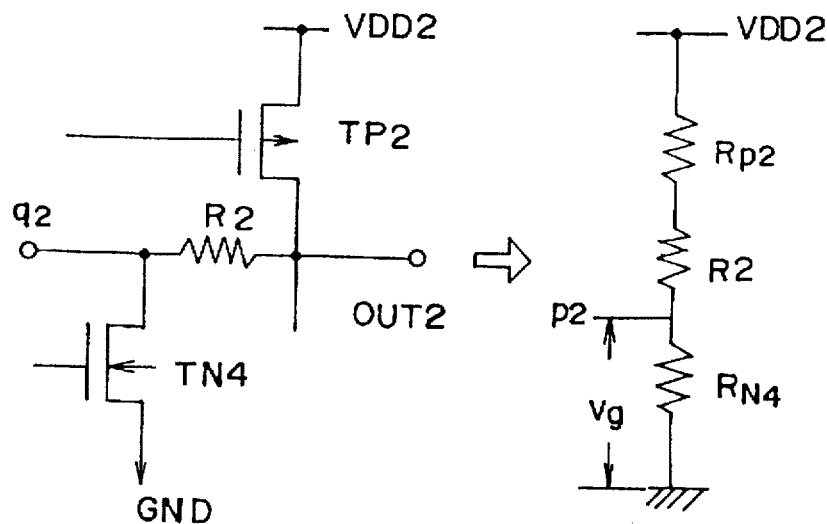
FIG. 29A is an equivalent circuit diagram seen from an output OUT2 of the level converter shown in FIG. A.

As a result, it becomes possible to shift the transistor TN1 to ON operation from OFF quickly next to the ON to OFF operation of the transistor TN1, thus making it possible to raise the potential of the output OUT1 from the "L" level to the "H" level steeply, as shown in FIG. 28C. This is because of a fact that the gate voltage of the transistor TP1 determines the switching speed by an ratio $(R_{p\,2}+R2)/R_{N\,4}$ of an ON resistance $R_{N\,4}$ of the transistor TN4 to a composite resistance of an ON resistance $R_{p\,2}$ of the transistor TP2 and the resistance R2 in an equivalent circuit diagram shown in FIG. 29A.

Figure 29B:
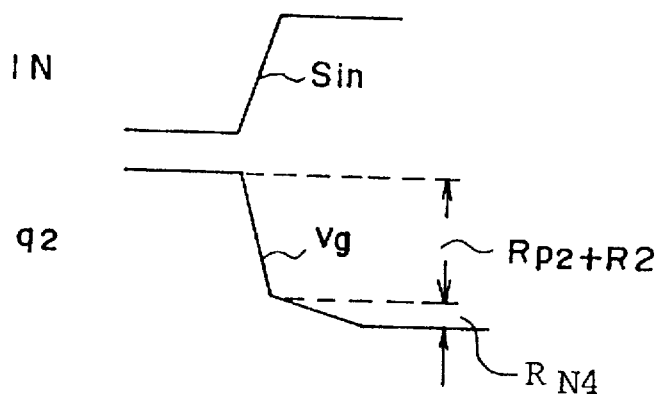
FIG. 29B is a waveform diagram showing the relationship between an input IN of the level converter shown in FIG. 27A and a point q2.

Besides, as shown in FIG. 29B, when the input IN is shifted from the "L" level to the "H" level, gate voltage Vg of the transistor TP1 falls steeply depending on the composite resistance of the ON resistance $R_{p\,2}$ of the transistor TP2 and the resistance R2, and the waveform is converged thereafter gently to the ground line level depending on the ON resistance $R_{N4}$ of the transistor TN4. Here, when the resistance R1 is designed high, it is possible to make the ON operation speed of the transistor TN4 and the ON operation speed of the transistor TP1 equal to each other, to make the rise of the transistor TP1 shorter and to turn the transistor TP2 OFF at a high speed.

Conversely, when the input IN is shifted from the "L" level to the "H" level, a non-inverting signal $IN_D$="L"→"H" level such as shown in FIG. 27B is supplied to the gates of the transistors TN1 and TN3 and an inverting signal $\overline{IN}_D$="H"→"L" level is supplied to the gates of the transistors TN2 and TN4 from the input latch circuit 11A.

As a result, when the input IN is shifted from the "L" level to the "H" level, it is also possible to shift the transistor TP2 to ON operation quickly next to the OFF operation of the transistor TN2, thus making it possible to raise the potential of the output OUT2 from the "L" level to the "H" level steeply as shown in an equivalent circuit of FIG. 28D. This is due to such a fact that the gate voltage of the transistor TP2 is determined by a ratio of an ON resistance $R_{N3}$ of the transistor TN3 to a composite resistance of the ON resistance $R_{p1}$ of the transistor TP1 and the resistance R1, i.e. $R_{N3}/(R_{p1}+R1)$ and the switching speed is thus determined.

Figure 29C:
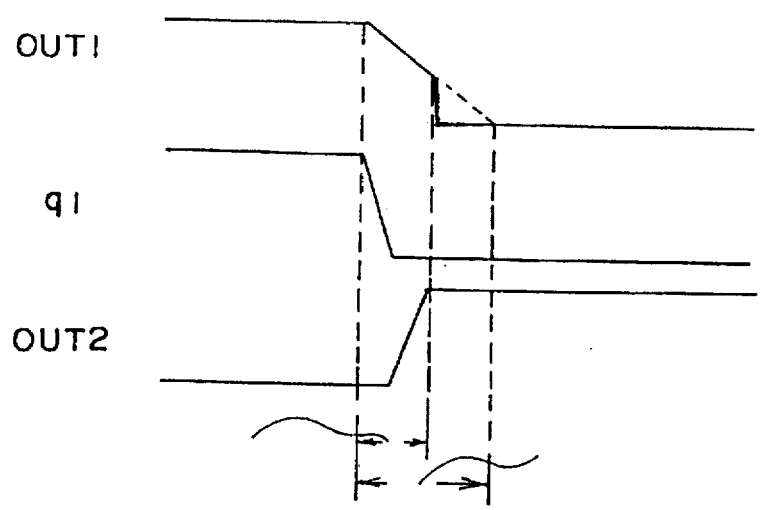
FIG. 29C relates to waveforms at outputs OUT1 and OUT2 of the level converter shown in FIG. 27A and is a comparison diagram between the present invention and the related art.

With this, since the potential level can be lowered to the potential level at a change point q1 as shown in FIG. 29C for instance, the flow of signal transmission through the output OUT2→q2→the transistor TP1→the output OUT1→q1→the transistor TP2 can be made more rapid as compared with the prior art of the present invention.

Besides, since the gate voltage of the transistor TP1 has been determined only by the ratio of the ON resistance $R_{p2}$ of the transistor TP2 to the ON resistance $R_{N2}$ of the transistor TN2 in the prior art of the present invention, it has been required to design the transistor TP2 small. In the embodiment of the present invention, however, it becomes no longer required to make the ON resistances of the transistors TP1 and TP2, and it is possible to design the transistor size of the transistors TP1 and TP2 coordinately to the other transistor sizes, thus making it easy to form various signal processing circuits including level converters in a gate array (a CMOS integrated circuit).

With the foregoing, it becomes possible to remove a through electric current between the transistors TP1 and TN1 and a through electric current between the transistors TP2 and TN2 connected to the driving power source system VDD2 and GND as that in the prior art of the present invention. With this, it becomes possible to aim at reduction of circuit power consumption of the level converter concerned and to aim at achievement of a higher speed of circuit operation as compared with the first embodiment.

(3) Description of the third preferred embodiment

Figure 30:
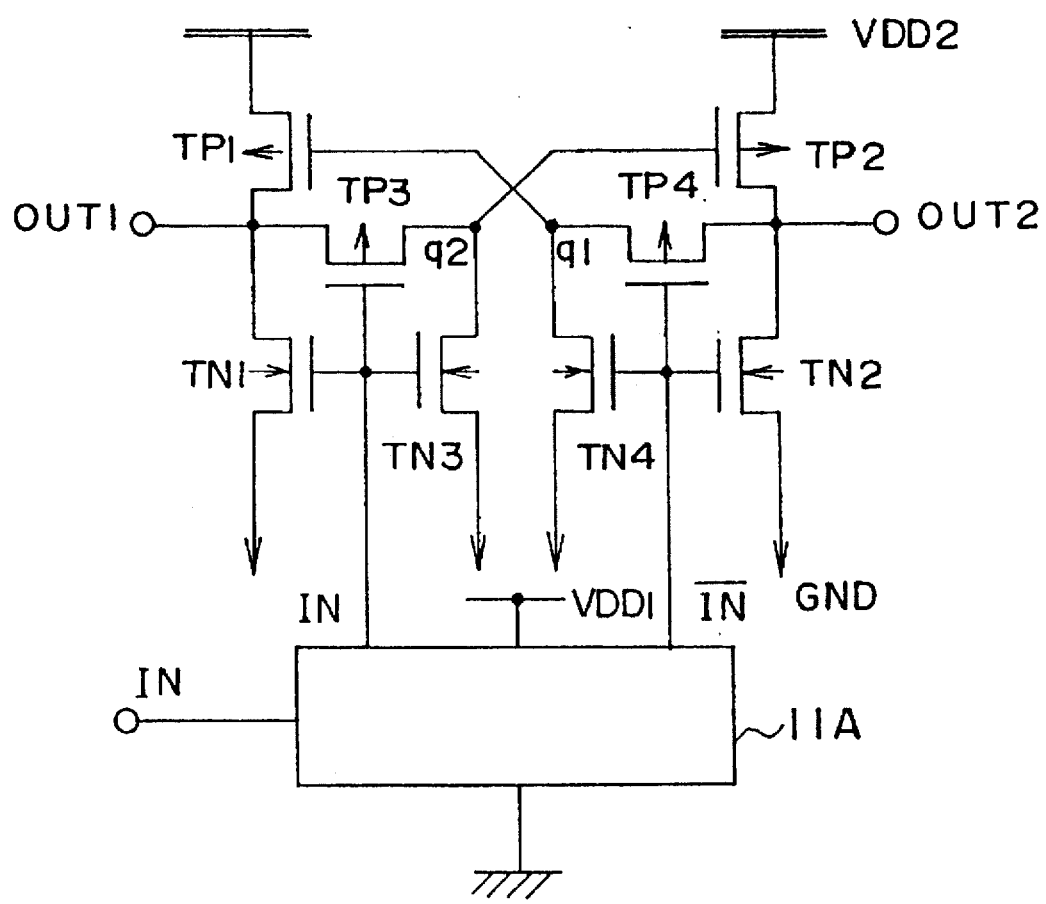
FIG. 30 is a block diagram of a level converter according to a third preferred embodiment of the present invention.

In a third embodiment of the present invention, being different from the level converter according to the second embodiment, transistors TP3 and TP4 are provided in place of the resistances R1 and R2 as shown in FIG. 30.

Namely, the transistor TP3 is an example of the seventh transistor T7 as shown in FIG. 30, and consists of a p-type field effect transistor (hereinafter referred to simply as a transistor). The transistor TP3 is connected between the gate of the transistor TP2 and the output OUT1, and has an ON resistance of approximately several KΩ depending on the ON resistance of the transistor TP2. Further, the gate of the transistor T3 is connected to the gates of the transistors TN1 and TN3, and connected further to the input latch circuit 11A.

The transistor TP4 is an example of the transistor T8, and consists of a p-type field effect transistor (hereinafter referred to simply as a transistor). The transistor TP4 is connected between the gate of the transistor TP1 and the output OUT2, and has an ON resistance of approximately several KΩ depending on the ON resistance of the transistor TP1. Further, the gate of the transistor TP4 is connected to the gates of the transistors TN2 and TN4, and connected further to the input latch circuit 11A.

With this, complementary signals $IN_D$ and $\overline{IN}_D$ are supplied to a junction point of the gates of the transistors TN1, TP3 and TN3 and a junction point of the gates of the transistors TN2, TP4 and TN4 from the input latch circuit 11A, respectively. Besides, since other construction is similar to the first and the second embodiments, the description thereof is omitted.

Next, the operation of the level converter concerned will be described with reference to FIGS. 31A to 31D. For example, at stationary time when the input IN shows the "H" level, a non-inverting signal $IN_D$="H" level is supplied to the gates of the transistors TN1, TP3 and TN3 and an inverting signal $\overline{IN}_D$="L" level is supplied to the gates of the transistors TN2, TP4 and TN4 from the input latch circuit 11A. With this, as shown in an equivalent circuit of FIG. 31A, the transistors TN1, TN3, and TP2 and TP4 are turned ON, the transistors TN2, TN4, TP1 and TP3 are turned OFF, and the output OUT1 shows the "L" level and the output OUT2 shows the "H" level.

Conversely, at stationary time when the input IN shows the "L" level, a non-inverting signal $IN_D$="L" level is supplied to the gates of the transistors TN1, TP3 and TN3 and an inverting signal $\overline{IN}_D$="H" level is supplied to the gates of the transistors TN2, TP4 and TN4 from the input latch circuit 11A. With this, as shown in an equivalent circuit of FIG. 31B, the transistors TN2, TN4, TP1 and TP4 are turned ON, the transistors TN1, TN3, TP2 and TP4 are turned OFF, and the output OUT1 shows the "H" level and the output OUT2 shows the "L" level.

Furthermore, when the input IN is shifted from the "H" level to the "L" level, a non-inverting signal $IN_D$="H"→"L" level is supplied to the gates of the transistors TN1, TN3 and TP3, and an inverting signal $\overline{IN}_D$="L"→"H" level is supplied to the gates of the transistors TN2, TN4 and TP4 from the input latch circuit 11A. Here, the inverting signal $\overline{IN}_D$ shifted from the "L" level to the "H" level is outputted to the transistors TN2, TN4 and TP4 behind the non-inverting signal $IN_D$ shifted from the "H" level to the "L" level similarly to the first embodiment.

Figure 31A:
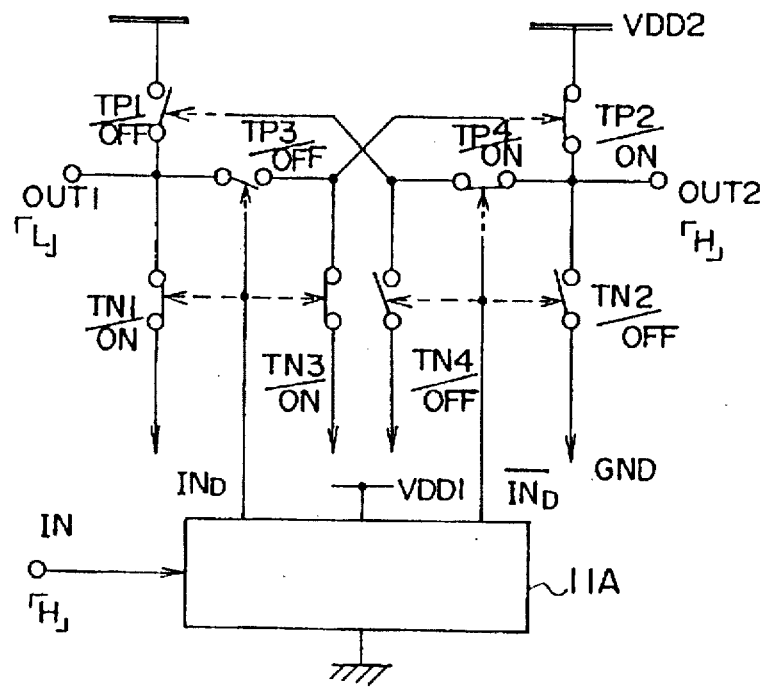
FIG. 31A is an equivalent circuit diagram for explaining the operation at stationary time (IN="H") of the level converter shown in FIG. 30.
Figure 31B:
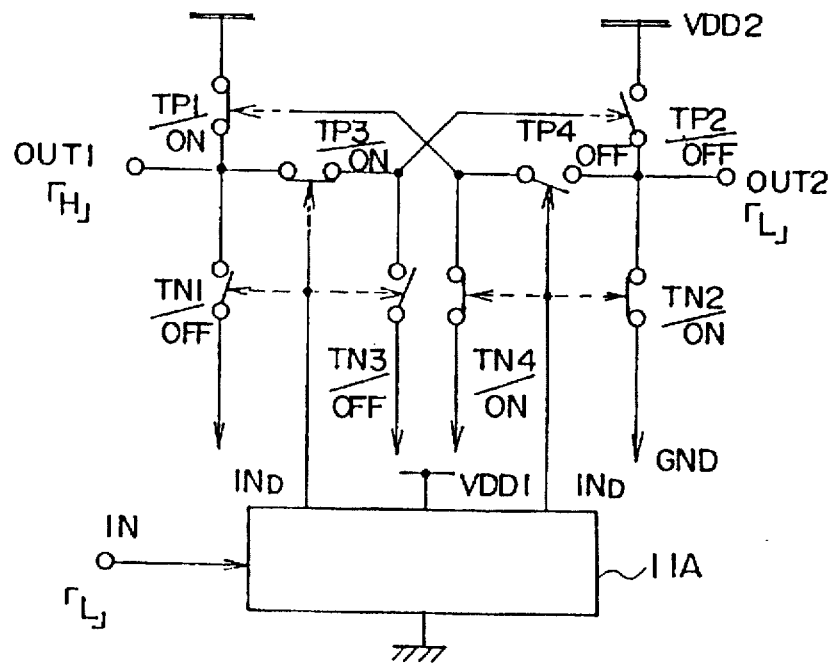
FIG. 31B is an equivalent circuit diagram for explaining the operation at stationary time (IN="L") of the level converter shown in FIG. 30.
Figure 31C:
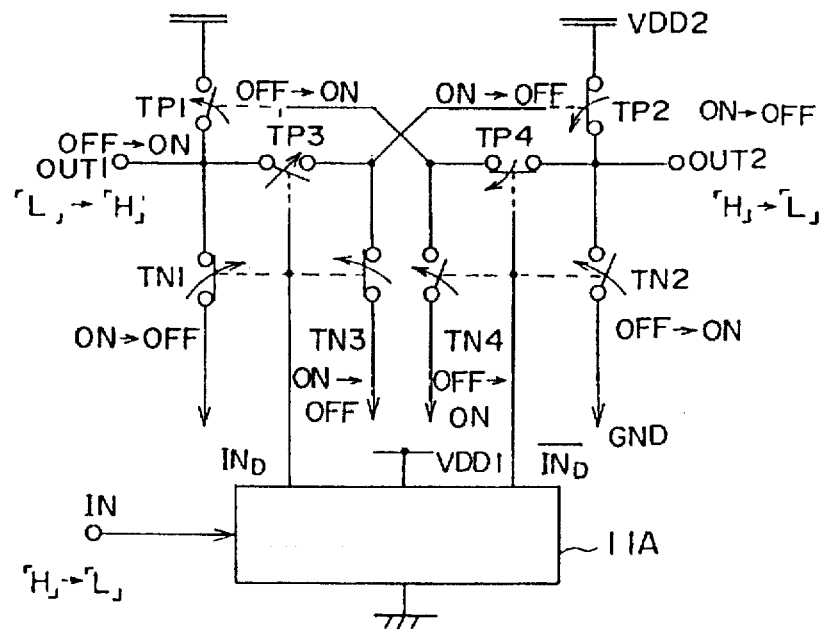
FIG. 31C is an equivalent circuit diagram for explaining the operation at transition time (IN="H"→"L") of the level converter shown in FIG. 30.

With this, as shown in FIG. 31C, the transistor TP1 is shifted from OFF to ON quickly next to the ON to OFF operation of the transistors TN1 and TN3 and the OFF to ON operation of the transistor TP3, and the potential of the output OUT1 is raised from the "L" level to the "H" level steeply. Further, the transistor TP2 is shifted from ON to OFF quickly next to the OFF to ON operation of the transistors TN2 and TN4 and the ON to OFF operation of the transistor TP4, and the potential of the output OUT2 falls from the "H" level to the "L" level steeply.

Conversely, when the input IN is shifted from the "L" level to the "H" level, a non-inverting signal $IN_D$="L"→"H" level is supplied to the gates of the transistors TN1, TN3 and TP3, and an inverting signal $\overline{IN}_D$="H"→"L" level is supplied to the gates of the transistors TN2, TN4 and TP4 from the input latch circuit 11A. Here, the non-inverting signal $IN_D$ shifted from the "L" level to the "H" level is outputted to the transistors TN1, TN3 and TP3 behind the inverting signal $\overline{IN}_D$ shifted from the "H" level to the "L" level.

Figure 31D:
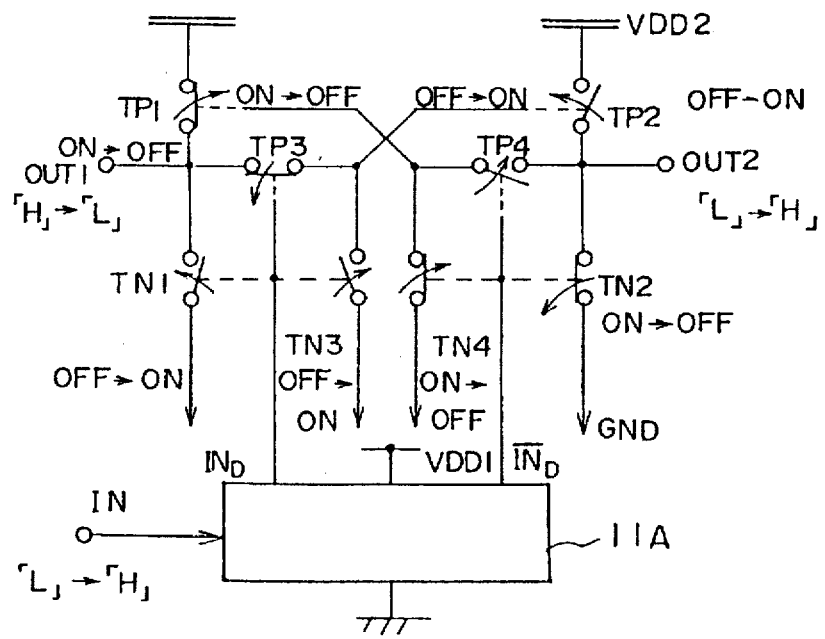
FIG. 31D is an equivalent circuit diagram for explaining the operation at transition time (IN="L"→"H") of the level converter shown in FIG. 30.

With this, as shown in FIG. 31D, the transistor TP2 is shifted from OFF to ON quickly next to the ON to OFF operation of the transistors TN2 and TN4 and the OFF to ON operation of the transistor TP4, and the potential of the output OUT2 is raised from the "L" level to the "H" level steeply. Further, the transistor TP1 is shifted from ON to OFF quickly next to the OFF to ON operation of the transistors TN1 and TN3 and the ON to OFF operation of the transistor TP3, and the potential of the output OUT1 falls from the "H" level to the "L" level steeply.

Through repeated operation of the foregoing, it is possible to convert a signal level applied with signal processing in a 3 V driving system into a potential level applicable with signal processing by a 5 V driving system similarly to the first embodiment.

Thus, according to a level converter related to the third embodiment of the present invention, as shown in FIG. 30, the transistors TP3 and TP4 are connected in place of the resistances R1 and R2 connected to the level converter according to the second embodiment, and complementary signals $IN_D$ and $\overline{IN}_D$ are supplied to a junction point of the gates of the transistors TN1, TP3 and TN3 and a junction point of the gates of the transistors TN2, TN4 and TP4 from the input latch circuit 11A, respectively.

Thus, it is possible to improve the switching speed of the output OUT1 when the input IN is shifted from the "H" level to the "L" level. Namely, the gate voltage of the transistor TP1 is determined by a ratio of an ON resistance $R_{N\,4}$ of the transistor TN4 to the composite resistance of an ON resistance $R_{p\,2}$ of the transistor TP2 and an ON resistance $R_{p\,4}$ of the transistor TP4, i.e., $R_{N\,4}/(R_{p\,2}+R_{p\,4})$. With this, it is possible to raise the potential of the output OUT1 from the "L" level to the "H" level steeply and to lower the potential of the output OUT2 from the "H" level to the "L" level steeply.

Further, the output OUT2 when the input IN is shifted from the "L" level to the "H" level is determined by a ratio of an ON resistance $R_{N\,3}$ of the transistor TN3 to the composite resistance of an ON resistance $R_{p\,1}$ of the transistor TP1 and an ON resistance $R_{p\,3}$ of the transistor TP3, i.e., $R_{N\,3}/(R_{p\,1}+R_{p\,3})$ similarly to the above. With this, it is possible to raise the potential of the output OUT2 from the "L" level to the "H" level steeply and to lower the potential of the output OUT1 from the "H" level to the "L" level steeply.

With the foregoing, it becomes possible to remove a through electric current between the transistors TP1 and TN1 and a through electric current between the transistors TP2 and TN2 connected to the driving power source system VDD2 and GND similarly to the first and the second embodiments. Thus, it becomes possible to aim at circuit power consumption of the level converter concerned and to aim at to achieve a higher speed of circuit operation similarly to the first and the second embodiments.

(4) Description of the fourth preferred embodiment

Figure 32:
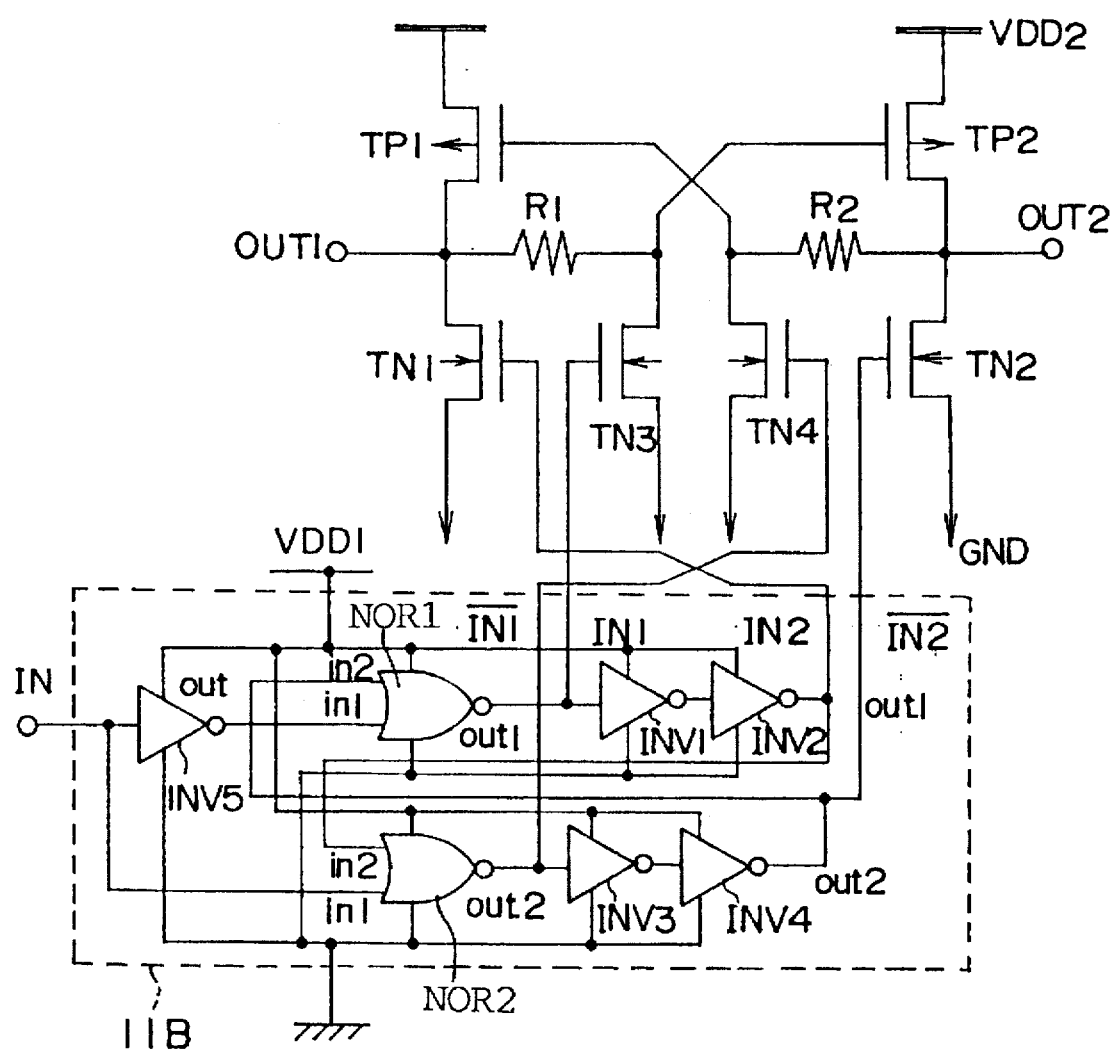
FIG. 32 is a block diagram of a level converter according to a fourth preferred embodiment of the present invention.

In a fourth embodiment of the present invention, being different from the level converter according to the second embodiment, an input latch circuit 11B for outputting two types of complementary signals IN1, IN2, $\overline{IN}_1$ and $\overline{IN}_2$ is provided and respective gates of transistors TN1 to TN4 are connected to the input latch circuits individually as shown in FIG. 32.

Namely, as shown in FIG. 32, the input latch circuit 11B is an example of the second latch circuit 11B, and consists of five units of inverters INV1 to INV5 and two units of two-input NOR circuits NOR1 and NOR2 connected to the driving power source system VDD1 and the ground line GND. The inverters INV1 and INV2 are connected in series and connected to an output out1 of the two-input NOR circuit NOR1, and the inverters INV3 and INV4 are connected in series and connected to an output out2 of the two-input NOR circuit NOR2.

Further, the input IN of the inverter INV5 is connected to one input in1 of the two-input NOR circuit NOR2, and an output out thereof is connected to one input in1 of the two-input NOR circuit NOR1. Another input in2 of the two-input NOR circuit NOR1 is connected to an output out2 of the inverter INV4, and another input in2 thereof is connected to an output out1 of the inverter INV2.

With this, a non-inverting signal IN1 is outputted from the two-input NOR circuit NOR1 to the gate of the transistor TN3, and an inverting signal $\overline{IN1}$ is outputted from the two-input NOR circuit NOR2 to the gate of the transistor TN4. Further, a non-inverting delay signal (hereinafter referred to also simply as a non-inverting signal) IN2 is outputted from the inverter INV2 to the gate of the transistor TN1, and an inverting delay signal $\overline{IN2}$ is outputted from the inverter INV4 to the gate of the transistor TN2. The operating state of the input latch circuit 11B is shown in TABLE 2.

TABLE 2

| | IN = L → H | H → L | Remarks |
|---|---|---|---|
| IN1 | L → H | H → L | |
| IN2 | L → H | H → L | Delay |
| $\overline{IN1}$ | H → L | L → H | |
| $\overline{IN2}$ | H → L | L → H | Delay |

Since other construction is similar to that in the second embodiment, the description thereof is omitted. Next, the operation of the level converter concerned will be described with reference to FIGS. 33A to 33D.

Figure 33A:
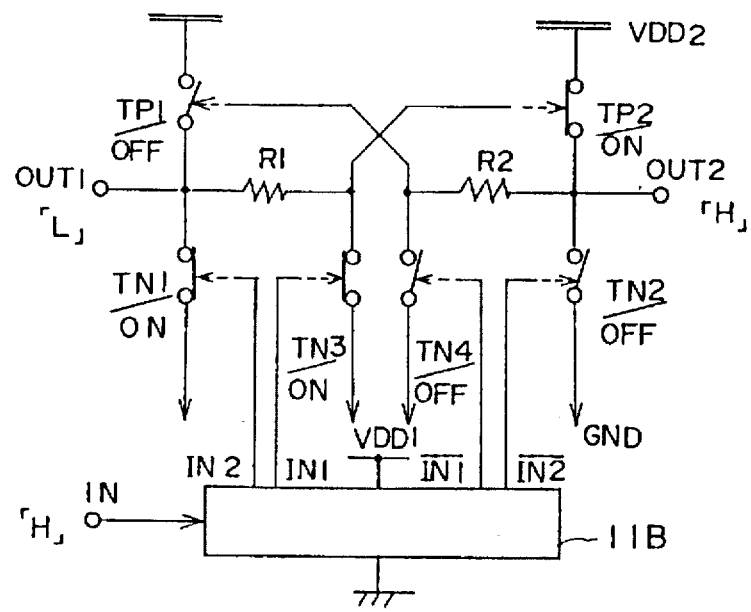
FIG. 33A is an equivalent circuit diagram for explaining the operation at stationary time (IN="H") of the level converter shown in FIG. 32.
Figure 33B:
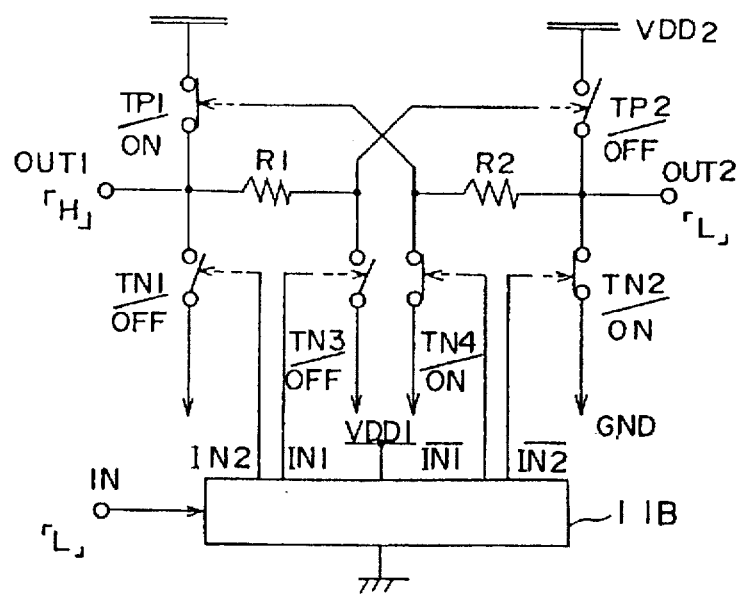
FIG. 33B is an equivalent circuit diagram for explaining the operation at stationary time (IN="L") of the level converter shown in FIG. 32.

For example, at stationary time when the input IN shows the "H" level, a non-inverting signal IN1="H" level is supplied to the gate of the transistor TN3 and an inverting signal $\overline{IN1}$="L" level is supplied to the gate of the transistor TN4 from the input latch circuit 11B. Further, a non-inverting signal IN2="H" level is supplied to the gate of the transistor TN1 and an inverting signal $\overline{IN2}$="L" level is supplied to the gate of the transistor TN2 from the input latch circuit 11B. With this as shown in FIG. 33A, the transistors TN1, TN3 and TP2 are turned ON, the transistors TN2, TN4 and TP1 are turned OFF, and the output OUT1 shows the "L" level and the output OUT2 shows the "H" level similarly to the second embodiment.

Conversely, at stationary time when the input IN shows the "L" level a non-inverting signal IN1="L" level is supplied to the gate of the transistor TN3 and an inverting signal IN1="H" level is supplied to the gate of the transistor TN4 from the input latch circuit 11B. Further, a non-inverting signal IN2="L" level is supplied to the gate of the transistor TN1 and an inverting signal $\overline{IN2}$="H" level is supplied to the gate of the transistor TN2 from the input latch circuit 11B. With this, as shown in an equivalent circuit of FIG. 33B, the transistors TN2, TN4 and TP1 are turned ON, the transistors TN1, TN3 and TP2 are turned OFF, and the output OUT1 shows the "H" level and the output OUT2 shows the "L" level.

Furthermore, when the input IN is shifted from the "H" level to the "L" level, a non-inverting signal IN1="H"→"l" level is supplied to the gate of the transistor TN3 and an inverting signal $\overline{IN1}$="L"→"H" level is supplied to the gate of the transistor TN4 from the input latch circuit 11B. Further, a non-inverting signal IN2="H"→"L" level is supplied to the gate of the transistor TN1 and an inverting signal $\overline{IN2}$="L"→"H" level is supplied to the gate of the transistor TN2 from the input latch circuit 11B.

Figure 33C:
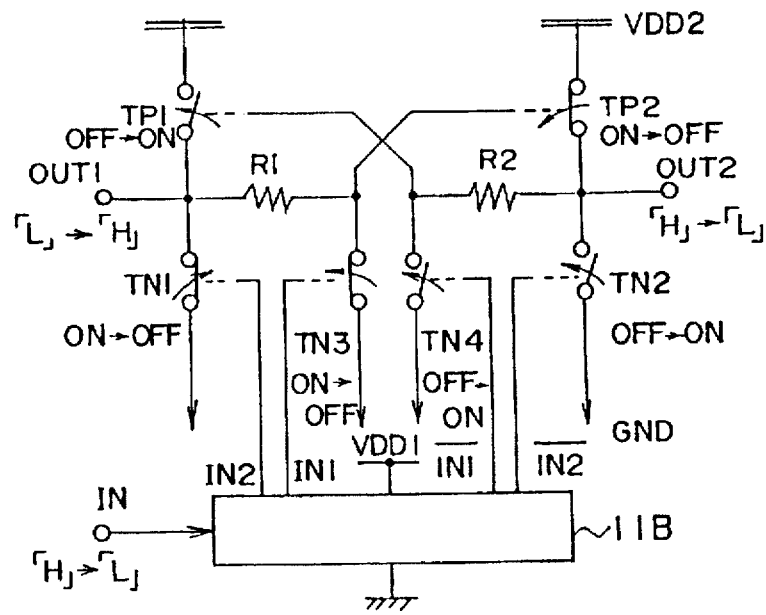
FIG. 33C is an equivalent circuit diagram for explaining the operation at transition time (IN="H"→"L") of the level converter shown in FIG. 32.

With this, as shown in FIG. 33C, the transistor TN3 is turned OFF from ON before TN1, and the transistor TN4 is turned ON from OFF before TN2. Then, the transistor TP1 is shifted from OFF to ON quickly, and the potential of the output OUT1 is raised from the "L" level to the "H" level steeply. Further, the transistor TP2 is shifted from ON to OFF quickly next to the ON to OFF operation of the transistor TN1, and the potential of the output OUT2 falls from the "H" level to the "L" level steeply.

Conversely, when the input IN is shifted from the "L" level to the "H" level, an inverting signal $\overline{IN1}$="H"→"L" level is supplied to the gate of the transistor TN4 and a non-inverting signal IN2="L"→"H" level is supplied to the gate of the transistor TN3 from the input latch circuit 11B. Further, a non-inverting signal IN1="L"→"H" level is supplied to the gate of the transistor TN1 and an inverting signal $\overline{IN2}$="H"→"L" level is supplied to the gate of the transistor TN2 from the input latch circuit 11B.

Figure 33D:
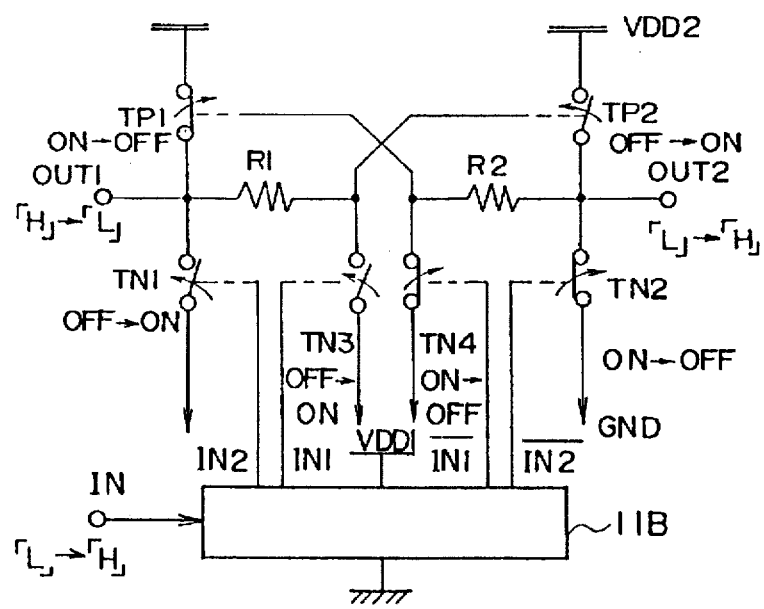
FIG. 33D is an equivalent circuit diagram for explaining the operation at transition time (IN="L"→"H") of the level converter shown in FIG. 32.

With this, as shown in FIG. 33D, the transistor TN4 is turned OFF from ON before TN2, and the transistor TN3 is turned ON from OFF before TN1. Then, the transistor TP2 is turned ON from OFF quickly, and the potential of the output OUT2 is raised from the "L" level to the "H" steeply level. Further, the transistor TP1 is turned OFF from ON quickly next to the ON to OFF operation of the transistor TN2, and the potential of the output OUT1 falls from the "H" level to the "L" level steeply.

Through repeated operation of the foregoing, it is possible to convert the signal level applied with signal processing by a 3 V driving system into a potential level applicable with signal processing by a 5[V] driving system similarly to the first embodiment.

Thus, according to a level converter related to the fourth embodiment of the present invention, respective gates of the transistors TN1 to TN4 are connected to the input latch circuit 11B individually as shown in FIG. 32.

As a result, when the input IN is shifted from the "H" level to the "L" level, a non-inverting signal IN1="H"→"L" level is supplied to the transistor TN3 and an inverting signal $\overline{IN1}$="L"→"H" level is supplied to the transistor TN4. Further, a non-inverting signal IN2="H"→"L" level is supplied to the transistor TN1 and an inverting signal $\overline{IN2}$="L"→"H" level is supplied to the transistor TN2.

Further, when the input IN is shifted from the "L" level to the "H" level, an inverting signal $\overline{IN1}$="H"→"L" level is supplied to the transistor T4 and a non-inverting signal IN2="L"→"H" level is supplied to the transistor TN1. Further, a non-inverting signal IN1="L"→"H" level is supplied to the transistor TN3, and an inverting signal $\overline{IN2}$="H"→"L" level is supplied to the transistor TN1.

Thus, it is possible to raise the potential of the output OUT1 from the "L" level to the "H" level steeply and to lower the potential of the output OUT2 from the "H" level to the "L" level steeply when the input IN is shifted from the "H" level to the "L" level similarly to the second embodiment. Further, when the input IN is shifted from the "L" level to the "H" level, it becomes possible to lower the potential of the output OUT1 from the "H" level to the "L" level steeply and to raise the potential of the output OUT2 from the "L" level to the "H" level steeply.

With this, similarly to the second and the third embodiments, it becomes possible to remove a through electric current between the transistors TP1 and TN1 and a through electric current between the transistors TP2 and TN2 connected to the driving power source system VDD2 and GND. Thus, it becomes possible to aim at reduction of circuit power consumption of the level converter concerned and to aim at to achieve a higher speed of circuit operation similarly to the second and the third embodiments.

(5) Description of the fifth preferred embodiment

Figure 34:
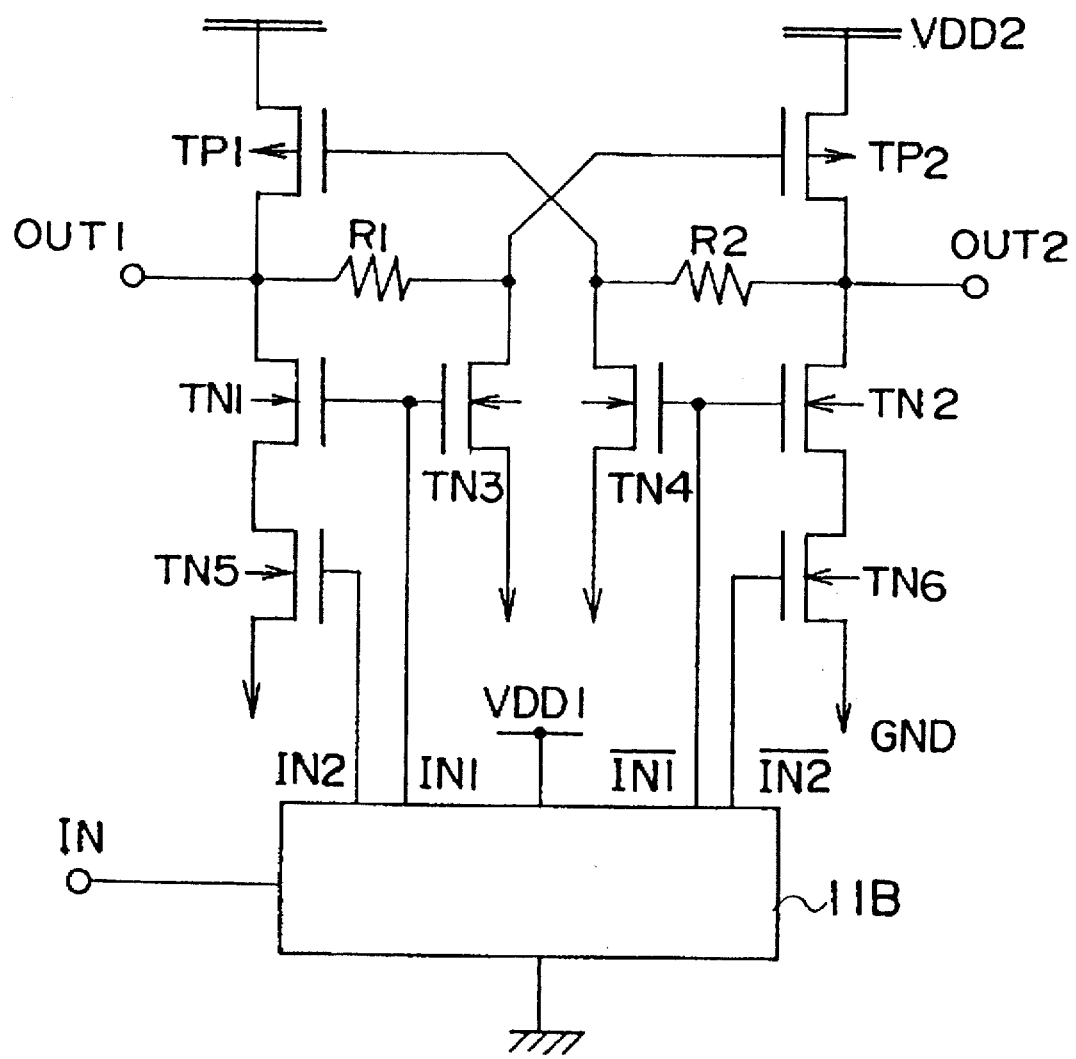
FIG. 34 is a block diagram of a level converter according to a fifth preferred embodiment of the present invention.

In a fifth embodiment, being different from the level converter according to the second embodiment, transistors TN5 and TN6 are connected to low potential sides of transistors TN1 and TN2 as shown in FIG. 34, and transistors TN1 and TN3, transistor TN5, transistors TN2 and TN4 and transistor TN6 are controlled individually by means of the input latch circuit 11B shown in the fourth embodiment.

Namely, as shown in FIG. 34, the transistor TN5 is an example of the transistor T9, and consists of an n-type field effect transistor (hereinafter referred to simply as a transistor). The drain of the transistor TN5 is connected to the source of the transistor TN1, and the source of the transistor TN5 is connected to the ground line GND.

The transistor TN6 is an example of the transistor T10, and consists of an n-type field effect transistor (hereinafter referred to simply as a transistor). The drain of the transistor TN6 is connected to the source of the transistor TN2, and the source of the transistor TN6 is connected to the ground line GND. Besides, respective gates of the transistors TN5 and TN6 are connected to the input latch circuit 11B.

Further, respective gates of the transistors TN1 and TN3 are connected to the input latch circuit 11B, and respective gates of the transistors TN2 and TN4 are connected to the input latch circuit 11B similarly to the above. With this, a non-inverting signal IN1 is outputted to the gates of the transistors TN1 and TN3, and an inverting signal $\overline{IN1}$ is outputted to the gates of the transistors TN2 and TN4.

Further, a non-inverting delay signal IN2 is outputted to the gate of the transistor TN5, and an inverting delay signal $\overline{IN2}$ is outputted to the gate of the transistor TN6. Besides, since other constructions are similar to those of the second embodiment, the description thereof is omitted.

Figure 35A:
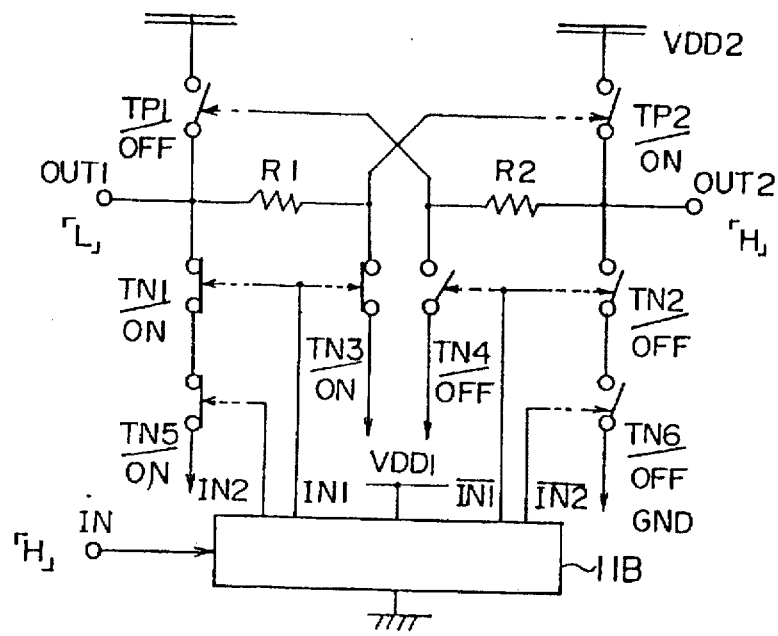
FIG. 35A is an equivalent circuit diagram for explaining the operation at stationary time (IN="H") of the level converter shown in FIG. 34.
Figure 35B:
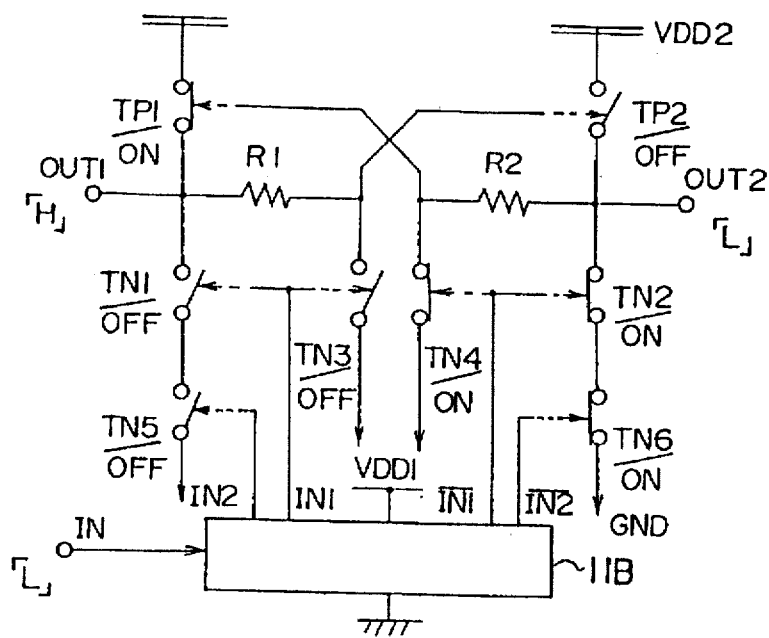
FIG. 35B is an equivalent circuit diagram for explaining the operation at stationary time (IN="L") of the level converter shown in FIG. 34.

Next, the operation of the level converter concerned will be described with reference to the equivalent circuit diagrams of FIGS. 35A to 35D. For example, at stationary time when the input IN shows the "H" level, a non-inverting signal IN1="H" level is supplied to the gates of the transistors TN1 and TN3 and an inverting signal $\overline{IN1}$="L" level is supplied to the gates of the transistors TN2 and TN4 from the input latch circuit 11B. Further, a non-inverting signal IN2="H" level is supplied to the gate of the transistor TN5 and an inverting signal $\overline{IN2}$="L" level is supplied to the gate of the transistor TN6 from the input latch circuit 11B. With this, as shown in FIG. 35A, the transistors TN1, TN3, TN5 and TP2 are turned ON, the transistors TN2, TN4, TN6 and TP1 are turned OFF, and the output OUT1 shows the "L" level and the output OUT2 shows the "H" level similarly to the second embodiment.

Conversely, at stationary time when the input IN shows the "L" level, a non-inverting signal IN1="L" level is supplied to the gates of the transistors TN1 and TN3 and a non-inverting signal IN2="L" level is supplied to the gate of the transistor TN5 from the input latch circuit 11B. Further, an inverting signal $\overline{IN1}$="H" level is supplied to the gates of the transistors TN2 and TN4 and an inverting signal $\overline{IN2}$="H" level is supplied to the gate of the transistor TN6 from the input latch circuit 11B. With this, as shown in the equivalent circuit of FIG. 35B, the transistors TN2, TN4, TN6 and TP1 are turned OFF, the transistors TN2, TN4, TN6 and TP1 are turned ON, and the output OUT1 shows the "H" level and the output OUT2 shows the "L" level.

Furthermore, when the input IN is shifted from the "H" level to the "L" level, a non-inverting signal IN1="H"→"L"

level is supplied to the gates of the transistors TN1 and TN3, and an inverting signal $\overline{IN1}$="L"→"H" level is supplied to the gates of the transistors TN2 and TN4. Further, a non-inverting signal IN2="H"→"L" level is supplied to the gate of the transistor TN5, and an inverting signal $\overline{IN2}$="L"→"H" level is supplied to the gate of the transistor TN6.

Figure 35C:
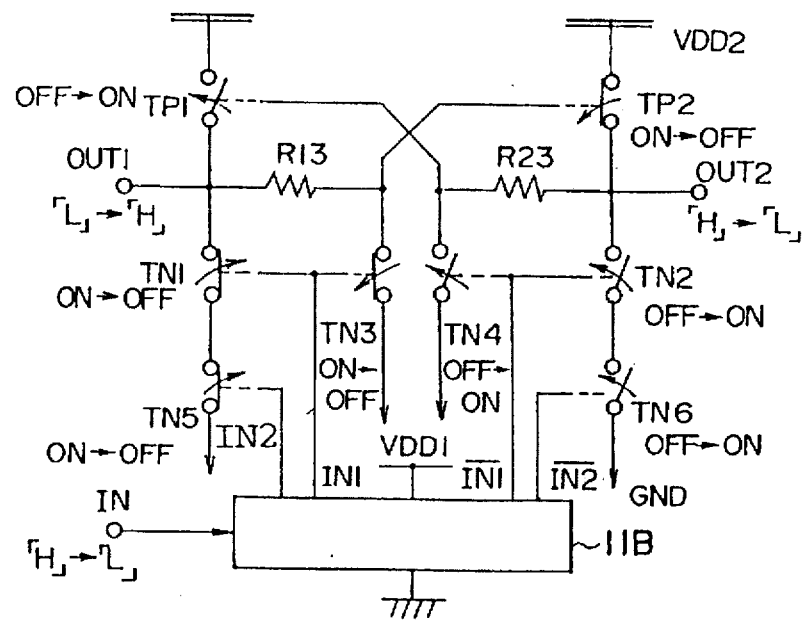
FIG. 35C is an equivalent circuit diagram for explaining the operation at transition time (IN="H"→"L") of the level converter shown in FIG. 34.

With this, as shown in FIG. 35C, the transistors TN3 and TN1 are turned OFF from ON before TN5, and the transistors TN4 and TN2 are turned ON from OFF behind TN6. Then, the transistor TP1 is turned ON from OFF quickly, and the potential of the output OUT1 is raised from the "L" level to the "H" level steeply. Further, the transistor TP2 is turned OFF from ON quickly next to the ON to OFF operation of the transistor TN5, and the potential of the output OUT2 falls from the "H" level to the "L" level steeply.

Conversely, when the input IN is shifted from the "L" level to the "H" level, a non-inverting signal IN1="L"→"H" level is supplied to the gates of the transistors TN1 and TN3, and a non-inverting signal IN2="L"→"H" level is supplied to the gate of the transistor TN5. Further, an inverting signal $\overline{IN1}$="H"→"L" level is supplied to the gates of the transistors TN2 and TN4, and an inverting signal $\overline{IN2}$="H"→"L" level is supplied to the gate of the transistor TN6.

Figure 35D:
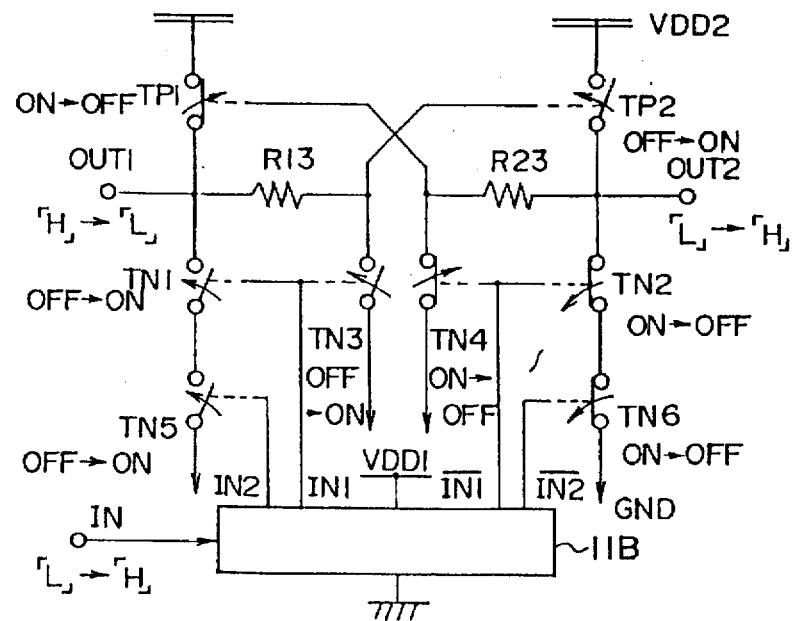
FIG. 35D is an equivalent circuit diagram for explaining the operation at transition time (IN="L"→"H") of the level converter shown in FIG. 34.

With this, as shown in FIG. 35D, the transistors TN4 and TN2 are turned OFF from ON before TN6, and the transistors TN1 and TN3 are turned ON from OFF before TN5. Then, the transistor TP2 is turned ON from OFF quickly, and the potential of the output OUT2 is raised from the "L" level to the "H" level steeply. Further, the transistor TP1 is turned OFF from ON quickly next to the ON to OFF operation of the transistor TN2, and the potential of the output OUT1 falls from the "H" level to the "L" level steeply.

Through repeated operation of the foregoing, it is possible to convert the signal level applied with signal processing by a 3 V driving system into a potential level applicable with signal processing by a 5 V driving system.

Thus, according to a level converter related to the fifth embodiment of the present invention, as shown in FIG. 34, the transistors TN5 and TN6 are connected to the low potential sides of the transistors TN1 and TN2, a non-inverting signal IN1 is supplied to respective gates of the transistors TN1 and TN3 from the input latch circuit 11B shown in the fourth embodiment, a non-inverting delay signal IN2 is supplied to the gate of the transistor TN5, an inverting signal $\overline{IN1}$ is supplied to respective gates of the transistors TN2 and TN4, and an inverting delay signal $\overline{IN2}$ is supplied to the gate of the transistor TN6.

As a result, when the input IN is shifted from the "H" level to the "L" level, it is possible to raise the potential of the output OUT1 from the "L" level to the "H" level steeply and to lower the potential of the output OUT2 from the "H" level to the "L" level steeply similarly to the second to the fourth level converters. Further, when the input IN is shifted from the "L" level to the "H" level, it becomes possible to lower the potential of the output OUT1 from the "H" level to the "L" level steeply and to raise the potential of the output OUT2 from the "L" level to the "H" level steeply.

With this, similarly to the second to the fourth embodiments, it becomes possible to remove a through electric current between the transistors TP1 and TN1 and a through electric current between the transistors TP2 and TN2 connected to the driving power source system VDD2 and GND. Thus, it becomes possible to aim at reduction of circuit power consumption of the level converter concerned and to aim at to achieve a higher speed of circuit operation similarly to the second to the fourth embodiments.

Besides, level converters which are driven by the power lines VDD1 and VDD2 at a higher potential, with the potential level of the ground line GND as the reference, than the zero potential thereof have been described in the first to the fifth embodiments, but the construction of level converters driven by the power lines GND1 and GND2 at a lower potential, with the potential level of the ground line GND as the reference, than the zero potential thereof will be described briefly in a sixth to a tenth embodiments.

(6) Description of the sixth preferred embodiment

A level converter according to a sixth embodiment different from the first to the fifth embodiments of the present invention is driven by power lines GND1 and GND2 at the potential, with the potential of a common power line VDD as the reference, lower than the potential of the power line VDD.

Figure 36A:
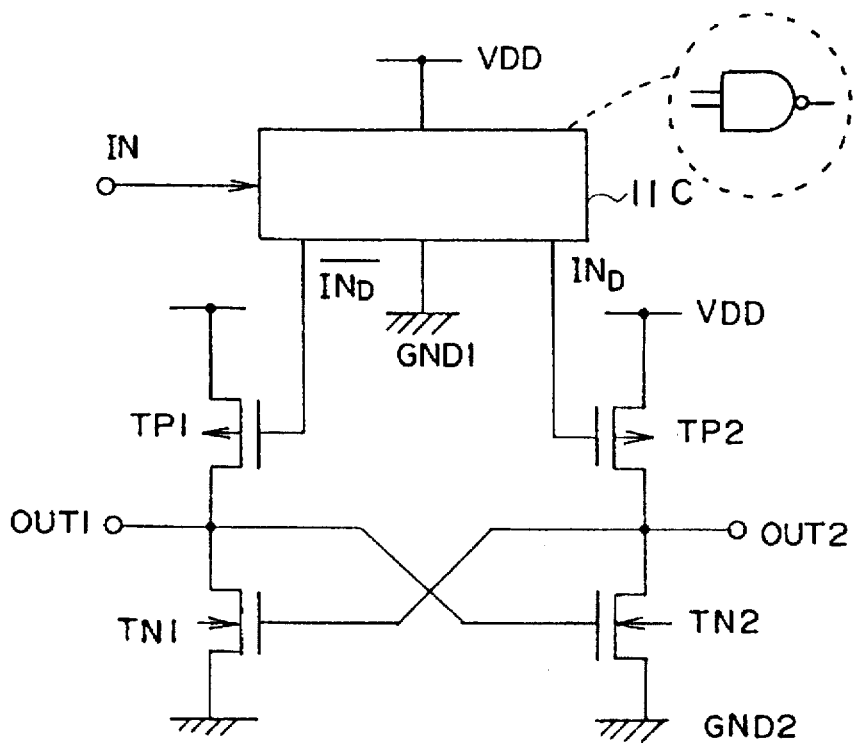
FIG. 36A is a block diagram of a level converter according to a sixth preferred embodiment of the present invention.

Namely, a sixth level converter of the present invention is composed of an input latch circuit 11C and four transistors TP1, TP2, TN1 and TN2 as shown in FIG. 36A. The input latch circuit 11C is another example of the transistor circuit 11, and connected between a power line GND1 (driving voltage=approximately −3 V) which becomes a first driving power source system and a common ground line VDD (0 V).

Besides, the input latch circuit 11C latches an input signal Sin and supplies complementary signals $IN_D$ and $\overline{IN}_D$ to the gate of the transistor TP1 and the gate of the transistor TP2, respectively. As to the internal structure of the input latch circuit 11C, the two-input NOR circuit is changed to a two-input NAND circuit, but other structures are similar to those of the first embodiment. Hence, the description thereof is omitted.

The transistor TP1 is an example of the first transistor T1, and consists of a p-type field effect transistor (hereinafter referred to simply as a transistor). The source of the transistor TP1 is connected to a common power line VDD which becomes the second driving power source system, the drain thereof is connected to the output OUT1 and the drain of the transistor TN1, and the gate thereof is connected to the output OUT2, respectively.

The transistor TP2 is an example of the third transistor T3, and consists of a p-type field effect transistor. The source of the transistor TP2 is connected to the power line VDD (driving voltage=approximately 0 V), the drain thereof is connected to the output OUT2 and the drain of the transistor TN2, and the gate thereof is connected to the input latch circuit 11C, respectively.

The transistor TN1 is an example of the second transistor T2, and consists of an n-type field effect transistor (hereinafter referred to simply as a transistor). The source of the transistor TN1 is connected to a ground line GND2, the drain thereof is connected to the output OUT1 and the drain of the transistor TP1, and the gate thereof is connected to the output OUT2.

The transistor TN2 is an example of the transistor T4, and consists of an n-type field effect transistor. The source of the transistor TN2 is connected to the ground line GND2, the drain thereof is connected to the output OUT2 and the drain of the transistor TP2, and the gate thereof is connected to the output OUT1.

Figure 36B:
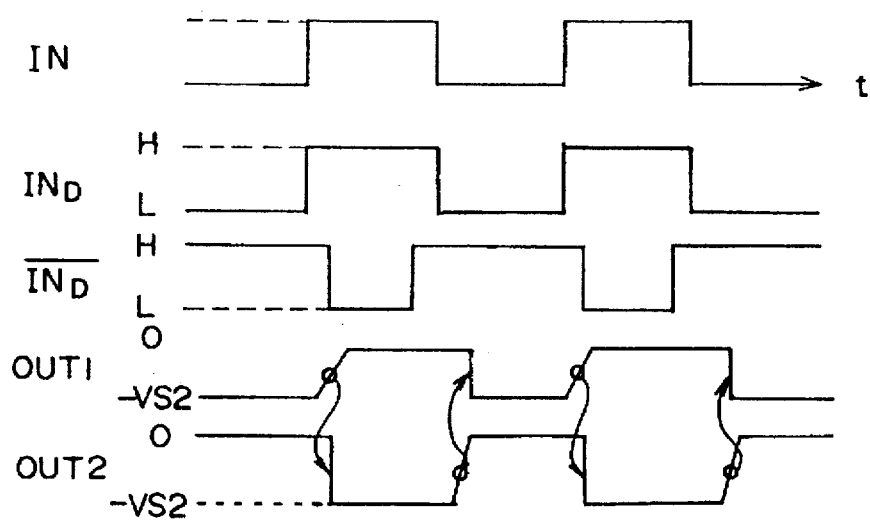
FIG. 36B is an operating waveform diagram of the level converter shown in FIG. 36A.

Next, the operation of the level converter concerned will be described with reference to FIG. 36B. As shown in FIG. 36B, at stationary time when the input IN shows the "H" level for instance, an inverting signal $\overline{IN}_D$="L" level is supplied to the gate of the transistor TP1 from the input latch circuit 11C, and a non-inverting signal $IN_D$="H" level is supplied to the gate of the transistor TP2. With this, the transistors TP1 and TN2 are turned ON, the transistors TP2 and TN1 are turned OFF, and the output OUT1 shows the "H" level and the output OUT2 shows the "L" level.

Conversely, at stationary time when the input IN shows the "L" level, an inverting signal $\overline{IN}_D$="H" level is supplied to the gate of the transistor TP1 and a non-inverting signal $IN_D$="L" level is supplied to the gate of the transistor TP2 from the input latch circuit 11C. With this, the transistors TP2 and TN1 are turned ON, the transistors TP1 and TN2 are turned OFF, and the output OUT1 shows the "L" level and the output OUT2 shows the "H" level.

Furthermore, at transition time when the input IN is shifted from the "H" level to the "L" level, an inverting signal $\overline{IN}_D$="L"→"H" level is supplied to the gate of the transistor TP1, and a non-inverting signal $IN_D$="H"→"L" level is supplied to the gate of the transistor TP2. With this, the transistors TP1 and TN2 are turned OFF from ON, the transistors TP2 and TN1 are shifted from OFF-state to ON-state, the output OUT1 falls from the "H" level to the "L" level, and the output OUT2 is raised from the "L" level to the "H" level. Conversely, at stationary time when the input IN is shifted from the "L" level to the "H" level, an inverting signal $\overline{IN}_D$="H"→"L" level is supplied to the gate of the transistor TP1 from the input latch circuit 11C, and a non-inverting signal $IN_D$="L"→"H" level is supplied to the gate of the transistor TP2. With this, the transistors TP2 and TN1 are turned OFF from ON, the transistors TP1 and TN2 are shifted from OFF state to ON state, the output OUT1 is raised from the "L" level to the "H" level, and the output OUT2 falls from the "H" level to the "L" level.

Through repeated operation of the foregoing, it is possible to convert the signal level applied with signal processing by a −3 V driving system into a potential level applicable with signal processing by a 5 V driving system.

Thus, according to a level converter related to the sixth embodiment of the present invention, as shown in FIG. 36A, it becomes possible to remove a through electric current between the transistors TP1 and TN1 and a through electric current between the transistors TP2 and TN2 connected between the power lines VDD and GND2 similarly to the first to the fifth embodiments also when a level conversion circuit connected to the ground lines GND1 and GND2 is formed with the potential of the power line VDD as the reference.

With this, it becomes possible to aim at reduction of circuit power consumption of the level converter concerned and to aim at to achieve a higher speed of circuit operation similarly to the first to the fifth embodiments.

(7) Description of the seventh preferred embodiment

Figure 37:
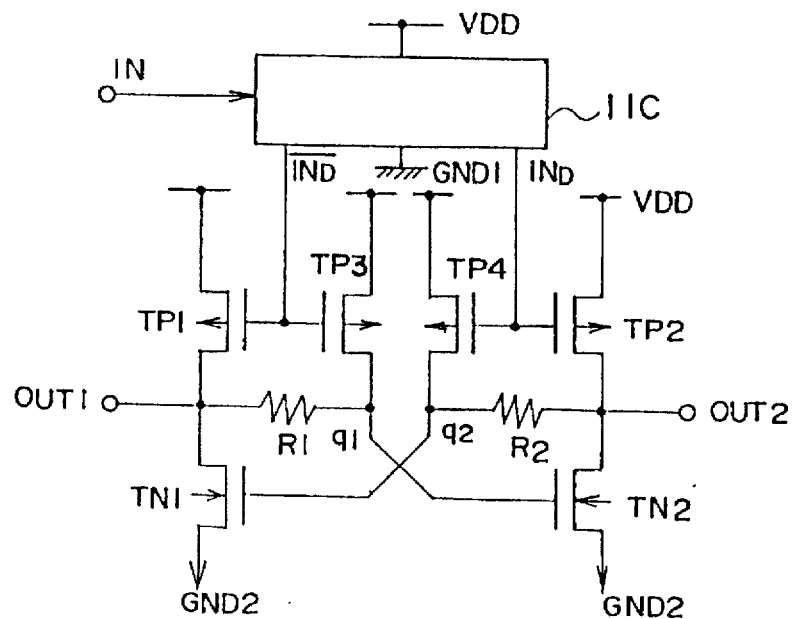
FIG. 37 is a block diagram of a level converter according to a seventh preferred embodiment of the present invention.

What is different from the sixth embodiment in a seventh embodiment is that resistances R1 and R2 and transistors TP3 and TP4 are connected as shown in FIG. 37. Namely, the resistance R1 is connected between the gate of the transistor TN2 and the output OUT1, and has a resistance value of approximately several KΩ depending on the ON resistance of the transistor TN1. The resistance R2 is connected between the gate of the transistor TN1 and the output OUT2, and has a resistance value of approximately several KΩ depending on the ON resistance of the transistor TN2.

The transistor TP3 is an example of the transistor T5, and consists of a p-type field effect transistor (hereinafter referred to simply as a transistor). The drain of the transistor TP3 is connected to a junction point q1 of the resistance R1 and the gate of the transistor TN2, and the source thereof is connected to the ground line VDD. Further, the gate of the transistor TP3 is connected to the gate of the transistor TP1 and connected further to the input latch circuit 11C.

The transistor TN4 is an example of the sixth transistor T6, and consists of a p-type field effect transistor (hereinafter referred to simply as a transistor). The drain of the transistor TP4 is connected to a junction point q2 of the resistance R2 and the gate of the transistor TN1, and the source thereof is connected to the ground line VDD. Further, the gate of the transistor TP4 is connected to the gate of the transistor TP2 and connected further to the input latch circuit 11C. Besides, since other constructions thereof are similar to those of the sixth embodiment, the description thereof is omitted.

Thus, according to a level converter related to the seventh embodiment of the present invention, as shown in FIG. 37, the resistances R1 and R2 and the transistors TP3 and TP4 are provided, and complementary signals $IN_D$ and $\overline{IN}_D$ are supplied to the junction point of the gates of the transistors TP1 and TP3 and the junction point of the gates of the transistors TP2 and TP4 from the input latch circuit 11C, respectively.

As a result, it becomes possible to remove a through electric current between the transistors TP1 and TN1 and a through electric current between the transistors TP2 and TN2 connected to power lines VDD and GND2 similarly to the second embodiment.

With this, it becomes possible to aim at reduction of circuit power consumption of the level converter concerned similarly to the first to the sixth embodiments and to aim at to achieve a higher speed of circuit operation similarly to the second embodiment.

(8) Description of the eighth preferred embodiment

Figure 38:
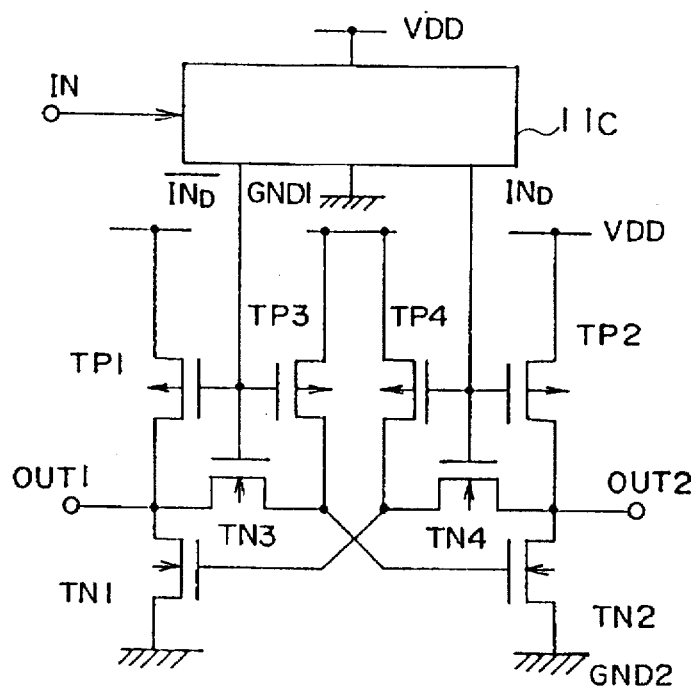
FIG. 38 is a block diagram of a level converter according to an eighth preferred embodiment of the present invention.

What is different from the seventh embodiment in an eighth embodiment is that transistors TN3 and TN4 are connected in place of the resistances R1 and R2 as shown in FIG. 38.

Namely, the transistor TN3 is an example of the seventh transistor T7, and consists of an n-type field effect transistor (hereinafter referred to simply as a transistor). The source of the transistor TN3 is connected between the gate of the transistor TN2 and the output OUT1, and has ON resistance of approximately several KΩ depending on the ON resistance of the transistor TN1. Further, the gate of the transistor TN3 is connected to the gates of the transistors TP1 and TP3 and connected further to the input latch circuit 11C.

The transistor TN4 is an example of the eighth transistor T8, and consists of an n-type field effect transistor (hereinafter referred to simply as a transistor). The transistor TN4 is connected between the gate of the transistor TN1 and the output OUT2, and has ON resistance of approximately several KΩ depending on the ON resistance of the transistor TN2. Further, the gate of the transistor TN4 is connected to the gates of the transistors TP2 and TP4 and connected further to the input latch circuit 11C. Besides, since other constructions thereof are similar to those of the sixth embodiment, the description thereof is omitted.

Thus, according to a level converter related to the eighth embodiment of the present invention, as shown in FIG. 38, the resistances R1 and R2 and the transistors TN3 and TN4 are provided, and complementary signals $IN_D$ and $\overline{IN}D$ are supplied to the junction point of the gates of the transistors TP1, TP3 and TN3 and the junction point of the gates of the transistors TP2, TP4 and TN4 from the input latch circuit 11C, respectively.

As a result, it becomes possible to remove a through electric current between the transistors TP1 and TN1 and a through electric current between the transistors TP2 and TN2 connected to power lines VDD and GND2 similarly to the seventh embodiment.

With this, it becomes possible to aim at reduction of circuit power consumption of the level converter concerned similarly to the first to the sixth embodiments, and to aim at to achieve a higher speed of circuit operation similarly to the second embodiment.

(9) Description of the ninth preferred embodiment

Figure 39:
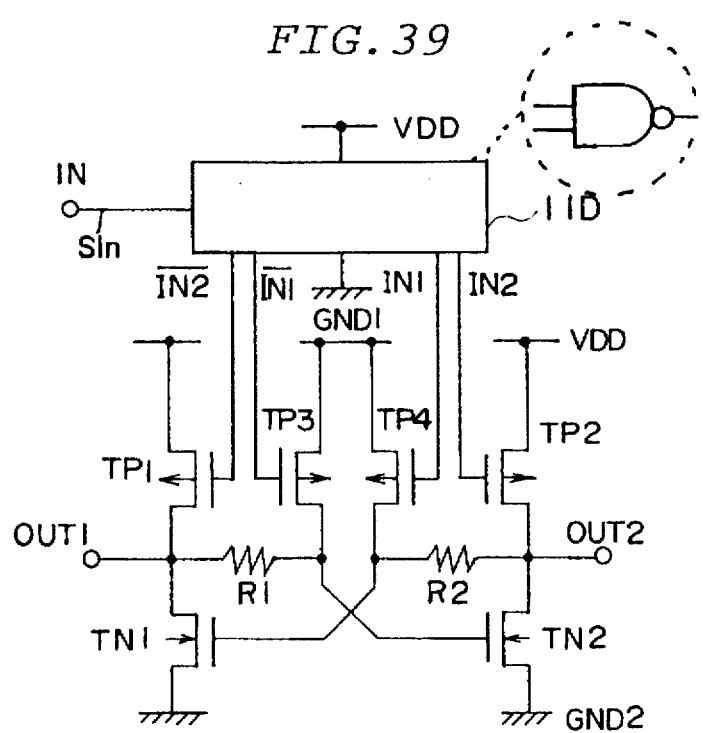
FIG. 39 is a block diagram of a level converter according to a ninth preferred embodiment of the present invention.

What is different from the eighth embodiment in a ninth embodiment is that an input latch circuit 11D for outputting two types of complementary signals IN1, IN2, $\overline{IN1}$ and $\overline{IN2}$ is provided, and respective gates of transistors TN1 and TN4 are connected individually to the input latch circuit 11D as shown in FIG. 39.

Namely, in FIG. 39, the input latch circuit 11D is another example of the second input latch circuit 11B and connected to the driving power source system VDD and the ground line GND1. The input latch circuit 11D latches an input signal Sin, and supplies complementary signals IN1 and $\overline{IN1}$ to the gates of the transistors TP3 and TP4. It further supplies complementary delay signals IN2 and $\overline{IN2}$ to the gates of the transistors TP1 and TP2. As to the internal construction of the input latch circuit 11D, it is required to alter the two-input NOR circuit to a two-input NAND circuit, but, since other constructions thereof are similar to those of the fourth embodiment, the description thereof is omitted.

Thus, according to a level converter related to the ninth embodiment of the present invention, respective gates of the transistors TP1 and TP4 are connected individually to the input latch circuit 11D as shown in FIG. 39.

As a result, when the input IN is shifted from the "H" level to the "L" level, an inverting signal $\overline{IN1}$="L"→"H" level is supplied to the transistor TP3, and a non-inverting signal IN1="H"→"L" level is supplied to the transistor TP4. Further, an inverting signal $\overline{IN2}$="L"→"H" level is supplied to the transistor TP1, and a non-inverting signal IN2="H"→"L" level is supplied to the transistor TP2.

Further, when the input IN is shifted from the "L" level to the "H" level, a non-inverting signal IN1="L"→"H" level is supplied to the transistor TP4, and a non-inverting signal IN2="L"→"H" level is supplied to the transistor TP2. Further, an inverting signal $\overline{IN1}$="H"→"L" level is supplied to the transistor TP3, and an inverting signal $\overline{IN2}$="H"→"L" level is supplied to the transistor TP1.

With this, when the input IN is shifted from the "H" level to the "L" level, it is possible to raised the potential of the output OUT2 from the "L" level to the "H" level steeply and to lower the potential of the output OUT1 from the "H" level to the "L" level steeply similarly to the seventh embodiment. Further when the input IN is shifted from the "L" level to the "H" level, it becomes possible to lower the potential of the output OUT2 from the "H" level to the "L" level steeply and to raise the potential of the output OUT1 from the "L" level to the "H" level steeply.

With this, it becomes possible to remove a through electric current between the transistors TP1 and TN1 and a through electric current between the transistors TP2 and TN2 connected to the driving power source system VDD and GND2 similarly to the seventh embodiment. Thus, it becomes possible to aim at reduction of circuit power consumption of the level converter concerned and to aim at to achieve a higher speed of circuit operation similarly to the sixth and the seventh embodiments.

(10) Description of the tenth preferred embodiment

Figure 40:
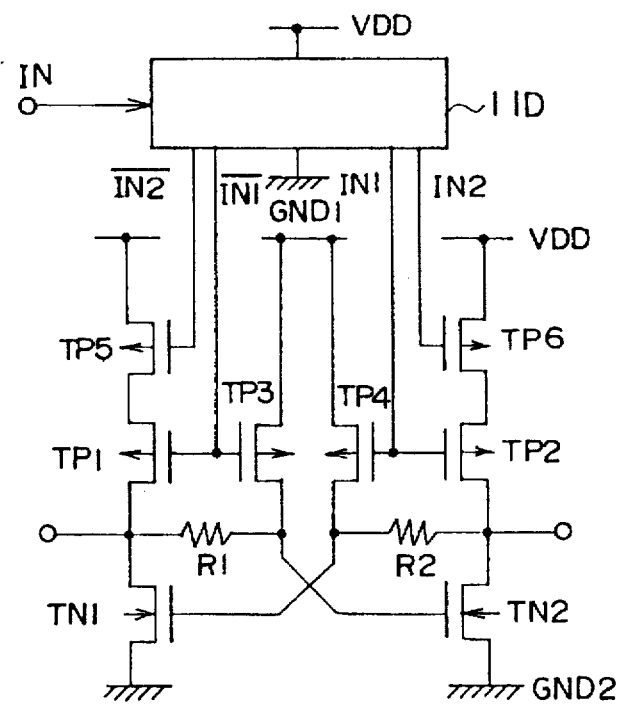
FIG. 40 is a block diagram of a level converter according to a tenth preferred embodiment of the present invention.

What is different from the ninth embodiment in a tenth embodiment is that transistors TP5 and TP6 are connected to the high potential sides of the transistors TP1 and TP2 as shown in FIG. 40, and the transistors TP1 and TP3, transistor TP5, the transistors TP2 and TP4 and the transistor TP6 are controlled individually by the input latch circuit 11D adopted in the ninth embodiment.

Namely, the transistor TP5 is an example of the ninth transistor T9, and consists of a p-type field effect transistor (hereinafter referred to simply as a transistor). The drain of the transistor TP5 is connected to the source of the transistor TP1, and the source of the transistor TP5 is connected to the power line VDD.

The transistor TP6 is an example of the tenth transistor T10, and consists of a p-type field effect transistor (hereinafter referred to simply as a transistor). The drain of the transistor TP6 is connected to the source of the transistor TP2, and the source of the transistor TP6 is connected to the power line VDD. Besides, respective gates of the transistors TP5 and TP6 are connected to the input latch circuit 11D.

Further, respective gates of the transistors TP1 and TP3 are connected to the input latch circuit 11D, and respective gates of the transistors TP2 and TP4 are connected to the input latch circuit 11D. Since other constructions thereof are similar to those of the seventh embodiment, the description thereof is omitted.

Thus, according to a level converter related to the tenth embodiment of the present invention, as shown in FIG. 40, the transistors TP5 and TP6 are connected to the high potential sides of the transistors TP1 and TP2, and an inverting signal $\overline{IN1}$ is outputted to the gates of the transistors TP1 and TP3 and a non-inverting signal IN1 is outputted to the gates of the transistors TP2 and TP4 from the input latch circuit 11D shown in the ninth embodiment. Further, an inverting delay signal $\overline{IN2}$ is outputted to the gate of the transistor TP5, and a non-inverting delay signal IN2 is outputted to the gate of the transistor TP6.

As a result, when the input IN is shifted from the "H" level to the "L" level, it is possible to raise the potential of the output OUT2 from the "L" level to the "H" level steeply and to lower the potential of the output OUT1 from the "H" level to the "L" level steeply similarly to the ninth embodiment. Further, when the input IN is shifted from the "L" level to the "H" level, it becomes possible to lower the potential of the output OUT2 from the "H" level to the "L" level steeply and to raise the potential of the output OUT1 from the "L" level to the "H" level steeply.

With this, it becomes possible to remove a through electric current between the transistors TP1 and TN1 and a through electric current between the transistors TP2 and TN2 connected to the driving power source system VDD and GND2 similarly to the sixth to the ninth embodiments. With this, it becomes possible to aim at reduction of circuit power consumption of the level converter which is driven, with the potential level of the ground line GND as the reference, by the power lines GND1 and GND2 at a potential power than the zero potential thereof, and to aim at a higher speed of circuit operation similarly to the sixth to the ninth embodiments.

(11) Description of the 11th preferred embodiment

Figure 41A:
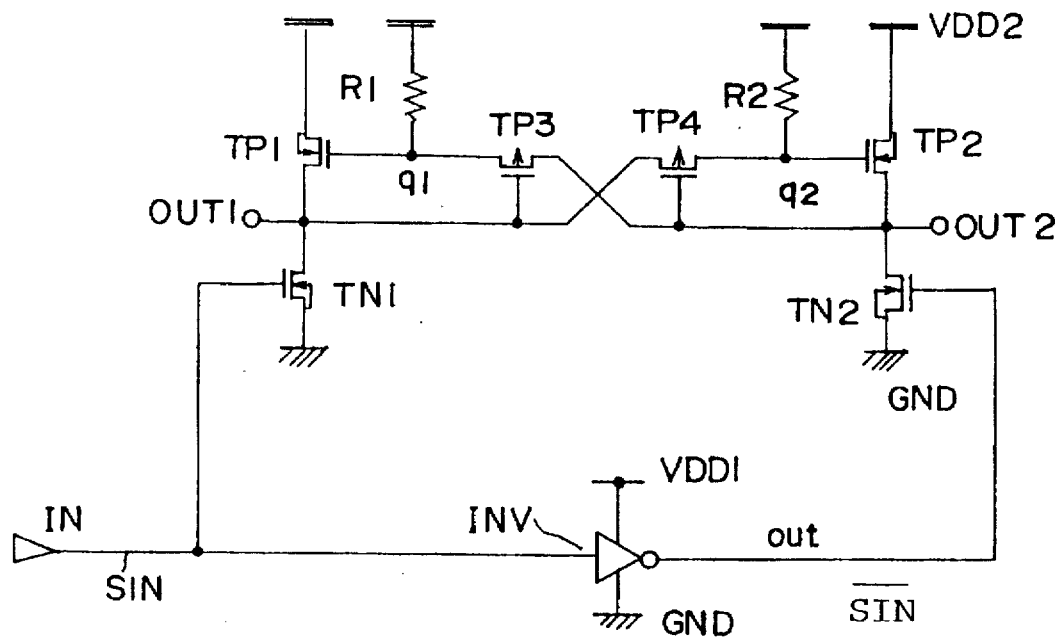
FIG. 41A is a block diagram of a level converter according to an 11th preferred embodiment of the present invention.

Being different from the first embodiment, an 11th level converter of the present invention is composed of an inverter INV, transistors TN1, TN2 and TP1 to TP4 and resistances R1 and R2 as shown in FIG. 41A. Further, the method of the transistors TP3 and TP4 and the resistances R1 and R2 is different.

Namely, the inverter INV is an example of the input transistor circuit 12, and is connected between the power line VDD1 (driving voltage VD1=approximately 3 V) which becomes the first driving power source system and the ground line GND (0 V). Besides, the input latch circuit 11A such as shown in FIG. 24 adopted in the first embodiment may also be used.

The transistor TP1 is an example of the first transistor T1, and consists of a p-type field effect transistor (hereinafter referred to simply as a transistor). The source of the transistor TP1 is connected to the power line VDD2, and the drain thereof is connected to the drain of the transistor TN1

(hereinafter referred to also as series connection) and connected further to the output OUT1. The gate of the transistor TP1 is connected to a junction point q1 of one end of the resistance R1 and the source of the transistor TP3.

The transistor TN1 is an example of the second transistor T2, and consists of an n-type field effect transistor (hereinafter referred to simply as a transistor). The source of the transistor TN1 is connected to the Ground line GND, and the gate thereof is connected to the IN of the inverter INV.

The transistor TP2 is an example of the third transistor T3, and consists of a p-type field effect transistor. The source of the transistor TP2 is connected to the power line VDD2, and the drain thereof is connected to the drain of the transistor TN2 and further to the output OUT2. The gate of the transistor TP2 is connected to a junction point q2 of one end of the resistance R2 and the source of the transistor TP4.

The transistor TN2 is an example of the fourth transistor T4, and consists of an n-type field effect transistor. The source of the transistor TN2 is connected to the ground line GND, and the gate thereof is connected to the output out of the inverter INV.

The transistor TP3 is an example of the fifth transistor T5, the transistor TP4 is an example of the sixth transistor T6, and either consists of a p-type field effect transistor. The drain of the transistor TP3 is connected to the gate of the transistor TP4 and further to the output OUT2. The gate of the transistor TP3 is connected to the drain of the transistor TP4 and further to the output OUT1.

The resistance R1 is connected between the junction point q1 and the power line VDD2, and has a resistance value of approximately several KΩ depending on the ON resistance of the transistor TN2. The resistance R2 is connected between the junction point q2 and the power line VDD2, and has a resistance value of approximately several KΩ depending on the ON resistance of the transistor TN1.

Next, the operation of the level converter concerned will be described with reference to FIG. 41B and FIGS. 42A to 42D.

Figure 41B:
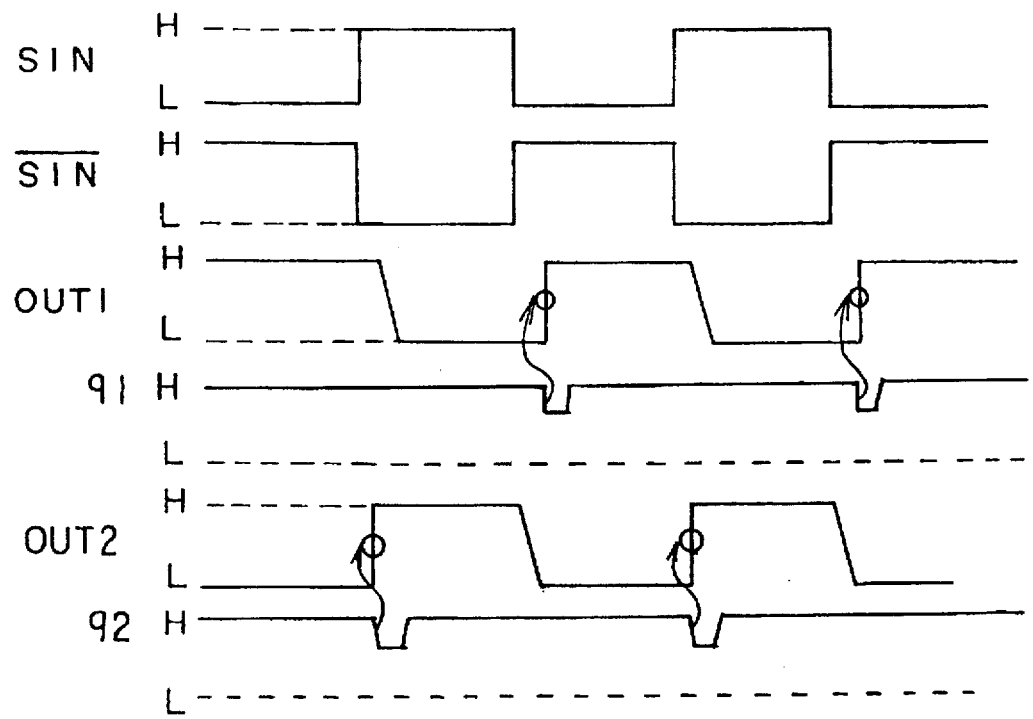
FIG. 41B is an operating waveform diagram of the level converter shown in FIG. 41A.

For example, as shown in FIG. 41B, at stationary time when the IN shows the "H" level, an input signal SIN="H" level is supplied to the gate of the transistor TN1 and an input inverting signal $\overline{SIN}$="L" level is supplied to the gate of the transistor TN2. With this, as shown in an equivalent circuit of FIG. 42A, the transistors TN1 and TP3 are turned ON, the transistors TN2, TP1, TP4 and TP2 are turned OFF, and the output OUT2 shows the "H" level and the output OUT1 shows the "L" level.

Figure 42A:
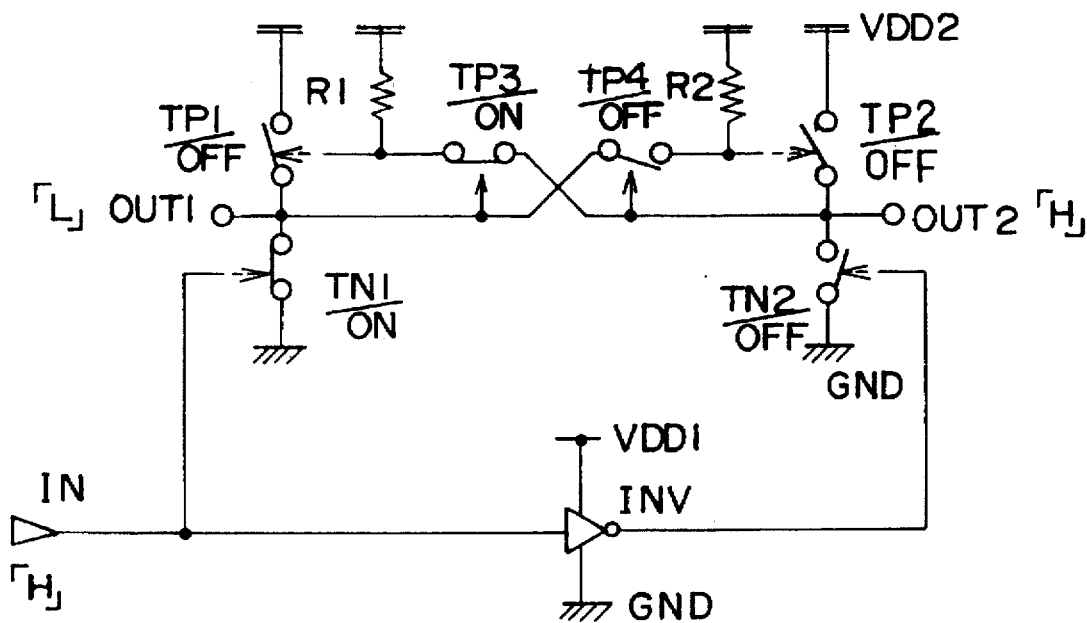
FIG. 42A is an equivalent circuit diagram for explaining the operation at stationary time (IN="H") of the level converter shown in FIG. 41A.
Figure 42B:
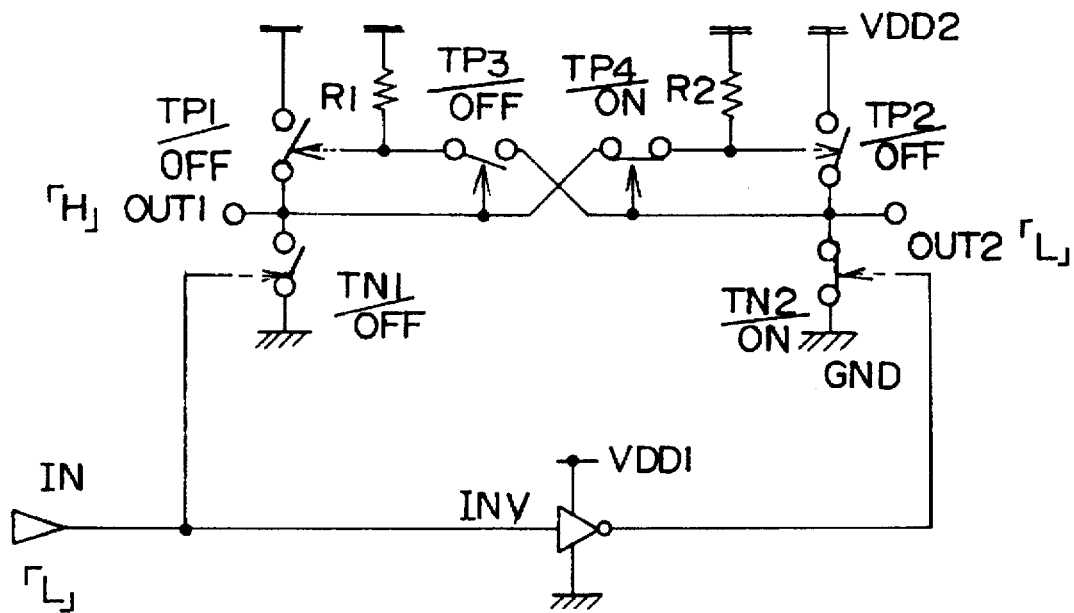
FIG. 42B is an equivalent circuit diagram for explaining the operation at stationary time (IN="L") of the level converter shown in FIG. 41A.

Conversely, at stationary time when the input IN shows the "L" level, an input inverting signal $\overline{SIN}$="H" level such as shown in FIG. 42B is supplied to the gate of the transistor TN2, and an input signal SIN="L" level is supplied to the gate of the transistor TN1. With this, as shown in an equivalent circuit of FIG. 42B, the transistors TN2 and TP4 are turned ON, the transistors TN1, TP2, TP3 and TP1 are turned OFF, and the output OUT1 shows the "H" level and the output OUT2 shows the "L" level.

Furthermore, when the input IN is shifted from the "H" level to the "L" level steeply, an input signal SIN="H"→"L" level such as shown in FIG. 41B is supplied to the gate of the transistor TN1, and an input inverting signal $\overline{SIN}$="L"→"H" level is supplied to the gate of the transistor TN2.

Figure 42C:
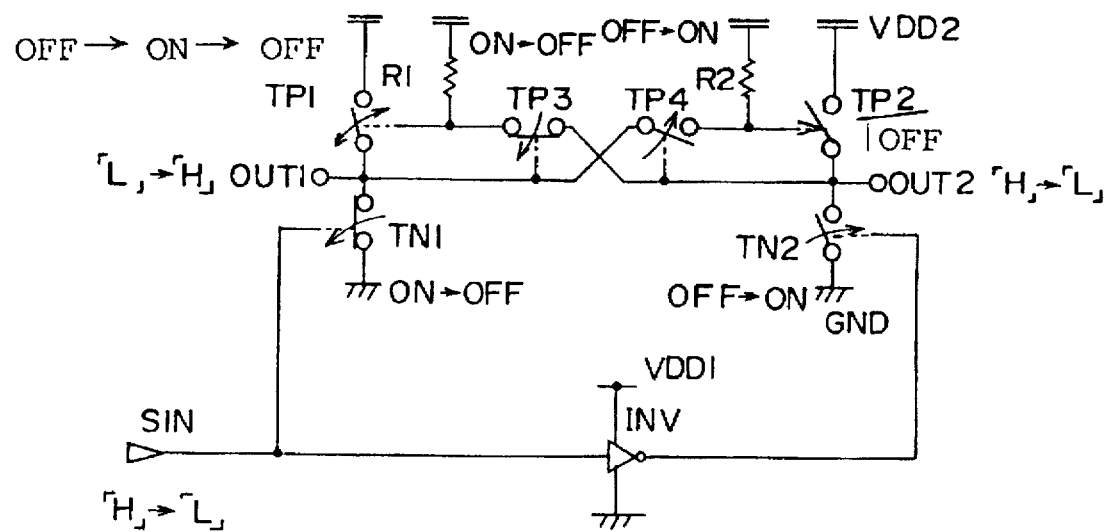
FIG. 42C is an equivalent circuit diagram for explaining the operation at transition time (IN="H"→"L") of the level converter shown in FIG. 41A.

With this, as shown in FIG. 42C, the transistor TP1 is turned ON from OFF quickly next to the OFF to ON operation of the transistor TN2, and the potential of the output OUT1 is raised from the "L" level to the "H" level steeply. Besides, the transistor TP1 is turned OFF immediately after momentary ON operation. Further, the transistor TP2 is kept in an OFF state as it is next to the ON to OFF operation of the transistor TN1, and the potential of the output OUT2 falls from the "H" level to the "L" level steeply.

Conversely, when the input IN is shifted from the "L" level to the "H" level, an input signal SIN="L"→"H" level such as shown in FIG. 41B is supplied to the gate of the transistor TN1, and an input inverting signal $\overline{SIN}$="H"→"L" level is supplied to the gate of the transistor TN2.

Figure 42D:
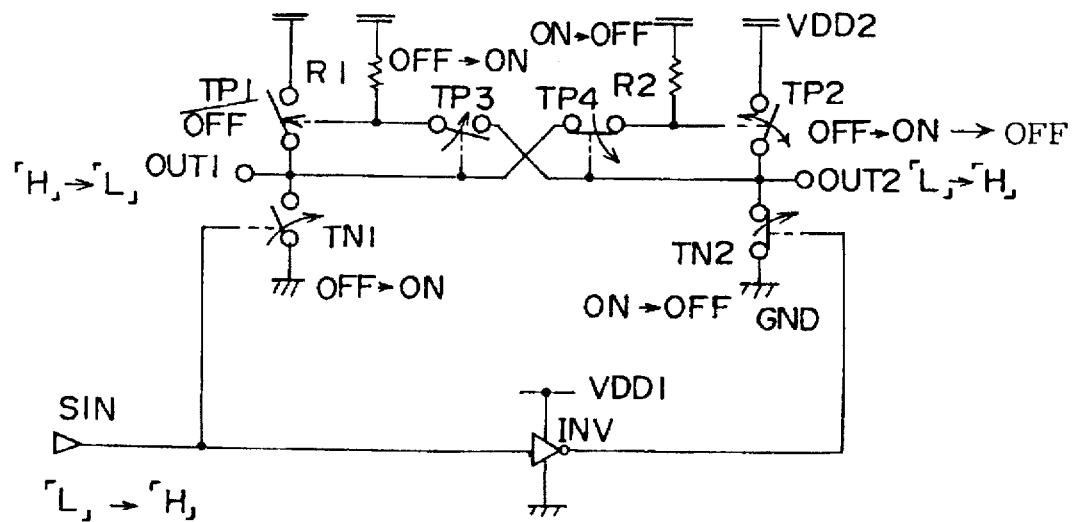
FIG. 42D is an equivalent circuit diagram for explaining the operation at transition time (IN="L"→"H") of the level converter shown in FIG. 41A.

With this, as shown in FIG. 42D, the transistor TP2 is turned ON from OFF quickly next to the OFF to ON operation of the transistor TN1, and the potential of the output OUT2 is raised from the "L" level to the "H" level steeply. Besides, the transistor is turned OFF immediately after momentary ON operation. Further, the transistor TP1 is kept in an OFF state as it is next to the ON to OFF operation of the transistor TN2, and the potential of the output OUT1 falls from the "H" level to the "L" level steeply.

Through repeated operation of the foregoing, it is possible to convert the signal level applied with signal processing by a 3 V driving system into a potential value applicable with signal processing by a 5 V driving system similarly to the first to the fifth embodiments.

Thus, according to a level converter related to the 11th embodiment of the present invention, the inverter INV, the transistors TN1, TN2 and TP1 to TP4 and the resistances R1 and R2 are provided as shown in FIG. 41A.

As a result, when the input IN is shifted from the "H" level to the "L" level, the transistors TN1 and TP3 are turned OFF from ON, and the transistors TN2 and TP4 are turned ON from OFF. At this time, the potential level of the output OUT2 is determined by the ratio of the resistance R1 to the ON resistance of the transistor TN2.

For example, when the ratio of the ON resistance is set so as to be lower than threshold voltage Vth of the transistor TP1, the transistor TP3 is turned OFF, and the gate voltage of the transistor TP1 is set to the "H" level, by the resistance R1. Further, the transistor TP4 is turned ON, the "H" level is transmitted to the output OUT1 through the resistance R2, and the output OUT1 is shifted from the "L" level to the "H" level at a high speed.

Conversely, when the input IN is shifted from the "L" level to the "H" level, the transistors TN1 and TP3 are turned ON from OFF, and the transistors TN2 and TP4 are turned OFF from ON. At this time, the transistor TP1 is kept in an OFF state as it is, and the transistor TP2 is turned ON momentarily.

At this time, the potential level of the output OUT1 is determined by the ratio of the resistance R2 to the ON resistance of the transistor TN1. For example, when the ratio of the ON resistance is set so as to be lower than the threshold voltage Vth of the transistor TP2, the transistor TP4 is turned OFF from ON, and the gate voltage of the transistor TP2 is set to the "H" level by the resistance R2. Further, the transistor TP3 is turned ON, the "H" level is transmitted to the output OUT2 through the resistance R1, and the output OUT2 is shifted from the "L" level to the "H" level at a high speed.

With this, it becomes possible to remove a through electric current between the transistors TP1 and TN1 and a through electric current between the transistors TP2 and TN2 connected to the driving power source system VDD2 and GND. Thus, it becomes possible to aim at reduction of circuit power consumption of the level converter concerned, and to aim at to achieve a higher speed of circuit operation as compared with the first to the fifth embodiments.

(12) Description of the 12th preferred embodiment

Figure 43A:
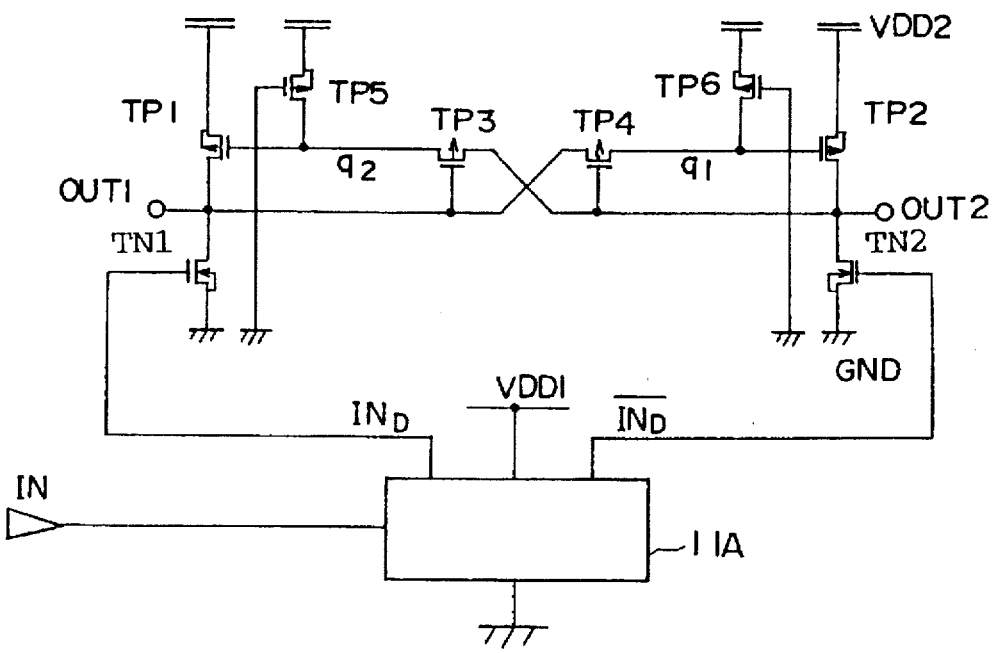
FIG. 43A is a block diagram of a level converter according to a 12th preferred embodiment of the present invention.

In a 12th embodiment, being different from the 11th embodiment, transistors TP5 and TP6 are provided, and an input latch circuit 11A is provided in place of the inverter INV as shown in FIG. 43A.

Namely, the transistor TP5 is an example of the seventh transistor T7, and consists of a p-type field effect transistor. The transistor TP5 is provided at the connecting position of the resistance R1 according to the 11th embodiment. The transistor TP5 is connected between a junction point q2 and the power line VDD2, and the gate thereof is connected to the ground line GND. The transistor TP5 has an ON resistance value of approximately several $K\Omega$ depending on the ON resistance of the transistor T2.

The transistor TN6 is an example of the eighth transistor T8, and consists of a p-type field effect transistor. The transistor TP6 is connected between a junction point q1 and the power line VDD2, and the gate thereof is connected to the ground line GND. Besides, the transistor TP6 has an ON resistance value of approximately several $K\Omega$ depending on the ON resistance of the transistor TN1.

Further, the input latch circuit 11A is an example of the input transistor circuit 13, and a circuit adopted in the second embodiment is applied, which is connected between the first driving power line VDD1 and GND. Complementary control signals $IN_D$ and $\overline{IN}_D$ thereof are applied to the gates of the transistors TN1 and TN2, since other constructions and operation are similar to those of the second and the 11th embodiments, the description thereof is omitted.

Figure 43B:
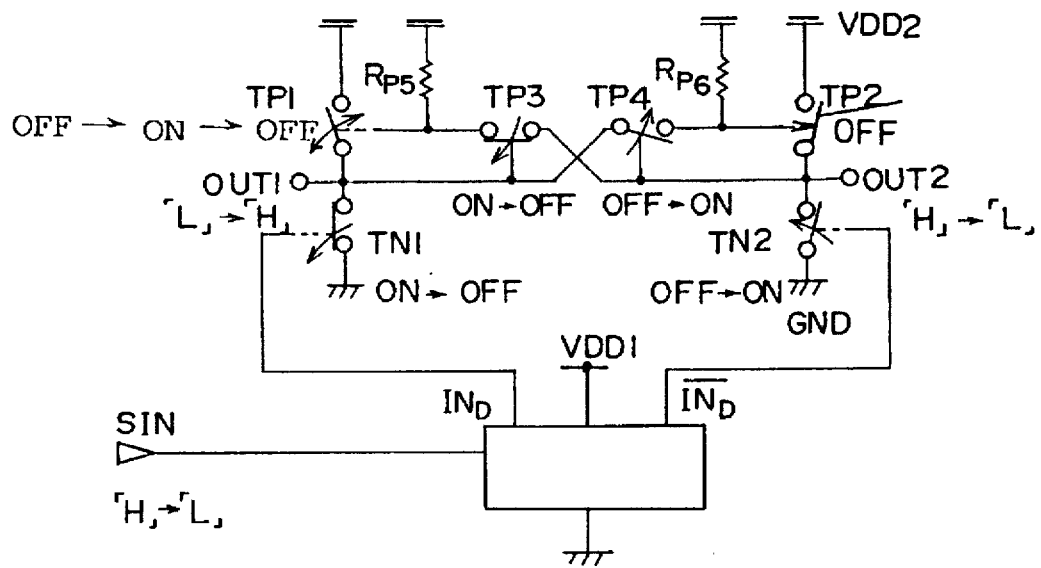
FIG. 43B is an equivalent circuit diagram for explaining the operation at transition time (IN="H"→"L") of the level converter shown in FIG. 43A.

Thus, according to a level converter related to the 12th embodiment of the present invention, as shown in FIG. 43B, the input latch circuit 11A and the transistors TN1, TN2 and TP1 to TP6 are provided, and the transistors TP5 and TP6 are placed at the connecting positions of the resistances R1 and R2 of the level converter according to the 11th embodiment.

As a result, the functions of the resistances R1 and R2 of the level converter according to the 11th embodiment can be taken over by normally ON resistance $R_{p\ 5}$ and $R_{p\ 6}$ of the transistors TP5 and TP6. For example, when the input IN is shifted from the "H" level to the "L" level, the transistors TN1 and TP3 are turned OFF from ON, and the transistors TN2 and TP4 are turned ON from OFF. At this time, the transistor TP1 is turned ON momentarily, and the transistor TP2 is kept in OFF operation as it is. Further, the potential level of the output OUT2 is determined by the ratio of the normally ON resistance $R_{p\ 5}$ of the transistor TP5 to the ON resistance of the transistor TN2.

For example, when the normally ON resistance $R_{p\ 5}$ is set so as to become lower than the threshold voltage Vth of the transistor TP1 thus setting the ratio of the ON resistance of the circuit, the transistor TP3 is turned OFF, and the gate voltage of the transistor TP1 is set to the "H" level of the normally ON resistance $R_{p\ 5}$. Further, the transistor TP4 is turned ON, the "H" level is transmitted to the output OUT1 through the normally ON resistance $R_{p\ 6}$ of the transistor TP6, and the output OUT1 is shifted from the "L" level to the "H" level.

Conversely, when the input IN is shifted from the "L" level to the "H" level, the transistors TN1 and TP3 are turned ON from OFF, and the transistors TN2 and TP4 are turned OFF from ON. At this time, the transistor TP1 is kept in OFF operation as it is, and the transistor TP2 is turned ON momentarily. Further, the potential level of the output OUT1 is determined by the ratio of the normally ON resistance $R_{p\ 6}$ to the ON resistance of the transistor TN1. For example, when the normally ON resistance $R_{p\ 6}$ is set so as to become lower than the threshold voltage Vth of the transistor TP2 thus setting the ratio of the ON resistance of the circuit, the transistor TP4 is turned OFF from ON, and the gate voltage of the transistor TP2 is set to the "H" level by the normally ON resistance $R_{p\ 6}$.

Further, the transistor TP3 is turned ON, the "H" level is transmitted to the output OUT2 through the normally ON resistance $R_{p\ 5}$, and the output OUT2 is shifted from the "L" level to the "H" level at a high speed.

With this, it becomes possible to remove a through electric current between the transistors TP1 and TN1 and a through electric current between the transistors TP2 and TN2 connected to the driving power source system VDD2 and GND similarly to the 11th embodiment. Thus, it becomes possible to aim at reduction of circuit power consumption and to achieve a higher speed of circuit operation.

(13) Description of the 13th preferred embodiment

Figure 44A:
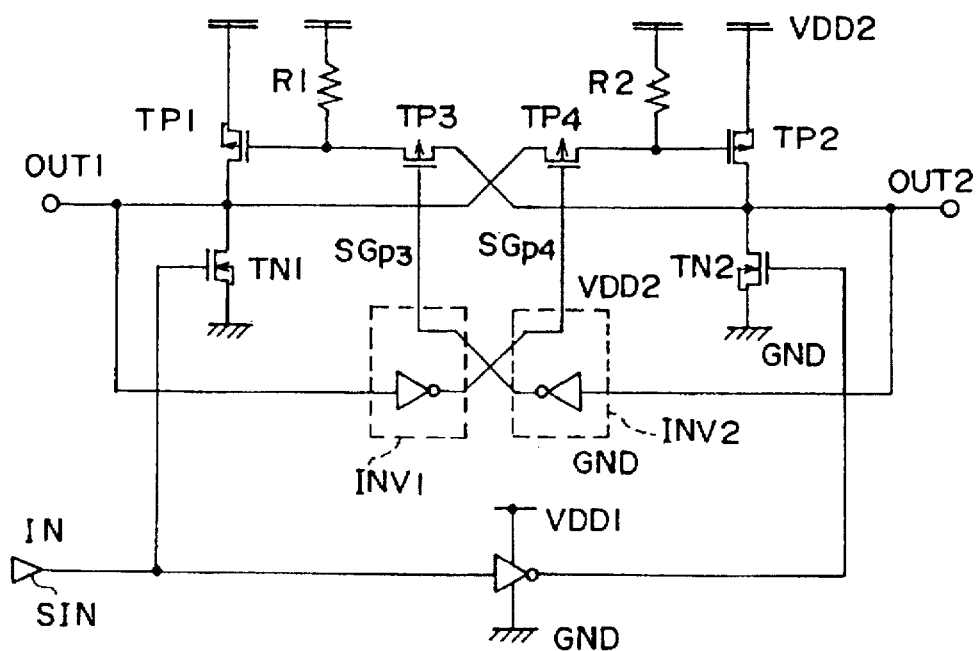
FIG. 44A is a block diagram of a level converter according to a 13th preferred embodiment of the present invention.

In a 13th embodiment, being different from the 11th embodiment, inverters INV1 and INV2 in odd numbers are provided as shown in FIG. 44A.

For example, one piece of inverter INV1 which shows an example of inverters INV in odd numbers is connected between the gate of the transistor TP4 and an output OUT1. The inverter INV1 is connected to the power line VDD2 and the ground line GND, and delays the potential level of the output OUT1 so as to control the transistor TP4 through the gate thereof. Similarly, one piece of inverter INV2 is connected between the gate of the transistor TP3 and the output OUT2. The inverter INV2 is connected to the power line VDD2 and the ground line GND, and delays the potential level of the output OUT2 so as to control the transistor TP3 through the gate thereof. Besides, since other constructions are similar to those of the 11th embodiment, the description thereof is omitted.

Next, the operation of the level converter will be described with reference to FIG. 44B and FIGS. 45A to 45D.

Figure 44B:
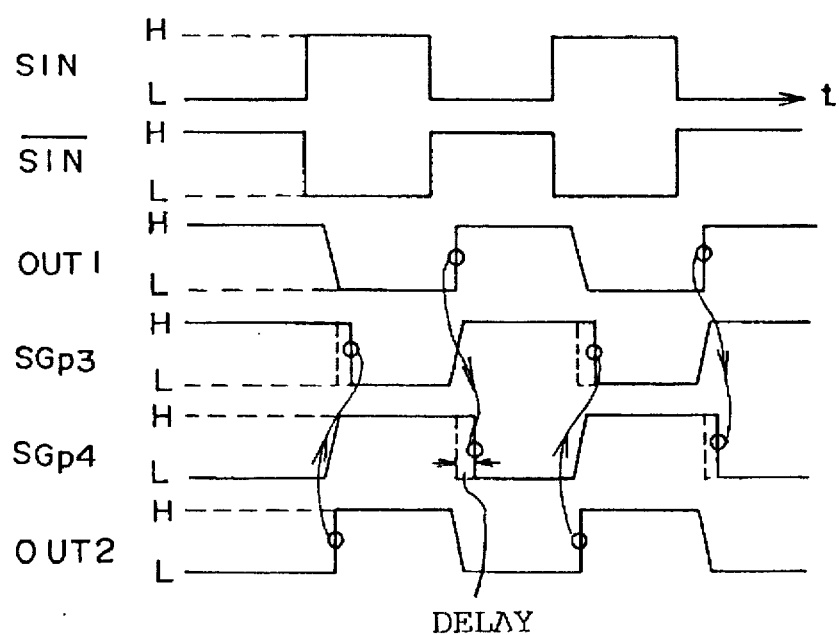
FIG. 44B is an operating waveform diagram of the level converter shown in FIG. 44A.

For example, at stationary time when the input IN shows the "H" level, an input signal SIN="H" level is supplied to the gate of the transistor TN1 and an input inverting signal $\overline{SIN}$="L" level is supplied to the gate of transistor TN2 the as shown in FIG. 44B. With this, as shown in an equivalent circuit of FIG. 45A, the transistors TN1 and TP3 are turned ON, the transistors TN2, TP1, TP2 and TP4 are turned OFF, and the output OUT2 shows the "H" level and the output OUT1 shows the "L" level.

Figure 45A:
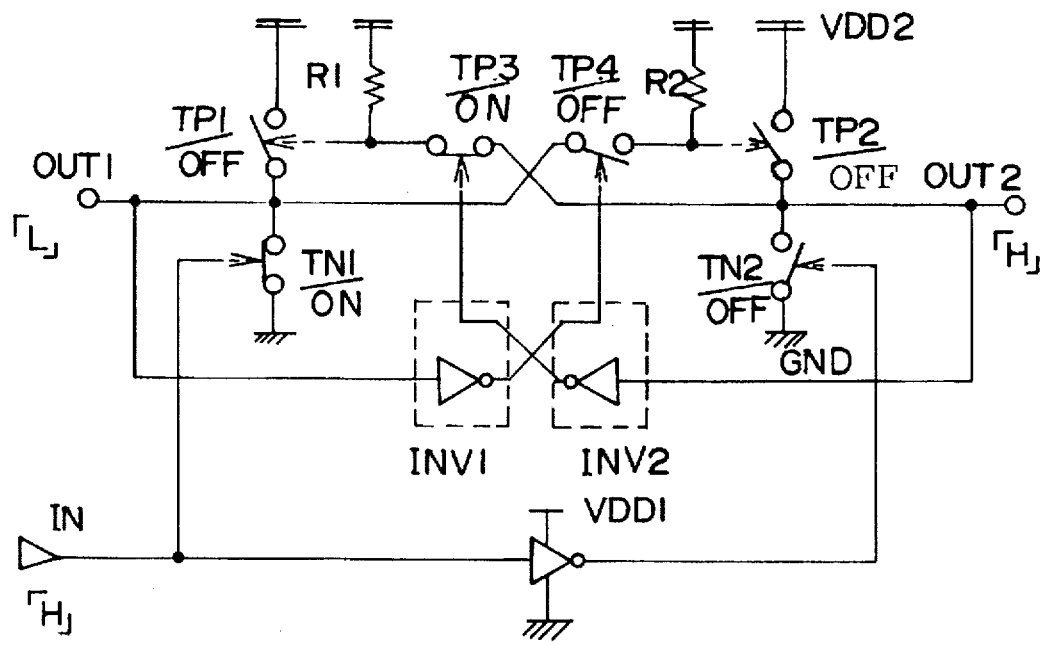
FIG. 45A is an equivalent circuit diagram for explaining the operation at stationary time (IN="H") of the level converter shown in FIG. 44A.
Figure 45B:
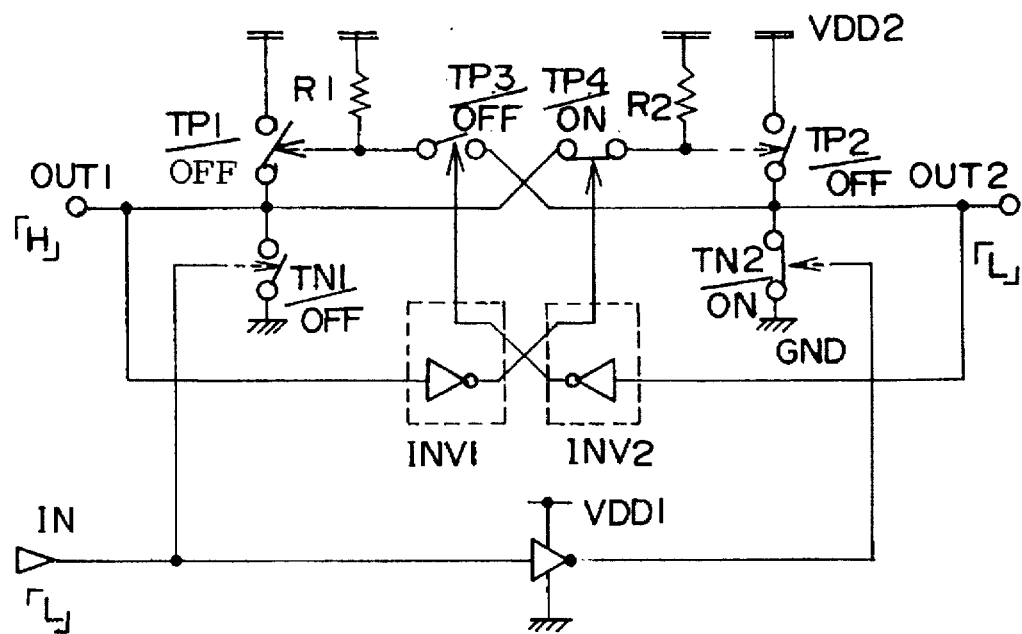
FIG. 45B is an equivalent circuit diagram for explaining the operation at stationary time (IN="L") of the level converter shown in FIG. 44A.

Conversely, at stationary time when the input IN shows the "L" level, an input inverting signal $\overline{SIN}$="H" level such as shown in FIG. 45B is supplied to the gate of the transistor TN2, and an input signal SIN="L" level is supplied to the gate of the transistor TN1. With this, as shown in an equivalent circuit of FIG. 45B, the transistors TN2 and TP4 are turned ON, the transistors TN1, TP1, TP2 and TP3 are turned OFF, and the output OUT1 shows the "H" level and the output OUT2 shows the "L" level.

Figure 45C:
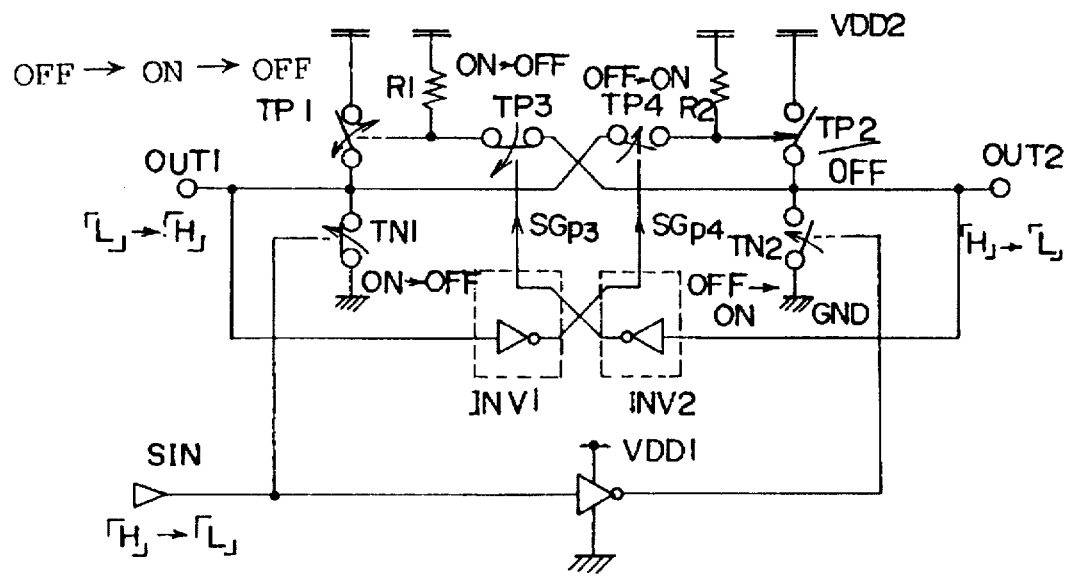
FIG. 45C is an equivalent circuit diagram for explaining the operation at transition time (IN="H"→"L") of the level converter shown in FIG. 44A.

Furthermore, when the input IN is shifted from the "H" level to the "H" level, an input signal SIN="H"→"L" level such as shown in FIG. 44B is supplied to the gate of the transistor TN1, and an input inverting signal $\overline{SIN}$="L"→"H" level is supplied to the gate of the transistor TN2. With this, as shown in FIG. 45C, the transistor TP1 is turned ON from OFF quickly next to the OFF to ON operation of the transistor TN2, and the potential of the output OUT1 is raised from the "L" level to the "H" level steeply. When the transistor TP1 is turned ON momentarily, it is turned OFF immediately. At this time, the "L" to "H" level of the output OUT1 is delayed by the inverter INV1, a gate control signal $SG_{p\,4}$ is supplied to the transistor TP4 and it is shifted from OFF to ON. Further, the transistor TN1 is turned OFF from ON, but the transistor TP2 is kept in OFF operation as it is, and the potential of the output OUT2 falls from the "H" level to the "L" level steeply.

Figure 45D:
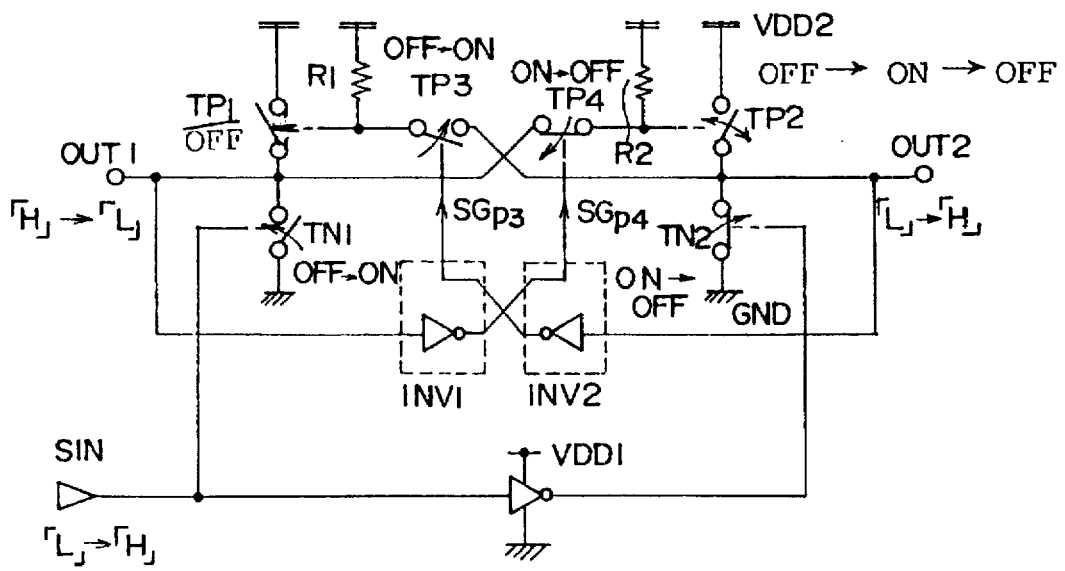
FIG. 45D is an equivalent circuit diagram for explaining the operation at transition time (IN="L"→"H") of the level converter shown in FIG. 44A.

Conversely, when the input IN is shifted from the "L" level to the "H" level, an input signal SIN="L"→"H" level such as shown in FIG. 44B is supplied to the gate of the transistor TN1, and an input inverting signal=$\overline{\text{SIN}}$="H"→"L" level is supplied to the gate of the transistor TN2. With this, as shown in FIG. 45D, the transistor TP2 is turned ON from OFF quickly next to the OFF to ON operation of the transistor TN1, and the potential of the output OUT2 is raised from the "L" level to the "H" level steeply. The transistor TP2 is turned OFF immediately after momentary ON operation.

At this time, the "L" to "H" level of the output OUT2 is delayed by the inverter INV2, and a gate control signal $SG_{p\,3}$ thereof is supplied to the transistor TP3, which is turned ON from OFF. Further, the transistor TN2 is turned OFF from ON, but the transistor TP1 is kept in OFF operation as it is, and the potential of the output OUT2 falls from the "H" level to the "L" level steeply.

Through repeated operation of the foregoing, it is possible to convert the signal level applied with signal processing by a 3 V driving system into a potential level applicable with signal processing by a 5 V driving system.

Thus, according to a level converter related to the 13th embodiment of the present invention, as shown in FIG. 44A, the inverters INV1 and INV2 in odd numbers are provided, the inverter INV2 is connected between the gate of the transistor TP3 and the output OUT2 and the inverter INV1 is connected between the gate of the transistor TP4 and the output OUT1.

As a result, when the input IN is shifted from the "H" level to the "L" level, it is possible to delay the "L" to "H" level of the output OUT1 by the inverter INV1, to supply the gate control signal $SG_{p\,4}$ to the transistor TP4 and to turn the transistor TP4 OFF and then ON with delay.

Further, when the input IN is shifted from the "L" level to the "H" level, it is possible to delay the "L" to "H" level of the output OUT2 by the inverter INV2, to supply the gate control signal $SG_{p\,3}$ to the transistor TP3 and to turn the transistor TP3 OFF and then ON with delay.

With this, when the input IN is shifted from the "H" level to the "L" level or shifted from the "L" level to the "H" level, it is possible to shift the output OUT1 from the "L" level to the "H" level at a higher speed and to shift the output OUT2 from the "L" level to the "H" level at a higher speed as compared with the 11th embodiment.

With this, it becomes possible to remove a through electric current between the transistors TP1 and TN1 and a through electric current between the transistors TP2 and TN2 connected to the driving power source system VDD2 and GND similarly to the 11th embodiment. Thus, it becomes possible to aim at reduction of circuit power consumption and to achieve a higher speed of circuit operation.

(14) Description of the 14th preferred embodiment

Figure 46A:
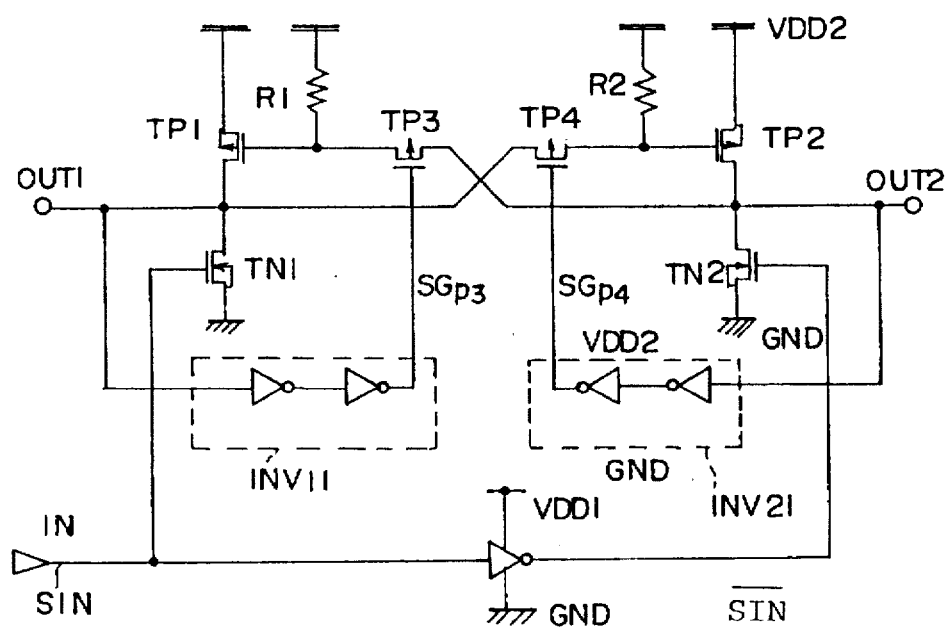
FIG. 46A is a block diagram of a level converter according to a 14th preferred embodiment of the present invention.

In a 14th embodiment, being different from the 13th embodiment, inverters INV11 and INV12 in even numbers are provided as shown in FIG. 46A.

For example, two pieces of inverters INV11 which show an example of inverters INV in even numbers are connected between the gate of the transistor TP3 and the output OUT1. The inverters INV11 are connected between the power line VDD2 and the ground line GND, and delay the potential level of the output OUT1 so as to control the transistor TP3 through the gate being different from the 13th embodiment. Similarly, two pieces of inverters INV21 are connected between the gate of the transistor TP4 and the output OUT2. The inverters INV21 are connected to the power line VDD2 and the ground line GND, and delay the potential level of the output OUT2 so as to control the transistor TP4 through the gate being different from the 13th embodiment.

Besides, the number of stages of the inverters INV11 and INV21 is controlled in accordance with loads (inverter circuits, etc.) connected to the outputs OUT1 and OUT2. For example, the delay time is controlled so that it becomes equal to the waveform rise time until threshold voltage of a load circuit is reached. Thus, it becomes possible to transmit a signal to a next stage at a high speed. Since other constructions are similar to those of the 11th embodiment, the description thereof is omitted.

Next, the operation of the level converter concerned will be described with reference to FIG. 46B, FIGS. 47A to 47D and FIGS. 48A and 48B.

Figure 46B:
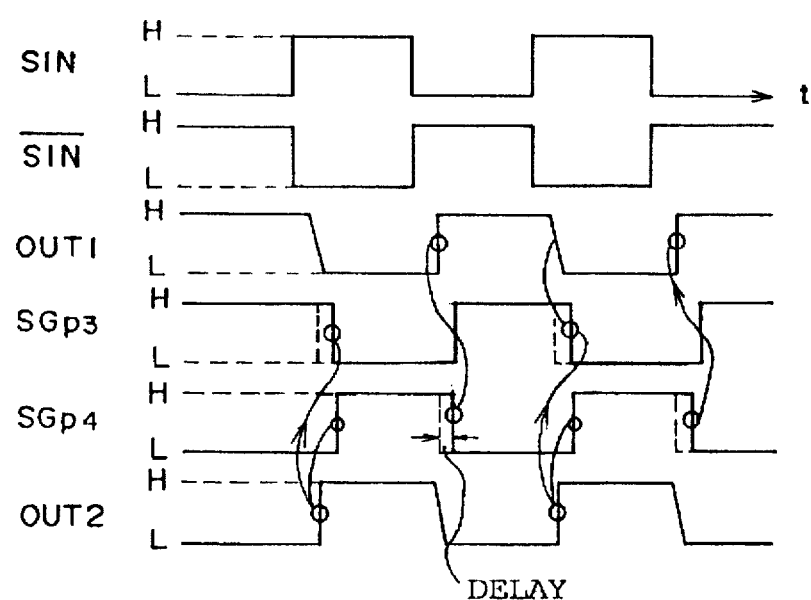
FIG. 46B is an operating waveform diagram of the level converter shown in FIG. 46A.

For example, at stationary time when the input IN shows the "H" level, an input signal SIN="H" level is supplied to the gate of the transistor TN1, and an input inverting signal $\overline{\text{SIN}}$="L" level is supplied to the gate of the transistor TN2 as shown in FIG. 46B. With this, as shown in an equivalent circuit of FIG. 47A, the transistors TN1 and TP3 are turned ON, the transistors TN2, TP1, TP2 and TP4 are turned OFF, and the output OUT2 shows the "H" level and the output OUT1 shows the "L" level.

Figure 47A:
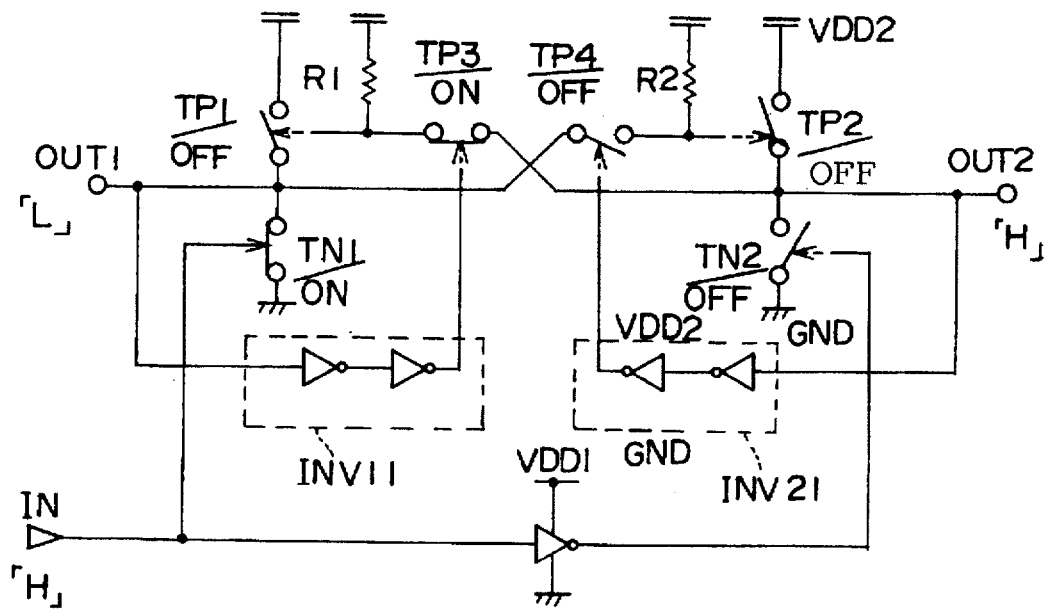
FIG. 47A is an equivalent circuit diagram for explaining the operation at stationary time (IN="H") of the level converter shown in FIG. 46A.
Figure 47B:
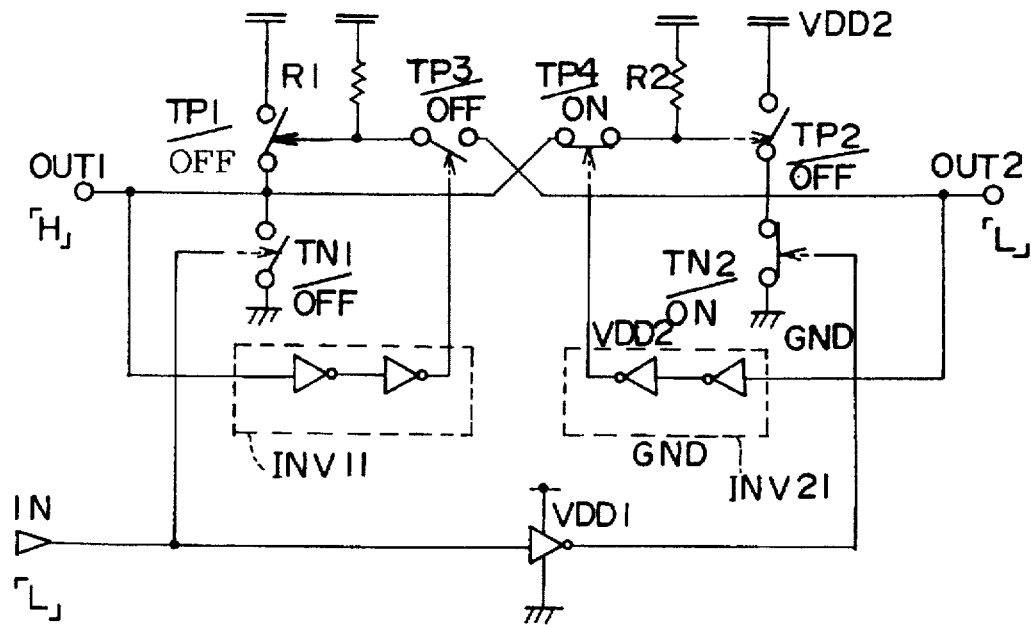
FIG. 47B is an equivalent circuit diagram for explaining the operation at stationary time (IN="L") of the level converter shown in FIG. 46A.

Conversely, at stationary time when the input IN shows the "L" level, an input inverting signal $\overline{\text{SIN}}$="H" level such as shown in FIG. 47B is supplied to the gate of the transistor TN2, and an input signal SIN="L" level is supplied to the gate of the transistor TN1. With this, as shown in an equivalent circuit of FIG. 47B, the transistors TN2 and TP4 are turned ON, the transistors TN1, TP1, TP2 and TP3 are turned OFF, and the output OUT1 shows the "H" level and the output OUT2 shows the "L" level.

Figure 47C:
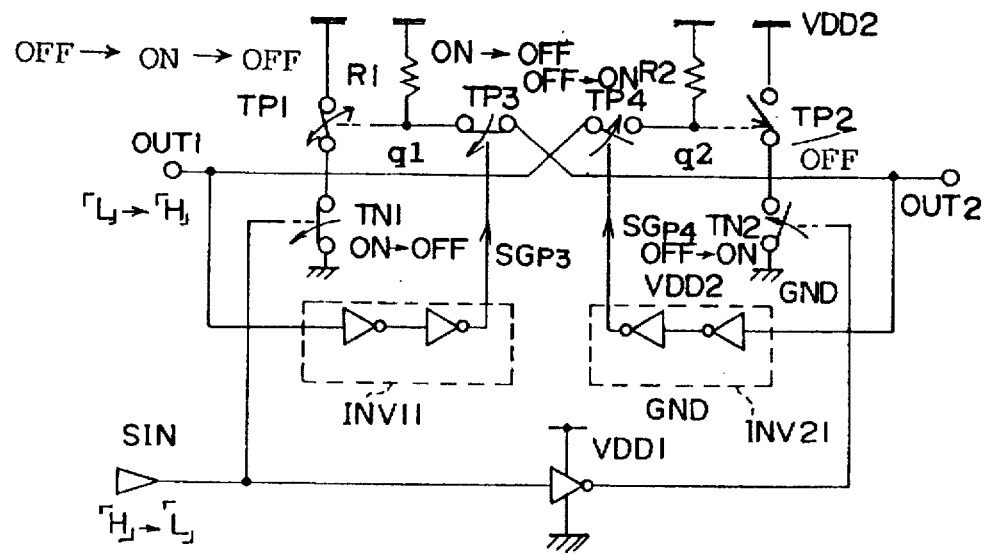
FIG. 47C is an equivalent circuit diagram for explaining the operation at transition time (IN="H"→"L") of the level converter shown in FIG. 46A.

Furthermore, when the input IN is shifted from the "H" level to the "L" level, an input signal SIN="H"→"L" level such as shown in FIG. 46B is supplied to the gate of the transistor TN1, and an input inverting signal $\overline{\text{SIN}}$="L"→"H" level is supplied to the gate of the transistor TN2. With this, the transistor TN2 is turned ON from OFF as shown in FIG. 47C, and rise time tf from the "H" level to the "L" level at the output OUT2 is determined by a ratio of an ON resistance of TN2 to the composite value of the resistance R1 and an ON resistance of TP3 and the junction point q1 is shifted from the "H" level to the "L" level. Besides, the time tf is expressed by A+B in FIG. 48A. The output OUT2 is changed depending on voltage×TN2/(R1+TP3+TN2), and the junction point q1 is changed by voltage× (TN2+TP3)/(R1+TP3+TN2), respectively.

With this, the transistor TP1 is turned ON from OFF, and the potential of the output OUT1 is raised from the "L" level to the "H" level steeply. As a result, the gate of the transistor TP3 shows the "H" level through the inverter INV11, and the transistor TP3 is turned OFF. At this time, the "L" to "H" level of the output OUT1 is delayed by the inverter INV11, and the gate control signal $SG_{p\,3}$ is supplied to the transistor TP3, which is turned OFF from ON.

Further, since the transistor TP3 is turned OFF, the gate voltage of the transistor TP1 shows the "H" level by the resistance R1, and the transistor TP1 is turned OFF. This process is shown in the period A in FIG. 48A.

Next, the level of the output OUT2 gives the "L" level to the gate of the transistor TP4 through the inverters INV21, thereby to turn the transistor TP4 ON. Namely, the "H" to "L" level of the output OUT2 is delayed by the inverters INV21, and the gate control signal $SG_{p4}$ thereof is supplied to the transistor TP4, which is turned OFF from ON, but the transistor TP2 is kept OFF as it is, and the potential of the output OUT2 falls from the "H" level to the "L" level steeply. With this, the resistance R2 propagates the "H" level to the output OUT1. This process is shown in the period B in FIG. 48A.

Conversely, when the input IN is shifted from the "L" level to the "H" level, an input signal SIN="L"→"H" level such as shown in FIG. 46B is supplied to the gate of the transistor TN1, and an input inverting signal $\overline{SIN}$="H"→"L" level is supplied to the gate of the transistor TN2.

Figure 47D:
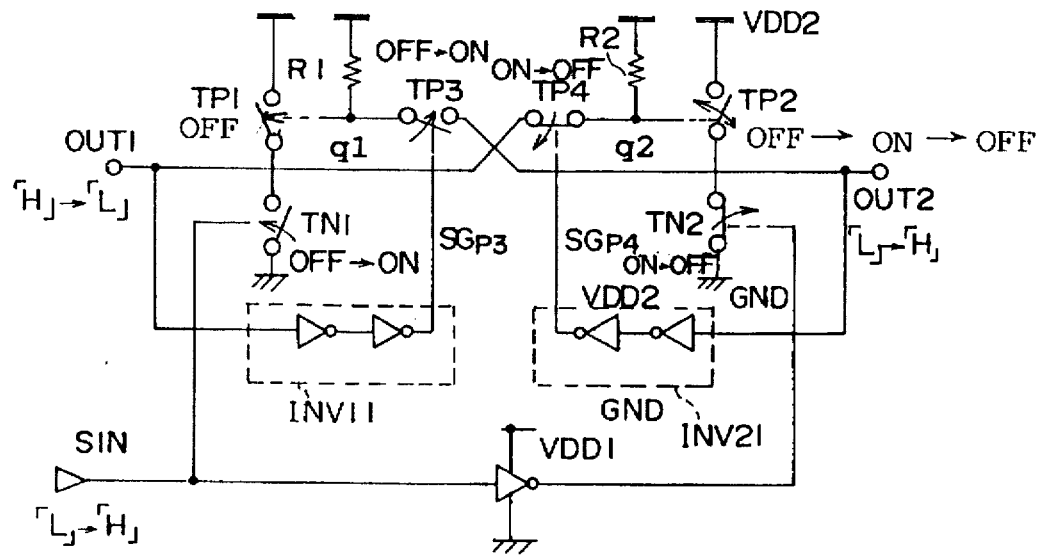
FIG. 47D is an equivalent circuit diagram for explaining the operation at transition time (IN="L"→"H") of the level converter shown in FIG. 46A.
Figure 48A:
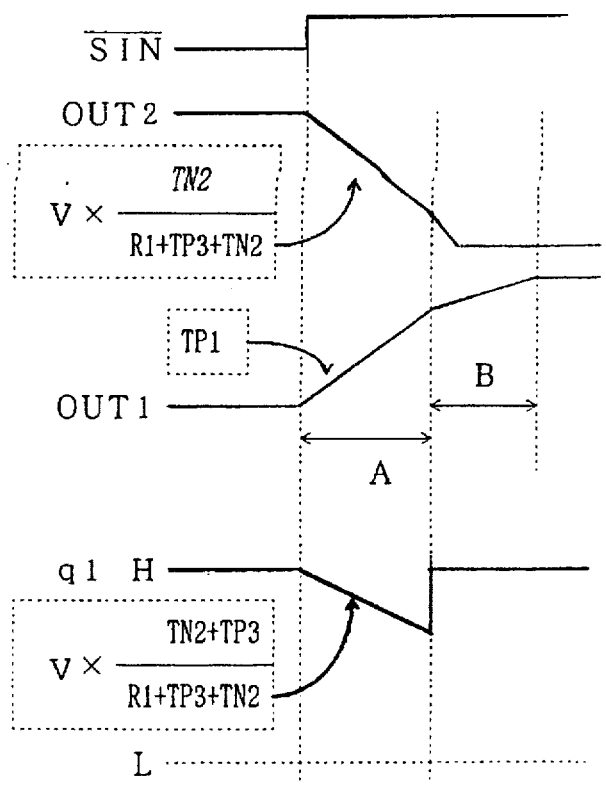
FIG. 48A is a waveform diagram for supplementing the operation at transition time (IN="H"→"L") of the level converter shown in FIG. 46A.
Figure 48B:
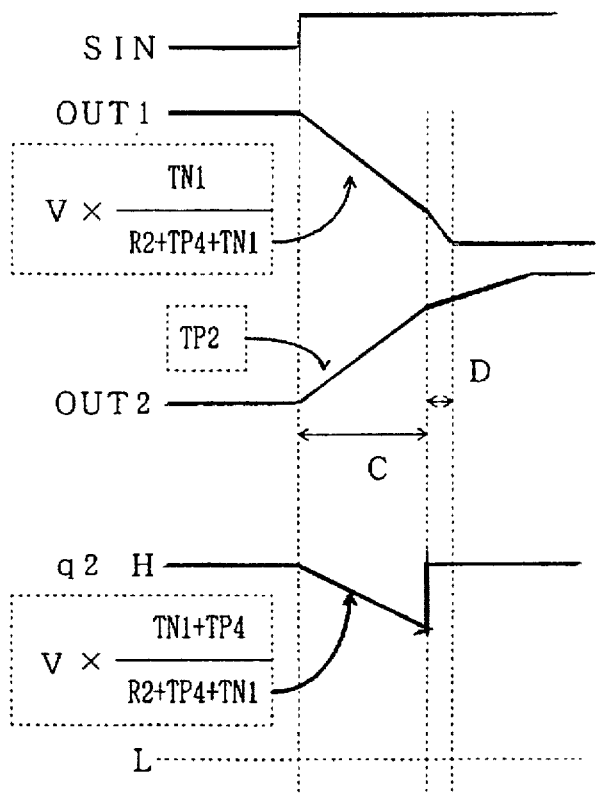
FIG. 48B is a waveform diagram for supplementing the operation at transition time (IN="L"→"H") of the level converter shown in FIG. 46A.

With this, as shown in FIG. 47D, the transistor TN1 is turned ON from OFF, and the rise time tf from the "H" level to the "L" level at the output OUT1 is determined by a ratio of an ON resistance of TN1 to the composite value of the resistance R2 and an ON resistance of TP4 and the junction point q2 is shifted from the "H" level to the "L" level. Besides, the time tf is expressed by C+D in FIG. 48B. The output OUT1 changes depending on voltage×TN1/(R2+TP4+TN1), and the junction point q2 changes depending on voltage×(TN1+TP4)/(R2+TP4+TN1), respectively.

With this, as shown in FIG. 47D, the transistor TP2 is turned ON from OFF, and the potential of the output OUT2 is raised from the "L" level to the "H" level steeply. As a result, the gate of the transistor TP3 shows the "H" level through the inverters INV11, and the transistor TP3 is turned OFF. At this time, the "L" to "H" level of the output OUT2 is delayed by the inverters INV21, and the gate control signal $SG_{p4}$ thereof is supplied to the transistor TP4, which is turned OFF from ON.

Further, since the transistor TP4 is turned OFF, the gate voltage of the transistor TP2 shows the "H" level by the resistance R2, and the transistor TP2 is turned OFF. This process is shown in the period C in FIG. 48A.

At this time, the "H" to "L" level of the output OUT1 is delayed by the inverters INV11, and the gate control signal $SG_{p3}$ thereof is supplied to the transistor TP3, which is turned ON from OFF. With this, the transistor TN2 is turned OFF from ON, but the transistor TP1 is kept OFF as it is, and the potential of the output OUT2 is raised from the "L" level to the "H" level steeply. With this, the output OUT2 propagates the "H" level by the resistance R1. This process is shown in the period D in FIG. 48B.

Through repeated operation of the foregoing, it is possible to convert the signal level applied with signal processing by a 3 V driving system into a potential level applicable with signal processing by a 5 V driving system similarly to the 11th embodiment.

Thus, according to a level converter related to the 14th embodiment of the present invention, as shown in FIG. 46A, the inverters INV11 and INV21 in even numbers are provided, these serially connected inverters INV11 are connected between the gate of the transistor TP3 and the output OUT1, and the inverters INV21 are connected between the gate of the transistor TP4 and the output OUT2.

As a result, when the input IN is shifted from the "H" level to the "L" level, the transistor TP3 is turned OFF after the lapse of delay time of the inverters INV11, and the gate voltage of the transistor TP1 is set to the "H" level by the resistance R1. With this, the transistor TP4 is turned ON, and the "H" level is transmitted to the output OUT1 by the resistance R2.

At this time, a first signal transmission path circulating through the transistor TN2→the output OUT2→the transistor TP1→the output OUT1→the inverters INV11→the transistor TP3→the resistance R1→the transistor TP1 and a second signal transmission path circulating through the transistor TN2→the output OUT2→the inverters INV21→the transistor TP4→the resistance R2→the output OUT1 are formed.

Through the first signal transmission path, it is possible to shift the output OUT1 from the "L" level to the "H" level at a high speed, and it becomes possible to maintain the potential through the second signal transmission path after the output OUT1 is raised in the first signal transmission path, thus continuing the transition state, and the output OUT1 is shifted from the "L" level to the "H" level at a high speed.

Conversely, when the input IN is shifted from the "L" level to the "H" level, the transistor TP4 is turned ON from OFF after the lapse of delay time of the inverters INV21, the gate voltage of the transistor TP2 is set to the "H" level, the transistor TP3 is turned ON, and the "H" level is transmitted to the output OUT2 by the resistance R1.

At this time, a third signal transmission path circulating through the transistor TN1→the output OUT1→the transistor TP2→the output OUT2→the inverters INV21→the transistor TP4→the resistance R2→the transistor TP2 and a fourth signal transmission path circulating through the transistor TN1→the output OUT1→the inverters INV11→the transistor TP3→the resistance R1→the output OUT2 are formed.

As a result, it is possible to shift the output OUT1 from the "L" level to the "H" level at a high speed through the third signal transmission path, it becomes possible, after the level of the output OUT1 is raised through the signal transmission path, to hold the potential and continue the transition state through the fourth signal transmission path, and the output OUT2 is shifted from the "L" level to the "H" level at a high speed.

With this, it becomes possible to shorten the time required for raising the output OUT1 and the output OUT2 from the "L" level to the "H" level by providing delay in the signal transmission time by means of inverters INV11 and INV21 and by turning the transistors TP1 and TP2 ON during the delay period, thus making it possible to aim at to achieve a higher speed of circuit operation as compared with the 11th to the 13th embodiments. Further, it becomes possible to further reduce the through electric current between the transistors TP1 and TN1 and the through electric current between the transistors TP2 and TN2 connected to the driving power source system VDD2 and GND. With this, it becomes possible to aim at reduction of circuit power consumption.

DESCRIPTION OF THE 15TH PREFERRED EMBODIMENT

Figure 49A:
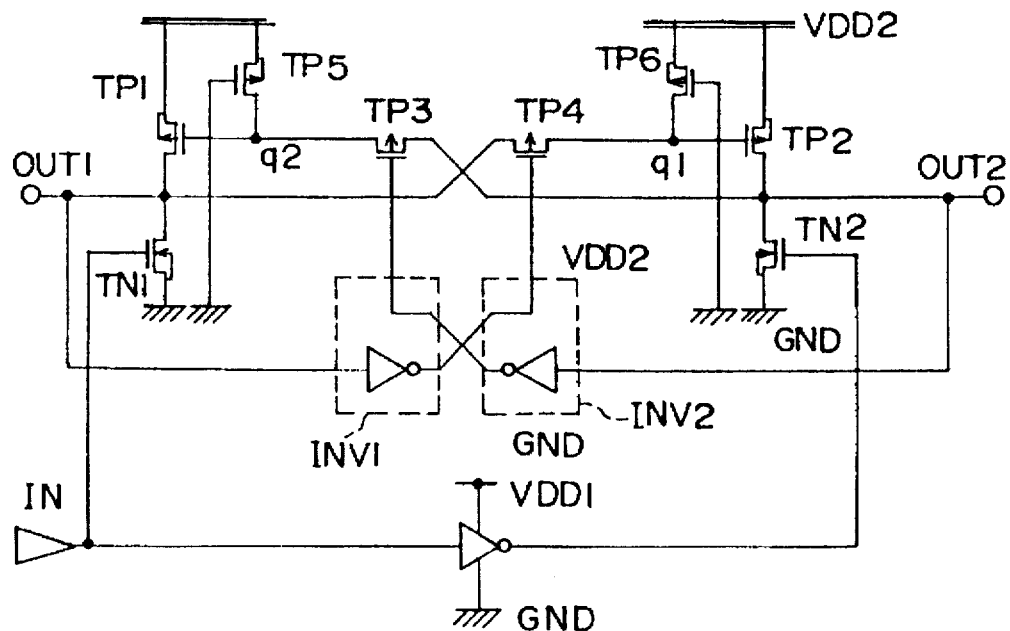
FIG. 49A is a block diagram of a level converter according to a 15th preferred embodiment of the present invention.

In a 15th embodiment, transistors TP5 and TP6 such as shown in FIG. 49A are provided in the level converter of the 13th embodiment, and the functions of the resistances R1 and R2 according to the 13th embodiment are provided. Namely, the transistor TP5 is an example of the seventh transistor T7, and consists of a p-type field effect transistor. The transistor TP5 is provided at the connecting position of the resistance R1 according to the 13th embodiment. The transistor TP5 is connected between the junction point q2 and the power line VDD2, and the gate thereof is connected to the ground line GND. The transistor TP5 has an ON resistance value of approximately several KΩ depending on the ON resistance of the transistor TN2.

The transistor TP6 is an example of the eighth transistor T8, and consists of a p-type field effect transistor. The transistor TP6 is connected between the junction point q1 and the power line VDD2, and the gate thereof is connected to the ground line GND. Besides, the transistor TP6 has an ON resistance value of approximately several KΩ depending on the ON resistance of the transistor TN1. Since other constructions are similar to those of the 13th embodiment, the description thereof is omitted.

Thus, according to a level converter related to the 15th embodiment of the present invention, the transistors TP5 and TP6 are provided as shown in FIG. 49A so as to provide functions of the resistances R1 and R2.

Figure 49B:
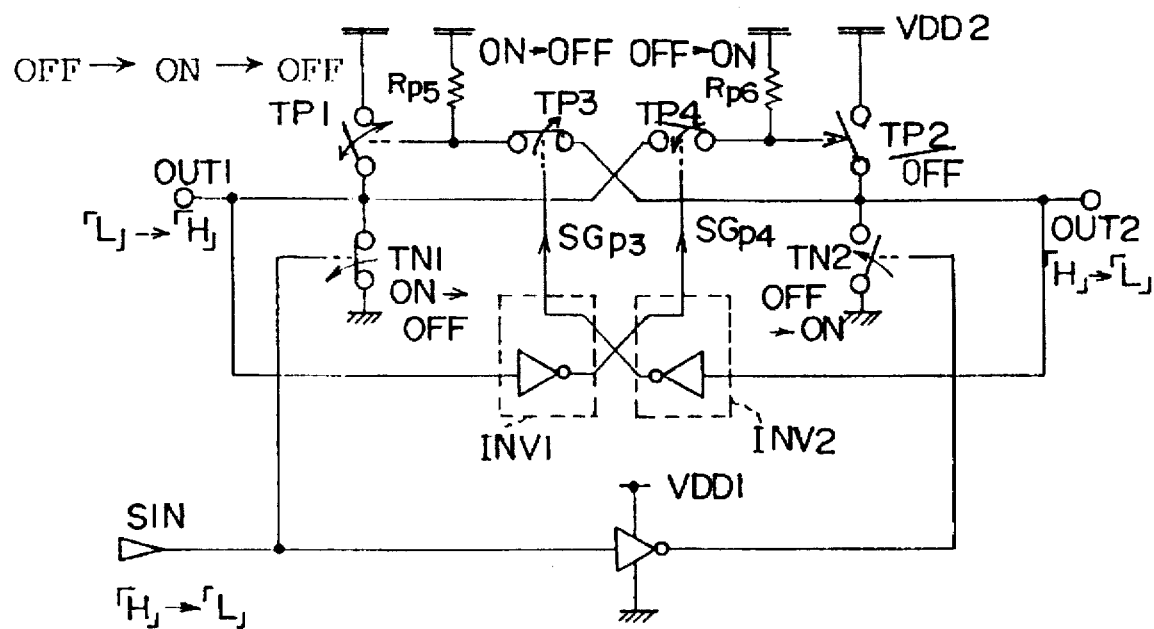
FIG. 49B is an equivalent circuit diagram for explaining the operation at transition time (IN="H"→"L") of the level converter shown in FIG. 49A.

As a result, when the input IN is shifted from the "H" level to the "L" level, it is possible to delay the "L" to "H" level of the output OUT1 by the inverter INV1 and to supply the gate control signal $SG_{p\ 4}$ thereof to the transistor TP4, thus shifting the transistor TP4 to ON operation with delay from OFF as shown in FIG. 49B. At this time, the potential level of the output OUT2 is determined by the ratio of the normally ON resistance $R_{p\ 5}$ of the transistor TP5 to the ON resistance of the transistor TN2.

Further, when the input IN is shifted from the "L" level to the "H" level, it is possible to delay the "L" to "H" level by the inverter INV2 and to supply the gate control signal $SG_{p\ 3}$ to the transistor TP3, thus shifting the transistor TP3 to ON operation with delay from OFF. The potential level of the output OUT1 is determined by the ratio of the normally ON resistance $R_{p\ 6}$ to the ON resistance of the transistor TN1.

With this, when the input IN is shifted from the "H" level to the "L" level or from the "L" level to the "H" level, it is possible to shift the output OUT1 from the "L" level to the "H" level at a high speed and to shift the output OUT2 from the "L" level to the "H" level at a high speed similarly to the 14th embodiment.

With this, it becomes possible to remove a through electric current between the transistors TP1 and TN1 and a through electric current between the transistors TP2 and TN2 connected to the driving power source system VDD2 and GND similarly to the 14th embodiment. Thus, it becomes possible to aim at reduction of circuit power consumption and to achieve a higher speed of circuit operation.

(16) Description of the 16th preferred embodiment

Figure 50A:
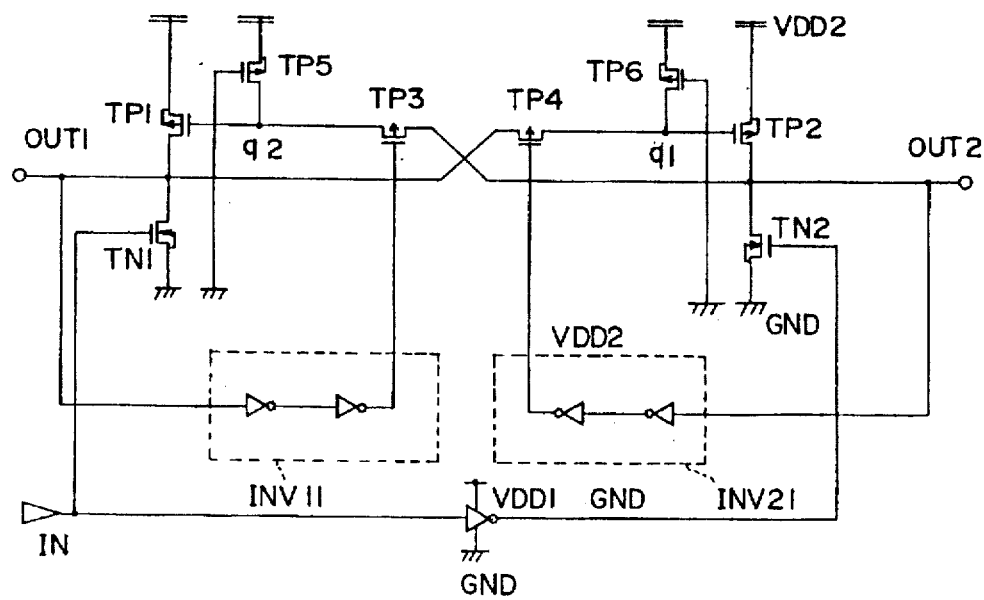
FIG. 50A is a block diagram of a level converter according to a 16th preferred embodiment of the present invention.

In a 16th embodiment, transistors TP5 and TP6 such as shown in FIG. 50A are provided in the level converter of the 14th embodiment so as to provide the functions of the resistances R1 and R2 according to the 14th embodiment. Namely, the transistor TP5 is an example of the seventh transistor T7, and consists of a p-type field effect transistor. The transistor TP5 is connected between the gate-source junction point q2 and the power line VDD2, and the gate thereof is connected to the ground line GND. The transistor TP5 has an ON resistance value of approximately several KΩ depending on the ON resistance of the transistor TN2.

The transistor TP6 is an example of the eighth transistor T8, and consists of a p-type field effect transistor. The transistor TP6 is connected between the gate-source junction point q1 and the power line VDD2, and the gate thereof is connected to the ground line GND. Besides, the transistor TP6 has an ON resistance value of approximately several KΩ depending on the ON resistance of the transistor TN1. Since other constructions thereof are similar to those of the 14th embodiment, the description thereof is omitted.

Thus, according to a level converter related to the 16th embodiment of the present invention, the transistors TP5 and TP6 are replaced at connecting positions of the resistances R1 and R2 of the level converter according to the 14th embodiment as shown in FIG. 50A.

Figure 50B:
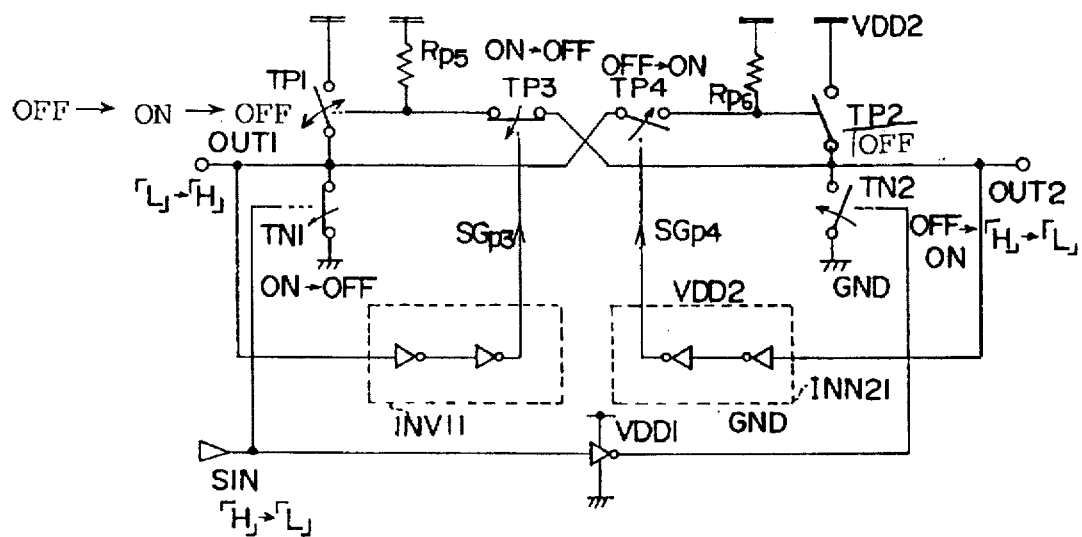
FIG. 50B is an equivalent circuit diagram for explaining the operation at transition time (IN="H"→"L") of the level converter shown in FIG. 50A.

As a result, when the input IN is shifted from the "H" level to the "L" level, the transistor TP3 is turned OFF after the delay time through an inverter INV11, and the gate voltage of the transistor TP1 is set to the "H" level by the normally ON resistance $R_{p\ 5}$ of the transistor TP5 as shown in FIG. 50B. The transistor TP4 is turned ON, and the "H" level is transmitted to the output OUT1 through the normally ON resistance $R_{p\ 6}$ of the transistor TPo.

At this time, a first signal transmission path circulating through the transistor TN2→the output OUT2→the transistor TP1→the output OUT1→the inverter INV11→the transistor TP3→the ON resistance $R_{p\ 5}$→the transistor TP1 and a second signal transmission path circulating through the transistor TN2→the output OUT2→the inverter INV21→the transistor TP4→the ON resistance $R_{p\ 6}$→the output OUT1 are formed.

It is possible to shift the output OUT1 from the "L" level to the "H" level at a high speed through the first signal transmission path, and it becomes possible, after the output is raised through the first signal transmission path, to maintain the potential so as to continue the transition state through the second signal transmission path, and the output OUT1 is shifted from the "L" level to the "H" level at a high speed.

Conversely, when the input IN is shifted from the "L" level to the "H" level, the transistor TP4 is turned OFF from ON with delay time through the inverter INV22, the gate voltage of the transistor TP2 is set to the "H" level by the ON resistance $R_{p\ 6}$, the transistor TP3 is turned ON, and the "H" level is transmitted to the output OUT2 by the ON resistance $R_{p\ 5}$.

At this time, a third signal transmission path circulating through the transistor TN1→the output OUT1→the transistor TP2→the output OUT2→the inverter INV21→the transistor TP4→the ON resistance $R_{p\ 6}$→the transistor TP6 and a fourth signal transmission path circulating through the transistor TN1→the output OUT1→the inverter INV11→the transistor TP3→the ON resistance $R_{p\ 5}$→the output OUT2 are formed.

As a result, it is possible to shift the output OUT2 from the "L" level to the "H" level at a high speed through the third signal transmission path, and it becomes possible, after the level is raised through the signal transmission path, to maintain the potential thereof and continue the transition state through the fourth signal transmission path, thus shifting the output OUT2 from the "L" level to the "H" level at a high speed.

With this, it becomes possible to shorten the time required to raise the output OUT1 and the output OUT2 from the "L" level to the "H" level similarly to the 14th embodiment by providing delay in the signal transmission time by the inverter s INV11 and INV21 and turning the transistors TP1 and TP2 ON during the delay time, thus making it possible to aim at to achieve a higher speed of circuit operation as compared with the 11th to the 13th embodiments. Further, it becomes possible to further reduce a through electric current between the transistors TP1 and TN1 and a through electric current between the transistors TP2 and TN2 connected to the driving power source system VDD2 and GND. Thus, it becomes possible to aim at reduction of circuit power consumption.

(17) Description of the 17th preferred embodiment

Figure 51A:
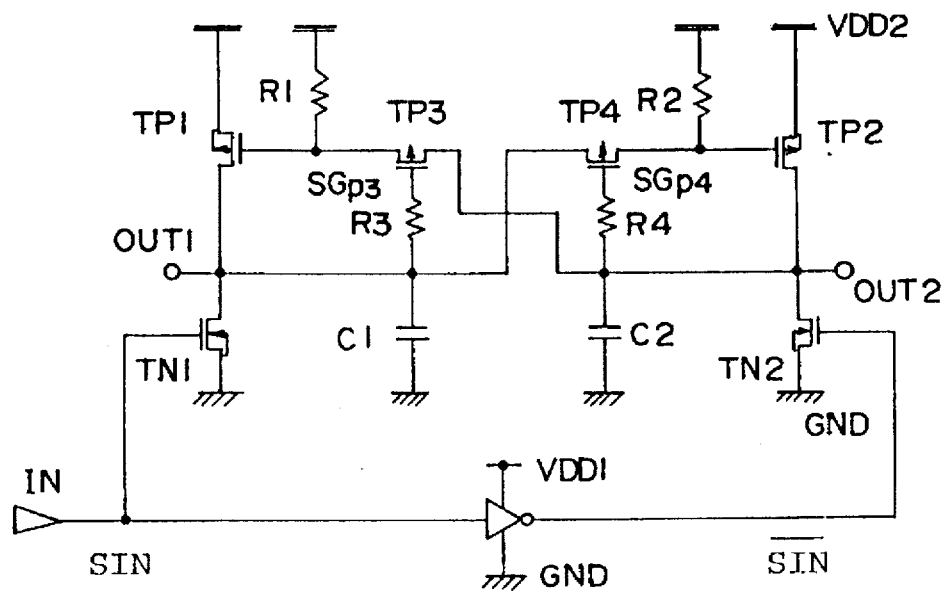
FIG. 51A is a block diagram of a level converter according to a 17th preferred embodiment of the present invention.

In a 17th embodiment, resistances R3 and R4 and capacitors C1 and C2 are provided in the level converter of the 11th embodiment as shown in FIG. 51A.

Namely, the resistance R3 is an example of the third load element, and is connected between the gate of the transistor TP3 and the output OUT1. The resistance R3 is set at a resistance value of approximately several KΩ depending on the ON resistance of the transistor TP3.

The resistance R4 is an example of the fourth load element, and is connected between the gate of the transistor TP4 and the output OUT2. The resistance R4 is set at a resistance value of approximately several KΩ depending on the ON resistance of the transistor TP4.

The capacitor C1 is an example of the first electrostatic capacity C1, and is connected between the output OUT1 and the ground line GND. The capacitor C2 is an example of the second electrostatic capacity C2, and is connected between the output OUT2 and the ground line GND. Besides, the resistance R3 and the capacitor C1 form an integrating circuit, and delay the potential level of the output OUT1 and output the delayed signal to the gate of the transistor TP3. Similarly, the resistance R4 and the capacitor C2 form an integrating circuit, and delay the potential level of the output OUT2 and output the delayed signal to the gate of the transistor TP4.

The time constants of the integrated circuits are adjusted in accordance with the loads (inverter circuits or the like) connected to the outputs OUT1 and OUT2. For example, the time constants are adjusted so as to become equal to the waveform rise time for reaching threshold voltage of the load circuits. With this, it becomes possible to transmit a signal to the next stage at a high speed. Besides, since other constructions are similar to those of the 11th embodiment, the description thereof is omitted.

Next, the operation of the level converter concerned will be described with reference to FIG. 51B and FIG. 52A to FIG. 52D.

Figure 51B:
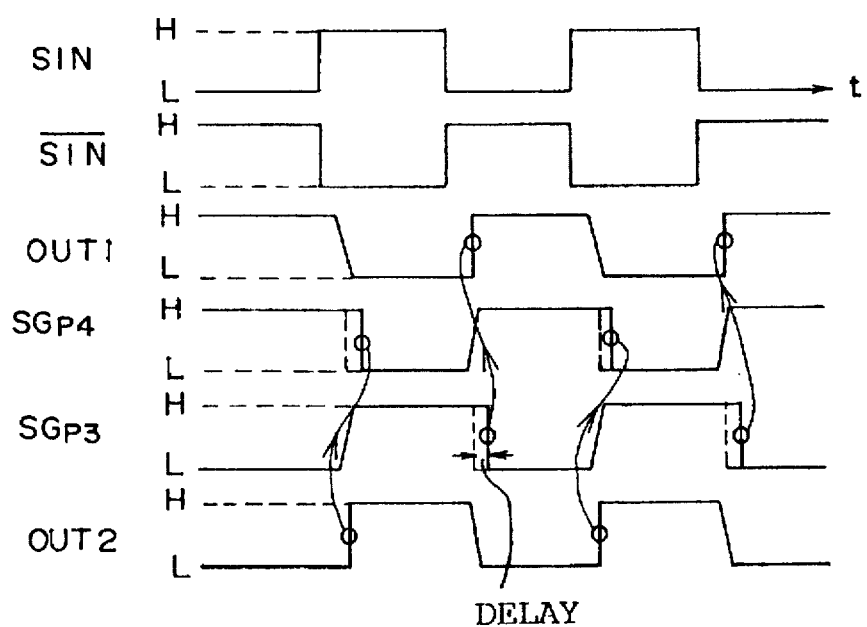
FIG. 51B is an operating waveform diagram of the level converter shown in FIG. 51A.

For example, as shown in FIG. 51B, at stationary time when the input IN shows the "H" level, an input signal SIN="H" level is supplied to the gate of the transistor TN1, and an input inverting signal $\overline{\text{SIN}}$="L" level is supplied to the gate of the transistor TN2. With this, as shown in equivalent circuit of FIG. 52A, the transistors TN1 and TP3 are turned ON, the transistors TN2, TP1, TP2 and TP4 are turned OFF, and the output OUT2 shows the "H" level and the output OUT1 shows the "L" level.

Figure 52A:
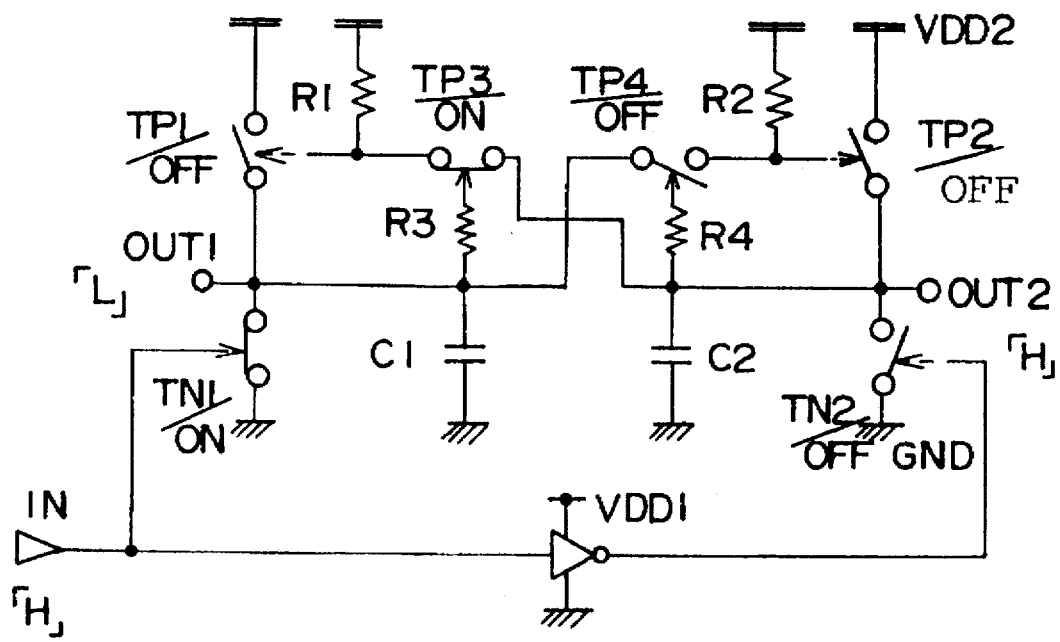
FIG. 52A is an equivalent circuit diagram for explaining the operation at stationary time (IN="H") of the level converter shown in FIG. 51A.
Figure 52B:
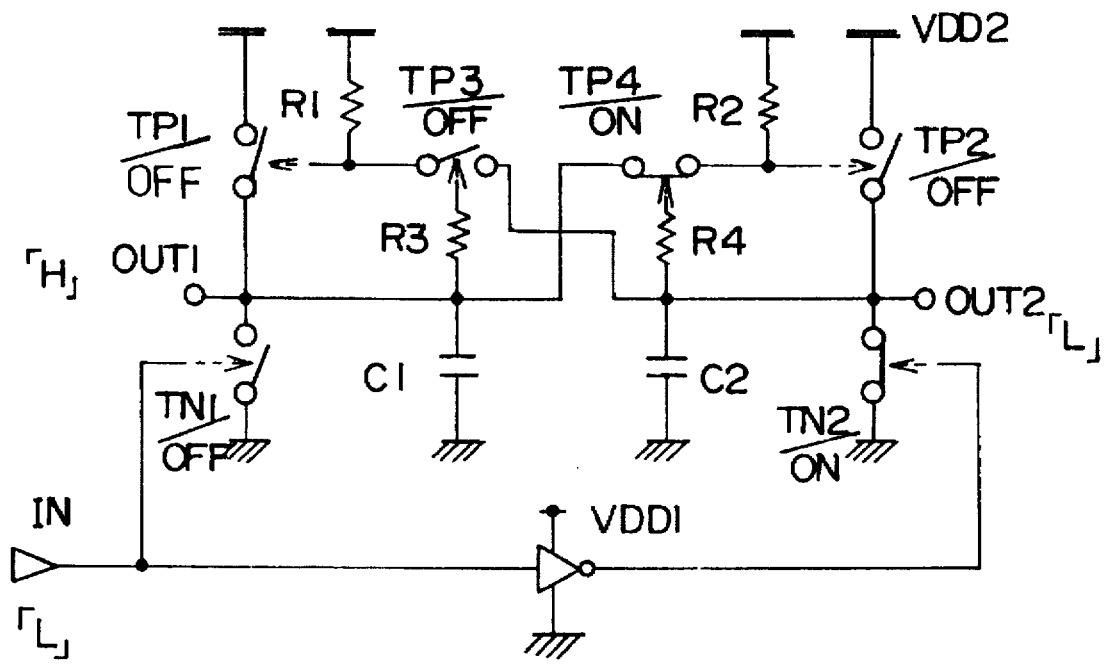
FIG. 52B is an equivalent circuit diagram for explaining the operation at stationary time (IN="L") of the level converter shown in FIG. 51A.

Conversely, at stationary time when the input IN shows the "L" level, an input inverting signal $\overline{\text{SIN}}$="H" level such as shown in FIG. 52B is supplied to the gate of the transistor TN2, and an input signal SIN="L" level is supplied to the gate of the transistor TN1. With this, as shown in an equivalent circuit of FIG. 52B, the transistors TN2 and TP4 are turned ON, the transistors TN1, TP1, TP2 and TP3 are turned OFF, and the output OUT1 shows the "H" level and the output OUT2 shows the "L" level.

Furthermore, when the input IN is shifted from the "H" level to the "L" level, an input signal SIN="H"→"L" level such as shown in FIG. 51B is supplied to the gate of the transistor TN1, and an input inverting signal $\overline{\text{SIN}}$="L"→"H" level is supplied to the gate of the transistor TN2.

Figure 52C:
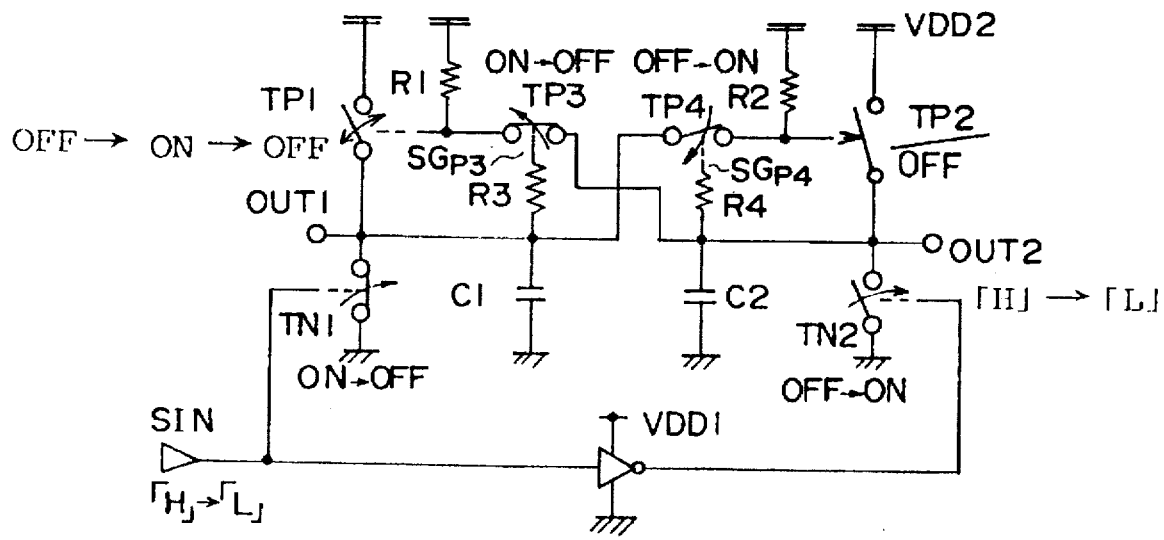
FIG. 52C is an equivalent circuit diagram for explaining the operation at transition time (IN="H"→"L") of the level converter shown in FIG. 51A.

With this, as shown in FIG. 52C, the transistor TP1 is turned ON from OFF quickly next to the OFF to ON operation of the transistor TN2, and the potential of the output OUT1 is raised from the "L" level to the "H" level steeply. The transistor TP1 is turned OFF immediately after momentary ON operation. Further, the transistor TN1 is turned OFF from ON, but the transistor TP2 is kept OFF as it is, and the potential of the output OUT2 falls from the "H" level to the "H" level steeply. At this time, the "L" to "H" level of the output OUT1 is delayed by the resistance R3 and the capacitor C1, and the gate control signal $SG_{p\,3}$ is supplied to the transistor TP3, which is turned OFF from ON. Further, the transistor TN1 is turned OFF from ON, but the transistor TP2 is kept OFF as it is, and the potential of the output OUT2 falls from the "H" level to the "L" level steeply.

Figure 52D:
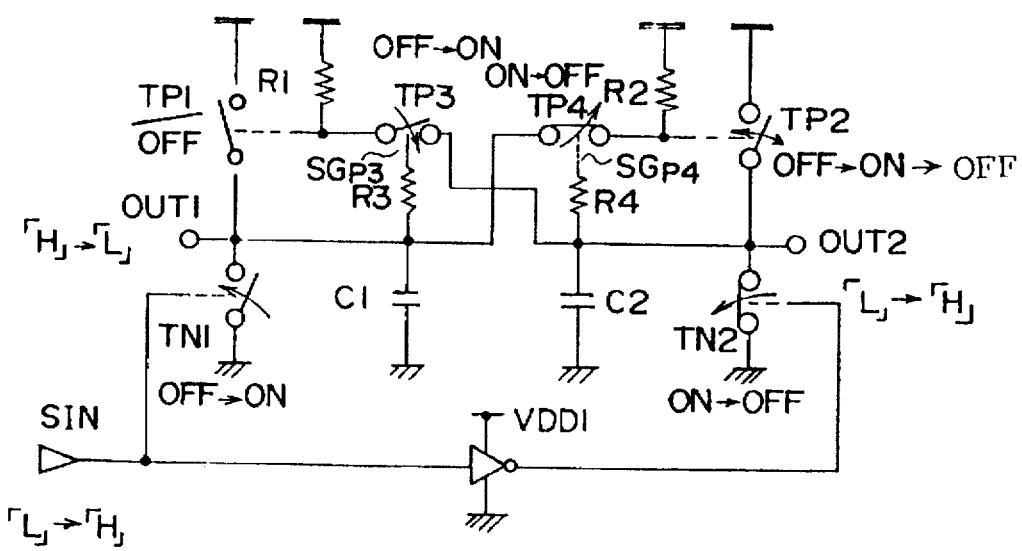
FIG. 52D is an equivalent circuit diagram for explaining the operation at transition time (IN="L"→"H") of the level converter shown in FIG. 51A.

Conversely, when the input IN is shifted from the "L" level to the "H" level, an input signal SIN="L"→"H" level such as shown in FIG. 51B is supplied to the gate of the transistor TN1, and an input inverting signal $\overline{\text{SIN}}$="H"→"L" level is supplied to the gate of the transistor TN2. With this, as shown in FIG. 52D, the transistor TN1 is turned ON from OFF, the transistor TP2 is turned ON from OFF quickly, and the potential of the output OUT2 is raised from the "L" level to the "H" level steeply. The transistor TP2 is turned OFF immediately after momentary ON operation.

At this time, the "L" to "H" level of the output OUT2 is delayed by the resistance R4 and the capacitor C2, and the gate control signal $SG_{p\,4}$ thereof is supplied to the transistor TP4, which is turned OFF from ON. Further, the transistor TN2 is turned OFF from ON, but the transistor TP1 is kept OFF as it is, and the potential of the output OUT1 falls from the "H" level to the "L" level steeply.

Through repeated operation of the foregoing, it is possible to convert the signal level applied with signal processing by a 3 V driving system into a potential level applicable with signal processing by a 5 V driving system similarly to the 11th to the 16th embodiments.

Thus, according to a level converter related to the 17th embodiment of the present invention, the resistances R3 and R4 and the capacitors C1 and C2 are provided as shown in FIG. 51A.

Thus, it is possible to supply the gate control signal $SG_{p\,3}$ with the potential level of the output OUT1 delayed by the resistance R3 and the capacitor C1 to the gate of the transistor TP3. Further, it is possible to supply the gate control signal $SG_{p\,4}$ with the potential level of the output OUT2 delayed by the resistance R4 and the capacitor C2 to the gate of the transistor TP4.

Thus, when the input IN is shifted from the "H" level to the "L" level or from the "L" level to the "H" level, it is possible to have the output OUT1 shift from the "L" level to the "H" level at a high speed and to have the output OUT2 shift from the "L" level to the "H" level at a high speed similarly to the 14th and the 16th embodiments.

With this, it becomes possible to remove a through electric current between the transistors TP1 and TN1 and a through electric current between the transistors TP2 and TN2 connected to the second driving power source system VDD2 and GND similarly to the 11th to the 16th level converters. Thus, it becomes possible to aim at reduction of circuit power consumption and to achieve a higher speed of circuit operation.

(18) Description of the 18th preferred embodiment

Figure 53A:
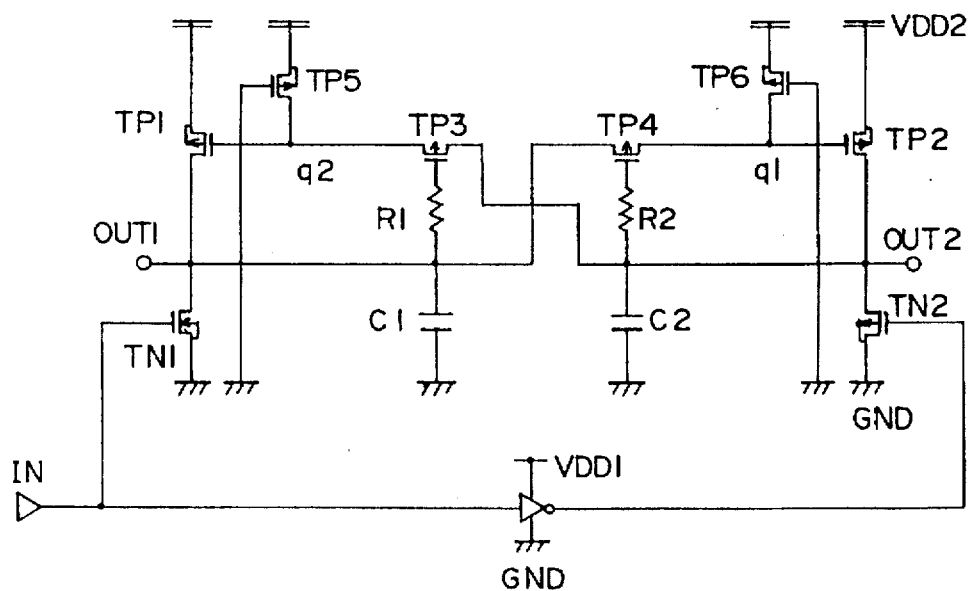
FIG. 53A is a block diagram of a level converter according to an 18th preferred embodiment of the present invention.

In an 18th embodiment, transistors TP5 and TP6 are provided in the level converter of the 17th embodiment as shown in FIG. 53A so as to provide the functions of the resistances R1 and R2 according to the 14th embodiment. Namely, the transistor TP5 is provided at the connecting position of the resistance R1 according to the 14th embodiment. The transistor TP5 is connected between the junction point q2 and the power line VDD2, and the gate thereof is connected to the ground line GND. The transistor TP5 has an ON resistance value of approximately several KΩ depending on the ON resistance of the transistor TN2.

The transistor TP6 is connected between the junction point q1 and the power line VDD2, and the gate thereof is connected to the ground line GND. Besides, the transistor TP6 has an ON resistance value of approximately several KΩ depending on the ON resistance of the transistor TN1. Since other constructions are similar to those of the 14th and the 17th embodiments, the description thereof is omitted.

Thus, according to the level converter related to the 18th embodiment of the present invention, the transistors TP5 and TP6 are provided so as to provide the functions of the resistances R1 and R2 as shown in FIG. 53(A).

Figure 53B:
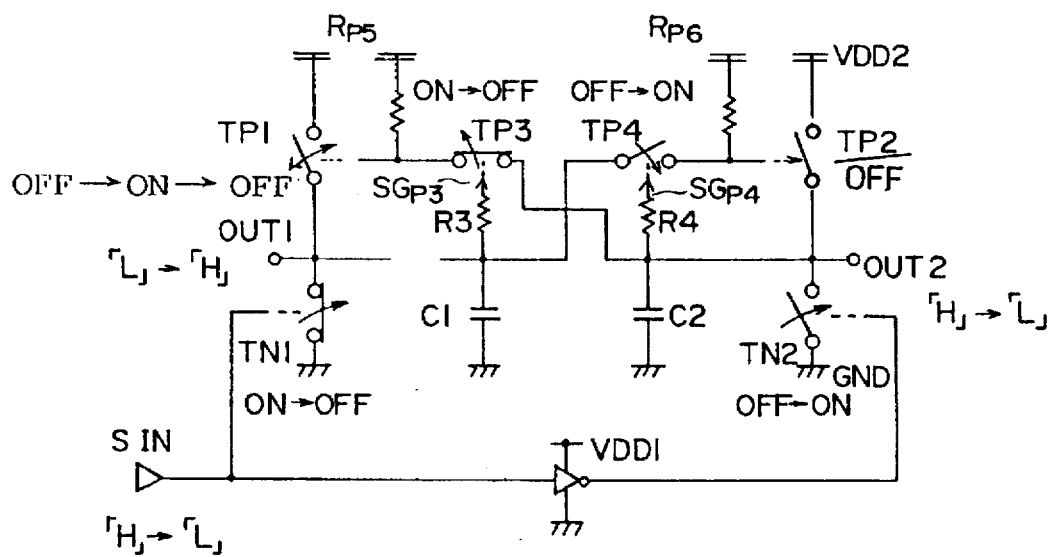
FIG. 53B is an equivalent circuit diagram for explaining the operation at transition time (IN="H"→"L") of the level converter shown in FIG. 53A.

As a result, when the input IN is shifted from the "H" level to the "L" level, it is possible to delay the "L" to "H" level of the output OUT1 by the resistance R3 and the capacitor C1 and supply the gate control signal $SG_{p\ 3}$ thereof to the gate of the transistor TP3 as shown in FIG. 53B, thus making it possible to turn the transistor TP3 OFF with delay from ON. At this time, the potential level of the output OUT2 is determined by the ratio of the normally ON resistance $R_{p\ 5}$ of the transistor TP5 to the ON resistance of the transistor TN2.

Further, when the input IN is shifted from the "L" level to the "H" level, it is possible to delay the "L" to "H" level of the output OUT2 by the resistance R4 and the capacitor C2 and to supply the gate control signal $SG_{p\ 4}$ to the gate of the transistor TP4, thus making it possible to turn the transistor TP4 OFF with delay from ON. At this time, the potential level of the output OUT1 is determined by the ratio of the normally ON resistance $R_{p\ 6}$ to the ON resistance of the transistor TN1.

Thus, when the input IN is shifted from the "H" level to the "L" level or from the "L" level to the "H" level, it is possible to shift the output OUT1 from the "L" level to the "H" level at a high speed and to shift the output OUT2 from the "L" level to the "H" level at a high speed similarly to the 14th embodiment.

With this, it becomes possible to remove a through electric current between the transistors TP1 and TN1 and a through electric current between the transistors TP2 and TN2 connected to the driving power source system VDD2 and GND similarly to the 14th embodiment. Thus, it becomes possible to aim at reduction of circuit power consumption and to achieve a higher speed of circuit operation.

(19) Description of the 19th preferred embodiment

Figure 54A:
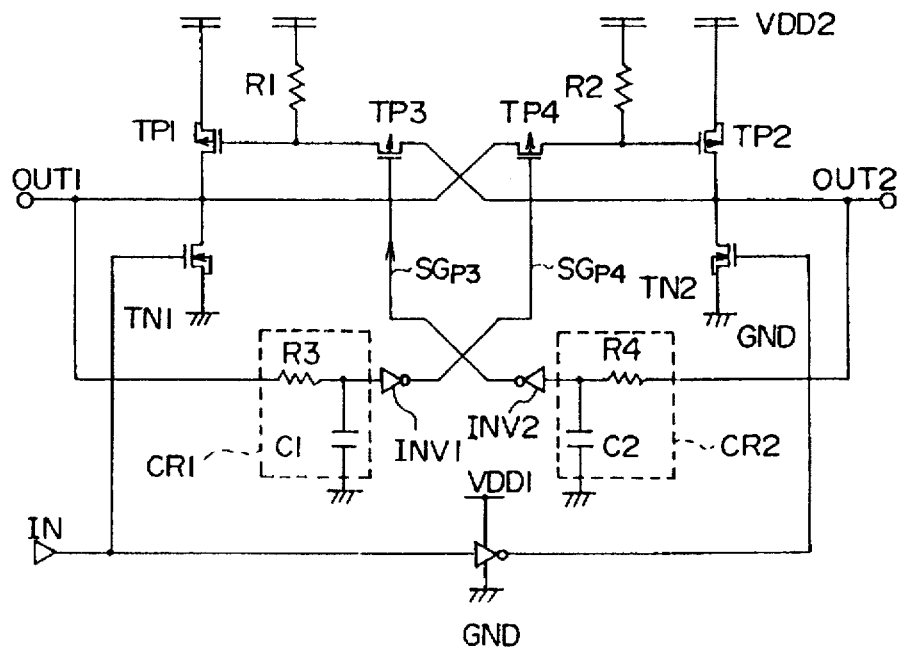
FIG. 54A is a block diagram of a level converter according to a 19th preferred embodiment of the present invention.

In a 19th embodiment, integrating circuits CR1 and CR2 such as shown in FIG. 54A are provided in the level converter shown in the 15th embodiment.

Namely, the integrating circuit CR1 is connected between the inverter INV1 and the output OUT1, and consists of the resistance R3 and the capacitor C1. The function thereof is to delay the potential level of the output OUT1 and output a delayed signal to the inverter INV1. Besides, the resistance R3 is connected between the input of the inverter INV1 and the output OUT1, and the capacitor C1 is connected between the junction point thereof and the ground line GND.

Similarly, the integrating circuit CR2 is connected between the inverter INV2 and the output OUT2, and consists of the resistance R4 and the capacitor C2. The function thereof is to delay the potential level of the output OUT2 and output the delayed signal thereof to the inverter INV2. Besides, the resistance R4 is connected between the input of the inverter INV2 and the output OUT2, and the capacitor C2 is connected between the junction point thereof and the ground line GND.

Further, the time constants of the integrating circuits CR1 and CR2 are adjusted in accordance with the loads (inverter circuits or the like) connected to the outputs OUT1 and OUT2. For example, the time constants are adjusted so as to become equal to the waveform rise time for reaching the threshold voltage of the load circuit. With this, it becomes possible to transmit a signal to the next stage at a high speed. Since other constructions are similar to those of the 11th embodiment, the description thereof is omitted.

Next, the operation of the level converter concerned will be described with reference to FIG. 54B and FIG. 55A to FIG. 55D.

Figure 54B:
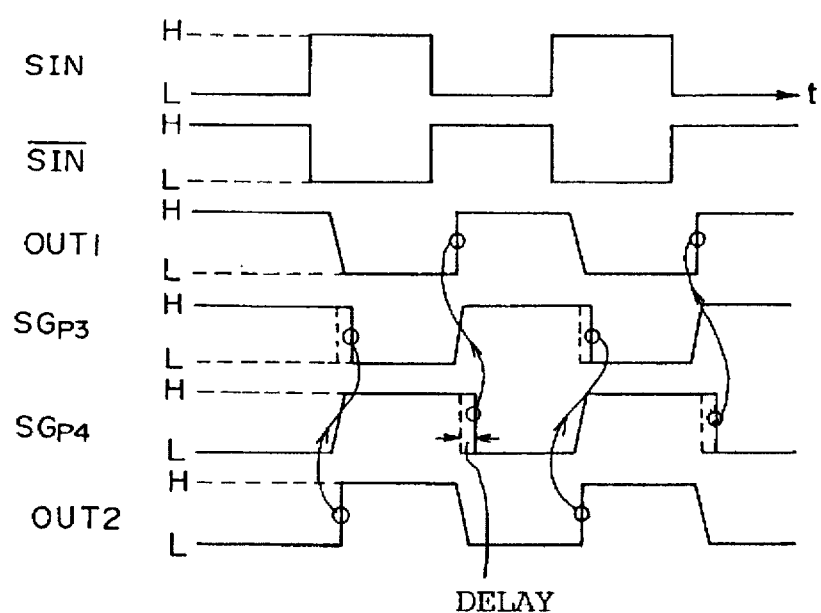
FIG. 54B is an operating waveform diagram of the level converter shown in FIG. 54A.

For example, at stationary time when the input IN shows the "H" level, an input signal SIN="H" level is supplied to the gate of the transistor TN1 and an input inverting signal $\overline{SIN}$="L" level is supplied to the gate of the transistor TN2 as shown in FIG. 54B.

Figure 55A:
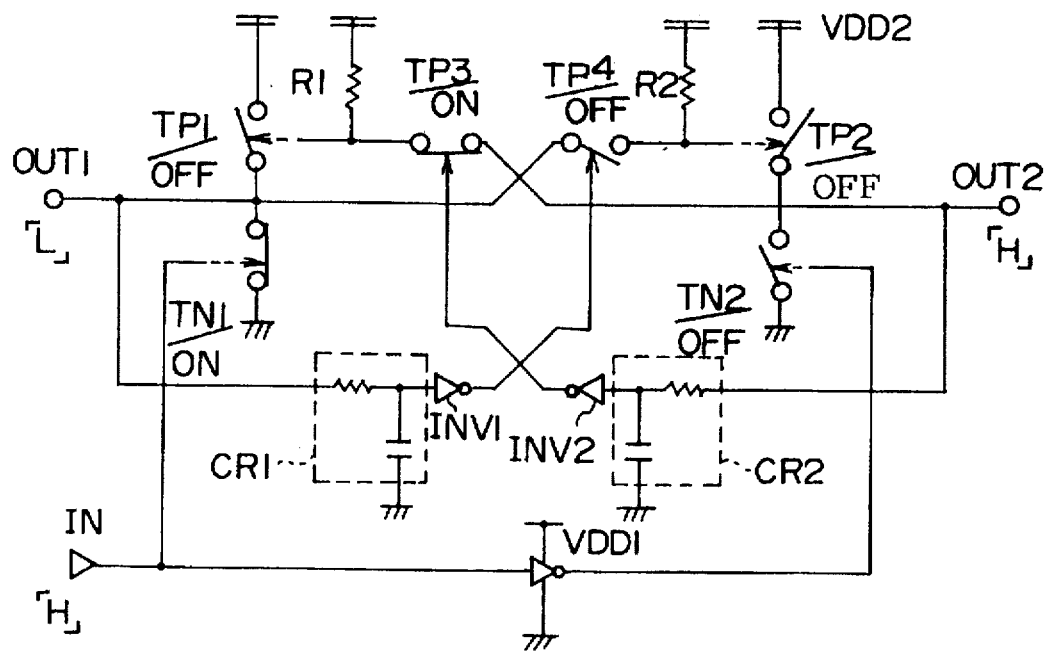
FIG. 55A is an equivalent circuit diagram for explaining the operation at stationary time (IN="H") of the level converter shown in FIG. 54A.

With this, as shown in an equivalent circuit of FIG. 55A, the transistors TN1 and TP3 are turned ON, the transistors TN2, TP1, TP2 and TP4 are turned OFF, and the output OUT2 shows the "H" level and the output OUT1 shows the "L" level.

Figure 55B:
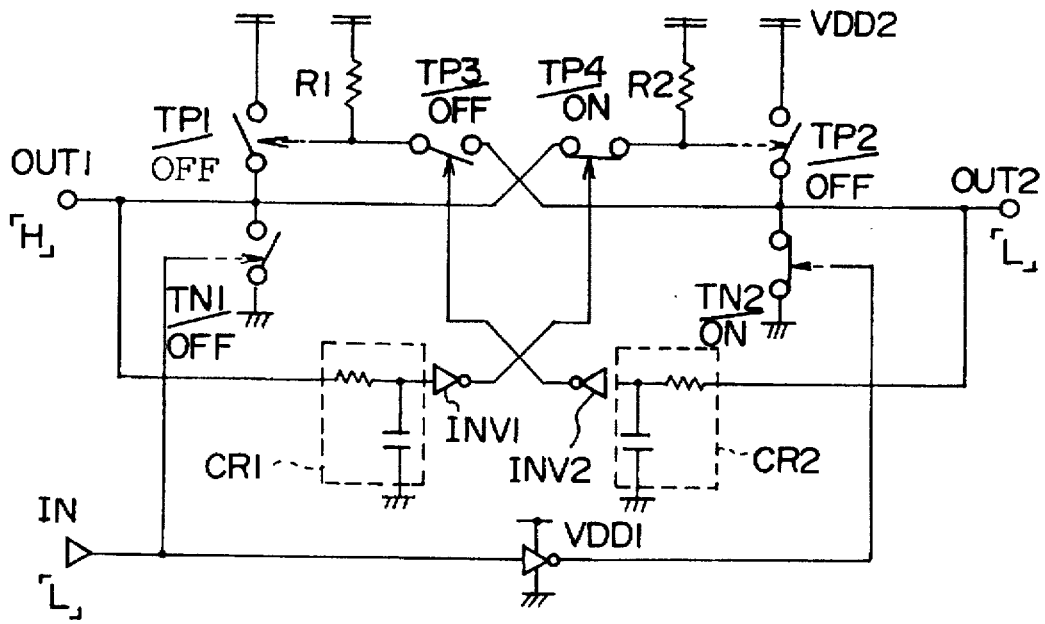
FIG. 55B is an equivalent circuit diagram for explaining the operation at stationary time (IN="L") of the level converter shown in FIG. 54A.

Conversely, at stationary time when the input IN shows the "L" level, an input signal SIN="L" level such as shown in FIG. 55B is supplied to the gate of the transistor TN1 and an input inverting signal $\overline{SIN}$="H" level is supplied to the gate of the transistor TN2. With this, as shown in an equivalent circuit of FIG. 55B, the transistors TN2 and TP4 are turned ON, the transistors TN1, TP1, TP2 and TP3 are turned OFF, and the output OUT1 shows the "H" level and the output OUT2 shows the "L" level.

Furthermore, when the input IN is shifted from the "H" level to the "L" level, an input signal SIN="H"→"L" level such as shown in FIG. 54B is supplied to the gate of the transistor TN1, and an input inverting signal $\overline{SIN}$="L"→"H" level is supplied to the gate of the transistor TN2.

Figure 55C:
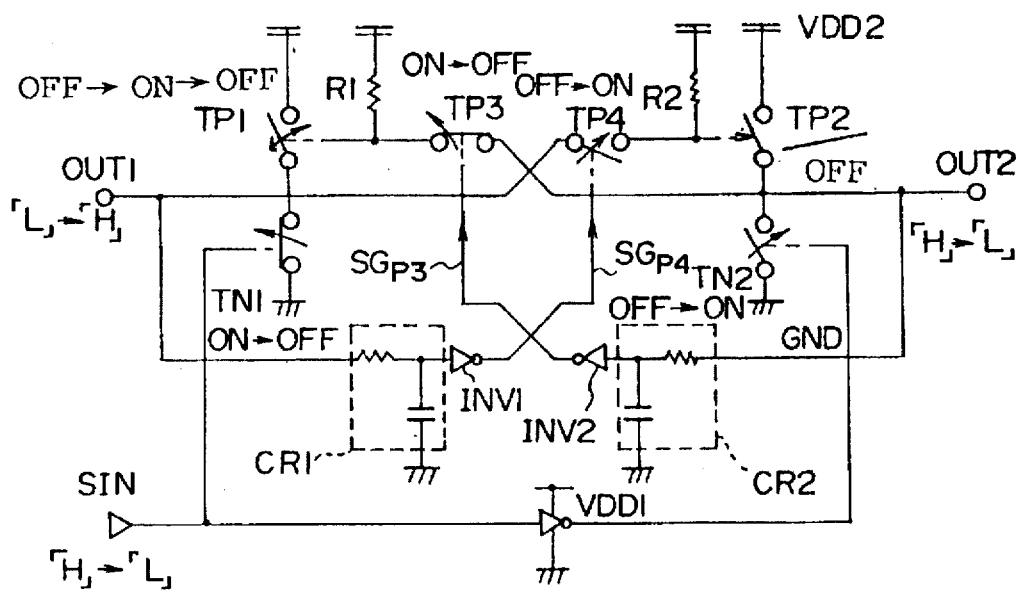
FIG. 55C is an equivalent circuit diagram for explaining the operation at transition time (IN="H"→"L") of the level converter shown in FIG. 54A.

With this, as shown in FIG. 55C, the transistor TN2 is turned ON from OFF, the transistor TP1 is turned ON from OFF quickly, and the potential level of the output OUT1 is raised from the "L" level to the "H" level steeply. The transistor TP1 is turned OFF immediately after momentary ON operation. The transistor TN1 is turned OFF from ON, but the transistor TP2 is kept OFF as it is, and the potential of the output OUT2 falls from the "H" level to the "L" level steeply. At this time, the "L" to "H" level of the output OUT1 is delayed by the integrating circuit CR1, and the gate control signal $SG_{p\ 4}$ is supplied to the transistor TP4, which is turned ON from OFF. Further, the transistor TN1 is turned OFF from ON, but the transistor TP2 is kept OFF as it is, and the potential of the output OUT2 falls from the "H" level to the "L" level steeply.

Figure 55D:
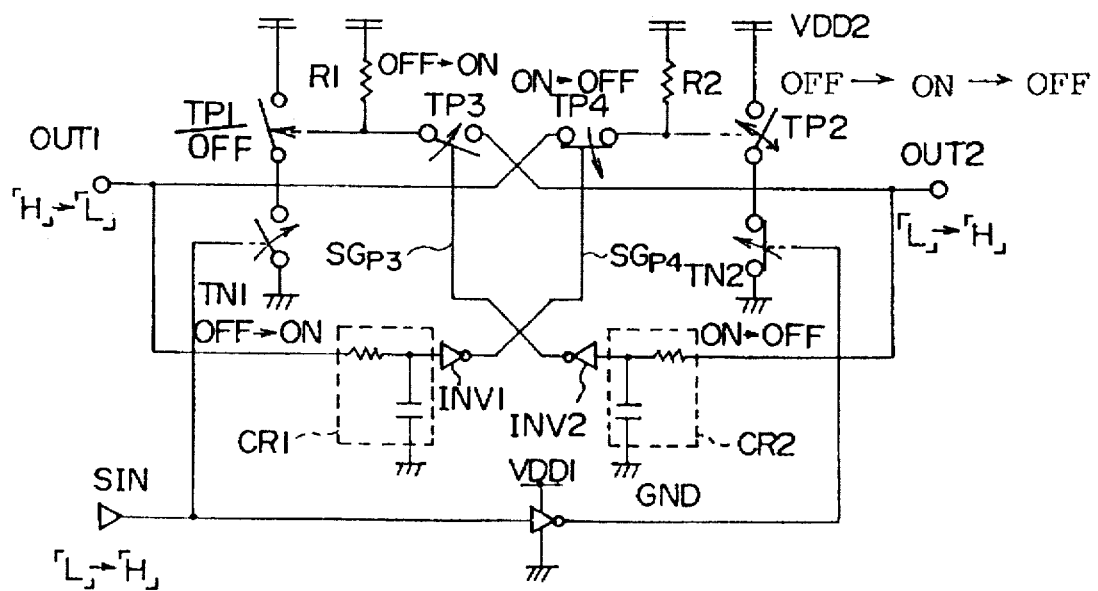
FIG. 55D is an equivalent circuit diagram for explaining the operation at transition time (IN="L"→"H") of the level converter shown in FIG. 54A.

Conversely, when the input IN is shifted from the "L" level to the "H" level, an input signal SIN="L"→"H" level such as shown in FIG. 54B is supplied to the gate of the transistor TN1, and an input inverting signal $\overline{SIN}$="H"→"L" level is supplied to the gate of the transistor TN2. With this, as shown in FIG. 55D, the transistor TN1 is turned ON from OFF, the transistor TN2 is turned ON from OFF quickly, and the potential of the output OUT2 is raised from the "L" level to the "H" level steeply. The transistor TP2 is turned OFF immediately after momentary ON operation.

At this time, the "L" to "H" level of the output OUT2 is delayed by the integrating circuit CR2, and the gate control signal $SG_{p\ 3}$ thereof is supplied to the transistor TP3, which is turned ON from OFF. Further, the transistor TP2 is turned OFF from ON, but the transistor TP1 is kept OFF as it is, and the potential of the output OUT1 falls from the "H" level to the "L" level steeply.

Through repeated operation of the foregoing, it is possible to convert the signal level applied with signal processing by a 3 V driving system into a potential level applicable with signal processing by a 5 V driving system.

Thus, according to a level converter related to the 19th embodiment of the present invention, the integrating circuits CR1 and CR2 are connected at preceding stages of the inverters INV1 and INV2 as shown in FIG. 54A.

As a result, when the input IN is shifted from the "H" level to the "L" level or from the "L" level to the "H" level, it is possible to supply the gate control signal $SG_{p\,4}$ with the potential level of the output OUT1 delayed by the integrating circuit CR1 and the inverter INV1 to the gate of the transistor TP4, and it is possible to supply the gate control signal $SG_{p\,3}$ with the potential level of the output OUT2 delayed by the integrating circuit CR2 and the inverter INV2 to the gate of the transistor TP3. Thus, it is possible to shift the output OUT1 from the "L" level to the "H" level at a high speed, and to shift the output OUT2 from the "L" level to the "H" level at a high speed.

With this, similarly to the 11th to the 18th level converters, it becomes possible to remove a through electric current between the transistors TP1 and TN1 and a through electric current between the transistors TP2 and TN2 connected to the second driving power source system VDD2 and GND. Thus, it becomes possible to aim at reduction of circuit power consumption and to achieve a higher speed of circuit operation.

(20) Description of the 20th preferred embodiment

Figure 56A:
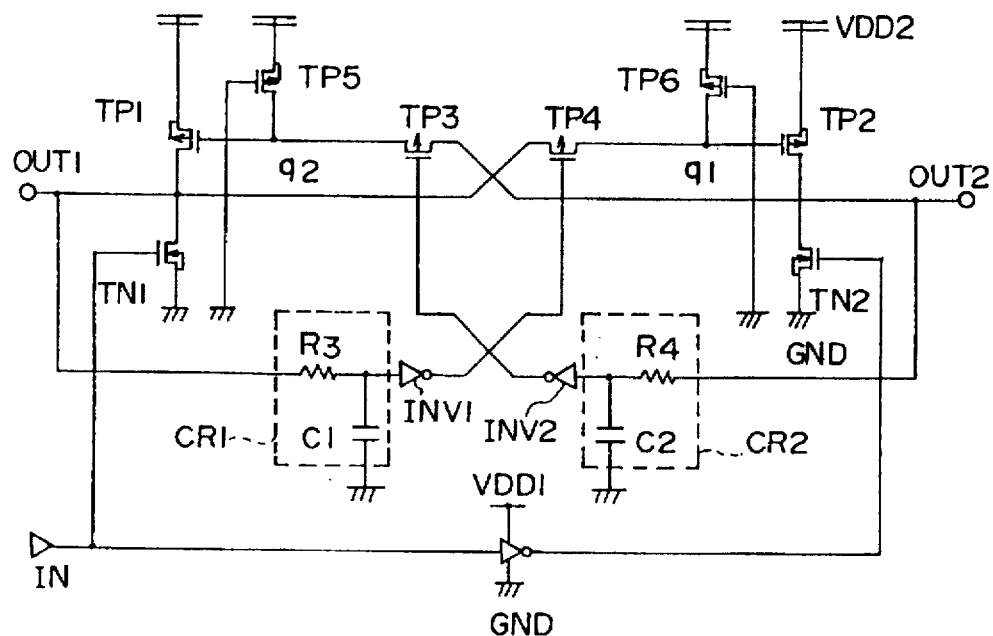
FIG. 56A is a block diagram of a level converter according to a 20th preferred embodiment of the present invention.
Figure 56B:
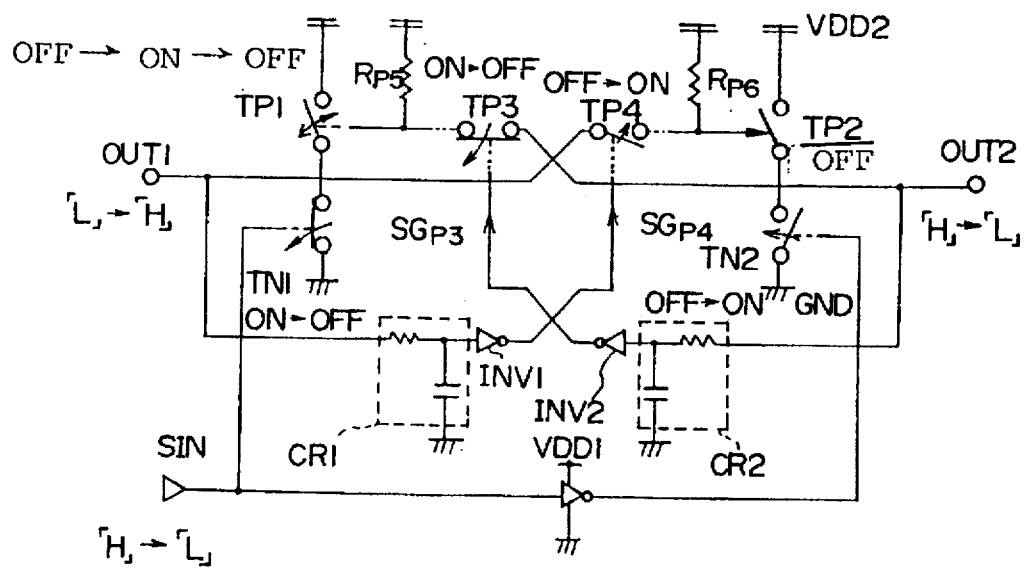
FIG. 56B is an equivalent circuit diagram for explaining the operation at transition time (IN="H"→"L") of the level converter shown in FIG. 56A.

In a 20th embodiment, transistors TP5 and TP6 are provided so as to provide the functions of resistances R1 and R2 according the 14th embodiment as shown in FIG. 56A in the level converter of the 19th embodiment. The transistor TP5 is provided at the connecting position of the resistance R1 according to the 14th embodiment. Namely, the transistor TP5 is connected between the junction point q2 and the power line VDD2, and the gate thereof is connected to the ground line GND. The transistor TP5 has an ON resistance value of approximately several KΩ depending on the ON resistance of the transistor TN2.

The transistor TP6 is connected between the junction point q1 and the power line VDD2, and the gate thereof is connected to the ground line GND. Besides, the transistor TP6 has an ON resistance value of approximately several KΩ depending on the ON resistance of the transistor TP7. Since other constructions thereof are similar to those of the 14th and the 19th embodiments, the description thereof is omitted.

Thus, according to the level converter related to the 20th embodiment, the transistors TP5 and TP6 are provided so as to provide the functions of the resistances R1 and R2 as shown in FIG. 56A.

As a result, when the input IN is shifted from the "H" level to the "L" level, it is possible to delay the "L" to "H" level of the output OUT1 by an integrating circuit CR1 and supply the gate control signal $SG_{p\,4}$ to the gate of the transistor TP4, thus shifting the transistor TP4 to ON with delay from OFF as shown in FIG. 51B. At this time, the potential level of the output OUT2 is determined by the ratio of the normally ON resistance of the transistor TP5 to the ON resistance of the transistor TN2.

Further, when the input IN is shifted from the "L" level to the "H" level, it is possible to delay the "L" to "H" level of the output OUT2 by an integrating circuit CR2 and supply the gate control signal $SG_{p\,3}$ to the gate of the transistor TP3, thus shifting the transistor TP3 to OFF with delay from ON. At this time, the potential level of the output OUT1 is determined by the ratio of the normally ON resistance $P_{p\,6}$ to the ON resistance of the transistor TN1.

With this, when the input IN is shifted from the "H" level to the "L" level or from the "L" level to the "H" level, it is possible to shift the output OUT1 from the "L" level to the "H" level at a high speed and to shift the output OUT2 from the "L" level to the "H" level at a high speed similarly to the 14th embodiment.

With this, it becomes possible to remove a through electric current between the transistors TP1 and TN1 and a through electric current between the transistors TP2 and TN2 connected to the driving power source system VDD2 and GND similarly to the 14th and the 19th embodiments. Thus, it becomes possible to aim at reduction of circuit power consumption and to achieve a higher speed of circuit operation.

In the level converters according to the 11th to the 20th embodiments described above, the power lines VDD1 and VDD2 are connected to high potential power sources with the potential level of the ground line GND as the reference, but, in the level converter according to the 21st to the 30th embodiments described hereinafter, the structures of transistor circuits in which the power lines GND1 and GND2 are connected to low potential power sources with the potential level of the power line GND as the reference are shown.

(21) Description of the 21st preferred embodiment

Figure 57A:
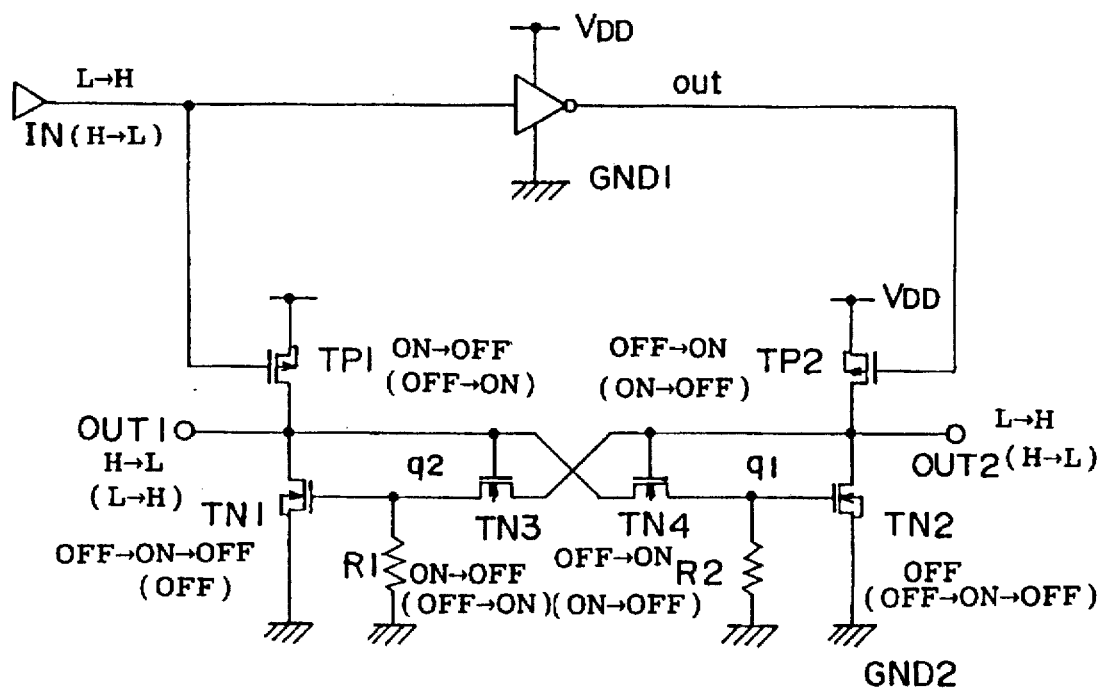
FIG. 57A is a block diagram of a level converter according to a 21st preferred embodiment of the present invention.
Figure 57B:
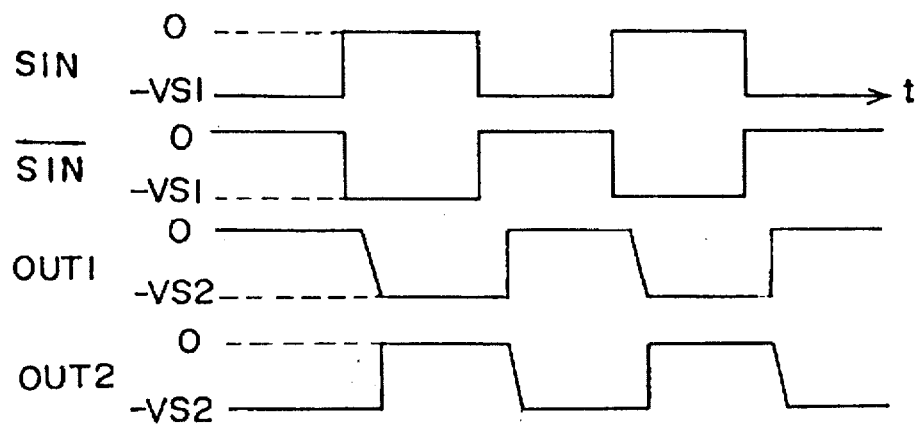
FIG. 57B is an operating waveform diagram of the level converter shown in FIG. 57A.

In a 21st level converter according to the present invention, an inverter INV, transistors TN1 to TN3, TP1 and TP2 and resistances R1 and R2 are provided, and the method of connecting to the power source is different from the 11th to the 20th embodiments as shown in FIG. 57A.

Namely, the inverter INV is connected between a ground line VDD (0 V) and a ground line (driving voltage $-VS1=$ approximately $-3$ V) GND1 which become a first driving power source system. Besides, the input latch circuit 11A such as shown in FIG. 25A adopted in the first embodiment may be used in place of the inverter INV.

The transistor TP1 is an example of the first transistor T1, and consists of a p-type field effect transistor (hereinafter referred to simply as a transistor). The source of the transistor TP1 is connected to the power line VDD, and the drain thereof is connected to the drain of the transistor TN1 (hereinafter also called series connection) and connected to the output OUT1. The gate of the transistor TP1 is connected to the input IN of the inverter INV.

The transistor TN1 is an example of the second transistor T2, and consists of an n-type field effect transistor (hereinafter referred to simply as a transistor). The source of the transistor TN1 is connected to a ground line (driving voltage–VS2=approximately −5 V) GND2, and the gate thereof is connected to the junction point q2 of one end of the resistance R1 and the transistor TN3.

The transistor TP2 is an example of the third transistor T3, and consists of a p-type field effect transistor. The source of the transistor TP2 is connected to the power line VDD, and the drain thereof is connected to the drain of the transistor TN2 and connected also to the output OUT2. The gate of the transistor TP2 is connected to the output out of the inverter INV.

The transistor TN2 is an example of the fourth transistor T4, and consists of an n-type field effect transistor. The source of the transistor TN2 is connected to the ground line GND2, the drain thereof is connected to a junction point q1 of one end of the resistance R2 and the transistor TN4.

The transistor TN3 is an example of the fifth transistor T5, the transistor TN4 is an example of the sixth transistor T6, and both consist of n-type field effect transistors. The drain of the transistor TN3 is connected to the gate of the transistor TN4 and is also connected to the output OUT2. The gate of the transistor TN3 is connected to the drain of the transistor TN4 and is also connected to the output OUT1.

The resistance R1 is connected between the junction point q2 and the ground line GND2, and has a resistance value of approximately several KΩ depending on the ON resistance of the transistor TP2. The resistance R2 is connected between a junction point q1 and the ground line GND2, and has a resistance value of approximately several KΩ depending on the ON resistance of the transistor TP1. Since other constructions thereof are similar to those of the 11th embodiment, the description thereof is omitted.

Thus, according to a level converter related to the 21st embodiment of the present invention, there are provided the inverter INV, the transistors TN1 to TN4, TP1 and TP2 and the resistances R1 and R2 as shown in FIG. 57A.

As a result, when the input signal SIN is shifted from the "L" level to the "H" level, the transistor TN3 is turned OFF from ON, and the transistor TN4 is turned ON from OFF. The transistors TN2 is turned OFF, and the transistors TN1 is turned ON momentarily. At this time, the potential level of the output OUT2 is determined by the ratio of the resistance R1 to the ON resistance of the transistor TP2 and TN2.

For example, when the ratio of the ON resistance is set so as to get lower than the threshold voltage Vth of the transistor TN1, the transistor TN3 is turned OFF, and the gate voltage of the transistor TN1 is set to the "L" level by the resistance R1. Further, the transistor TN4 is turned ON, the "L" level is transmitted to the output OUT1 by the resistance R2, and the output OUT1 is shifted from the "H" level to the "L" level at a high speed.

Conversely, when the input signal SIN is shifted from the "H" level to the "L" level, the transistors TP1 and TN2 are turned ON from OFF, and the transistors TP2, TN2 and TN4 are turned OFF from ON. The transistors TN2 is turned ON momentarily, and the transistors TP1 and TN2 are turned OFF. At this time, the potential level of the output OUT1 is determined by the ratio of the resistance R2 to the ON resistance of the transistor TP1 and TN4. For example, when the ratio of the ON resistance is set so as to get lower than the threshold voltage Vth of the transistor TN2, the transistor TN4 is turned OFF from ON, and the gate voltage of the transistor TN2 is set to the "L" level by the resistance R2. Further, the transistor TN3 is turned ON, the "L" level is transmitted to the output OUT2 by the resistance R1, and the output OUT2 is shifted from the "H" level to the "L" level at a high speed.

With this, it is possible to convert the ELC signal level applied with signal processing by a −3 V driving system into a potential level applicable with signal processing by a −5 V driving system. Further, it becomes possible to remove a through electric current between the transistors TP1 and TN1 and a through electric current between the transistors TP2 and TN2 connected to the driving power source system VDD and GND2. Thus, it becomes possible to aim at reduction of circuit power consumption of the level converter concerned and to aim at a higher speed of circuit operation similarly to the 11th embodiment.

(22) Description of the 22nd preferred embodiment

Figure 58A:
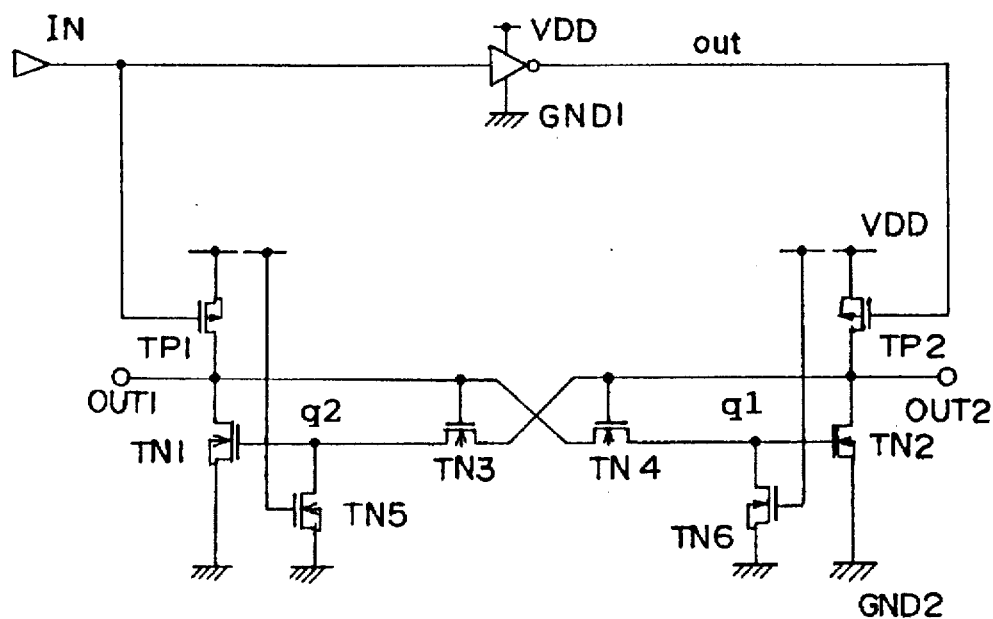
FIG. 58A is a block diagram of a level converter according to a 22nd preferred embodiment of the present invention.

Being different from the 21st embodiment, there are provided transistors TN5 and TN6 and an input latch circuit 11A in place of the inverter INV in a 22nd embodiment as shown in FIG. 58A.

Namely, the transistor TN5 is an example of the seventh transistor T7, and consists of an n-type field effect transistor. The transistor TN5 is provided at the connecting position of the resistance R1 according to the 21st embodiment. The transistor TN5 is connected between the junction point q2 and the ground line GND2, and the gate thereof is connected to the power line VDD2. The transistor TN5 has an ON resistance value of approximately several KΩ depending on the ON resistance of the transistor TP2.

The transistor TN6 is an example of the eighth transistor T8, and consists of an n-type field effect transistor. The transistor TN6 is connected between the junction point q1 and the ground line GND2, and the gate thereof is connected to the power line VDD2. Besides, the transistor TN6 has an ON resistance value of approximately several KΩ depending on the ON resistance of the transistor TP1. Since other constructions thereof are similar to those of the 21st embodiment, the description thereof is omitted.

Thus, according to a level converter related to the 22nd embodiment of the present invention, the transistors TN1 to TN6, TP1 and TP2 are provided, and the transistors TN5 and TN6 are replaced at the connecting position of the resistances R1 and R2 of the level converter according to the 21st embodiment.

Figure 58B:
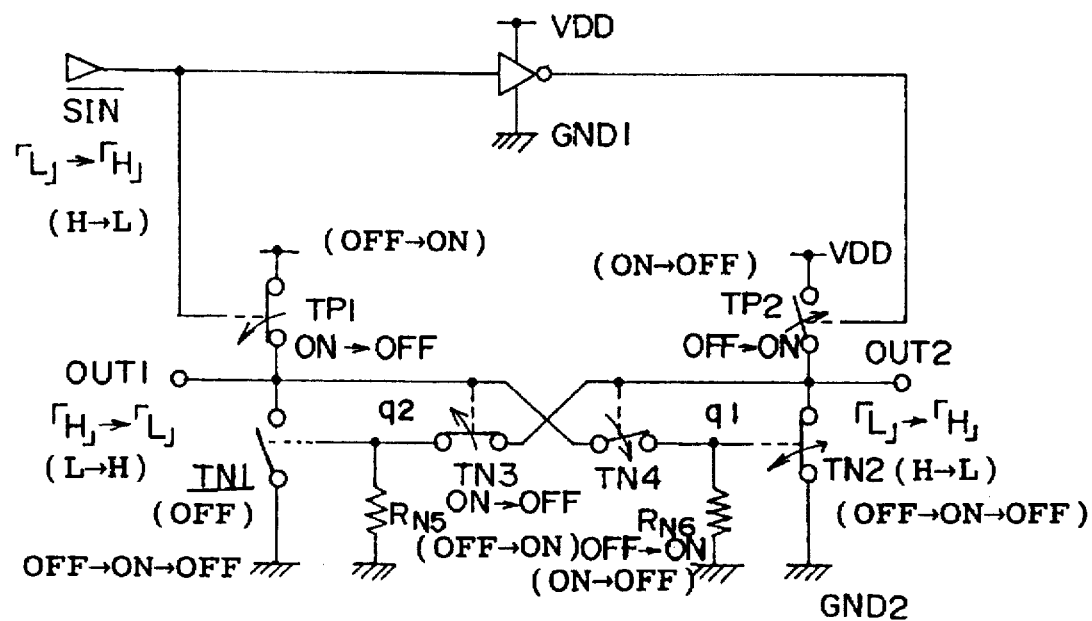
FIG. 58B is an equivalent circuit diagram for explaining the operation at transition time (IN="H"→"L") of the level converter shown in FIG. 58A.

As a result, it is possible to substitute the normally ON resistances RN5 and R. 6 of the transistors TN5 and TN6 for the functions of the resistances R1 and R2 of the level converter according to the 21st embodiment. For example, when the input signal SIN is shifted from the "L" level to the "H" level, the transistors TP2 and TN4 are turned ON from OFF and the transistors TP1 and TN3 are turned OFF from ON as shown in FIG. 58B. At this time, the transistor TN2 is kept OFF as it is, and the transistor TN1 is turned ON momentarily. In this case, the potential level of the output OUT2 is determined by the ratio of the normally ON resistance $R_{N\,5}$ of the transistor TN5 to the ON resistance of the transistor TP2.

In other words, when the normally ON resistance is set and the ratio of the ON resistance of the circuit is set so as to get lower than the threshold voltage Vth of the transistor TN1, the transistor TN3 is turned OFF, and the gate voltage of the transistor TN1 is set to the "L" level by the normally ON resistance $R_{N\,5}$. Further, the transistor TN4 is turned ON, the "L" level is transmitted to the output OUT1 by the normally ON resistance $R_{N\,6}$ of the transistor TN6, and the output OUT1 is shifted from the "H" level to the "L" level at a high speed.

Conversely, when the input signal SIN is shifted from the "H" level to the "L" level, the transistors TP1 and TN3 are turned OFF from ON, and the transistors TP2 and TN4 are turned ON from OFF. At this time, the transistor TN1 is kept OFF as it is, and the transistor TN2 is turned ON momentarily.

At this time, the potential level of the output OUT1 is determined by the ratio of the normally ON resistance $P_{p\,6}$ to the ON resistance of the transistor TP1. For example, when the normally ON resistance $R_{N\,6}$ is set and the ratio of the ON resistance of the circuit is set so as to get lower than the threshold voltage Vth of the transistor TN2, the transistor TN4 is turned OFF from ON, and the gate voltage of the transistor TN2 is set to the "L" level by the normally ON resistance $R_{N\,6}$.

Further, the transistor TN3 is turned ON, the "L" level is transmitted to the output OUT2 by the normally ON resistance $R_{N\,5}$, and the output OUT2 is shifted from the "H" level to the "L" level at a high speed.

With this, it becomes possible to remove a through electric current between the transistors TP1 and TN1 and a through electric current between the transistors TP2 and TN2 connected to the driving power source system VDD and GND2 similarly to the 21st embodiment. Thus, it becomes possible to aim at reduction of circuit power consumption and a higher speed of circuit operation.

(23) Description of the 23rd preferred embodiment

Figure 59A:
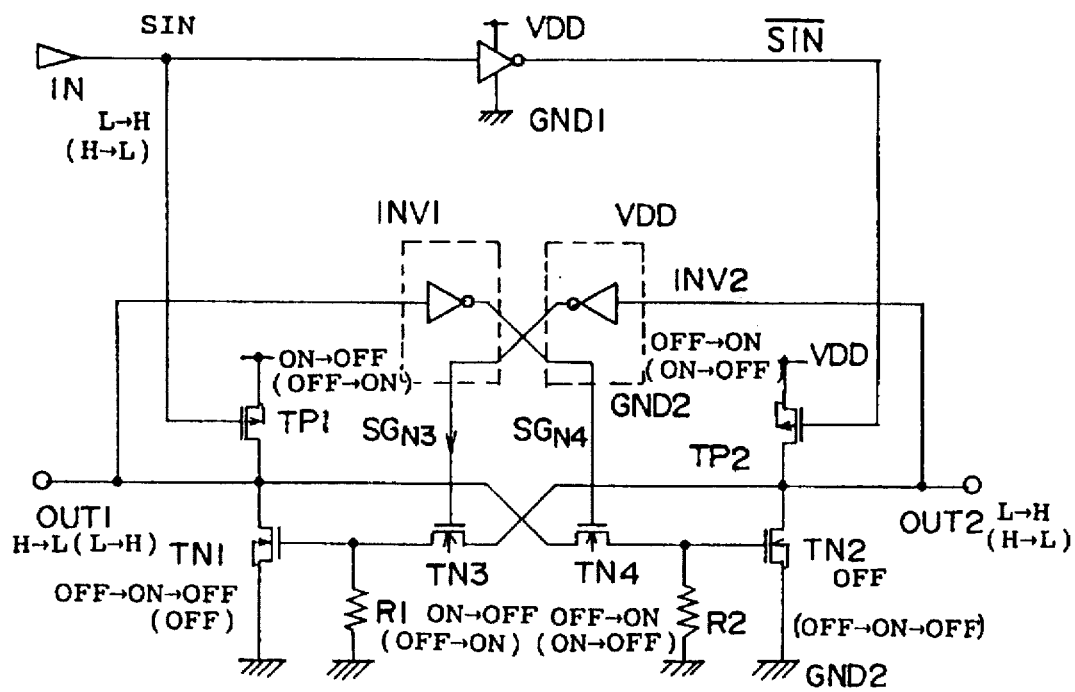
FIG. 59A is a block diagram of a level converter according to a 23rd preferred embodiment of the present invention.

Being different from the 21st embodiment, inverters INV1 and INV2 in odd numbers are provided as shown in FIG. 59A in a 23rd embodiment.

For example, one piece of inverter INV1 which shows an example of inverters INV in odd numbers is connected between the gate of the transistor TN4 and the output OUT1. The inverter INV1 is connected between the power line VDD and the ground line GND2, delays the potential level of the output OUT1 and controls the gate of the transistor TN4. Similarly, one piece of inverter INV2 is connected between the gate of the transistor TN3 and the output OUT2. The inverter INV2 is connected to the power line VDD and the ground line GND2, delays the potential level of the output OUT2 and controls the gate of the transistor TN3. Besides, since other constructions are similar to those of the 21st embodiment, the description thereof is omitted.

Thus, according to the level converter related to the 23rd embodiment of the present invention, the inverters INV1 and INV2 in odd numbers are provided, the inverter INV2 is connected between the gate of the transistor TN3 and the output OUT2, and the inverter INV1 is connected between the gate of the transistor TN4 and the output OUT1 as shown in FIG. 59A.

Figure 59B:
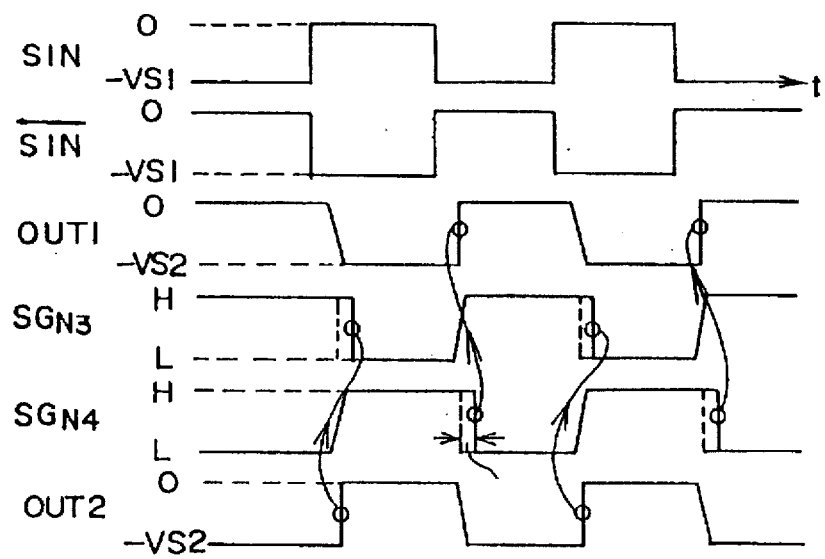
FIG. 59B is an operating waveform diagram of the level converter shown in FIG. 59A.

As a result, when the input signal SIN is shifted from the "L" level to the "H" level, it is possible to delay the "L" to "H" level of the output OUT1 by the inverter INV1, to supply the gate control signal $SG_{N4}$ thereof to the transistor TN4 and to turn the transistor TN4 ON with delay from OFF as shown in FIG. 59B.

Further, when the input signal SIN is shifted from the "H" level to the "L" level, it is possible to delay the "H" to "L" level of the output OUT2 by the inverter INV2, to supply the gate control signal $SG_{N3}$ to the transistor TN3 and to turn the transistor TN3 ON with delay from OFF.

With this, when the input signal SIN is shifted from the "H" level to the "L" level or from the "L" level to the "H" level, it is possible to shift the output OUT1 from the "L" level to the "H" level at a higher speed and to shift the output OUT2 from the "L" level to the "H" level at a higher speed as compared with the 21st embodiment.

With this, it becomes possible to remove a through electric current between the transistors TP1 and TN1 and a through electric current between the transistors TP2 and TN2 connected to the driving power source system VDD and GND2 similarly to the 21st embodiment. Thus, it becomes possible to aim at reduction of circuit power consumption and a high speed of circuit operation.

(24) Description of the 24th preferred embodiment

Figure 60A:
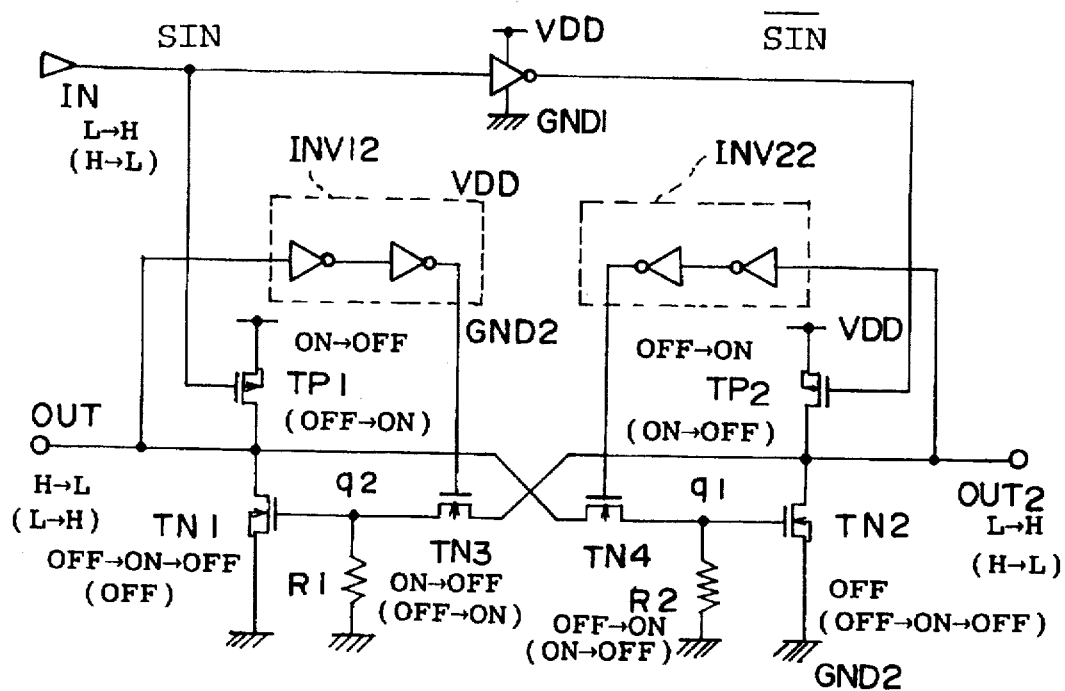
FIG. 60A is a block diagram of a level converter according to a 24th preferred embodiment of the present invention.

Being different from the 23rd embodiment, inverters INV12 and INV22 in even numbers are provided as shown in FIG. 60A in a 24th embodiment.

For example, two pieces of inverters showing examples of inverters INV in even number are connected between the gate of the transistor TN3 and the output OUT1, thus forming an inverter INV12. The inverter INV12 is connected to the power line VDD and the ground line GND2, and, being different from the 23rd embodiment, it delays the potential level of the output OUT1 and controls the gate of the transistor TN3. Similarly, the inverter INV22 is connected between the gate of the transistor TN4 and the output OUT2. The inverter INV22 is connected to the power line VDD and the ground line GND2, and, being different from the 23rd embodiment, it delays the potential level of the output OUT2 and controls the gate of the transistor TN4.

Besides, the number of stages of the inverters INV12 and INV22 is adjusted in accordance with the loads (inverter circuits or the like) connected to the outputs OUT1 and OUT2. For example, the delay time is adjusted so as to be equal to the waveform rise time reaching the threshold voltage of the load circuit. With this, it becomes possible to transmit a signal to a next stage at a high speed. Since other constructions thereof are similar to those of the 21st embodiment, the description thereof is omitted.

Thus, according to a level converter related to the 24th embodiment of the present invention, inverters in even numbers are provided, the inverter INV12 formed by serially connecting these inverters is connected between the gate of the transistor TN3 and the output OUT1, and the inverter INV22 is connected between the gate of the transistor TN4 and the output OUT2.

Figure 60B:
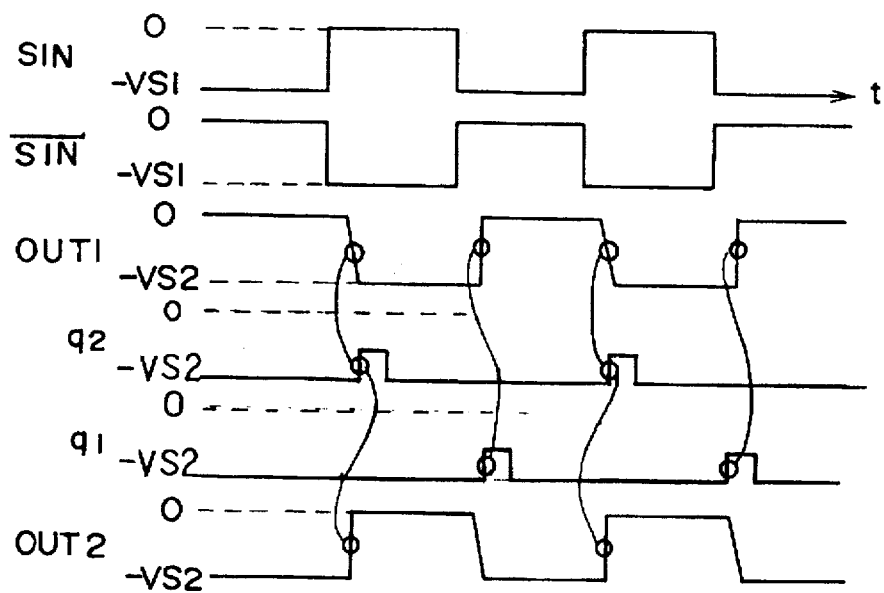
FIG. 60B is an operating waveform diagram of the level converter shown in FIG. 60A.

As a result, when the input signal SIN is shifted from the "L" level to the "H" level as shown in FIG. 60B, the transistor TN3 is turned OFF after the lapse of delay time by the inverter INV12, and the gate voltage of the transistor TN1 is set to the "L" level by the resistance R1. With this, the transistor TN4 is turned ON, and the "L" level is transmitted to the output OUT1 by the resistance R2.

At this time, a first signal transmission path circulating through the transistor TP2→the output OUT2→the transistor TN1→the output OUT1→the inverter INV12→the transistor TN3→the resistance R1→the transistor TN1 and a second signal transmission path circulating through the transistor TP2→the output OUT2→the inverter INV22→the transistor TN4→the resistance R2→the output OUT1 are formed.

It is possible to shift the output OUT1 from the "H" level to the "L" level at a high speed through the first signal transmission path, and, after the level goes down in the signal transmission path, it becomes possible to hold the potential and to continue the transition state through the second signal transmission path, and the output OUT1 is shifted from the "H" level to the "L" level at a high speed.

Conversely, when the input signal SIN is shifted from the "H" level to the "L" level, the transistor TN4 is turned OFF from ON after the lapse of delay time by the inverter INV22, the gate voltage of the transistor TN2 is set to the "L" level by the resistance R2, the transistor TN3 is turned ON, and the "L" level is transmitted to the output OUT2 by the resistance R1.

At this time, a third signal transmission path circulating through the transistor TP1→the output OUT1→the transistor TN2→the output OUT2→the inverter INV22→the transistor TN4→the resistance R2→the transistor TN2 and a fourth signal transmission path circulating through the transistor TP1→the output OUT1→the inverter INV12→the transistor TN3→the resistance R1→the output OUT2 are formed.

As a result, it is possible to shift the output OUT2 from the "H" level to the "L" level at a high speed, and after the level goes down in the signal transmission path, it becomes possible to hold the potential and to continue the transition state through the fourth signal transmission path, and the output OUT2 is shifted from the "H" level to the "L" level at a high speed.

Thus, it becomes possible to shorten the time required for falling of the output OUT1 and the output OUT2 from the "H" level to the "L" level, thus making it possible to aim at a higher speed of circuit operation as compared with the 21st to the 23rd embodiments by providing delay in signal transmission time by means of the inverter INV12 or INV22 and turning the transistors TN3 and TN4 ON during the delay period. Further, it becomes possible to remove a through electric current between the transistors TP1 and TN1 and a through electric current between the transistors TP2 and TN2 connected to the driving power source system VDD and GND2. Thus, it becomes possible to aim at reduction of circuit power consumption.

(25) Description of the 25th preferred embodiment

Figure 61:
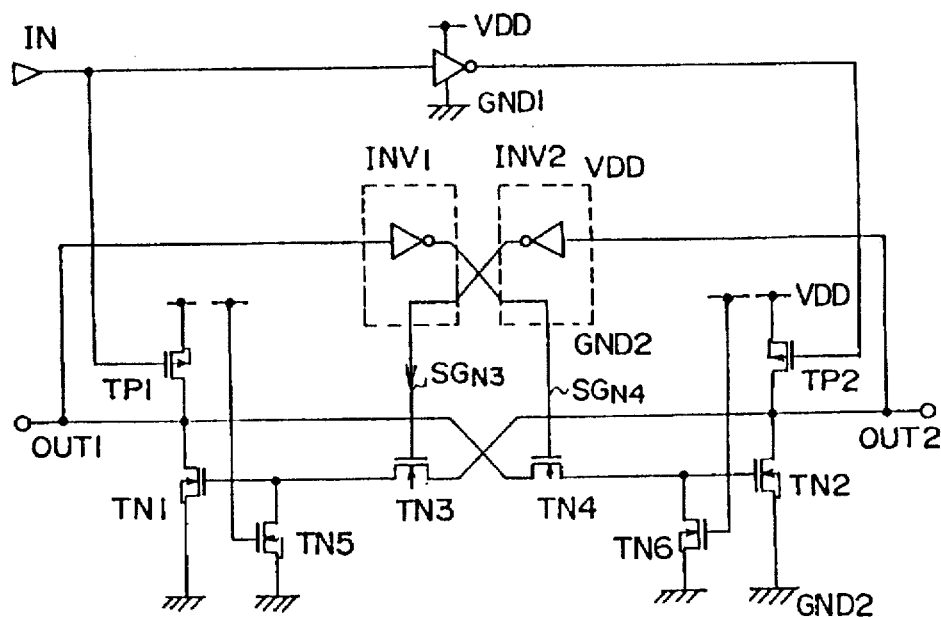
FIG. 61 is a block diagram of a level converter according to a 25th preferred embodiment of the present invention.

In a 25th embodiment, transistors TN5 and TN6 such as shown in FIG. 61 are provided so as to provide the functions of the resistances R1 and R2 related to the 23rd embodiment in the level converter according to the 23rd embodiment. Namely, the transistor TN5 is an example of the seventh transistor T7, and consists of an n-type field effect transistor. The transistor TN5 is provided at the connecting position of the resistance R1 according to the 23rd embodiment. The transistor TN5 is connected between the junction point q2 and the ground line GND2, and the gate thereof is connected to the power line VDD. The transistor has an ON resistance value of approximately several KΩ depending on the ON resistance of the transistor TP2.

The transistor TN6 is an example of the eighth transistor T8, and consists of an n-type field effect transistor. The transistor TN6 is connected between the junction point q1 and the ground line GND2, and the gate thereof is connected to the power line VDD. Besides, the transistor TN6 has an ON resistance value of approximately several KΩ depending on the ON resistance of the transistor TP1. Since other constructions thereof are similar to those of the 23rd embodiment, the description thereof is omitted.

Thus, according to a level converter related to the 25th embodiment of the present invention, the transistors TN5 and TN6 are provided so as to provide the functions of the resistances R1 and R2 as shown in FIG. 61.

As a result, when the input signal SIN is shifted from the "L" level to the "H" level, it is possible to delay a transition time from the "H" to "L" level of the output OUT1 by the inverter INV1, and to supply the gate control signal $SG_{N4}$ to the transistor TN4 so as to turn the transistor TN4 ON with delay from OFF. At this time, the potential level of the output OUT2 is determined by the ratio of the normally ON resistance $R_{N\,5}$ of the transistor to the ON resistance of the transistor TP2 and TN3.

Further, when the input inverting signal $\overline{SIN}$ is shifted from the "L" level to the "H" level, it is possible to delay a transition time from the "L" to "H" level of the output OUT2 by the inverter INV2 and supply the gate control signal $SG_{N\,3}$ thereof to the transistor TN3 so as to turn the transistor TN3 ON with delay from OFF. The potential level of the output OUT1 is determined by the ratio of the normally ON resistance $R_{N\,6}$ to the ON resistance of the transistor TP1 and TN4.

With this, when the input signal SIN is shifted from the "L" level to the "H" level or from the "H" level to the "L" level, it is possible to shift the output OUT1 from the "H" level to the "L" level at a high speed and the output OUT2 from the "H" level to the "L" level at a high speed similarly to the 24th embodiment.

With this, it becomes possible to remove a through electric current between the transistors TP1 and TN1 and a through electric current between the transistors TP2 and TN2 connected to the driving power source system VDD and GND2 similarly to the 24th embodiment. Thus, it becomes possible to aim at reduction of circuit power consumption and a higher speed of circuit operation.

(26) Description of the 26th preferred embodiment

Figure 62:
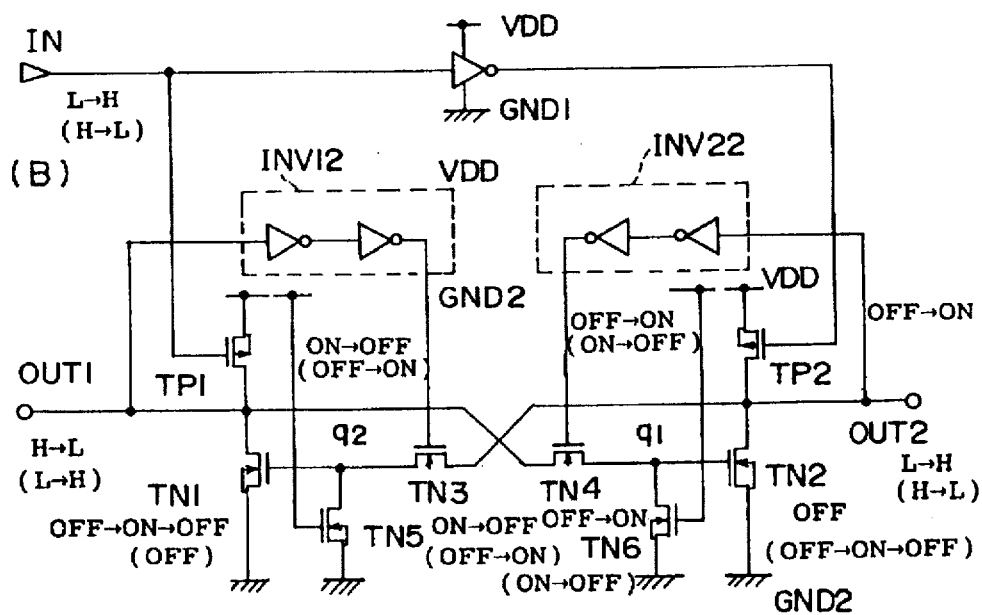
FIG. 62 is a block diagram of a level converter according to a 26th preferred embodiment of the present invention.

FIG. 62 shows a block diagram of a level converter according to a 26th embodiment of the present invention.

In the 26th embodiment, transistors TN5 and TN6 such as shown in FIG. 53(B) are provided in the level converter of the 24th embodiment and the functions of the resistances R1 and R2 according to the 24th embodiment are provided therewith. Namely, the transistor TN5 is an example of the seventh transistor T7, and consists of an n-type field effect transistor. The transistor TN5 is provided at the connecting position of the resistance R1 according to the 24th embodiment. The transistor TN5 is connected between the junction point q1 and the ground line GND2, and the gate thereof is connected to the power line VDD. The transistor TN5 has an ON resistance value of approximately several KΩ depending on the ON resistance of the transistor TP2.

The transistor TN6 is an example of the eighth transistor T8, and consists of an n-type field effect transistor. The transistor TN6 is connected between the junction point q1 and the ground line GND2, and the gate thereof is connected to the power line VDD. Besides, the transistor TN6 has an ON resistance value of approximately several KΩ depending on the ON resistance of the transistor TP1. Since other constructions thereof are similar to those of the 24th embodiment, the description thereof is omitted.

Thus, according to a level converter related to the 26th embodiment of the present invention, the transistors TN5 and TN6 are replaced at the connecting positions of the resistances R1 and R2 of the level converter according to the 24th embodiment as shown in FIG. 62.

As a result, when the input signal SIN is shifted from the "L" level to the "H" level, the transistor TN3 is turned OFF after the lapse of delay time by the inverter INV12, and the gate voltage of the transistor TN1 is set to the "L" level by the normally ON resistance $R_{N5}$ of the transistor TN5. With this, the transistor TN4 is turned ON, and the "L" level is transmitted to the output OUT1 by the normally ON resistance $R_{N6}$ of the transistor TN6.

At this time, a first signal transmission path circulating through the transistor TP2→the output OUT2→the transistor TN1→the output OUT1→the inverter INV12→the transistor TN3→the ON resistance $R_{N5}$→the transistor TP1 and a second signal transmission path circulating through the transistor TP2→the output OUT2→the inverter INV22→the transistor TN4→the ON resistance $R_{N6}$→the output OUT1 are formed.

It is possible to shift the output OUT1 from the "H" level to the "L" level at a high speed through the first signal transmission path, and it becomes possible, after the level goes down through the signal transmission path, to hold the potential and continue the transition state, and the output OUT1 is shifted from the "H" level to the "L" level at a high speed.

Conversely, when the input signal SIN is shifted from the "H" level to the "L" level, the transistor TN4 is turned OFF from ON after the delay time by the inverter INV22, the gate voltage of the transistor TN2 is set to the "L" level by the ON resistance $R_{N6}$, the transistor TN3 is turned ON, and the "L" level is transmitted to the output OUT2 by the ON resistance $R_{N5}$.

At this time, a third signal transmission path circulating through the transistor TP1→the output OUT1→the transistor TN2→the output OUT2→the inverter INV22→the transistor TN4→the ON resistance $R_{N6}$→the transistor TN2 and a fourth signal transmission path circulating through the transistor TP1→the output OUT1→the inverter INV12→the transistor TN3→the ON resistance $R_{N5}$→the output OUT2 are formed.

As a result, it is possible to shift the output OUT2 from the "H" level to the "L" level at a high speed through the third signal transmission path, and it becomes possible, after the level falls through the third signal transmission path, to hold the potential thereof and continue the transition state through the fourth signal transmission path, and the output OUT2 is shifted from the "H" level to the "L" level at a high speed.

With this, it becomes possible to shorten the time to raise the output OUT1 and the output OUT2 from the "H" level to the "L" level similarly to the 24th embodiment by providing a delay in the signal transmission period of time by means of the inverters INV12 and INV22 and turning the transistors TN3 and TN4 ON, thus making it possible to aim at to achieve a higher speed as compared with the 21st to the 23rd embodiments. Further, it becomes possible to reduce a through electric current between the transistors TP1 and TN1 and a through electric current between the transistors TP2 and TN2 connected to the driving power source system VDD and GND2. Thus, it becomes possible to aim at reduction of circuit power consumption.

(27) Description of the 27th preferred embodiment

Figure 63:
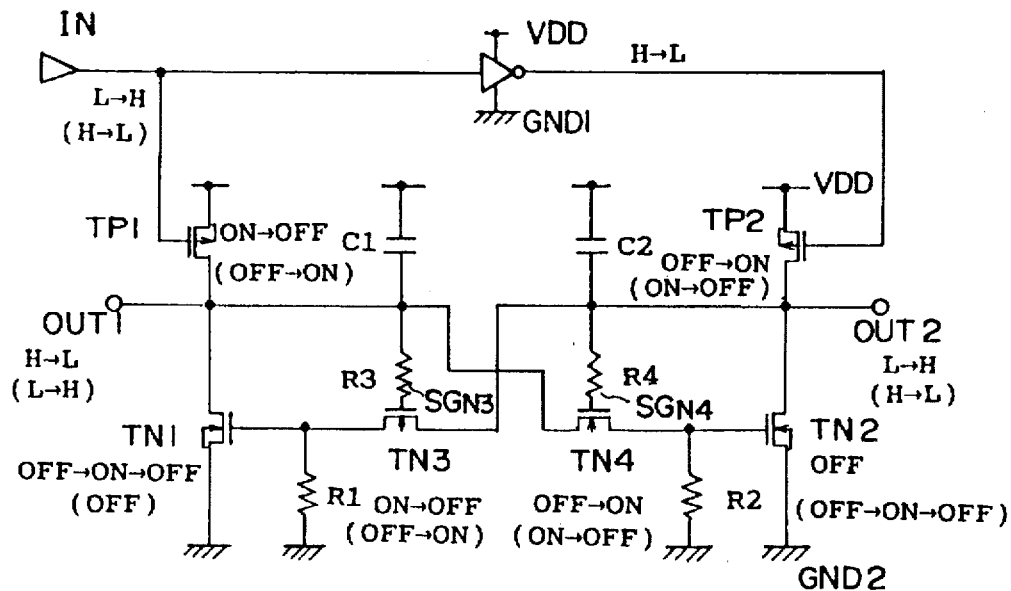
FIG. 63 is a block diagram of a level converter according to a 27th preferred embodiment of the present invention.

In a 27th embodiment, resistances R3 and R4 and capacitors C1 and C2 such as shown in FIG. 63 are provided in the level converter of the 21st embodiment.

Namely, the resistance R3 (the third load element) is connected between the gate of the transistor TN3 and the output OUT1. The resistance R3 is set to have a resistance value of approximately several K$\Omega$ depending on the ON operation of the transistor TNJ.

The resistance R4 (the fourth load element) is connected between the gate of the transistor TN4 and the output OUT2. The resistance R4 is set to have a resistance value of approximately several K$\Omega$ depending on the ON operation of the transistor TN4. The capacitor C1 is an example of the first electrostatic capacity C1 and is connected between the output OUT1 and the power line VDD. The capacitor C2 is an example of the second electrostatic capacity C2 and is connected between the output OUT2 and the power line VDD. Besides, the resistance R3 and the capacitor C1 form an integrating circuit, which delays the potential level of the output OUT1 and outputs the delayed signal to the gate of the transistor TN3. Similarly, the resistance R4 and the capacitor C2 form an integrating circuit, which delays the potential level of the output OUT2 and outputs the delayed signal to the gate of the transistor TN4.

The time constants of the integrating circuits are adjusted in accordance with the loads (inverter circuits or the like) connected to the outputs OUT1 and OUT2. For example, the time constant is adjusted so as to get equal to the waveform rise time reaching the threshold voltage of the load circuit. With this, it becomes possible to transmit the signal to the next stage at a high speed. Besides, since other constructions thereof are similar to those of the 21st embodiment, the description thereof is omitted.

As described, according to a level converter related to the 27th embodiment of the present invention, the resistances R3 and R4 and the capacitors C1 and C2 are provided as shown in FIG. 63.

As a result, it is possible to supply a gate control signal $SG_{N3}$ with the potential level of the output OUT1 delayed by means of the resistance R3 and the capacitor C1 to the gate of the transistor TN3. Further, it is possible to supply a gate control signal $SG_{N4}$ with the potential level of the output OUT2 delayed by means of the resistance R4 and the capacitor C2 to the gate of the transistor TN4. Thus, when the input signal SIN is shifted from the "H" level to the "L" level or from the "L" level to the "H" level, it is possible to shift the output OUT1 from the "H" level to the "L" level at a high speed and the output OUT2 from the "L" level to the "H" level at a high speed similarly to the 24th and the 26th embodiments.

With this, it becomes possible to remove a through electric current between the transistors TP1 and TN1 and a through electric current between the transistors TP2 and TN2 connected to the second driving power source system VDD and GND2 similarly to the 21st to the 26th embodiments. Thus, it becomes possible to aim at reduction of circuit power consumption and a high speed of circuit operation.

(28) Description of the 28th preferred embodiment

Figure 64:
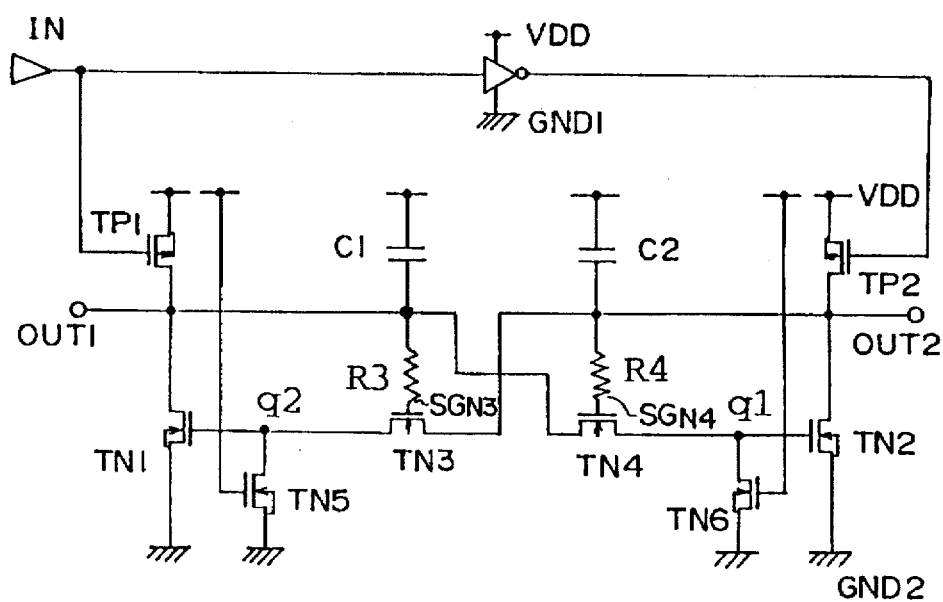
FIG. 64 is a block diagram of a level converter according to a 28th preferred embodiment of the present invention.

In a 28th embodiment, transistors TN5 and TN6 are provided so as to provide them with the functions of the resistances R1 and R2 according to the 24th embodiment as shown in FIG. 64 in the level converter of the 27th embodiment. The transistor TN5 is provided at the connecting position of the resistance R1 according to the 24th embodiment. Namely, the transistor TN5 is connected between the junction point q2 and the ground line GND2, and the gate thereof is connected to the power line VDD. The transistor TN5 has an ON resistance value of approximately several K$\Omega$ depending on the ON resistance of the transistor TP2.

The transistor TN6 is connected between the junction point q1 and the ground line GND2, and the gate thereof is connected to the power line VDD. Besides, the transistor TN6 has an ON resistance value of approximately several K$\Omega$ depending on the ON resistance of the transistor TP1. Since other constructions thereof are similar to those of the 24th and the 27th embodiments, the description thereof is omitted.

Thus, according to a level converter related to the 28th embodiment of the present invention, the transistors TN5 and TN6 are provided so as to provide them with the functions of the resistances R1 and R2 as shown in FIG. 64.

As a result, when the input signal SIN is shifted from the "L" level to the "H" level, it is possible to delay the "H" to "L" level of the output OUT1 by the resistance R3 and the capacitor C1 and to supply the gate control signal $SG_{N3}$ to the gate of the transistor TN3, thus making it possible to turn the transistor TN3 OFF with delay from ON. At this time, the potential level of the output OUT2 is determined by the ratio of the normally ON resistance $R_{N5}$ of the transistor TN5 to the ON resistance of the transistor TP2.

Further, when the input signal SIN is shifted from the "L" level to the "H" level, it is possible to delay the "L" to "H" level of the output OUT2 by the resistance R4 and the capacitor C2 and to supply the gate control signal $SG_{N4}$ to the gate of the transistor TN4, thus making it possible to turn the transistor TN4 ON with delay from OFF. At this time, the potential level of the output OUT1 is determined by the ratio of the normally ON resistance $R_{N6}$ to the ON resistance of the transistor TP1.

With this, when the input signal SIN is shifted from the "L" level to the "H" level or from the "H" level to the "L" level, it is possible to shift the output OUT1 from the "H" level to the "L" level at a high speed and to shift the output OUT2 from the "H" level to the "L" level at a high speed.

With this, it becomes possible to remove a through electric current between the transistors TP1 and TN1 and a through electric current between the transistors TP2 and TN2 connected to the driving power source system VDD and GND2 similarly to the 24th embodiment. Thus, it becomes possible to aim at reduction of circuit power consumption and a higher speed of circuit operation.

(29) Description of the 29th preferred embodiment

Figure 65:
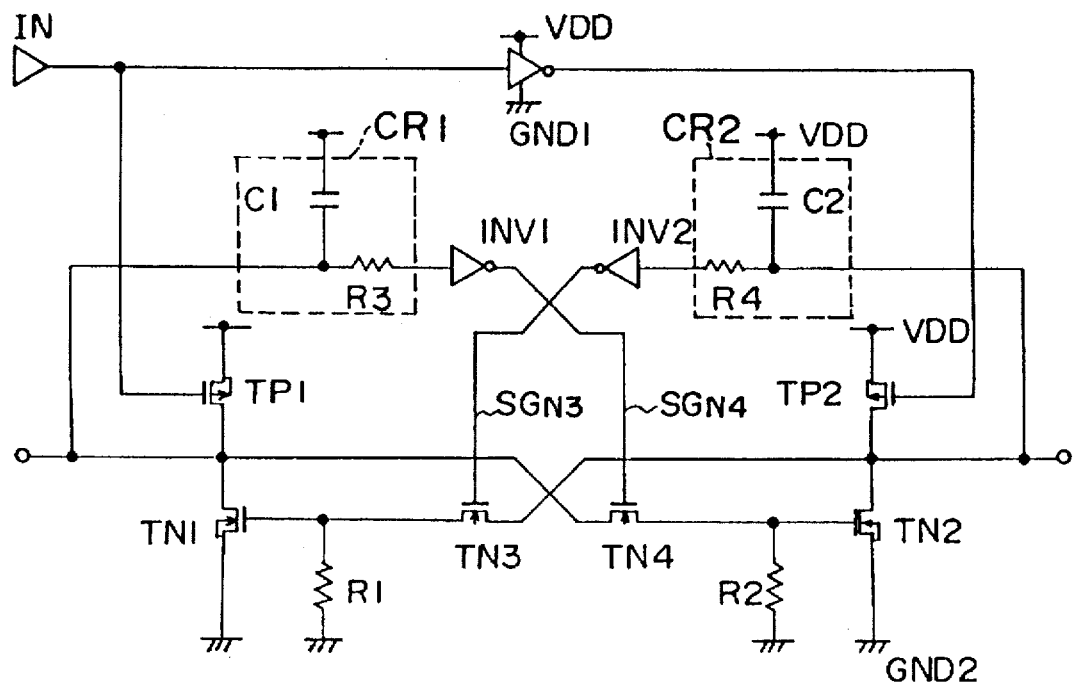
FIG. 65 is a block diagram of a level converter according to a 29th preferred embodiment of the present invention.

In a 29th embodiment, integrating circuits CR1 and CR2 such as shown in FIG. 65 are provided in the level converter according to the 25th embodiment.

Namely, the integrating circuit CR1 is connected between the inverter INV1 and the output OUT1, and consists of the resistance R3 and the capacitor C1. The function thereof is to delay the potential level of the output OUT1 and output a delayed signal to the inverter INV1. Besides, the resistance R3 is connected between the input of the inverter INV1 and the output OUT1, and the capacitor C1 is connected between the junction point and the power line VDD.

Similarly, the integrating circuit CR2 is connected between the inverter INV2 and the output OUT2, and consists of the resistance R4 and the capacitor C2. The function thereof is to delay the potential level of the output OUT2 and output the delayed signal to the inverter INV2. Besides, the resistance R4 is connected between the input of the inverter INV2 and the output OUT2, and the capacitor C2 is connected between the junction point and the power line VDD.

Further, the time constants of the integrating circuits CR1 and CR2 are adjusted in accordance with the loads (inverter circuits or the like) connected to the outputs OUT1 and OUT2. For example, the time constant is adjusted so as to become equal to the waveform rise time reaching the threshold voltage of the load circuit. With this, it becomes possible to transmit a signal to a next stage at a high speed. Since other constructions thereof are similar to those of the 21st embodiment, the description thereof is omitted.

Thus, according to a level converter related to the 29th embodiment of the present invention, the integrating circuits CR1 and CR2 are connected at preceding stages of the inverters INV1 and INV2 as shown in FIG. 65.

As a result, when the input signal SIN is shifted from the "L" level to the "H" level or from the "H" level to the "L" level, it is possible to supply the gate control signal $SG_{N4}$ with the potential level of the output OUT1 delayed by means of the integrating circuit CR1 and the inverter INV1 to the gate of the transistor TN4 and to supply the gate control signal $SG_{N3}$ with the potential level of the output OUT2 delayed by means of the integrating circuit CR2 and the inverter INV2 to the gate of the transistor TN3. Thus, it is possible to shift the output OUT1 from the "H" level to the "L" level at a high speed and to shift the output OUT2 from the "H" level to the "L" level at a high speed.

With this, it becomes possible to remove a through electric current between the transistors TP1 and TN1 and a through electric current between the transistors TP2 and TN2 connected to the second driving power source system VDD and GND2 similarly to the 21st to the 28th embodiments. Thus, it becomes possible to aim at reduction of circuit power consumption and a high speed of circuit operation.

(30) Description of the 30th preferred embodiment

Figure 66:
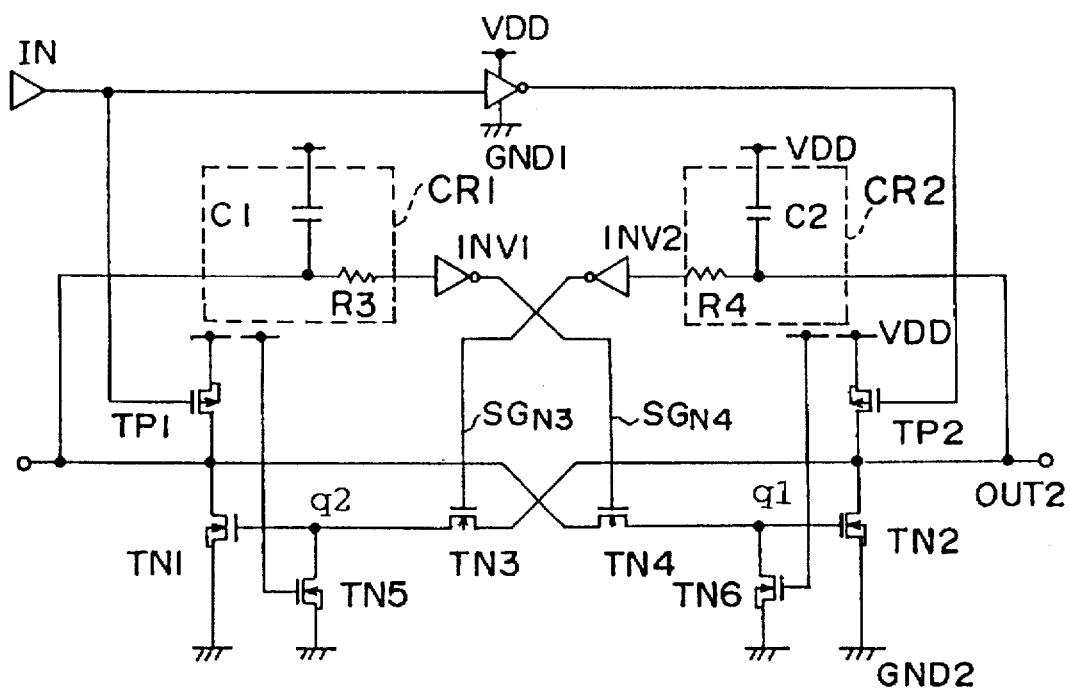
FIG. 66 is a block diagram of a level converter according to a 30th preferred embodiment of the present invention.
Figure 67:
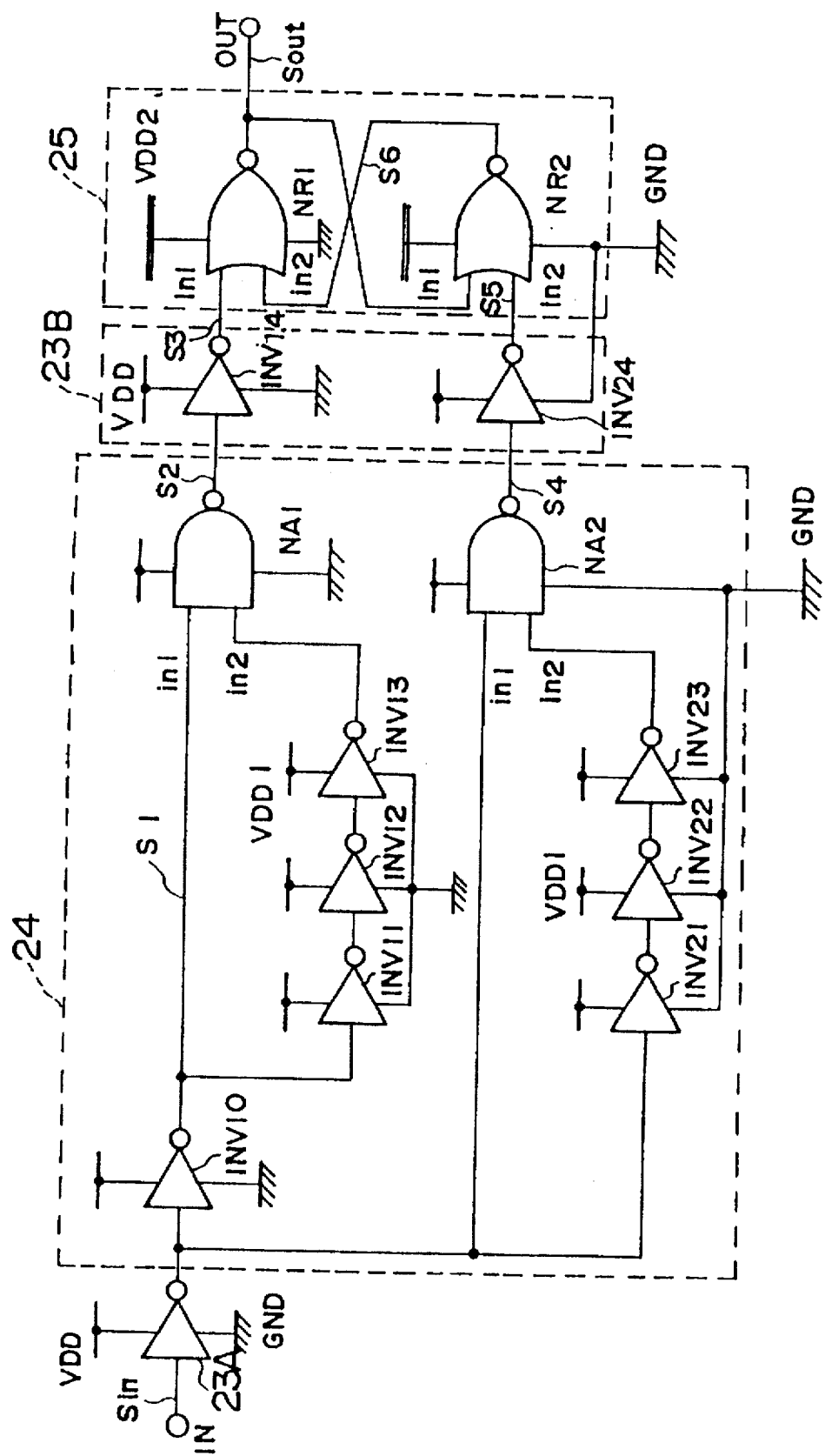
FIG. 67 is a block diagram of a level converter according to a 31st preferred embodiment of the present invention.

In a 30th embodiment, transistors TN5 and TN6 are provided so as to provide the functions of the resistances R1 and R2 according to the 24th embodiment with these transistors as shown in FIG. 66 in the level converter of the 29th embodiment. The transistor TN5 is provided at the connecting position of the resistance R1 according to the 14th embodiment. Namely, the transistor TN5 is connected between the junction point q2 and the ground line GND2, and the gate thereof is connected to the power line VDD. The transistor TN5 has an ON resistance value of approximately several KΩ depending on the ON resistance of the transistor TP2.

The transistor TN6 is connected between the junction point q1 and the ground line GND2, and the gate thereof is connected to the power line VDD. Besides, the transistor TN6 has an ON resistance value of approximately several KΩ depending on the ON resistance of the transistor TP1. Since other constructions thereof are similar to those of the 29th embodiment, the description thereof is omitted.

Thus, according to a level converter related to the 30th embodiment of the present invention, the transistors TN5 and TN6 are provided so as to provide these transistors with the functions of the resistances R1 and R2 as shown in FIG. 66.

As a result, when the input signal SIN is shifted from the "L" level to the "H" level, it is possible to delay the "H" to "L" level of the output OUT1 by the integrating circuit CR1 and to supply the gate control signal $SG_{N4}$ to the gate of the transistor TN4, as shown in FIG. 66, thus turning the transistor TN4 ON with delay from OFF. At this time, the potential level of the output OUT2 is determined by the ratio of the normally ON resistance $R_{N5}$ of the transistor TN5 to the ON resistance of the transistor TP2.

Further, when the input signal SIN is shifted from the "H" level to the "L" level, it is possible to delay the "H" to "L" level of the output OUT2 by the integrating circuit CR2 and to supply the gate control signal $SG_{N3}$ to the gate of the transistor TN3, thus turning the transistor TN3 ON with delay from OFF. At this time, the potential level of the output OUT1 is determined by the ratio of the normally ON resistance $R_{N6}$ to the ON resistance of the transistor TP1.

As a result, when the input signal SIN is shifted from the "L" level to the "H" level or from the "H" level to the "L" level, it is possible to shift the output OUT1 from the "H" level to the "L" level at a high speed and the output OUT2 from the "H" level to the "L" level at a high speed.

With this, it becomes possible to remove a through electric current between the transistors TP1 and TN1 and a through electric current between the transistors TP2 and TN2 connected to the driving power source system VDD and GND2 similarly to the 24th and the 29th embodiments. Thus, it becomes possible to aim at reduction of circuit power consumption and a higher speed of circuit operation.

In the level converters according to the first to the 30th embodiments described above, it becomes possible to shorten the rise time required to reach the "L" level from the "H" level at GND standard and the fall time required to reach the "H" level from the "L" level at VDD standard as compared with the prior art of the present invention even when the transistors TP1 and TP2 are structured in the size equivalent to other transistor size.

(31) Description of the 31st preferred embodiment

Being different from the level converters according to the first to the 30th embodiments, a 31st embodiment is composed of an inverter 23A, a one-shot timer circuit 24, a waveform shaping circuit 23B and an output latch circuit 25.

Namely, the inverter 23A is connected between the power line VDD1 (driving voltage VD2=approximately 3 V) and the ground line (0 V) which becomes the first driving power source system, and outputs the input signal Sin after inverting it.

The one-shot timer circuit 24 is an example of the pulse generating circuit 14, and is connected to the first driving power source system VDD1 and GND. The one-shot timer circuit 24 comprises inverters INV10 to INV13, INV21 to INV23 and two-input NAND circuits NA1 and NA2. Four inverters INV10 to INV13 are cascade-connected and connected further to the output of the inverter 23A and a second input in2 of the two-input NAND circuit NA1, and the output of the inverter INV10 is connected to a first input in1 of the two-input NAND circuit NA1.

Further, the inverters INV21 to INV23 are cascade-connected and connected further to the output of the inverter 23A and a second input in2 of the two-input NAND circuit NA1, and the output of the inverter 23A is connected to a first input in1 of the two-input NAND circuit NA2. The function of the one-shot timer circuit 24 is to generate a one-shot pulse signal based on the input signal Sin and output that signal to the waveform shaping circuit 23B.

The waveform shaping circuit 23B is composed of inverters INV14 and INV24, and is connected to the first driving power source system VDD1 and GND. The inverter INV14 outputs a NAND logical signal (hereinafter referred to as a one-shot pulse signal) outputted from the two-input NAND circuit NA1 after inverting the signal to the output latch circuit 25. Similarly, the inverter INV24 outputs a one-shot pulse signal outputted from the two-input NAND circuit NA2 after inverting the signal to the output latch circuit 25.

The output latch circuit 25 is an example of the signal output circuit 15, and is connected between the power line VDD2 (driving voltage VD2=approximately 5 V) and the ground line GND (0 V) which become the second driving power source system. The output latch circuit 25 is composed of two-input NOR circuits NR1 and NR2. A first input in1 of the two-input NOR circuit NR1 is connected to the inverter INV14, and a second input in2 thereof is connected to the output of the two-input NOR circuit NR1. Further, a first input in1 of the two-input NOR circuit NR2 is connected to the inverter INV24, and a second input in2 thereof is connected to the output of the two-input NOR circuit NR2. With this, an output signal with the level converted is latched by and outputted from the output latch circuit 25.

Thus, according to the level converter related to the 31st embodiment of the present invention, there are provided the inverter 23A, the one-shot timer circuit 24, the waveform shaping circuit 23B and the output latch circuit 25. The timer circuit 24 is connected to the first driving power source system, and the output latch circuit 25 is connected to the second driving power source system, respectively.

Figure 68:
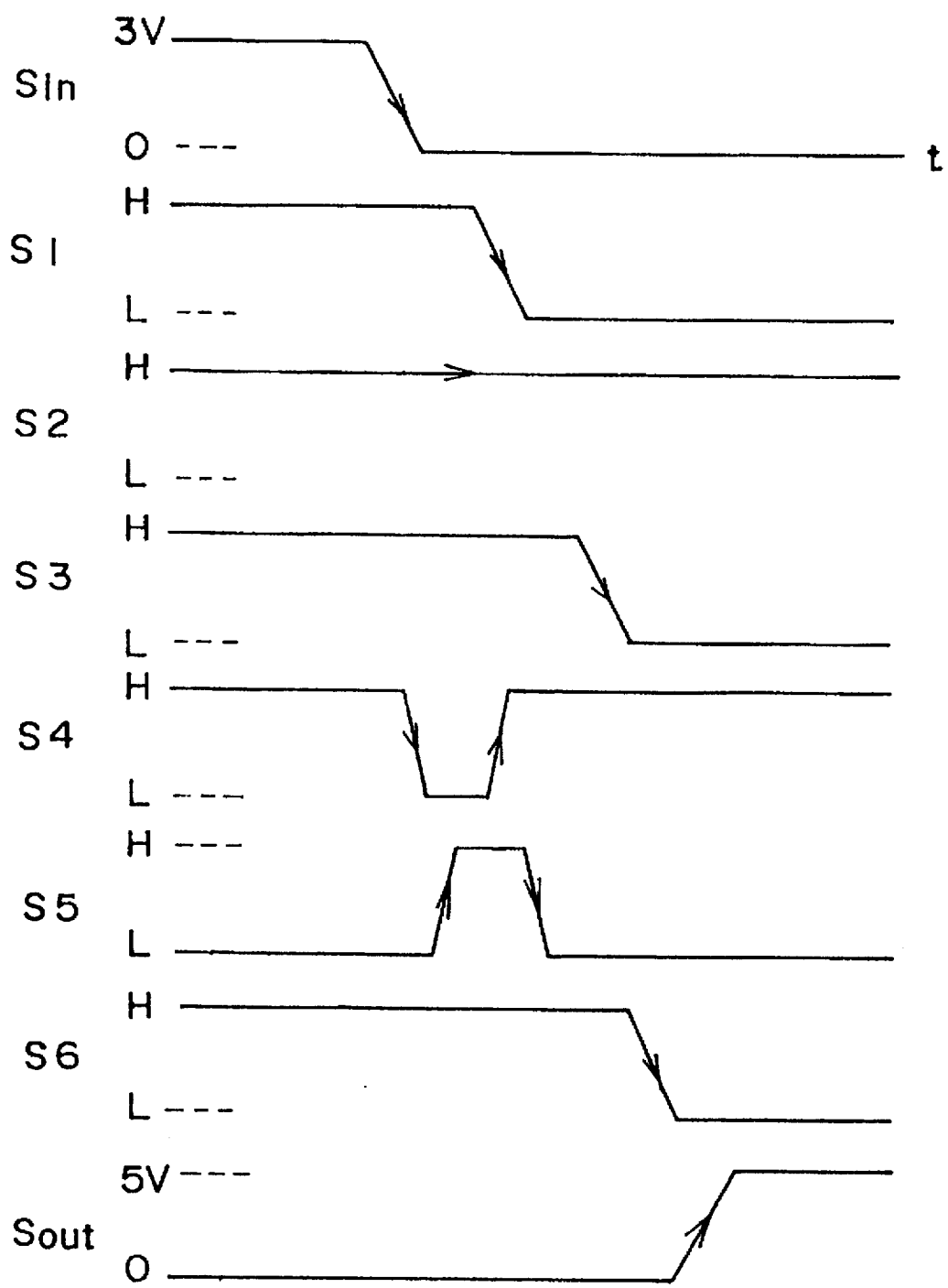
FIG. 68 is an operating waveform diagram of the level converter shown in FIG. 67.

For example, as shown in FIG. 68, when the input signal Sin is shifted from a circuit of the first driving power source system is shifted from the "H" level to the "L" level, and output signal S1 is outputted from the inverter INV10 to the two-input NOR circuit NR1 with a delay from the fall of the signal. Further, an output signal S2 of the two-input NAND circuit NA1 is maintained at the "H" level, and changes depending on the delay time by the cascade-connected inverters INV11 to INV13. Because of such a change, an output signal S3 from the inverter INV14 falls, and the signal S3 is outputted to the output latch circuit 25.

On the other hand, an output signal S4 of the two-input NAND circuit NA2 is shifted from the "H" level to the "L" level and then to the "H" level based on the fall of the input signal Sin, which generates a one-shot pulse signal and is outputted from the inverter INV24 after inversion, and an output signal S5 thereof is outputted to the output latch circuit 25.

As a result, NOR logic of the output signal S5 and a signal Sout fed back from the output is obtained in the two-input NOR circuit NR2, and an output signal S6 thereof falls from the "H" level to the "L" level. Thus, NOR logic of the output signal S3 and the output signal S6 is obtained in the two-input NOR circuit NR2, thus making it possible to output the result of the above as the output signal Sout applicable with signal processing by the second driving power source system from the output latch circuit 25.

With this, it is possible to switch the voltage of the first driving power source system to and from that of the second driving power source system momentarily based on the one-shot pulse signal. Thus, it becomes possible to aim at reduction of circuit power consumption as compared with a level converter including a current mirror circuit involving current consumption as a principal part.

(32) Description of the 32nd preferred embodiment

Figure 69:
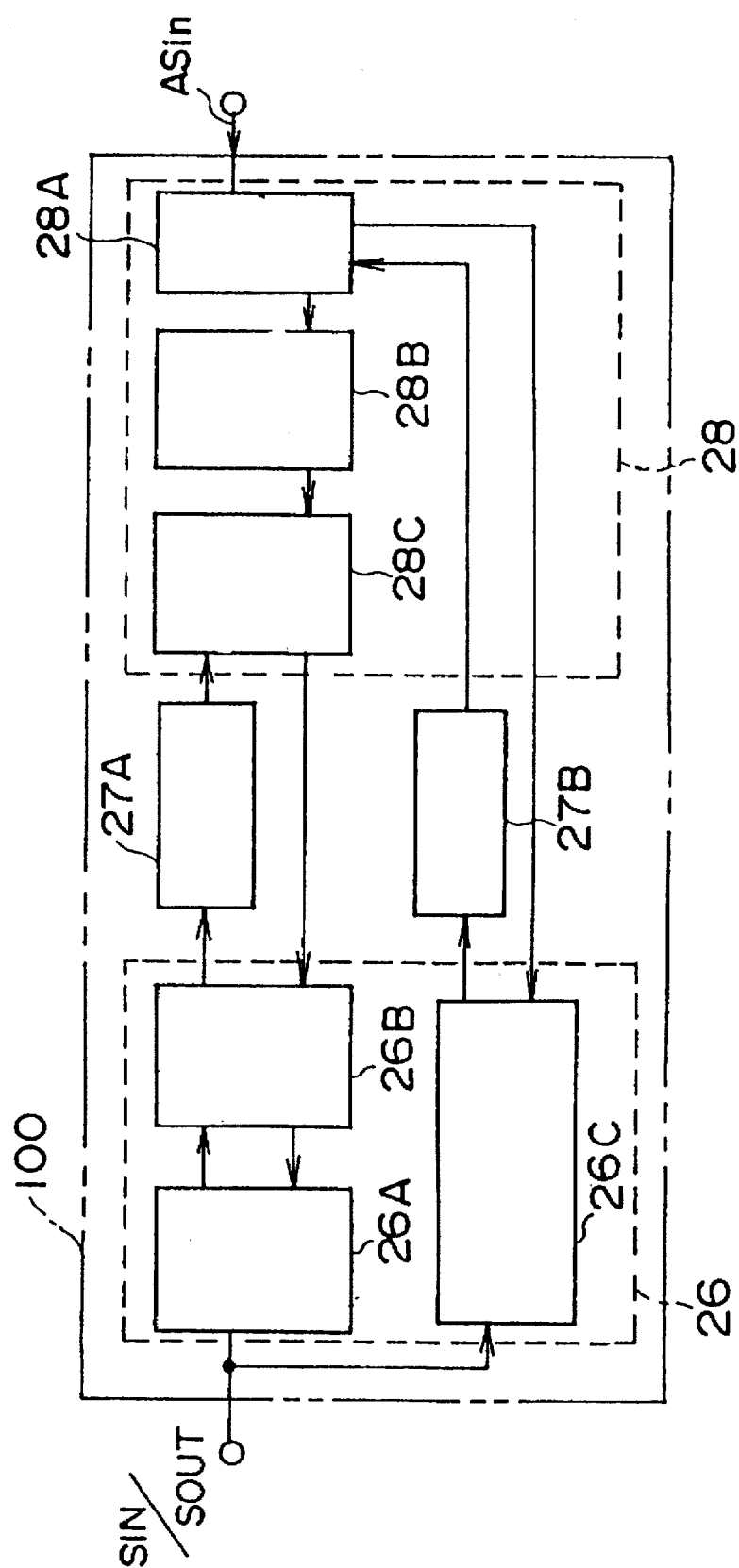
Figure 70:
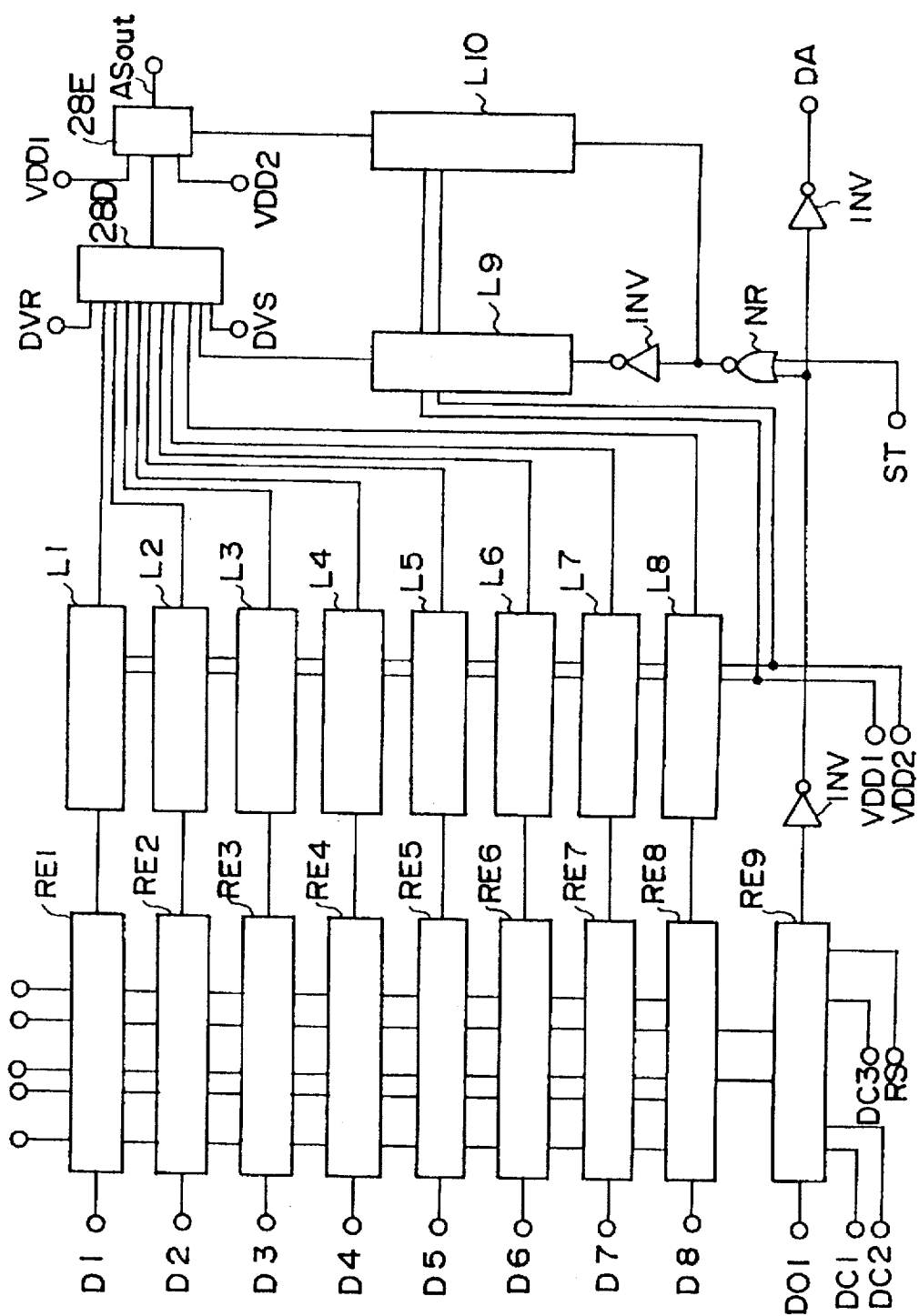

FIG. 69 shows a block diagram of a semiconductor integrated circuit according to a 32nd embodiment of the present invention, and FIG. 70 shows an internal block diagram of a D/A converter circuit thereof, respectively.

For example, a semiconductor integrated circuit for converting a signal between an information processing unit and an analog processing equipment is provided with a 3 V driving circuit system 26, level converters 27A and 27B and a 5 V driving circuit system 28 in a same semiconductor chip 100 as shown in FIG. 69.

Namely, the 3 V driving circuit system 26 is an embodiment of the first circuit system 16, and is a signal processing circuit driven based on a first voltage level such as the power line VDD1=3 V and the ground line GND (0 V). Further, an example of the 3 V driving circuit system 26 comprises an address decoder 26A, a digital processing portion 26B and an I/O port portion 26C, and now performs digital/analog conversion and now outputs a control signal to the 5 V driving circuit system 28 based on data Sout outputted from a central processor unit (hereinafter referred to as a CPU). Furthermore, an analog/digital conversion signal processed by the 5 V driving circuit system 28 is outputted to the CPU as output data SOUT.

The level converters 27A and 27B show an embodiment of the level conversion circuit 17, and convert the level of the output signal of the 3 V driving circuit system 26 into a signal which can be processed by the driving circuit system 28. For example, the level converter 27A converts the input signal SIN applied with digital/analog processing by the circuit system 26 into a signal applicable with processing by the circuit system 28.

Further, the level converter 27B converts a control signal outputted from the I/O port portion 26C of the circuit system 26 into a control signal applicable with processing by the circuit system 28. Besides, there is a feature in that the level converters 27A and 27B comprise the level converters according to the first to the 30th embodiments of the present invention.

The 5 V driving circuit system 28 is an embodiment of the second circuit system 18, and is a signal processing circuit for driving various signals with level converted based on the second voltage level such as the power line VDD2=5 V and the ground line GND (0 V). Further, an example of the 5 V driving circuit system 28 is composed of an I/O cell portion 28A, an analog switch portion 28B and an analog processing portion 28C, and samples analog input signals ASin outputted from various analog processing equipments and outputs the result to the circuit system 26.

FIG. 70 shows an example of the internal structure of a D/A converter forming a part of a semiconductor integrated circuit according to the 32nd embodiment of the present invention, which shows a case that the input data SIN are composed of 8 bits (D1 to D8).

The D/A converter circuit is provided with nine registers RE1 to RE9 connected to a digital signal 3 V system, ten level converters L1 to L10 forming the level converters 27A and 27B, a D/A analog cell 28D for processing an analog signal 5 V system, an output buffer 28E, an inverter and a NOR circuit NR as shown in FIG. 70.

The function of the D/A converter circuit is such that the digital input data D1 to D8 applied with signal processing by the digital signal 3 V system are held by the registers RE1 to RE9, those data are level-converted into signals applicable with processing by an analog signal 5 V system, and the signals are applied with digital/analog conversion by the D/A analog cell 28D.

At this time, digital control data DO1 outputted from the digital signal 3 V system are held by the register RE9 are outputted to two level converters L9 and L10 through the inverter INV and the NOR circuit NR. Those data are level converted into a control signal applicable with processing by the analog signal 5 V system in the level converters L9 and L10, and the signal is outputted to the D/A analog cell 28D and the I/O cell portion 28A. With this, the analog output signal ASout is outputted from the output buffer 28E.

As described above, according to a semiconductor integrated circuit related to the 32nd embodiment of the present invention, the 3 V driving circuit system 26, the level converters 27A and 27B and the 5 V driving circuit system 28 are provided in the same semiconductor chip 100 as shown in FIG. 69, and the level converters according to the first to the 30th embodiments of the present invention are applied thereto.

As a result, it is possible to achieve low power consumption and a high speed of signal operation in a semiconductor integrated circuit performing signal conversion processing between an information processing device and an analog processing equipment. Further, it becomes unnecessary to package individual IC on a printed board separately as in the related art of the present invention due to the fact that respective signal processing circuits are included in the same semiconductor chip 100. Moreover, it becomes possible to form a hybrid integrated circuit easily using a low voltage driving integrated circuit of 2 to 3 V class and an existing 5 V driving system integrated circuit.

With this, it becomes possible to make an IC packaging area of an electronic device small, and it becomes also possible to aim at miniaturization and improvement of duration of use of portable electronic device which depends on a battery driven power source.

(33) Description of the 33rd preferred embodiment

Figure 71:
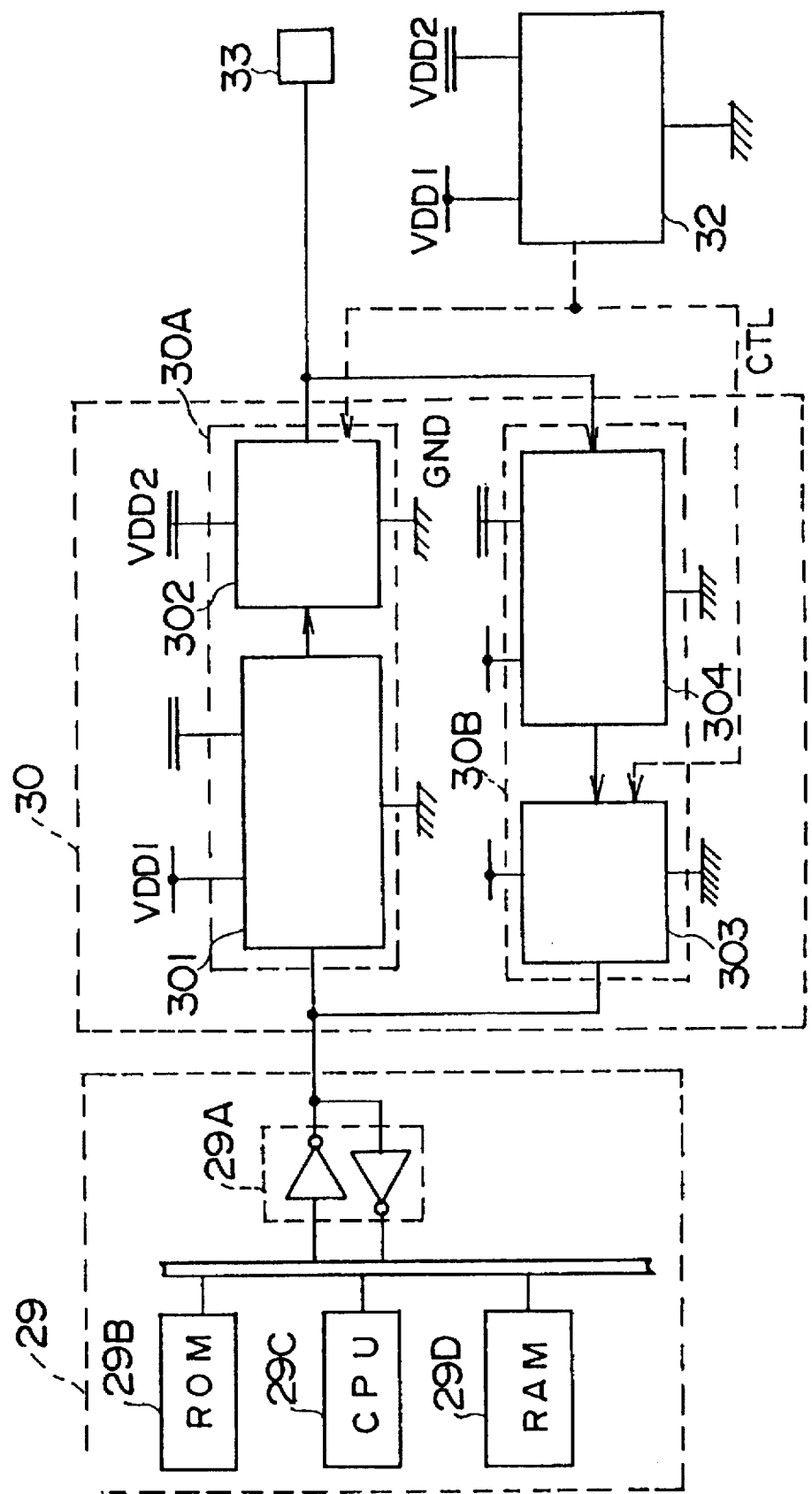

For example, a semiconductor integrated circuit applied to an input/output interface portion of a 3 V driving circuit system includes a bidirectional level converter 30, an internal circuit 29 and a timing generating circuit 32 provided in the same semiconductor chip as shown in FIG. 71.

Namely, the internal circuit 29 is an example of the first circuit system 19, and is connected between the power line VDD1 (driving voltage VD2=approximately 3 V) and the ground line GND (0 V) which becomes the first driving power source system. For example, the internal circuit 29 is composed of an I/O port portion 29A, a read-only memory (ROM) 29B, a CPU 29C, a random-access memory (RAM) 29D or the like.

The bidirectional level converter 30 is an example of the bidirectional level conversion circuit 20, and consists of an output level converter 30A and an input level converter 30B. The output level converter 30A is composed of a level converter 301 and an output buffer 302, and converts the level of an output signal of the internal circuit 29 of the 3 V driving system into the level of a signal applicable with processing by the 5 V driving circuit system. Besides, the bidirectional level converter 30 is provided at each input-output terminal 33.

Figure 72:
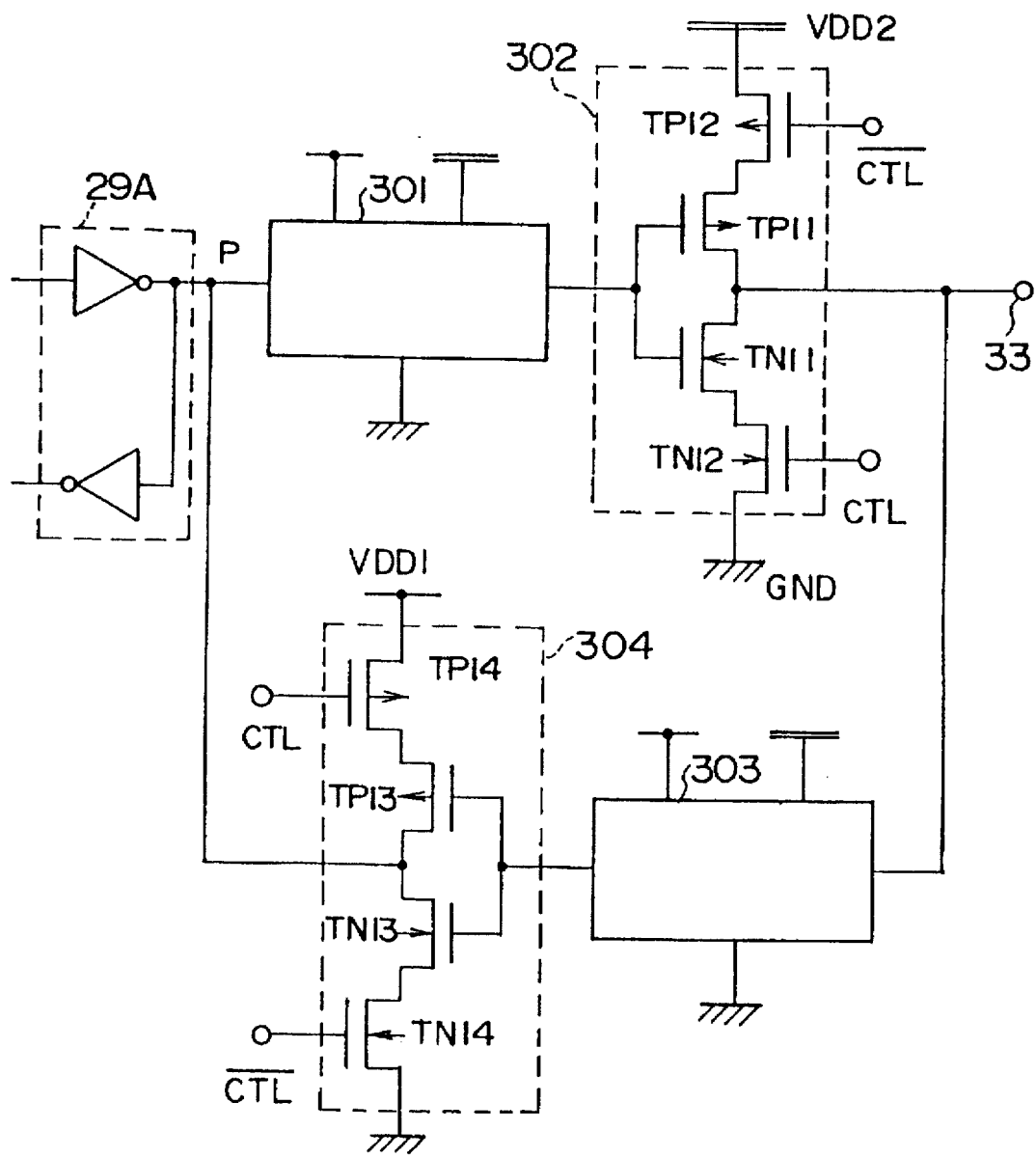

For example, the level converters according to the first to the 30th embodiments are applied to the level converter 301, and the output buffer 302 is formed of p-type field effect transistors TP11 and TP12 and n-type field effect transistors TN11 and TN12 as shown in FIG. 72. Besides, the transistors TP12, TP11, TN11 and TN12 are connected in series between the power line VDD2 and the ground line GND, and the common gate of the transistors TP11 and TN11 is connected to the level converter 301 and the common drain thereof is connected to the input-output terminal 33. Further, an inverting control signal $\overline{CTL}$ is supplied to the gate of the transistor TP12, and a control signal CTL is supplied to the gate of the transistor TN12.

The input level converter 30B is composed of a level converter 303 and an input buffer 304, and converts the level of a signal processed by the 5 V driving circuit system into an output level applied with processing in the internal circuit 29 of the 3 V driving system based on the control signal CTL. For example, the level converters according to the first to the 30th embodiments of the present invention are applied to the level converter 303, and the output buffer 304 is formed of p-type field effect transistors TP13 and TP14 and n-type field effect transistors TN13 and TN14 as shown in FIG. 72.

Besides, the transistors TP14, TP13, TN13 and TN14 are connected in series between the power line VDD1 and the ground line GND. The common gate of the transistors TP13 and TN13 is connected to the level converter 303, and the common drain thereof is connected to a junction point P of the I/O port portion 29A and the level converter 301. Further, a control signal CTL is supplied to the gate of the transistor TP14, and an inverting control signal $\overline{CTL}$ is supplied to the gate of the transistor TN14.

Figure 73A:
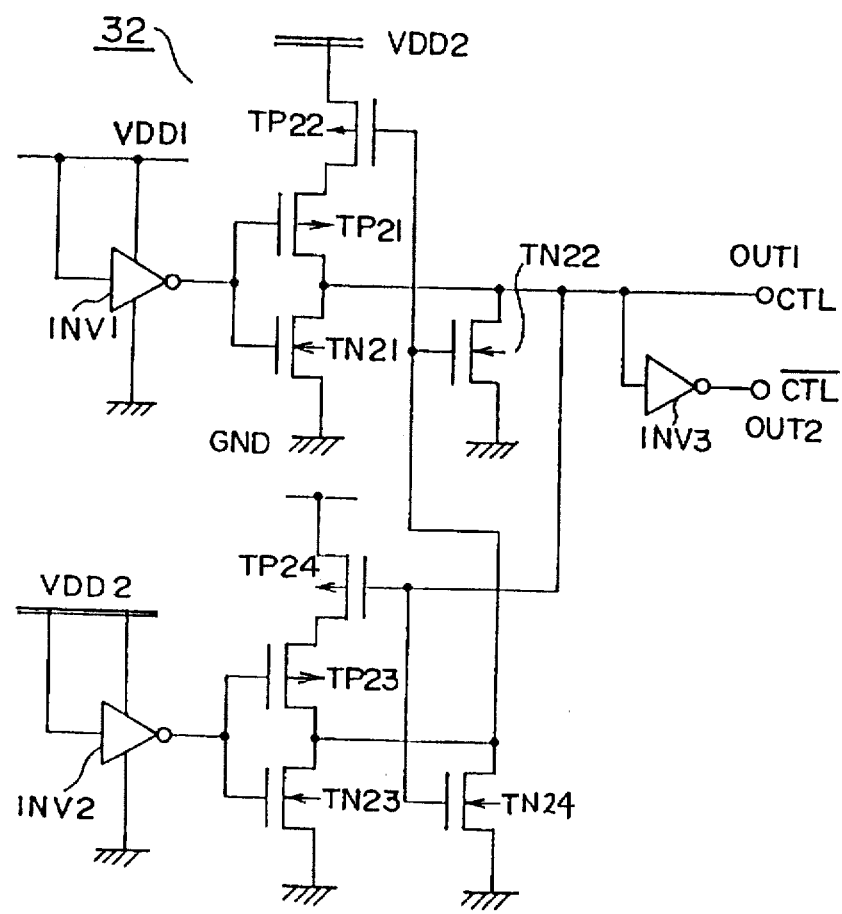

The timing generating circuit 32 is an example of the signal control unit 22, and generates a control signal CTL based on the order of making the power lines VDD1 and VDD2. For example, the timing generating circuit 32 comprises inverters INV1 to INV3, p-type field effect transistors TP21 to TP24 and n-type field effect transistors TN21 to TN24 as shown in FIG. 73A.

The inverter INV1 is connected between the power line VDD1 and the ground line GND, and the input thereof is connected to the power line VDD1. The transistors TP22, TP21 and TN21 are connected in series between the power line VDD2 and the ground line GND. The common gate of the transistors TP21 and TN21 is connected to the inverter INV, and the common drain thereof is connected to the drain of the transistor TN22 and the gates of the transistors TP24 and TN24 and further to the output OUT1.

Further, the inverter INV2 is connected between the power line VDD2 and the ground line GND, and the input thereof is connected to the power line VDD2. The transistors TP24, TP23 and TN23 are connected in series between the power line VDD1 and the ground line GND. The common gate of the transistors TP23 and TN23 is connected to the inverter INV2, and the common drain thereof is connected to the drain of the transistor TN24 and the gates of the transistors TP22 and TN22. The inverter INV3 is connected between the output OUT1 and the output OUT2.

With this, a non-inverting control signal CTL is supplied from the output OUT1 of the timing generating circuit 32 to the gate of the transistor TN12 of the output buffer 302 and the gate of the transistor TP14 of the input buffer 304, and an inverting signal $\overline{CTL}$ is supplied from the output OUT2 thereof to the gate of the transistor TP12 of the output buffer 302 and the gate of the transistor TN14 of the input buffer 304.

Figure 74A:
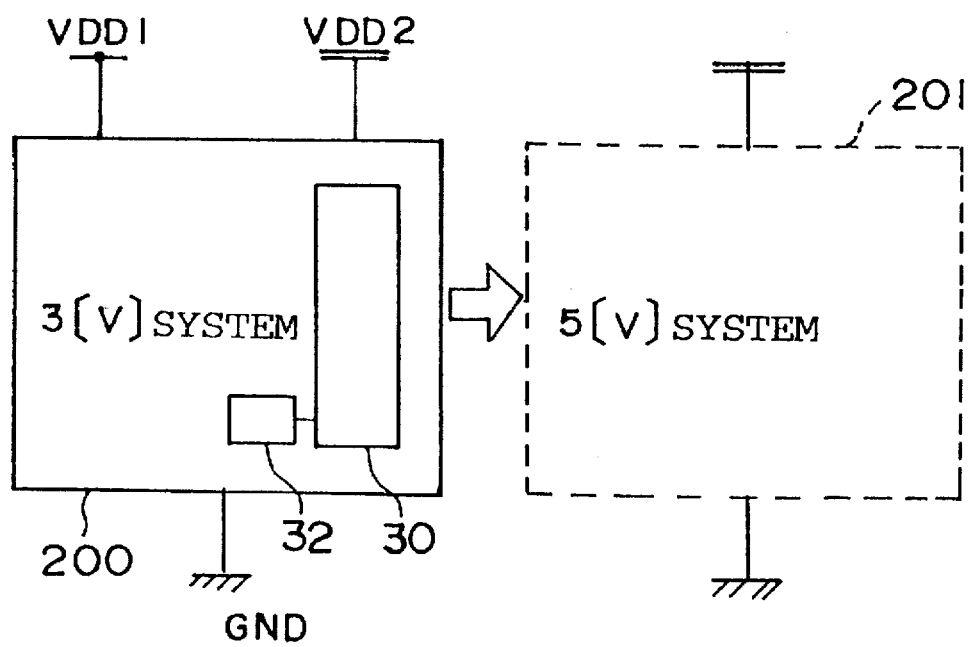

Thus, according to a semiconductor integrated circuit related to the 33rd embodiment of the present invention, the bidirectional converter 30, the internal circuit 29 and the timing generating circuit 32 are provided in the same semiconductor chip as shown in FIG. 74A, the bidirectional level converter 30 is provided at each input/output terminal and the level converters according to the first to the 30th embodiments of the present invention are applied to the level converters 301 and 303.

As a result, it is possible to generate the control signal CTL by the timing generating circuit 32 based in the order of making the power lines VDD1 and VDD2 and to determine the operating direction by outputting the control signal CTL to respective bidirectional level converters 30.

Figure 73B:
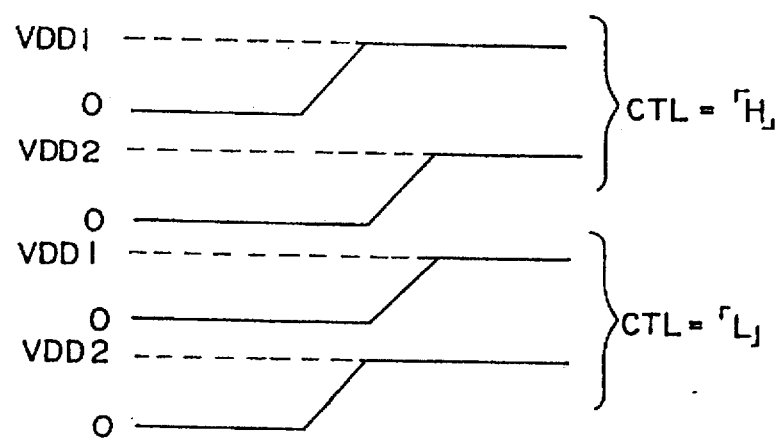

For example, as shown in FIG. 73B, when the power line VDD1 is made first and the power line VDD2 is made later, a non-inverting control signal CTL="H" level is supplied to the gate of the transistor TN12 of the output level converter 30A, and an inverting control signal $\overline{CTL}$="L" level is supplied to the gate of the transistor TP12 thereof. Further, a non-inverting control signal CTL="L" level is supplied to the gate of the transistor TP14 of the input level converter 30B, and an inverting control signal $\overline{CTL}$="H" level is supplied to the gate of the transistor TN14.

As a result, the output level converter 30A is brought into an operating state and the input level converter 30B is brought into a non-operating state, thus making it possible to automatically determine the output direction from an IC of the 3 V driving system such as shown in FIG. 73B to an IC of the 5 V driving system.

Conversely, when the power line VDD2 is made first and the power line VDD1 is made later, a non-inverting control signal CTL="L" level is supplied to the gate of the transistor TN12 of the output level converter 30A and an inverting control signal $\overline{CTL}$="H" level is supplied to the gate of the transistor TP12 thereof. Further, a non-inverting control signal CTL="H" level is supplied to the gate of the transistor TP14 of the input level converter 30B and an inverting control signal $\overline{CTL}$="L" level is supplied to the gate of the transistor TN14.

As a result, the output level converter 30A is brought into a non-operating state and the input level converter 30B is brought into an operating state, thus making it possible to automatically determine the input direction from an IC of the 5 V driving circuit system 200 to an IC of the 3 V driving circuit system 201.

Thus, it is possible to determine the signal input/output direction as a control signal by the order of making the power source without depending on external supply of power, thus reducing useless input/output terminals. Moreover, it becomes possible to reduce the number of input/output terminals of a one-chip microcomputer or the like to the utmost.

Figure 74B:
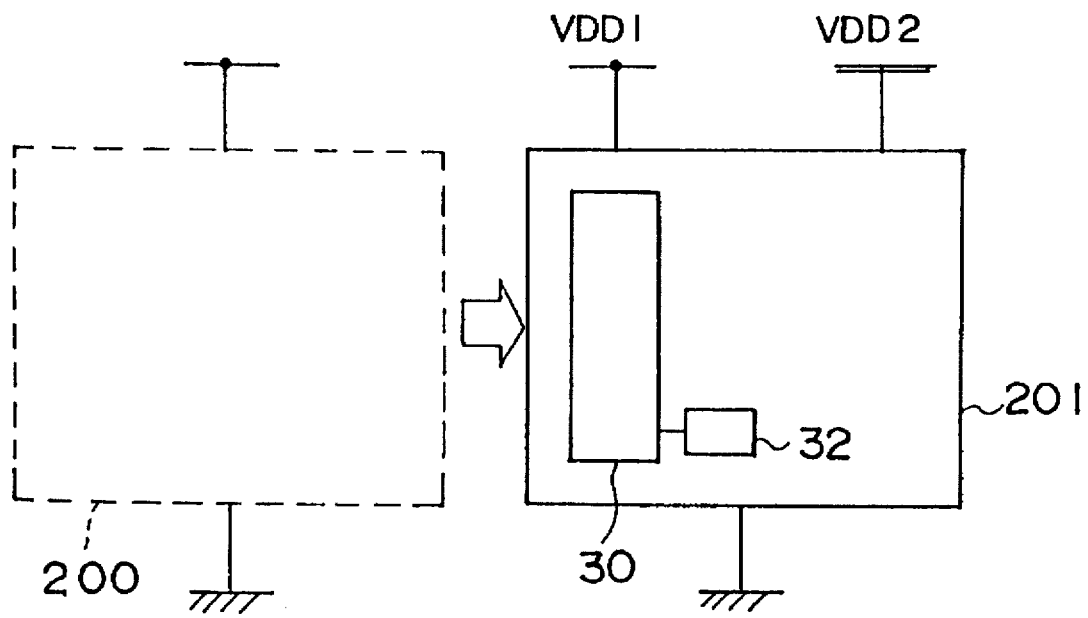

Further, the bidirectional level converter 30, the timing generating circuit 32 and the 5 V driving circuit system 201 which is an example of the second circuit system 19 may be provided in the same semiconductor chip and integrated as shown in FIG. 74B. Thus, it becomes possible to adopt the driving power source voltage of its own and the driving power source voltage of another IC without discriminating the amplitude thereof in particular.

For example, by incorporating the bidirectional level converter 30 into either an IC of the 3 or 4 V driving system or that of the 5 V driving system, it becomes possible to use the IC in common notwithstanding that the IC connected thereto is of the 3 or 4 V driving system or the 5 V driving system. In other words, the same IC can be used in common when the IC concerned itself is of the 5 V driving system and the IC connected externally is of the 4 V driving system or even when the IC concerned itself is of the 3 V driving system and the IC connected externally is of the 5 V driving system.

Further, according to the semiconductor integrated circuit related to the 33rd embodiment of the present invention, it becomes possible to improve the packaging efficiency of ICs as compared with the related art of the present invention due to a fact that the bidirectional level converter 30 and the timing generating circuit 32 are provided in the same semiconductor chip as the 3 V driving circuit system 200 and the 5 V driving circuit system 201.

(34) Description of the 34th preferred embodiment

Figure 75:
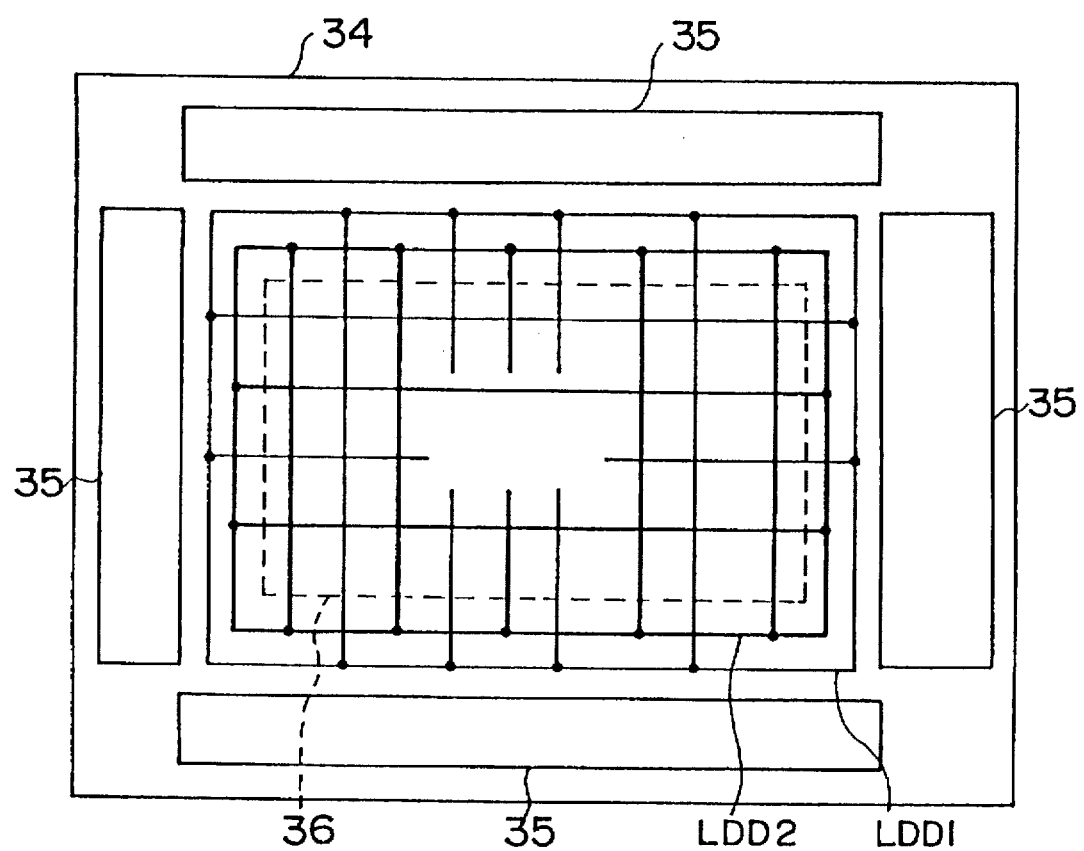

For example, when a semiconductor integrated circuit according to the 33rd embodiment of the present invention is integrated with CMOS circuits and power sources thereof are wired, an I/O cell portion 35 and a cell array portion 36 are arranged in a semiconductor chip 34 first as shown in FIG. 75. Here, the 3 V driving circuit system 200 or the 5 V driving circuit system 201 of the 32nd embodiment including the level converters according to the first to the 30th embodiments of the present invention is arranged in the cell array portion 36.

Further, power lines for supplying power to the I/O cell portion 35 and the cell array portion 36 are wired in a lattice form. For example, 5 V power source wirings LDD2 and 3 V power source wirings LDD1 are arranged in a ring shape between the I/O cell portion 35 and the cell array portion 36 therearound, and arranged in a lattice shape from the ring-shaped wirings with respect to the cell array portion 36.

Figure 76:
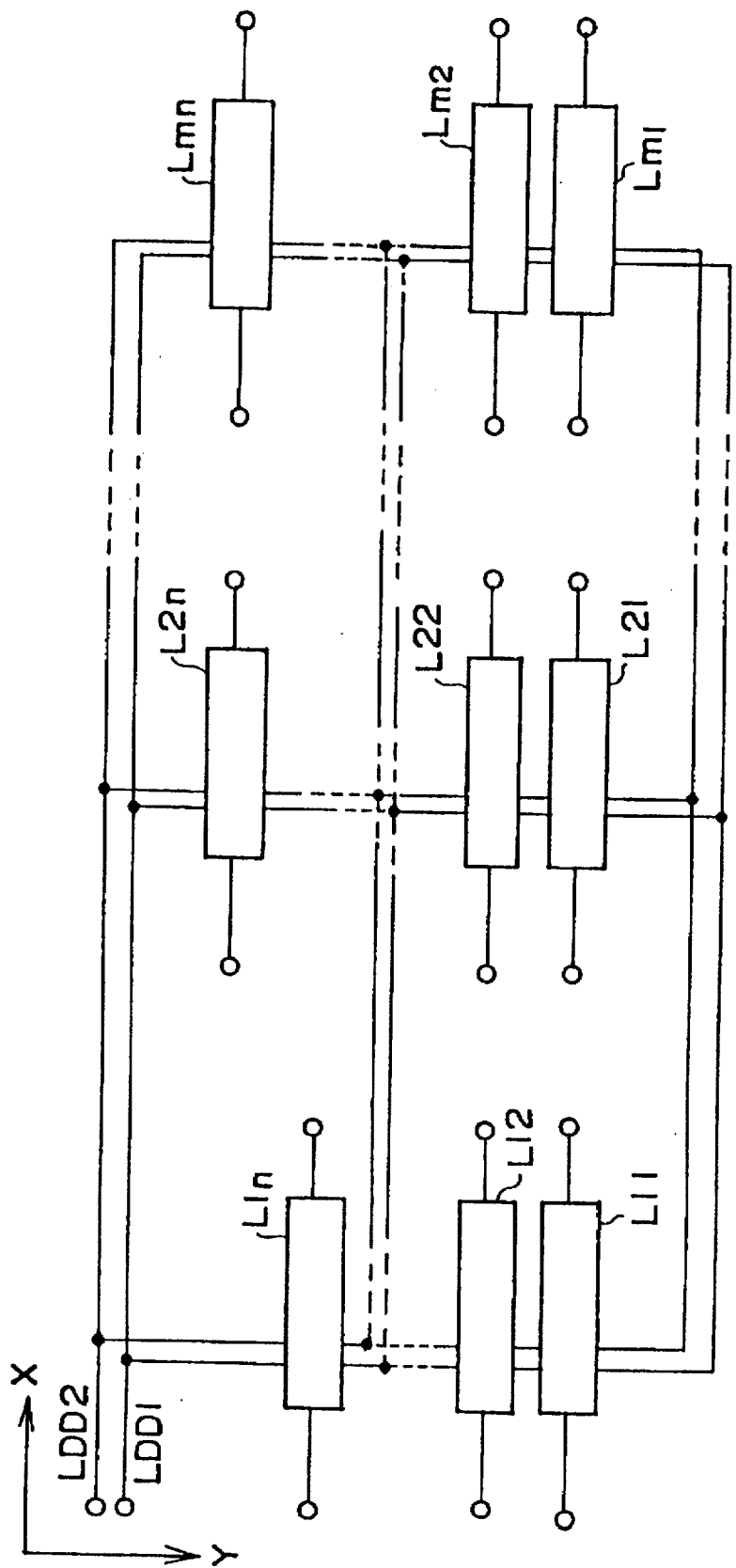

FIG. 76 shows a block diagram showing level converter cells arranged in the cell array portion. For example, in m×n pieces of level converter cells, m(m−1 to m) pieces of level converter cells L11 to Lm1 are arranged in an X direction of the cell array portion 36 and n(n=1 to n) pieces of them are arranged in a Y direction in parallel to one another. Further, the 5 V power source wirings LDD2 and the 3 V power source wirings LDD1 are wired in a ring shape and in a lattice shape with respect to the m×m pieces of level converter cells.

Figure 77:
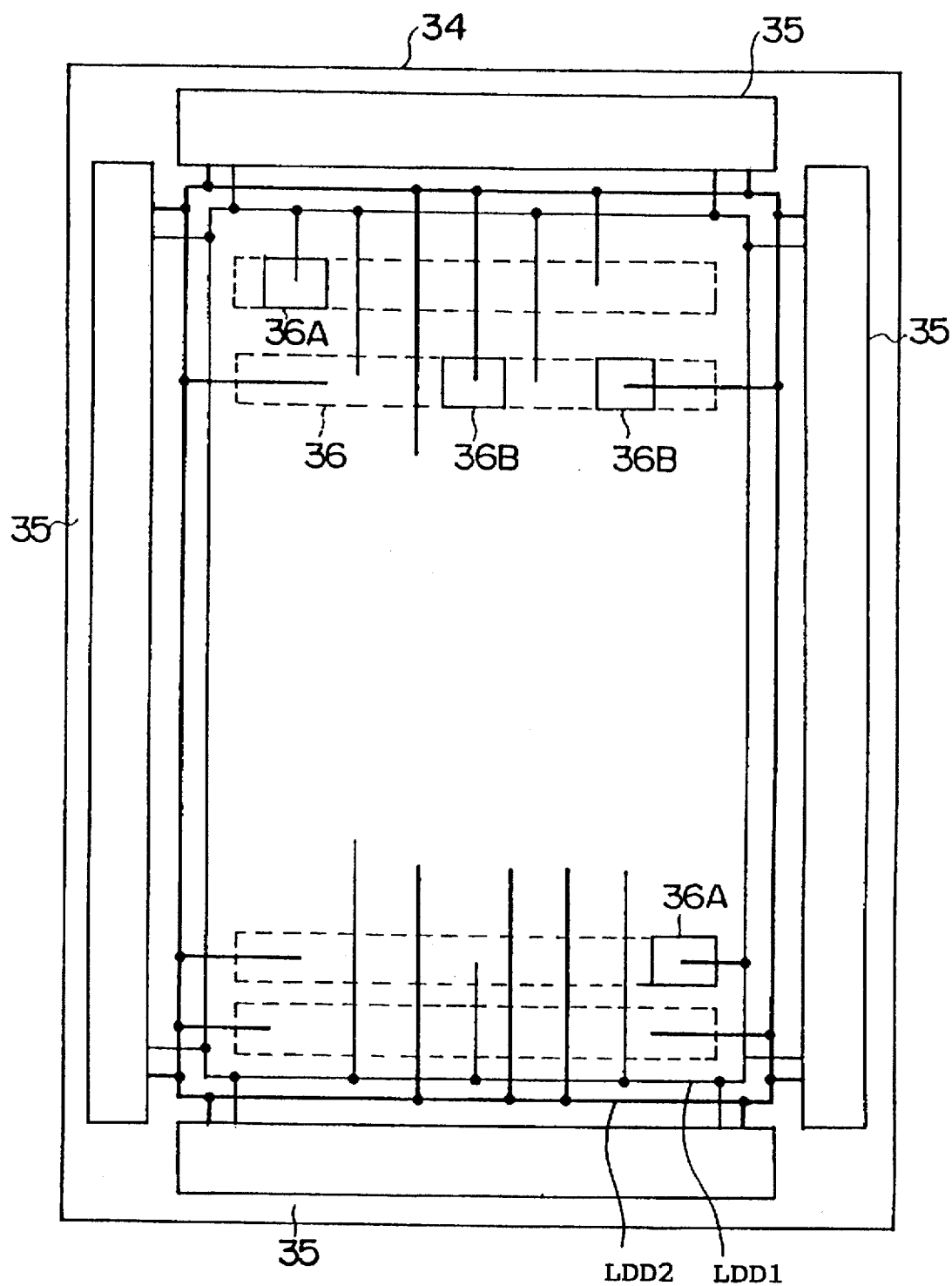

To be concrete, the 5 V power source wirings LDD2 and the 3 V power source wirings LDD1 are wired in the I/O cell portion 35 arranged in the semiconductor chip as shown in FIG. 77. The power source wirings LDD1 are connected to 3 V driving cells 36A of the cell array portion 36, and 5 V driving cells 36B are connected to the power source wirings LDD2. Thus, it becomes possible to provide the degree of freedom in the arrangement of the level converters.

Thus, according to the semiconductor integrated circuit related to the 34th embodiment of the present invention, the 5 V power source wirings LDD2 and the 3 V power source wirings LDD1 are wired in a lattice shape in the semiconductor chip 34 as shown in FIG. 75 to FIG. 77.

Figure 78:
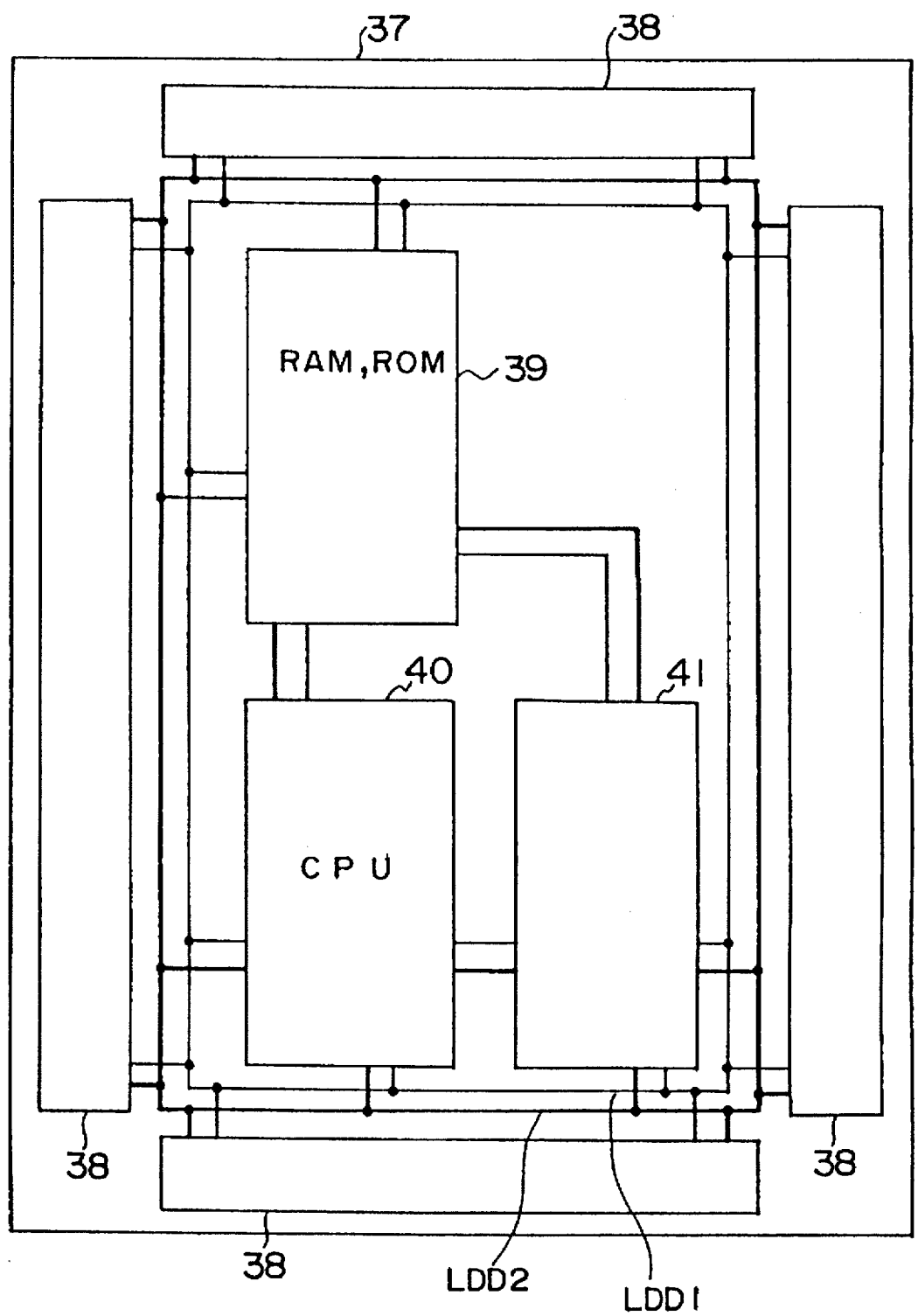

As a result, it is possible to supply high or low voltage freely to respective cells from vertical and horizontal directions by wiring the power source wirings LDD2 and LDD1 on a semiconductor chip 34 at need in a ring shape (a lattice shape) in respective cell lines from vertical and horizontal directions as shown in FIG. 78 for instance without separating a low voltage source and a high voltage source from each other depending on the cell line as in the related art of the present invention.

Thus, an I/O port portion 38, a RAM, a ROM, a multiplier cell portion 39 and other macrocell portion 41 are arranged in the same cell as shown in FIG. 78, thus making it possible to aim at reduction of useless power consumption of a one-chip microprocessor or the like including the 3 V driving circuit system 26, the level converters 27A and 27B and the 5 V driving circuit system 28.

Further, by passing wirings of input/output signals can be reduced as compared with the related art of the present invention since the layout of the level converters may be made freely. With this, the present invention contributes greatly to provide a semiconductor integrated circuit for converting a signal level at a high speed between circuit systems having different driving power sources and to provide an applied circuit device. Accordingly, all of modified examples included in the true spirit and scope of the present invention are included in the claims.

What is claimed is:

1. A level converter coupled to a first power source, a second power source, and a third power source, receiving an input signal, said level converter comprising:

an input transistor circuit, coupled to said first power source and supplied with power from the first power source, generating an inverting signal and a non-inverting signal based on said input signal; and an output transistor circuit comprising:

a first transistor having a first source connected to said second power source, a first drain, and a first gate, a second transistor having a second source connected to the third power source, a second drain connected to the first drain, and a second gate connected to said non-inverting signal, a third transistor having a third source connected to said second power source, a third drain connected to said first gate, and a third gate connected to said first drain, to said second drain, and to a first output, and a fourth transistor having a fourth source connected to said third power source, a fourth drain connected to said third drain and to a second output, and a fourth gate connected to said inverting signal;

wherein a time period during which said second transistor is turned on by said non-inverting signal generated by said input transistor circuit is included within a time period during which said fourth transistor is turned off by said inverting signal; and a time period during which said fourth transistor is turned on by said inverting signal generated by said input transistor circuit is included in a time period during which said second transistor is turned off by said non-inverting signal.

2. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:

a first load element having a first end and a second end;

a second load element having a first end and a second end;

a first transistor having a first source, connected to the second power source, a first drain connected to a first output and to the first load element, and a first gate;

a second transistor having a second source connected to the third power source, a second drain connected to the first drain, and a second gate connected to the non-inverting signal;

a third transistor having a third source, connected to the second power source, a third drain connected to a second output, and a third gate connected to the first drain through the first load element;

a fourth transistor having a fourth source, connected to the third power source, a fourth drain connected to the first gate through the second load element, to the third drain, to the second output, and a fourth gate connected to the inverting signal;

a fifth transistor having a fifth source connected to the third power source, a fifth drain connected to the first end of the first load element and to the third gate, and a fifth gate connected to the second gate and to the input signal; and a sixth transistor having a sixth source connected to the third power source, a sixth drain connected to the first end of the second load element and to the first gate, and a sixth gate connected to the fourth gate and to the inverting signal.

3. A level converter according to claim 2, wherein said input transistor circuit supplies a non-inverting input signal into the gate of said second transistor and the gate of the fifth transistor and supplies a delayed-inverting input signal into the gate of said fourth transistor and the gate of the sixth transistor, respectively.

4. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:

a first transistor comprising a gate, a source, and a drain;

a second transistor comprising a gate, a source, and a drain;

a third transistor comprising a gate, a source, and a drain;

a fourth transistor comprising a gate, a source, and a drain;

a fifth transistor comprising a gate, a source, and a drain;

a sixth transistor comprising a gate, a source, and a drain;

a seventh transistor comprising a gate, a source, and a drain; and an eighth transistor comprising a gate, a source, and a drain;

wherein:

the drain of said first transistor is connected to the drain of the second transistor;

the source of said first transistor, and the source of said third transistor are connected to the second power source;

the drain of said third transistor is connected to the drain of said fourth transistor;

the source of said second transistor, the source of said fourth transistor, the source of said fifth transistor, and the source of said sixth transistor are connected to the third power source;

the gate of said first transistor is coupled through the eighth transistor to the drain of said third transistor and the drain of said fourth transistor and a second output;

the gate of the third transistor is coupled through the seventh transistor to the drain of said first transistor and the drain of said second transistor and a first output through the seventh transistor;

the drain of said fifth transistor and the drain of said seventh transistor are connected to the gate of the third transistor;

the source of the seventh transistor is connected to the drain of the first transistor and the drain of the second transistor and the first output;

the gate of said fifth transistor and the gate of said seventh transistor are connected to the gate of the second transistor;

the drain of said sixth transistor and the drain of the eighth transistor are connected to the gate of the first transistor;

the source of said eighth transistor is connected to the drain of the third transistor and the drain of the fourth transistor and the second output;

the gate of said sixth transistor and the gate of the eighth transistor are connected to the gate of the fourth transistor; and the gate of said second transistor, the gate of said fifth transistor, and the gate of said seventh transistor are connected to the non-inverting signal, and the gate of said sixth transistor, the gate of said sixth transistor, and the gate of the eighth transistor are connected to the inverting signal.

5. A level converter according to claim 4, wherein said input transistor circuit supplies a non-inverting input signal into the gate of said second transistor, the gate of the fifth transistor and the gate of the seventh transistor and supplies a delayed-inverting input signal into the gate of said fourth transistor, the gate of the sixth transistor and the gate of the eighth transistor, respectively.

6. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:
   a first transistor comprising a gate, a source, and a drain;
   a second transistor comprising a gate, a source, and a drain;
   a third transistor comprising a gate, a source, and a drain;
   a fourth transistor comprising a gate, a source, and a drain;
   a fifth transistor comprising a gate, a source, and a drain;
   a sixth transistor comprising a gate, a source, and a drain;
   a first load element; and
   a second load element, wherein:
      the drain of said first transistor is connected to the drain of the second transistor;
      the source of said first transistor and the source of said third transistor are connected to the second power source, respectively;
      the drain of said third transistor is connected to the drain of said fourth transistor;
      the source of said second transistor and the source of said fourth transistor are connected to the third power source;
      the gate of said first transistor is coupled through the fifth transistor to the drain of said third transistor and the drain of said fourth transistor and a second output;
      the gate of said third transistor is coupled through the sixth transistor to the drain of said first transistor and the drain of said second transistor and a first output;
      one end of said first load element is connected to the gate of the first transistor and the drain of said fifth transistor;
      one end of said second load element is connected to the gate of the third transistor and the drain of said sixth transistor;
      the source of said fifth transistor is connected to the gate of the sixth transistor, the drain of the third transistor and the drain of the fourth transistor and the second output;
      the source of said sixth transistor is connected to the gate of the fifth transistor, the drain of the first transistor and the drain of the second transistor and the first output;
      other respective ends of said first load element and said second load element are connected to said second power source, respectively; and
      the gate of said second transistor is connected to the non-inverting signal and the gate of the fourth transistor is connected to the inverting signal.

7. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:
   a first transistor comprising a gate, a source, and a drain;
   a second transistor comprising a gate, a source, and a drain;
   a third transistor comprising a gate, a source, and a drain;
   a fourth transistor comprising a gate, a source, and a drain;
   a fifth transistor comprising a gate, a source, and a drain;
   a sixth transistor comprising a gate, a source, and a drain;
   a seventh transistor comprising a gate, a source, and a drain; and
   an eighth transistor comprising a gate, a source, and a drain; wherein:
      the drain of said first transistor is connected to the drain of the second transistor;
      the source of said first transistor, the source of the third transistor, the source of the seventh transistor, and the source of the eighth transistor are connected to the second power source, respectively;
      the drain of said third transistor is connected to the drain of said fourth transistor;
      the source of said second transistor and the source of the fourth transistor are connected to the third power source;
      the gate of said first transistor is coupled through the fifth transistor to the drain of said third transistor and the drain of the fourth transistor and a second output;
      the gate of said third transistor is coupled through the sixth transistor to the drain of said first transistor and the drain of the second transistor and a first output;
      the drain of said fifth transistor is connected to the gate of the first transistor and the drain of said seventh transistor;
      the drain of said sixth transistor and the drain of the eighth transistor are connected to the gate of the third transistor;
      the source of said fifth transistor is connected to the gate of the sixth transistor, the drain of the third transistor, the drain of the fourth transistor and the second output;
      the source of said sixth transistor is connected to the gate of the fifth transistor, the drain of the first transistor, the drain of the second transistor and the first output; and the gate of said second transistor is connected to the non-inverting signal and the gate of the fourth transistor is connected to the inverting signal.

8. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:
a first load element having a first end and a second end, said second end connected to the second power source;
a second load element having a first end and a second end, said second end connected to the, second power source;
an odd number of first inverters;
an odd number of second inverters;
a first transistor having a first source connected to the second power source, a first drain, and a first gate;
a second transistor having a second source connected to the third power source, a second drain connected to the first drain, and a second gate connected to the non-inverting signal;
a third transistor having a third source connected to the second power source, a third drain, and a third gate;
a fourth transistor having a fourth source connected to the third power source, a fourth drain coupled through the fifth transistor to the first gate, to the third drain, and to a second output, and a fourth gate connected to the inverting signal;
a fifth transistor having a fifth source connected to the third drain, to the fourth drain, and to the second output, a fifth drain connected to the first end of the first load element and to the first gate, and a fifth gate connected to the odd number of second inverters; and
a sixth transistor having a sixth source connected to the first drain, to the second drain, and to a first output, a sixth drain connected to the first end of the second element and to the third gate, and a sixth gate connected to the odd number of first inverters, wherein said odd number of first inverters are connected to the first output and said odd number of second inverters are connected to the second output.

9. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:
a first transistor comprising a gate, a source, and a drain;
a second transistor comprising a gate, a source, and a drain;
a third transistor comprising a gate, a source, and a drain;
a fourth transistor comprising a gate, a source, and a drain;
a fifth transistor comprising a gate, a source, and a drain;

a sixth transistor comprising a gate, a source, and a drain;
a seventh transistor comprising a gate, a source, and a drain;
an eighth transistor comprising a gate, a source, and a drain;
an odd number of first inverters; and
an odd number of second inverters, wherein:
the drain of said first transistor is connected to the drain of the second transistor;
the source of said first transistor, the source of the third transistor, the source of the seventh transistor, and the source of the eighth transistor are connected to the second power source, respectively;
the drain of said third transistor is connected to the drain of said fourth transistor;
the source of said second transistor and the source of the fourth transistor are connected to the third power source;
the gate of said first transistor is coupled through the fifth transistor to the drain of said third transistor, the drain of the fourth transistor and a second output;
the gate of said third transistor is coupled through the sixth transistor to the drain of said first transistor, the drain of the second transistor and a first output;
the drain of said fifth transistor and the drain of the seventh transistor are connected to the gate of the first transistor;
the drain of said sixth transistor and the drain of the eighth transistor are connected to the gate of the third transistor;
the source of said fifth transistor is connected to the drain of the third transistor, the drain of the fourth transistor and the second output;
the source of said sixth transistor is connected to the drain of the first transistor, the drain of the second transistor and the first output;
the second inverters are connected between the gate of said fifth transistor and the second output;
the first inverters are connected between the gate of said sixth transistor and the first output; and
the gate of said second transistor is connected to the non-inverting signal and the gate of the fourth transistor is connected to the inverting signal.

10. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:
a first transistor comprising a gate, a source, and a drain;
a second transistor comprising a gate, a source, and a drain;
a third transistor comprising a gate, a source, and a drain;
a fourth transistor comprising a gate, a source, and a drain;
a fifth transistor comprising a gate, a source, and a drain;
a sixth transistor comprising a gate, a source, and a drain;
an even number of first inverters;
an even number of second inverters a first load element; and a second load element, wherein:

the drain of said first transistor is connected to the second transistor;

the source of said first transistor and the source of the third transistor are connected to the second power source, respectively;

the drain of said third transistor is connected to the drain of said fourth transistor;

the source of said second transistor and the source of the fourth transistor are connected to the third power source;

the gate of said first transistor is coupled through the fifth transistor to the drain of said third transistor, the drain of the fourth transistor and a second output;

the gate of said third transistor is coupled through the sixth transistor to the drain of said first transistor, the drain of the second transistor and a first output;

one end of said first load element is connected to the gate of the first transistor and the drain of said fifth transistor;

one end of said second load element is connected to the gate of the third transistor and the drain of said sixth transistor;

the source of said fifth transistor is connected to the drain of the third transistor, the drain of the fourth transistor and the second output;

the source of said sixth transistor is connected to the drain of the first transistor, the drain of the second transistor and the first output;

other end of said first load element and other end of the second load element are connected to said second power source, respectively;

said first inverters are connected between the gate of said fifth transistor and the first output;

said second inverters are connected between the gate of said sixth transistor and the second output; and the gate of said second transistor is connected to the non-inverting signal and the gate of the fourth transistor is connected to the inverting signal.

11. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:

a first transistor comprising a gate, a source, and a drain;

a second transistor comprising a gate, a source, and a drain;

a third transistor comprising a gate, a source, and a drain;

a fourth transistor comprising a gate, a source, and a drain;

a fifth transistor comprising a gate, a source, and a drain;

a sixth transistor comprising a gate, a source, and a drain;

an even number of first inverters; and an even number of second inverters; wherein:

the drain of said first transistor is connected to the drain of the second transistor;

the source of said first transistor, the source of the third transistor, the source of the seventh transistor, and the source of the eighth transistor are connected to the second power source, respectively;

the drain of said third transistor is connected to the drain of said fourth transistor;

the source of said second transistor and the source of the fourth transistor are connected to the third power source;

the gate of said first transistor is coupled through the fifth transistor to the drain of said third transistor, the fourth transistor and a second output;

the gate of said third transistor is coupled through the sixth transistor to the drain of said first transistor, the drain of the second transistor and a first output;

the drain of said fifth transistor and the drain of the seventh transistor are connected to the gate of the first transistor;

the drain of said sixth transistor and the drain of the eighth transistor are connected to the gate of the third transistor;

the source of said fifth transistor is connected to the drain of the third transistor, the drain of the fourth transistor and the second output;

the source of said sixth transistor is connected to the drain of the first transistor, the drain of the second transistor and the first output;

said first inverters are connected between the gate of said fifth transistor and the first output;

said second inverters are connected between the gate of said sixth transistor and the second output; and the gate of said second transistor is connected to the non-inverting signal and the gate of the fourth transistor is connected to the inverting signal.

12. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:

a first transistor comprising a gate, a source, and a drain;

a second transistor comprising a gate, a source, and a drain;

a third transistor comprising a gate, a source, and a drain;

a fourth transistor comprising a gate, a source, and a drain;

a fifth transistor comprising a gate, a source, and a drain;

a sixth transistor comprising a gate, a source, and a drain;

a first load element;

a second load element;

a third load element;

a fourth load element;

a first capacitor; and a second capacitor, wherein:

the drain of said first transistor is connected to the drain of the second transistor;

the source of said first transistor and the source of the third transistor are connected to the second power source, respectively;

the drain of said third transistor is connected to the drain of said fourth transistor;

the source of said second transistor and the source of the fourth transistor are connected to the third power source;

the gate of said first transistor is coupled through the fifth transistor to the drain of said third transistor, the drain of the fourth transistor and a second output;

the gate of said third transistor is coupled through the sixth transistor to the drain of said first transistor, the drain of the second transistor and a first output;

one end of said first load element is connected to the gate of the first transistor and the drain of said fifth transistor;

one end of said second load element is connected to the gate of the third transistor and the drain of said sixth transistor;

the source of said fifth transistor is connected to one end of the fourth load element and one end of the second capacitor, the drain of the third transistor, the drain of the fourth transistor and the second output;

the source of said sixth transistor is connected to one end of the third load element and one end of the first capacitor, the drain of the first transistor, the drain of the second transistor and the first output;

the gate of said fifth transistor is connected to another end of the third load element;

the gate of said sixth transistor is connected to another end of the fourth load element;

other end of said first load element and other end of the second load element are connected to said second power source, respectively;

other end of said first capacitor and other end of the second capacitor are connected to said third power source; and the gate of said second transistor is connected to the non-inverting signal and the gate of the fourth transistor is connected to the inverting signal.

13. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:
a first transistor comprising a gate, a source, and a drain;
a second transistor comprising a gate, a source, and a drain;
a third transistor comprising a gate, a source, and a drain;
a fourth transistor comprising a gate, a source, and a drain;
a fifth transistor comprising a gate, a source, and a drain;
a sixth transistor comprising a gate, a source, and a drain;
a seventh transistor comprising a gate, a source, and a drain;
an eighth transistor comprising a gate, a source, and a drain;
a first load element;
a second load element;
a first capacitor; and
a second capacitor, wherein:
the drain of said first transistors is connected to the drain of the second transistor;
the source of said first transistor, the source of the third transistor, the source of the seventh transistor and the source of the eighth transistor are connected to the second power source, respectively;

the drain of said third transistor is connected to the drain of said fourth transistor;

the source of said second transistor and the source of the fourth transistor are connected to the third power source;

the gate of said first transistor is coupled through the fifth transistor to the drain of said third transistor, the drain of the fourth transistor and a second output;

the gate of said third transistor is coupled through the sixth transistor to the drain of said first transistor, the drain of the second transistor and a first output;

the drain of said fifth transistor and the drain of the seventh transistor are connected to the gate of the first transistor;

the drain of said sixth transistor and the drain of the eighth transistor are connected to the gate of the third transistor;

the source of said fifth transistor is connected to one end of the second load element and one end of the second capacitor, the drain of the third transistor, the drain of the fourth transistor and the second output;

the source of said sixth transistor is connected to one end of the first load element and one end of the first capacitor, the drain of the first transistor, the drain of the second transistor and the first output;

the gate of said fifth transistor is connected to another end of the first load element;

the gate of said sixth transistor is connected to another end of the second load element;

other end of said first capacitor and other end of the second capacitor are connected to said third power source; and the gate of said second transistor is connected to the non-inverting signal and the gate of the fourth transistor is connected to the inverting signal.

14. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:
a first transistor comprising a gate, a source, and a drain;
a second transistor comprising a gate, a source, and a drain;
a third transistor comprising a gate, a source, and a drain;
a fourth transistor comprising a gate, a source, and a drain;
a fifth transistor comprising a gate, a source, and a drain;
a sixth transistor comprising a gate, a source, and a drain;
a first inverter;
a second inverter;
a first integrating circuit;
a second integrating circuit
a first load element;
a second load element, wherein:
the drain of said first transistor is connected to the drain of the second transistor;
the source of said first transistor and the source of the third transistor are connected to the second power source, respectively;

the drain of said third transistor is connected to the drain of said fourth transistor;

the source of said second transistor and the source of the fourth transistor are connected to the third power source;

the gate of said first transistor is coupled through the fifth transistor to the drain of said third transistor, the drain of the fourth transistor and a second output;

the gate of said third transistor is coupled through the sixth transistor to the drain of said first transistor, the drain of the second transistor and a first output;

one end of said first load element is connected to the gate of the first transistor and the drain of said fifth transistor;

one end of said second load element is connected to the gate of the third transistor and the drain of said sixth transistor;

the source of said fifth transistor is connected to the drain of the third transistor, the drain of the fourth transistor and the second output;

the source of said sixth transistor is connected to the drain of the first transistor, the drain of the second transistor and the first output;

other end of said first load element and other end of the second load element are connected to said second power source, respectively;

said second inverter and second integrating circuit are connected in series between the gate of said fifth transistor and the second output;

said first inverter and said first integrating circuit are connected in series between the gate of said sixth transistor and the first output; and the gate of said second transistor is connected to the non-inverting signal and the gate of the fourth transistor is connected to the inverting signal.

15. A level converter receiving an input signal and coupled to a first power source, a second power source, and a third power source, said level converter comprising:

an input transistor circuit, coupled to and supplied with power from the first power source, generating an inverting signal and a non-inverting signal of the input signal; and an output transistor circuit comprising:

a first transistor comprising a gate, a source, and a drain;

a second transistor comprising a gate, a source, and a drain;

a third transistor comprising a gate, a source, and a drain;

a fourth transistor comprising a gate, a source, and a drain;

a fifth transistor comprising a gate, a source, and a drain;

a sixth transistor comprising a gate, a source, and a drain;

a seventh transistor comprising a gate, a source, and a drain;

an eighth transistor comprising a gate, a source, and a drain;

a first inverter;

a second inverter;

a first integrating circuit;

a second integrating circuit a first load element;

a second load element, wherein:

the drain of said first transistor is connected to the drain of the second transistor;

the source of said first transistor, the source of the third transistor, the source of the seventh transistor and the source of the eighth transistor are connected to second power source, respectively;

the drain of said third transistor is connected to the drain of said fourth transistor;

the source of said second transistor and the source of the fourth transistor are connected to the third power source;

the gate of said first transistor is coupled through the fifth transistor to the drain of said third transistor, the drain of the fourth transistor and a second output;

the gate of said third transistor is coupled through the sixth transistor to the drain of said first transistor, the drain of the second transistor and a first output;

the drain of said fifth transistor and the drain of the seventh transistor are connected to the gate of the first transistor;

the drain of said sixth transistor and the drain of the eighth transistor are connected to the gate of the third transistor;

the source of said fifth transistor is connected to the drain of the third transistor, drain of the fourth transistor and the second output;

the source of said sixth transistor is connected to the drain of the first transistor, the drain of the second transistor and the first output;

the second inverter and the second integrating circuit are connected in series between the gate of said fifth transistor and the second output;

the first inverter and the first integrating circuit are connected in series between the gate of said sixth transistor and the first output; and the gate of said second transistor is connected to the non-inverting signal and the gate of the fourth transistor is connected to the inverting signal.

16. A level converter receiving an input signal and coupled to a first power source, a second power source, and a third power source, said level converter comprising:

an input transistor circuit, coupled to and supplied with power from the first power source, outputting a complementary signal based on the input signal; and an output transistor circuit comprising:

a first transistor having a first source, connected to the second power source, a first drain, and a first gate;

a second transistor having a second source connected to the third power source, a second drain connected to the first drain, and a second gate connected to the complementary signal;

a third transistor having a third source, connected to the second power source, a third drain connected to the first gate, and a third gate connected to the first drain, to the second drain, and to a first output; and a fourth transistor having a fourth source, connected to the third power source, a fourth drain connected to the third drain and to a second output, and a fourth gate connected to the complementary signal, said input transistor circuit comprising:

an inverter connected to the first power source and comprising and input and an output;

a first two-input NOR circuit comprising a first input, a second input, and an output; and a second two-input NOR circuit comprising a first input, a second input, and an output, wherein:

the input of said inverter is connected to the first input of the second two-input NOR circuit;

the output of said inverter is connected to the first input of the first two-input NOR circuit, and the second input of said first two-input NOR circuit is connected to the output of the second two-input NOR circuit;

the second input of said second two-input NOR circuit is connected to the output of the first two-input NOR circuit; and the output of said first two-input NOR circuit and the output of the second two-input NOR circuit are connected to said output transistor circuit.

17. A level converter receiving an input signal and coupled to a first power source, a second power source, and a third power source, said level converter comprising:

an input transistor circuit, coupled to and supplied with power from the first power source, outputting a first complementary signal and a second complementary signal based on the input signal; and an output transistor circuit comprising:
a first transistor comprising a gate, a source, and a drain;
a second transistor comprising a gate, a source, and a drain;
a third transistor comprising a gate, a source, and a drain;
a fourth transistor comprising a gate, a source, and a drain;
a fifth transistor comprising a gate, a source, and a drain;
a sixth transistor comprising a gate, a source, and a drain;
a first load element;
a second load element, wherein:
the drain of said first transistor is connected to the drain of the second transistor;
the source of said first transistor and the source of the third transistor are connected to the second power source, respectively;
the drain of said third transistor is connected to the drain of the fourth transistor;
the source of said second transistor, the source of the fourth transistor, the source of the fifth transistor and the source of the sixth transistor are connected to a low potential side of the third power source, respectively;
one end of said first load element is connected to the gate of the third transistor and the drain of the fifth transistor;
another end of said first load element is connected to the drain of the first transistor and the drain of the second transistor and the first output;
one end of said second load element is connected to the gate of the first transistor and the drain of the sixth transistor;
another end of said second load element is connected to the drain of the third transistor and the drain of the fourth transistor and the second output; and
the gate of said second transistor, the gate of the fourth transistor, the gate of the fifth transistor and the gate of the sixth transistor are connected to outputs of the input transistor circuit, respectively.

18. A level converter according to claim 17, wherein said input transistor circuit supplies:

a first non-inverting input signal into the gate of said fifth transistor, a second non-inverting input signal into the gate of said second transistor, a first delayed-inverting input signal into the gate of said sixth transistor, and a second delayed-inverting input signal into the gate of said fourth transistor, respectively.

19. A level converter according to claim 17, wherein said input transistor circuit comprises:

an inverter comprising an input and an output and connected to the first power source; and a first two-input NOR circuit comprising a first input, a second input, and an output; and a second two-input NOR circuit comprising a first input, a second input, and an output, wherein:
the input of said inverter is connected to the first input of the second two-input NOR circuit;
the output of said inverter is connected to the first input of the first two-input NOR circuit, and the second input of said first two-input NOR circuit is connected to the output of the second two-input NOR circuit;
the second input of said second two-input NOR circuit is connected to the output of the first two-input NOR circuit; and
the output of said first two-input NOR circuit and the output of the second two-input NOR circuit are connected to said output transistor circuit, respectively.

20. A level converter according to claim 17, wherein said input transistor circuit comprising:

an inverter connected to the first power source; and a first two-input NAND circuit comprising a first input, a second input, and an output; and a second two-input NAND circuit comprising a first input, a second input, and an output, wherein:
the input of said inverter is connected to the first input of the second two-input NAND circuit;
the output of said inverter is connected to the first input of the first two-input NAND circuit, and the second input of said first two-input NAND circuit is connected to the output of the second two-input NAND circuit;
the second input of said second two-input NAND circuit is connected to the output of the first two-input NAND circuit; and
the output of said first two-input NAND circuit and the output of the second two-input NAND circuit are connected to said output transistor circuit, respectively.

21. A level converter receiving an input signal and coupled to a first power source, a second power source, and a third power source, said level converter comprising:

an input transistor circuit, coupled to and supplied with power from the first power source, outputting a first complementary signal and a second complementary signal based on the input signal; and an output transistor circuit comprising:
a first transistor comprising a gate, a source, and a drain;
a second transistor comprising a gate, a source, and a drain;
a third transistor comprising a gate, a source, and a drain;
a fourth transistor comprising a gate, a source, and a drain;
a fifth transistor comprising a gate, a source, and a drain;
a sixth transistor comprising a gate, a source, and a drain;
a seventh transistor comprising a gate, a source, and a drain;

an eighth transistor comprising a gate, a source, and a drain;

a first load element;

a second load element, wherein:

the drain of said first transistor and second transistor are connected to each other;

the source of said first transistor and third transistor are connected to the second power source, respectively;

the drain of said third transistor is connected to the drain of the fourth transistor;

the source of said fifth transistor, the source of the sixth transistor, the source of the seventh transistor and the source of the eighth transistor are connected to a low potential side of the third power source, respectively;

one end of said first load element is connected to the gate of the third transistor and the drain of the fifth transistor;

another end of said first load element is connected to the drain of the first transistor and the drain of the second transistor and the first output;

the gate of said second transistor and the gate of the fifth transistor are connected to each other;

one end of said second load element is connected to the gate of the first transistor and the drain of the sixth transistor;

another end of said second load element is connected to the drain of the third transistor and the drain of the fourth transistor and the second output;

the gate of said fourth transistor and the gate of the sixth transistor are connected to each other;

the source of said second transistor is connected to the drain of the seventh transistor;

the source of said fourth transistor is connected to the drain of the eighth transistor; and the gate of said second transistor, the gate of the fourth transistor, the gate of the fifth transistor, the gate of the sixth transistor, the gate of the seventh transistor and the gate of the eighth transistor are connected to said input transistor circuit, respectively.

22. A level converter according to claim 21, wherein said input transistor circuit supplies:

a first non-inverting input signal into the gate of said second transistor and the gate of the fifth transistor, a second non-inverting input signal into the gate of said seventh transistor, a first delayed-inverting input signal into the gate of said fourth transistor and the gate of the sixth transistor, and a second delayed-inverting input signal into the gate of said eighth transistor, respectively.

23. A semiconductor integrated circuit comprising:

a bidirectional level conversion circuit one of converting an output signal of a first circuit system connected to a first driving power source into an output signal of a second circuit system connected to a second driving power source, and converting an output signal of the second circuit system connected to said second driving power source into an input signal of the first circuit system connected to said first driving power source; and a signal controlling circuit determining a signal direction of said bidirectional level conversion circuit in accordance with a sequence of turning on said first driving power source and said second driving power source.

24. A semiconductor integrated circuit comprising:

a first circuit system driven by being supplied with power from a first driving power source wired in a lattice form in a semiconductor chip; and a second circuit system which is supplied with power from a second driving power source wired in a lattice form in the semiconductor chip.

25. A semiconductor integrated circuit according to claim 24, further comprising a level conversion circuit for converting an output signal of said first circuit system into an input signal of a second circuit system by being supplied with power from said first driving power source.

26. A semiconductor integrated circuit comprising:

a first circuit system driven by being supplied with power from a first driving power source wired in a lattice form in a semiconductor chip;

a level conversion circuit for converting an output signal of said first circuit system into an input signal of a second circuit system by being supplied with power from said first driving power source; and a second circuit system which is supplied with power from a second driving power source wired in a lattice form in a semiconductor chip and driven based on said signal level converted, wherein the level conversion circuit comprises:

an input transistor circuit, coupled to and supplied with power from the first power source, outputting a complementary signal based on the input signal; and an output transistor circuit comprising:

a first transistor having a first source, connected to the second power source, a first drain, and a first gate;

a second transistor having a second source connected to a third power source, a second drain connected to the first drain, and a second gate connected to the complementary signal;

a third transistor having a third source, connected to the second power source, a third drain connected to the first gate, and a third gate connected to the first drain, to the second drain, and to a first output; and a fourth transistor having a fourth source, connected to the third power source, a fourth drain connected to the third drain and to a second output, and a fourth gate connected to the complementary signal.

* * * * *